US012804408B2

(12) United States Patent
Montalvo

(10) Patent No.: US 12,804,408 B2
(45) **Date of Patent: *Nov. 17, 2026**

(54) SYSTEM, METHOD, AND APPARATUS FOR PROVIDING DYNAMIC, PRIORITIZED SPECTRUM MANAGEMENT AND UTILIZATION

(71) Applicant: Digital Global Systems, Inc., Tysons Corner, VA (US)

(72) Inventor: Armando Montalvo, Winter Garden, FL (US)

(73) Assignee: Digital Global Systems, Inc., Tysons Corner, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/337,156

(22) Filed: Sep. 23, 2025

(65) Prior Publication Data

US 2026/0019817 A1 Jan. 15, 2026

Related U.S. Application Data

(63) Continuation of application No. 19/066,885, filed on Feb. 28, 2025, now Pat. No. 12,452,682, which is a (Continued)

(51) Int. Cl.
*H04W 72/0453* (2023.01)
*G06F 30/27* (2020.01)

(Continued)

(52) U.S. Cl.
CPC ............ *H04W 16/10* (2013.01); *G06F 30/27* (2020.01); *G06N 3/02* (2013.01); *G06N 5/022* (2013.01);

(Continued)

(58) Field of Classification Search
CPC ...... H04L 41/16; H04W 16/14; H04W 24/08; H04W 72/0453

(Continued)

(56) References Cited

U.S. PATENT DOCUMENTS 4,903,297 A 2/1990 Rist et al.
4,944,036 A 7/1990 Hyatt (Continued)

FOREIGN PATENT DOCUMENTS

CN 109033389 12/2018
WO 2005071853 A1 8/2005

(Continued)

OTHER PUBLICATIONS

"CBRS Incumbent Protections and Encumbrances Overview" by the Wireless Innovation Forum in Document WINNF-TR-5003, Version V1.0.0 published Apr. 28, 2020.

(Continued)

*Primary Examiner* — John Pezzlo
(74) *Attorney, Agent, or Firm* — Neo IP

(57) ABSTRACT

Systems, methods, and apparatuses for providing dynamic, prioritized spectrum utilization management. The system includes at least one monitoring sensor, at least one data analysis engine, at least one application, a semantic engine, a programmable rules and policy editor, a tip and cue server, and/or a control panel. The tip and cue server is operable utilize the environmental awareness from the data processed by the at least one data analysis engine in combination with additional information to create actionable data.

17 Claims, 92 Drawing Sheets
(54 of 92 Drawing Sheet(s) Filed in Color)

Spectral Correlation Density (SCD) using Machine Learning Image Comparison

Related U.S. Application Data continuation of application No. 18/810,105, filed on Aug. 20, 2024, now Pat. No. 12,279,127, which is a continuation of application No. 18/778,357, filed on Jul. 19, 2024, now Pat. No. 12,177,679, which is a continuation-in-part of application No. 18/591,848, filed on Feb. 29, 2024, now Pat. No. 12,133,082, which is a continuation-in-part of application No. 18/511,527, filed on Nov. 16, 2023, now Pat. No. 11,943,628, which is a continuation of application No. 18/137,765, filed on Apr. 21, 2023, now Pat. No. 11,832,110, which is a continuation of application No. 17/985,570, filed on Nov. 11, 2022, now Pat. No. 11,638,160, which is a continuation-in-part of application No. 17/691,683, filed on Mar. 10, 2022, now Pat. No. 11,838,763, which is a continuation of application No. 17/470,253, filed on Sep. 9, 2021, now Pat. No. 11,277,750, which is a continuation of application No. 17/085,635, filed on Oct. 30, 2020, now Pat. No. 11,395,149.

(60) Provisional application No. 63/018,929, filed on May 1, 2020.

(51) Int. Cl.

| | |
|---|---|
| ***G06N 3/02*** | (2006.01) |
| ***G06N 5/022*** | (2023.01) |
| ***G06N 5/04*** | (2023.01) |
| ***G06N 20/00*** | (2019.01) |
| ***G06N 20/10*** | (2019.01) |
| ***G06N 20/20*** | (2019.01) |
| ***H04L 41/0893*** | (2022.01) |
| ***H04L 41/16*** | (2022.01) |
| ***H04W 16/10*** | (2009.01) |
| ***H04W 24/02*** | (2009.01) |
| *G06N 3/042* | (2023.01) |
| *G06N 3/045* | (2023.01) |
| *H04L 41/0894* | (2022.01) |
| *H04W 16/14* | (2009.01) |
| *H04W 24/08* | (2009.01) |

(52) U.S. Cl.

CPC ............... *G06N 5/04* (2013.01); *G06N 20/00* (2019.01); *G06N 20/10* (2019.01); *G06N 20/20* (2019.01); *H04L 41/0893* (2013.01); *H04L 41/16* (2013.01); *H04W 24/02* (2013.01); *H04W 72/0453* (2013.01); *G06N 3/042* (2023.01); *G06N 3/045* (2023.01); *H04L 41/0894* (2022.05); *H04W 16/14* (2013.01); *H04W 24/08* (2013.01)

(58) Field of Classification Search

USPC ........................................ 370/252, 329, 430

See application file for complete search history.

(56) References Cited

U.S. PATENT DOCUMENTS

| | | | | |
|---|---|---|---|---|
| 5,559,756 | A | 9/1996 | Connolly, Jr. | |
| 6,385,434 | B1 | 5/2002 | Chuprun et al. | |
| 6,735,630 | B1 | 5/2004 | Gelvin et al. | |
| 6,823,022 | B1 | 11/2004 | Fullerton et al. | |
| 6,850,252 | B1 | 2/2005 | Hoffberg | |
| 6,906,625 | B1 | 6/2005 | Taylor et al. | |
| 6,983,009 | B2 | 1/2006 | Lomp | |
| 6,990,087 | B2 | 1/2006 | Rao et al. | |
| 7,020,701 | B1 | 3/2006 | Gelvin et al. | |
| 7,103,460 | B1 | 9/2006 | Breed | |
| 7,190,937 | B1 | 3/2007 | Sullivan et al. | |
| 7,215,716 | B1 | 5/2007 | Smith | |
| 7,269,151 | B2 | 9/2007 | Diener et al. | |
| 7,289,733 | B1 | 10/2007 | He | |
| 7,298,327 | B2 | 11/2007 | Dupray et al. | |
| 7,423,590 | B2 | 9/2008 | Smith | |
| 7,453,400 | B2 | 11/2008 | Struckman et al. | |
| 7,522,514 | B2 | 4/2009 | Tzannes et al. | |
| 7,599,686 | B2 | 10/2009 | Quinn et al. | |
| 8,005,018 | B2 | 8/2011 | Magnone et al. | |
| 8,145,133 | B2 | 3/2012 | Cho et al. | |
| 8,155,649 | B2 | 4/2012 | McHenry et al. | |
| 8,160,163 | B1 | 4/2012 | Yucek et al. | |
| 8,175,539 | B2 | 5/2012 | Diener et al. | |
| 8,175,617 | B2 | 5/2012 | Rodriguez | |
| 8,229,368 | B1 | 7/2012 | Immendorf et al. | |
| 8,254,393 | B2 | 8/2012 | Horvitz | |
| 8,301,075 | B2 | 10/2012 | Sherman et al. | |
| 8,315,224 | B2 | 11/2012 | Hoctor et al. | |
| 8,368,763 | B1 | 2/2013 | Gossett et al. | |
| 8,442,789 | B2 | 5/2013 | Eckert et al. | |
| 8,467,483 | B2 | 6/2013 | Vishakhadatta et al. | |
| 8,514,802 | B2 | 8/2013 | Junell | |
| 8,515,473 | B2 | 8/2013 | Mody et al. | |
| 8,792,901 | B2 | 7/2014 | Schmidt | |
| 8,838,123 | B2 | 9/2014 | Sadeghi et al. | |
| 8,886,794 | B2 | 11/2014 | Adnani et al. | |
| 8,902,834 | B2 | 12/2014 | Xiao et al. | |
| 8,972,311 | B2 | 3/2015 | Srikanteswara et al. | |
| 8,994,591 | B2 | 3/2015 | Dupray et al. | |
| 9,052,387 | B2 | 6/2015 | Akcasu et al. | |
| 9,246,576 | B2 | 1/2016 | Yanai et al. | |
| 9,356,727 | B2 | 5/2016 | Immendorf et al. | |
| 9,380,475 | B2 | 6/2016 | Wolcott et al. | |
| 9,397,619 | B2 | 7/2016 | Lozhkin | |
| 9,408,210 | B2 | 8/2016 | Pikhletsky et al. | |
| 9,439,078 | B2 | 9/2016 | Menon et al. | |
| 9,474,042 | B1 | 10/2016 | Wootton et al. | |
| 9,538,040 | B2 | 1/2017 | Goergen et al. | |
| 9,538,528 | B2 | 1/2017 | Wagner et al. | |
| 9,572,055 | B2 | 2/2017 | Immendorf et al. | |
| 9,578,516 | B2 | 2/2017 | Liu et al. | |
| 9,620,024 | B1 | 4/2017 | Mottram et al. | |
| 9,635,649 | B1 | 4/2017 | Amiri et al. | |
| 9,635,669 | B2 | 4/2017 | Gormley et al. | |
| 9,664,510 | B2 | 5/2017 | Nathan et al. | |
| 9,674,836 | B2 | 6/2017 | Gormley et al. | |
| 9,686,789 | B2 | 6/2017 | Gormley et al. | |
| 9,699,663 | B1 | 7/2017 | Jovancevic et al. | |
| 9,715,009 | B1 | 7/2017 | Parker et al. | |
| 9,769,692 | B2 | 9/2017 | Freda et al. | |
| 9,769,834 | B2 | 9/2017 | Immendorf et al. | |
| 9,819,441 | B2 | 11/2017 | Immendorf et al. | |
| 9,820,288 | B2 | 11/2017 | Höyhtyäet al. | |
| 9,860,075 | B1 | 1/2018 | Gerszberg et al. | |
| 9,893,795 | B1 | 2/2018 | Henry et al. | |
| 9,900,899 | B2 | 2/2018 | Jiang et al. | |
| 9,906,269 | B2 | 2/2018 | Fuchs et al. | |
| 9,923,700 | B2 | 3/2018 | Gormley et al. | |
| 9,936,442 | B1 | 4/2018 | Noonan et al. | |
| 9,942,775 | B2 | 4/2018 | Yun et al. | |
| 9,949,230 | B1 | 4/2018 | Meredith et al. | |
| 9,967,173 | B2 | 5/2018 | Gross et al. | |
| 9,989,633 | B1 | 6/2018 | Pandey et al. | |
| 10,070,444 | B2 | 9/2018 | Markwart et al. | |
| 10,091,798 | B2 | 10/2018 | Learned et al. | |
| 10,104,559 | B2 | 10/2018 | Immendorf et al. | |
| 10,141,929 | B2 | 11/2018 | Rakova et al. | |
| 10,165,450 | B2 | 12/2018 | Taher et al. | |
| 10,194,324 | B2 | 1/2019 | Yun et al. | |
| 10,218,490 | B1 | 2/2019 | Yang et al. | |
| 10,230,428 | B1 | 3/2019 | Barzegar et al. | |
| 10,243,784 | B2 | 3/2019 | Gerszberg et al. | |
| 10,249,202 | B1 | 4/2019 | Passe et al. | |
| 10,264,586 | B2 | 4/2019 | Beattie, Jr. et al. | |
| 10,338,118 | B1 | 7/2019 | Kempke et al. | |
| 10,338,191 | B2 * | 7/2019 | Baxley .................... | H04B 1/18 |
| 10,340,986 | B2 | 7/2019 | Li et al. | |
| 10,362,372 | B2 | 7/2019 | Pekarske et al. | |
| 10,368,246 | B2 | 7/2019 | Khambekar et al. | |

(56) References Cited

U.S. PATENT DOCUMENTS

| | | | |
|---|---|---|---|
| 10,382,976 | B2 | 8/2019 | Bennett et al. |
| 10,389,616 | B2 | 8/2019 | Ryan et al. |
| 10,393,784 | B2 | 8/2019 | Logan et al. |
| 10,396,919 | B1 | 8/2019 | O'Shea et al. |
| 10,397,742 | B2 | 8/2019 | Wootton et al. |
| 10,402,689 | B1 | 9/2019 | Bogdanovych et al. |
| 10,408,913 | B2 | 9/2019 | Miller |
| 10,462,674 | B2 | 10/2019 | Freda et al. |
| 10,477,342 | B2 | 11/2019 | Williams |
| 10,523,342 | B1 | 12/2019 | Kuzdeba et al. |
| 10,536,210 | B2 | 1/2020 | Zhao et al. |
| 10,541,712 | B1 | 1/2020 | Ayala et al. |
| 10,548,071 | B2 | 1/2020 | Maaref et al. |
| 10,552,738 | B2 | 2/2020 | Holt et al. |
| 10,560,143 | B2 | 2/2020 | Zeng et al. |
| 10,564,251 | B1 | 2/2020 | Baxley et al. |
| 10,582,401 | B2 | 3/2020 | Mengwasser et al. |
| 10,592,683 | B1 | 3/2020 | Lim et al. |
| 10,595,220 | B2 | 3/2020 | Morhart et al. |
| 10,599,996 | B2 | 3/2020 | Bose et al. |
| 10,605,890 | B1 | 3/2020 | Yun et al. |
| 10,630,391 | B1 | 4/2020 | LaGasse et al. |
| 10,681,573 | B2 | 6/2020 | Christopherson et al. |
| 10,700,721 | B2 | 6/2020 | Ayala et al. |
| 10,701,574 | B2 | 6/2020 | Gormley et al. |
| 10,721,135 | B1 | 7/2020 | Delson et al. |
| 10,769,239 | B2 | 9/2020 | Dokken et al. |
| 10,784,974 | B2 | 9/2020 | Menon |
| 10,798,597 | B2 | 10/2020 | Wolcott et al. |
| 10,812,992 | B1 | 10/2020 | Tran et al. |
| 10,813,102 | B2 | 10/2020 | Yun et al. |
| 10,839,311 | B2 | 11/2020 | Bose et al. |
| 10,873,533 | B1 | 12/2020 | Ismailsheriff et al. |
| 10,880,903 | B1 * | 12/2020 | Tsai ........................ H04L 41/12 |
| 10,904,781 | B2 | 1/2021 | Gheorghiu et al. |
| 10,917,797 | B2 | 2/2021 | Menon et al. |
| 10,944,436 | B1 | 3/2021 | Buckley |
| 10,952,084 | B2 | 3/2021 | Damnjanovic et al. |
| 10,985,791 | B1 | 4/2021 | Haridim et al. |
| 10,986,505 | B2 | 4/2021 | Cherian et al. |
| 11,012,340 | B2 | 5/2021 | Ryan et al. |
| 11,018,784 | B2 | 5/2021 | Ryan et al. |
| 11,018,957 | B1 | 5/2021 | Ezra et al. |
| 11,019,514 | B2 | 5/2021 | Ayala et al. |
| 11,032,014 | B2 | 6/2021 | O'Shea et al. |
| 11,035,972 | B2 | 6/2021 | Colombo et al. |
| 11,063,653 | B2 | 7/2021 | Ottersten et al. |
| 11,076,307 | B2 | 7/2021 | Vlachou et al. |
| 11,101,903 | B2 | 8/2021 | Yun |
| 11,122,431 | B2 | 9/2021 | Pazhyannur et al. |
| 11,190,946 | B1 | 11/2021 | Montalvo |
| 11,228,414 | B1 | 1/2022 | Nijim et al. |
| 11,259,189 | B2 | 2/2022 | Montalvo et al. |
| 11,265,040 | B2 | 3/2022 | Martone et al. |
| 11,272,372 | B2 | 3/2022 | Montalvo et al. |
| 11,277,161 | B2 | 3/2022 | Ayala et al. |
| 11,277,750 | B2 | 3/2022 | Montalvo et al. |
| 11,277,751 | B2 | 3/2022 | Montalvo |
| 11,282,397 | B2 | 3/2022 | Sakamaki et al. |
| 11,284,267 | B2 | 3/2022 | Montalvo et al. |
| 11,310,676 | B2 | 4/2022 | Gormley et al. |
| 11,334,807 | B1 | 5/2022 | O'Shea et al. |
| 11,349,582 | B2 | 5/2022 | Yun et al. |
| 11,385,271 | B2 | 7/2022 | Audet |
| 11,394,413 | B2 | 7/2022 | Ramabadran et al. |
| 11,394,475 | B1 | 7/2022 | Vaca et al. |
| 11,395,149 | B2 | 7/2022 | Montalvo |
| 11,405,796 | B2 | 8/2022 | Kempf et al. |
| 11,428,800 | B2 | 8/2022 | Luther |
| 11,445,378 | B2 | 9/2022 | Montalvo et al. |
| 11,452,110 | B1 | 9/2022 | Jorgovanovic et al. |
| 11,456,792 | B1 | 9/2022 | Comberiate et al. |
| 11,469,592 | B1 | 10/2022 | Doynov |
| 11,490,262 | B2 | 11/2022 | Montalvo et al. |
| 11,540,295 | B2 | 12/2022 | Yun et al. |

| | | | |
|---|---|---|---|
| 11,553,353 | B2 | 1/2023 | Montalvo et al. |
| 11,558,752 | B2 | 1/2023 | Aktas et al. |
| 11,564,104 | B2 | 1/2023 | Khalid |
| 11,570,627 | B1 | 1/2023 | Montalvo |
| 11,576,050 | B2 | 2/2023 | Montalvo et al. |
| 11,582,613 | B2 | 2/2023 | Montalvo et al. |
| 11,588,562 | B2 | 2/2023 | Garcia et al. |
| 11,627,470 | B1 | 4/2023 | Gronstad et al. |
| 11,632,762 | B2 | 4/2023 | Chakraborty et al. |
| 11,637,641 | B1 | 4/2023 | Garcia et al. |
| 11,638,159 | B2 | 4/2023 | Montalvo et al. |
| 11,638,160 | B2 | 4/2023 | Montalvo et al. |
| 11,647,396 | B1 | 5/2023 | Montalvo et al. |
| 11,653,213 | B2 | 5/2023 | Montalvo |
| 11,653,214 | B2 | 5/2023 | Montalvo et al. |
| 11,659,421 | B2 | 5/2023 | Ma et al. |
| 11,671,839 | B2 | 6/2023 | Guo et al. |
| 11,742,969 | B2 | 8/2023 | Hwang et al. |
| 11,751,068 | B2 | 9/2023 | Ponnampalam et al. |
| 11,758,605 | B2 | 9/2023 | Lim et al. |
| 11,778,480 | B2 | 10/2023 | Kakinada et al. |
| 11,785,628 | B2 | 10/2023 | Wieruch et al. |
| 11,800,368 | B2 | 10/2023 | Montalvo et al. |
| 11,800,369 | B2 | 10/2023 | Montalvo |
| 11,805,421 | B2 | 10/2023 | Montalvo et al. |
| 11,812,276 | B2 | 11/2023 | Montalvo et al. |
| 11,832,110 | B2 | 11/2023 | Montalvo et al. |
| 11,832,111 | B2 | 11/2023 | Lei et al. |
| 11,838,765 | B2 | 12/2023 | Montalvo |
| 11,849,333 | B2 | 12/2023 | Montalvo et al. |
| 11,895,635 | B2 | 2/2024 | Sevindik |
| 11,908,573 | B1 | 2/2024 | Forehand et al. |
| 11,910,199 | B2 | 2/2024 | Montalvo et al. |
| 11,924,648 | B1 | 3/2024 | Montalvo et al. |
| 11,943,003 | B2 | 3/2024 | Elmaghbub et al. |
| 11,943,628 | B1 | 3/2024 | Montalvo et al. |
| 11,985,510 | B1 | 5/2024 | Montalvo et al. |
| 12,015,927 | B2 | 6/2024 | Montalvo et al. |
| 12,015,928 | B2 | 6/2024 | Montalvo |
| 12,047,783 | B1 | 7/2024 | Montalvo et al. |
| 12,101,641 | B2 | 9/2024 | Gronstad et al. |
| 12,143,941 | B1 | 11/2024 | Duong |
| 12,477,588 | B2 | 11/2025 | Jang et al. |
| 12,482,227 | B1 | 11/2025 | Saraee et al. |
| 2002/0072288 | A1 | 6/2002 | Hei et al. |
| 2002/0078174 | A1 | 6/2002 | Sim et al. |
| 2003/0040277 | A1 | 2/2003 | Deats |
| 2003/0072252 | A1 | 4/2003 | Gurney et al. |
| 2003/0072288 | A1 | 4/2003 | Kuffner et al. |
| 2003/0072445 | A1 | 4/2003 | Kuhlman et al. |
| 2003/0096586 | A1 | 5/2003 | Oates et al. |
| 2003/0194692 | A1 | 10/2003 | Purdum |
| 2003/0198200 | A1 | 10/2003 | Diener et al. |
| 2004/0028003 | A1 | 2/2004 | Diener et al. |
| 2004/0142696 | A1 | 7/2004 | Saunders et al. |
| 2005/0007272 | A1 | 1/2005 | Smith et al. |
| 2005/0025182 | A1 | 2/2005 | Nazari |
| 2005/0192727 | A1 | 9/2005 | Shostak et al. |
| 2006/0050660 | A1 | 3/2006 | Wells |
| 2006/0088081 | A1 | 4/2006 | Withington et al. |
| 2007/0069950 | A1 | 3/2007 | Smith et al. |
| 2007/0091998 | A1 | 4/2007 | Woo et al. |
| 2007/0153779 | A1 | 7/2007 | Thornton et al. |
| 2008/0045235 | A1 | 2/2008 | Kennedy et al. |
| 2008/0108365 | A1 | 5/2008 | Buddhikot et al. |
| 2008/0120264 | A1 | 5/2008 | Lee et al. |
| 2008/0180325 | A1 | 7/2008 | Chung et al. |
| 2008/0198948 | A1 * | 8/2008 | Tang .................... H04B 17/327<br>375/316 |
| 2008/0212725 | A1 | 9/2008 | Tang |
| 2008/0222021 | A1 | 9/2008 | Stanforth et al. |
| 2009/0003201 | A1 | 1/2009 | Horvitz |
| 2009/0047920 | A1 | 2/2009 | Livsics et al. |
| 2009/0113514 | A1 | 4/2009 | James |
| 2009/0196162 | A1 | 8/2009 | Sambhwani et al. |
| 2009/0254572 | A1 | 10/2009 | Redlich et al. |
| 2010/0069074 | A1 | 3/2010 | Kodialam et al. |
| 2010/0075704 | A1 | 3/2010 | McHenry et al. |
| 2010/0105332 | A1 | 4/2010 | McHenry et al. |

(56) References Cited

U.S. PATENT DOCUMENTS

2010/0125438 A1 5/2010 Audet
2010/0148940 A1 6/2010 Gelvin et al.
2010/0248638 A1 9/2010 Harada et al.
2010/0325621 A1 12/2010 Andrade et al.
2011/0026425 A1 2/2011 Picard
2011/0034122 A1 2/2011 Kennedy, Jr. et al.
2011/0038268 A1 2/2011 Ross et al.
2011/0090939 A1 4/2011 Diener et al.
2011/0098029 A1 4/2011 Rhoads et al.
2011/0149879 A1 6/2011 Noriega et al.
2011/0210843 A1 9/2011 Kummetz
2011/0217943 A1 9/2011 Ashworth et al.
2011/0222489 A1 9/2011 Awad
2012/0058790 A1 3/2012 Junell et al.
2012/0075989 A1 3/2012 Roessel et al.
2012/0083235 A1 4/2012 Gomez et al.
2012/0108179 A1 5/2012 Kasslin et al.
2012/0120887 A1 5/2012 Deaton et al.
2012/0203510 A1 8/2012 Perez et al.
2012/0281637 A1 11/2012 Junell
2013/0070605 A1 3/2013 Ghosh et al.
2013/0128041 A1 5/2013 Hershey et al.
2013/0136014 A1 5/2013 Lee et al.
2013/0142129 A1 6/2013 Rinne et al.
2013/0165134 A1 6/2013 Touag et al.
2013/0301544 A1 11/2013 Drucker
2013/0315112 A1 11/2013 Gormley et al.
2013/0322279 A1 12/2013 Chincholi et al.
2013/0331114 A1 12/2013 Gormley et al.
2014/0086072 A1 3/2014 Maaref et al.
2014/0162711 A1 6/2014 Miller et al.
2014/0171018 A1 6/2014 Elrefaey et al.
2014/0171136 A1 6/2014 Elrefaey et al.
2014/0181678 A1 6/2014 Louchheim et al.
2014/0185580 A1 7/2014 Fang et al.
2014/0204766 A1 7/2014 Immendorf et al.
2014/0206279 A1 7/2014 Immendorf et al.
2014/0206343 A1 7/2014 Immendorf et al.
2014/0237547 A1 8/2014 Bose
2014/0279820 A1 9/2014 MacPherson
2014/0301216 A1 10/2014 Immendorf et al.
2014/0302796 A1 10/2014 Gormley et al.
2014/0335879 A1 11/2014 Immendorf et al.
2014/0347213 A1 11/2014 Nguyen et al.
2014/0355428 A1 12/2014 Smith et al.
2015/0016429 A1 1/2015 Menon et al.
2015/0033305 A1 1/2015 Shear et al.
2015/0139048 A1 5/2015 Lou
2015/0171516 A1 6/2015 Chen et al.
2015/0173403 A1 6/2015 Nagayama et al.
2015/0189528 A1 7/2015 Carbajal
2015/0201420 A1 7/2015 Martone et al.
2015/0215794 A1 7/2015 Gormley et al.
2015/0215949 A1 7/2015 Gormley et al.
2015/0229434 A1 8/2015 Shawn
2015/0233998 A1 8/2015 Chen et al.
2015/0245374 A1 8/2015 Mitola et al.
2015/0289265 A1 10/2015 Gormley et al.
2015/0289268 A1 10/2015 Ohta et al.
2015/0296386 A1 10/2015 Menon et al.
2015/0296526 A1 10/2015 Behravan et al.
2015/0348341 A1 12/2015 Baxley et al.
2015/0350914 A1 12/2015 Baxley et al.
2015/0365956 A1 12/2015 Learned
2015/0373528 A1 12/2015 Iwai
2016/0014613 A1 1/2016 Ponnampalam et al.
2016/0050690 A1 2/2016 Yun et al.
2016/0095007 A1 3/2016 Tian et al.
2016/0127931 A1 5/2016 Baxley et al.
2016/0150415 A1 5/2016 Laneman et al.
2016/0211898 A1 7/2016 Cai
2016/0234116 A1 8/2016 Lee et al.
2016/0270089 A1 9/2016 Olfat et al.
2016/0286627 A1 9/2016 Chen et al.
2016/0359682 A1 12/2016 Senarath et al.
2016/0366685 A1 12/2016 Gormley et al.
2016/0381558 A1 12/2016 Caulfield
2017/0026205 A1 1/2017 Agee
2017/0026860 A1 1/2017 Fuller et al.
2017/0041802 A1 2/2017 Sun et al.
2017/0064564 A1 3/2017 Yun et al.
2017/0094621 A1 3/2017 Xu et al.
2017/0127414 A1* 5/2017 Yi ........................ H04W 72/23
2017/0148467 A1 5/2017 Franklin et al.
2017/0156149 A1 6/2017 Lin et al.
2017/0180062 A1 6/2017 Johansen
2017/0187450 A1 6/2017 Jalali
2017/0208476 A1 7/2017 Khambekar et al.
2017/0238201 A1 8/2017 Gormley et al.
2017/0238203 A1 8/2017 Dzierwa et al.
2017/0245280 A1 8/2017 Yi et al.
2017/0272186 A1 9/2017 Yang et al.
2017/0280411 A1 9/2017 Noonan
2017/0280507 A1 9/2017 Wang
2017/0310450 A1 10/2017 Galeev et al.
2017/0313426 A1 11/2017 Morin et al.
2017/0374572 A1 12/2017 Kleinbeck et al.
2017/0374573 A1 12/2017 Kleinbeck et al.
2018/0041905 A1 2/2018 Ashrafi
2018/0054490 A1 2/2018 Wadhwa et al.
2018/0069650 A1 3/2018 Tran et al.
2018/0070296 A1 3/2018 Srikanteswara et al.
2018/0070362 A1 3/2018 Ryan et al.
2018/0115652 A1 4/2018 Russell et al.
2018/0136325 A1 5/2018 Miller, II et al.
2018/0139629 A1 5/2018 Chakrabarti et al.
2018/0145741 A1 5/2018 Zhao et al.
2018/0165575 A1 6/2018 Henry et al.
2018/0167772 A1* 6/2018 Bennett ................ H04B 7/0413
2018/0191775 A1 7/2018 Watson
2018/0198948 A1 7/2018 Hiramoto
2018/0279137 A1 9/2018 Learned et al.
2018/0295607 A1 10/2018 Lindoff et al.
2018/0308013 A1 10/2018 O'Shea
2018/0316627 A1 11/2018 Cui et al.
2018/0324595 A1 11/2018 Shima
2018/0349795 A1 12/2018 Boyle et al.
2018/0352441 A1 12/2018 Zheng et al.
2018/0352473 A1 12/2018 Gunasekara et al.
2018/0376006 A1 12/2018 Russell et al.
2019/0020530 A1 1/2019 Au et al.
2019/0027134 A1 1/2019 Kakirwar et al.
2019/0037418 A1 1/2019 Gunasekara et al.
2019/0052294 A1 2/2019 Abdelmonem
2019/0052381 A1 2/2019 Abdelmonem
2019/0058242 A1 2/2019 Tabe
2019/0058999 A1 2/2019 Gunasekara et al.
2019/0081747 A1 3/2019 Barzegar et al.
2019/0115950 A1 4/2019 Kakinada et al.
2019/0129407 A1 5/2019 Cella et al.
2019/0140741 A1 5/2019 Cheng et al.
2019/0159176 A1 5/2019 Barton et al.
2019/0174506 A1 6/2019 Willis, III et al.
2019/0182122 A1 6/2019 Kushnir
2019/0190693 A1 6/2019 Wetzker et al.
2019/0199756 A1 6/2019 Correnti et al.
2019/0213099 A1 7/2019 Schmidt et al.
2019/0223025 A1 7/2019 Kakinada et al.
2019/0258953 A1 8/2019 Lang et al.
2019/0274112 A1 9/2019 Kleinbeck et al.
2019/0306057 A1 10/2019 Barzegar et al.
2019/0327006 A1 10/2019 Mody et al.
2019/0332073 A1 10/2019 Nasle
2019/0339688 A1 11/2019 Cella et al.
2019/0342202 A1 11/2019 Ryan et al.
2019/0342783 A1 11/2019 Kim et al.
2019/0344433 A1 11/2019 Lerner
2019/0356433 A1 11/2019 Lee et al.
2019/0364433 A1 11/2019 Das
2019/0364565 A1 11/2019 Hmimy et al.
2019/0372902 A1 12/2019 Piersol
2019/0385373 A1 12/2019 Mittleman et al.
2020/0007249 A1 1/2020 Derr et al.
2020/0007823 A1 1/2020 Ophir et al.

(56) References Cited

U.S. PATENT DOCUMENTS

| | | | |
|---|---|---|---|
| 2020/0021323 | A1 | 1/2020 | Cyzs et al. |
| 2020/0036459 | A1 | 1/2020 | Menon |
| 2020/0036487 | A1 | 1/2020 | Hammond et al. |
| 2020/0059800 | A1 | 2/2020 | Menon et al. |
| 2020/0066132 | A1 | 2/2020 | Kleinbeck |
| 2020/0068573 | A1 | 2/2020 | Drozd et al. |
| 2020/0081484 | A1 | 3/2020 | Lee et al. |
| 2020/0092888 | A1 | 3/2020 | Zhang |
| 2020/0125956 | A1 | 4/2020 | Ravi et al. |
| 2020/0142022 | A1 | 5/2020 | Baxley et al. |
| 2020/0143279 | A1 | 5/2020 | West et al. |
| 2020/0145032 | A1 | 5/2020 | Ayala et al. |
| 2020/0145842 | A1 | 5/2020 | O'Shea et al. |
| 2020/0145852 | A1 | 5/2020 | Ayala et al. |
| 2020/0151554 | A1 | 5/2020 | Siraj et al. |
| 2020/0153467 | A1 | 5/2020 | Ayala et al. |
| 2020/0153535 | A1 | 5/2020 | Kankanamge et al. |
| 2020/0162967 | A1 | 5/2020 | Zollner |
| 2020/0177590 | A1 | 6/2020 | Levy et al. |
| 2020/0183429 | A1 | 6/2020 | Ottenheimer |
| 2020/0186265 | A1 | 6/2020 | Yun |
| 2020/0187213 | A1 | 6/2020 | Yun et al. |
| 2020/0196270 | A1 | 6/2020 | Kleinbeck et al. |
| 2020/0213006 | A1 | 7/2020 | Graham et al. |
| 2020/0215695 | A1 | 7/2020 | Cristache |
| 2020/0217882 | A1 | 7/2020 | Lee et al. |
| 2020/0220351 | A1 | 7/2020 | Meagher et al. |
| 2020/0236690 | A1 | 7/2020 | Mitola et al. |
| 2020/0242922 | A1 | 7/2020 | Dulberg et al. |
| 2020/0244813 | A1 | 7/2020 | Russell et al. |
| 2020/0266887 | A1 | 8/2020 | Rudolph |
| 2020/0274629 | A1 | 8/2020 | Wilson |
| 2020/0285855 | A1 | 9/2020 | Brebner |
| 2020/0285891 | A1 | 9/2020 | Yellin et al. |
| 2020/0285996 | A1 | 9/2020 | Janakiraman et al. |
| 2020/0311666 | A1 | 10/2020 | Gray et al. |
| 2020/0312103 | A1 | 10/2020 | Noll et al. |
| 2020/0322662 | A1 | 10/2020 | Korte et al. |
| 2020/0322703 | A1 | 10/2020 | Bures et al. |
| 2020/0326362 | A1 | 10/2020 | Guddeti et al. |
| 2020/0329382 | A1 | 10/2020 | Sahoo et al. |
| 2020/0336228 | A1 | 10/2020 | Ryan et al. |
| 2020/0344619 | A1 | 10/2020 | Gormley et al. |
| 2020/0377128 | A1 | 12/2020 | Marczuk et al. |
| 2020/0412749 | A1 | 12/2020 | Rollet |
| 2021/0037540 | A1 | 2/2021 | Tsuchiya et al. |
| 2021/0042830 | A1 | 2/2021 | Burke |
| 2021/0045127 | A1 | 2/2021 | Yun et al. |
| 2021/0056347 | A1 | 2/2021 | Sbodio et al. |
| 2021/0058146 | A1 | 2/2021 | Eichen |
| 2021/0067412 | A1 | 3/2021 | Horne et al. |
| 2021/0076223 | A1 | 3/2021 | Taneja et al. |
| 2021/0110261 | A1 | 4/2021 | Lee et al. |
| 2021/0119848 | A1 | 4/2021 | Casas et al. |
| 2021/0127284 | A1 | 4/2021 | Abdelmonem et al. |
| 2021/0133607 | A1 | 5/2021 | Stubbs et al. |
| 2021/0135703 | A1 | 5/2021 | Martone et al. |
| 2021/0143883 | A1 | 5/2021 | Yerramalli et al. |
| 2021/0152283 | A1 | 5/2021 | Lo et al. |
| 2021/0153030 | A1 | 5/2021 | Woods et al. |
| 2021/0182283 | A1 | 6/2021 | Carney et al. |
| 2021/0194912 | A1 | 6/2021 | Ward et al. |
| 2021/0203576 | A1 | 7/2021 | Padfield et al. |
| 2021/0209105 | A1 | 7/2021 | Kussmaul et al. |
| 2021/0211208 | A1 | 7/2021 | Wali |
| 2021/0234769 | A1 | 7/2021 | Ganapathi et al. |
| 2021/0235287 | A1 | 7/2021 | Ronen et al. |
| 2021/0250790 | A1 | 8/2021 | Seeber |
| 2021/0255638 | A1 | 8/2021 | Ma et al. |
| 2021/0264021 | A1 | 8/2021 | Kandel et al. |
| 2021/0264321 | A1 | 8/2021 | Xiang |
| 2021/0266907 | A1 | 8/2021 | Cui et al. |
| 2021/0274352 | A1 | 9/2021 | Vitebsky |
| 2021/0275050 | A1 | 9/2021 | Ren et al. |
| 2021/0286338 | A1 | 9/2021 | Karako et al. |
| 2021/0288731 | A1 | 9/2021 | Yun et al. |
| 2021/0305808 | A1 | 9/2021 | Doynov et al. |
| 2021/0312276 | A1 | 10/2021 | Rawat et al. |
| 2021/0314081 | A1 | 10/2021 | Shattil et al. |
| 2021/0326695 | A1 | 10/2021 | Vitebsky et al. |
| 2021/0334705 | A1 | 10/2021 | Akbar et al. |
| 2021/0335505 | A1 | 10/2021 | Tedaldi et al. |
| 2021/0344399 | A1 | 11/2021 | Levy et al. |
| 2021/0360390 | A1 | 11/2021 | Chun |
| 2021/0378054 | A1 | 12/2021 | Belur Ramachandra et al. |
| 2021/0390329 | A1 | 12/2021 | Ren et al. |
| 2021/0392504 | A1 | 12/2021 | Montalvo et al. |
| 2021/0405173 | A1 | 12/2021 | Elias et al. |
| 2021/0407526 | A1 | 12/2021 | Xiao |
| 2021/0409549 | A1 | 12/2021 | Russell et al. |
| 2021/0409959 | A1 | 12/2021 | Montalvo et al. |
| 2021/0409960 | A1 | 12/2021 | Montalvo et al. |
| 2022/0007197 | A1 | 1/2022 | Montalvo et al. |
| 2022/0021469 | A1 | 1/2022 | Veijalainen et al. |
| 2022/0022045 | A1 | 1/2022 | Montalvo |
| 2022/0053338 | A1 | 2/2022 | Nekoui et al. |
| 2022/0053388 | A1 | 2/2022 | Kim et al. |
| 2022/0058879 | A1 | 2/2022 | Rohan |
| 2022/0078622 | A1 | 3/2022 | Montalvo |
| 2022/0078637 | A1 | 3/2022 | Tullberg et al. |
| 2022/0109612 | A1 | 4/2022 | Bush et al. |
| 2022/0128611 | A1 | 4/2022 | Almog et al. |
| 2022/0141821 | A1 | 5/2022 | D'Oro et al. |
| 2022/0174499 | A1 | 6/2022 | Montalvo et al. |
| 2022/0191704 | A1 | 6/2022 | Montalvo et al. |
| 2022/0201495 | A1 | 6/2022 | Montalvo |
| 2022/0201496 | A1 | 6/2022 | Montalvo et al. |
| 2022/0206447 | A1 | 6/2022 | Osborn et al. |
| 2022/0210659 | A1 | 6/2022 | Montalvo et al. |
| 2022/0232423 | A1 | 7/2022 | Thyagaturu et al. |
| 2022/0253841 | A1 | 8/2022 | Lee |
| 2022/0256518 | A1 | 8/2022 | Hou et al. |
| 2022/0276618 | A1 | 9/2022 | Aroskar et al. |
| 2022/0278728 | A1 | 9/2022 | Vankayala et al. |
| 2022/0286153 | A1 | 9/2022 | Fleischer et al. |
| 2022/0303167 | A1 | 9/2022 | Wang et al. |
| 2022/0332348 | A1 | 10/2022 | Liu et al. |
| 2022/0369115 | A1 | 11/2022 | Mennes et al. |
| 2022/0371705 | A1 | 11/2022 | Poikonen et al. |
| 2022/0377610 | A1 | 11/2022 | Garcia et al. |
| 2022/0392340 | A1 | 12/2022 | De Steuben et al. |
| 2022/0394213 | A1 | 12/2022 | De Steuben et al. |
| 2022/0412804 | A1 | 12/2022 | Kar et al. |
| 2023/0003005 | A1 | 1/2023 | Verma et al. |
| 2023/0004826 | A1 | 1/2023 | Schuff et al. |
| 2023/0035635 | A1 | 2/2023 | Levine |
| 2023/0037701 | A1 | 2/2023 | Pinheiro et al. |
| 2023/0050882 | A1 | 2/2023 | Shalai et al. |
| 2023/0084157 | A1 | 3/2023 | Montalvo |
| 2023/0084904 | A1 | 3/2023 | Montalvo et al. |
| 2023/0086476 | A1 | 3/2023 | Montalvo |
| 2023/0087729 | A1 | 3/2023 | Goldstein et al. |
| 2023/0088208 | A1 | 3/2023 | Sun et al. |
| 2023/0090727 | A1 | 3/2023 | Yun et al. |
| 2023/0101810 | A1 | 3/2023 | Mummadi et al. |
| 2023/0110731 | A1 | 4/2023 | Montalvo et al. |
| 2023/0118290 | A1 | 4/2023 | Montalvo et al. |
| 2023/0119145 | A1 | 4/2023 | Montalvo et al. |
| 2023/0121345 | A1 | 4/2023 | Montalvo et al. |
| 2023/0123122 | A1 | 4/2023 | Montalvo et al. |
| 2023/0124382 | A1 | 4/2023 | Montalvo et al. |
| 2023/0124491 | A1 | 4/2023 | Montalvo et al. |
| 2023/0124883 | A1 | 4/2023 | Montalvo |
| 2023/0128069 | A1 | 4/2023 | Alabbasi et al. |
| 2023/0141111 | A1 | 5/2023 | Ciochina et al. |
| 2023/0156681 | A1 | 5/2023 | Tooher et al. |
| 2023/0156826 | A1 | 5/2023 | Palermo et al. |
| 2023/0176669 | A1 | 6/2023 | Gupta et al. |
| 2023/0179311 | A1 | 6/2023 | Martin et al. |
| 2023/0180014 | A1 | 6/2023 | Storn |
| 2023/0189314 | A1 | 6/2023 | Huang et al. |
| 2023/0189315 | A1 * | 6/2023 | Haustein ............... H04W 24/02 370/252 |
| 2023/0189382 | A1 | 6/2023 | Haustein et al. |

(56) References Cited

U.S. PATENT DOCUMENTS

2023/0209578 A1 6/2023 Chakraborty et al.
2023/0209584 A1 6/2023 Rahman et al.
2023/0211493 A1 7/2023 Cristache
2023/0217466 A1 7/2023 Zhao
2023/0232210 A1 7/2023 Velazquez et al.
2023/0246724 A1 8/2023 Pateromichelakis et al.
2023/0246791 A1 8/2023 Peng et al.
2023/0254103 A1 8/2023 Balasubramanian et al.
2023/0254204 A1 8/2023 Mansfield
2023/0259787 A1 8/2023 David
2023/0262470 A1 8/2023 Montalvo et al.
2023/0269593 A1 8/2023 Montalvo et al.
2023/0273291 A1 8/2023 Ozturk et al.
2023/0273600 A1 8/2023 Cella et al.
2023/0276244 A1 8/2023 Montalvo et al.
2023/0276246 A1 8/2023 Montalvo et al.
2023/0276418 A1 8/2023 Bacon
2023/0284031 A1 9/2023 Montalvo
2023/0284048 A1 9/2023 O'Shea et al.
2023/0300625 A1 9/2023 Montalvo et al.
2023/0305895 A1 9/2023 Doostnejad et al.
2023/0308884 A1 9/2023 Montalvo et al.
2023/0318932 A1 10/2023 Ferzli et al.
2023/0319862 A1 10/2023 Wu et al.
2023/0324512 A1 10/2023 Christoffers
2023/0328547 A1 10/2023 Agerstam et al.
2023/0334366 A1 10/2023 Jeffery et al.
2023/0337118 A1 10/2023 Jia
2023/0354043 A1 11/2023 Montalvo
2023/0373528 A1 11/2023 Holmqvist et al.
2023/0379723 A1 11/2023 Vuppala et al.
2023/0385347 A1 11/2023 Leveau et al.
2023/0388809 A1 11/2023 Aygul et al.
2023/0400551 A1 12/2023 Parker et al.
2023/0418287 A1 12/2023 Cristache
2023/0421253 A1 12/2023 Palermo et al.
2024/0012110 A1 1/2024 Emadi et al.
2024/0014831 A1 1/2024 Parker et al.
2024/0014832 A1 1/2024 Aikawa et al.
2024/0015518 A1 1/2024 Montalvo
2024/0015776 A1 1/2024 Gandhi et al.
2024/0022912 A1 1/2024 Montalvo et al.
2024/0022927 A1 1/2024 Tong et al.
2024/0031818 A1 1/2024 Montalvo et al.
2024/0032084 A1 1/2024 Hellwig
2024/0040387 A1 2/2024 Montalvo et al.
2024/0048994 A1 2/2024 Montalvo
2024/0056827 A1 2/2024 Elazzouni et al.
2024/0056836 A1 2/2024 Kovács et al.
2024/0098508 A1 3/2024 Kaliaperumal
2024/0103056 A1 3/2024 Naseef
2024/0107322 A1 3/2024 Montalvo
2024/0121619 A1 4/2024 Montalvo et al.
2024/0129194 A1 4/2024 Mueck
2024/0129202 A1 4/2024 Nukushina et al.
2024/0146808 A1 5/2024 Oshetski et al.
2024/0147248 A1 5/2024 Montalvo et al.
2024/0147262 A1 5/2024 Um et al.
2024/0147362 A1 5/2024 Thyagarajan et al.
2024/0155357 A1 5/2024 Montalvo
2024/0160978 A1 5/2024 Lau et al.
2024/0163655 A1 5/2024 Cristache
2024/0167236 A1 5/2024 Cristache
2024/0179535 A1 5/2024 Montalvo et al.
2024/0179742 A1 5/2024 Kim et al.
2024/0187866 A1 6/2024 Montalvo et al.
2024/0192563 A1 6/2024 Hur et al.
2024/0214823 A1 6/2024 Montalvo
2024/0220249 A1 7/2024 Chen et al.
2024/0221186 A1 7/2024 John Wilson et al.
2024/0224054 A1 7/2024 Montalvo et al.
2024/0224055 A1 7/2024 Montalvo et al.
2024/0224056 A1 7/2024 Montalvo et al.
2024/0233367 A1 7/2024 Motayed et al.
2024/0243768 A1 7/2024 Velazquez et al.
2024/0243838 A1 7/2024 Farhadi et al.
2024/0244444 A1 7/2024 Montalvo
2024/0249170 A1 7/2024 Guzik et al.
2024/0267742 A1 8/2024 Montalvo et al.
2024/0284188 A1 8/2024 Montalvo et al.
2024/0298185 A1 9/2024 Montalvo et al.
2024/0298186 A1 9/2024 Montalvo
2024/0305895 A1 9/2024 Iijima et al.
2024/0314290 A1 9/2024 Gonzalez Aguirre et al.
2024/0323657 A1 9/2024 Yang et al.
2024/0323906 A1 9/2024 Bhorkar et al.
2024/0334209 A1 10/2024 Uvaydov et al.
2024/0349064 A1 10/2024 Montalvo et al.
2024/0357369 A1 10/2024 Montalvo
2024/0362502 A1 10/2024 Tsai et al.
2024/0364598 A1 10/2024 Ganesan et al.
2024/0365129 A1 10/2024 Montalvo et al.
2024/0373236 A1 11/2024 Montalvo et al.
2024/0381100 A1 11/2024 Montalvo
2024/0381104 A1 11/2024 Montalvo
2024/0381105 A1 11/2024 Montalvo
2024/0381106 A1 11/2024 Montalvo et al.
2024/0381109 A1 11/2024 Naik et al.
2024/0388810 A1 11/2024 Henley et al.
2024/0388920 A1 11/2024 Montalvo
2024/0388921 A1 11/2024 Montalvo
2024/0388922 A1 11/2024 Montalvo
2024/0397327 A1 11/2024 Montalvo
2024/0397328 A1 11/2024 Montalvo
2024/0397333 A1 11/2024 Montalvo
2024/0406742 A1 12/2024 Montalvo
2024/0414549 A1 12/2024 Montalvo
2024/0414552 A1 12/2024 Montalvo
2024/0422557 A1 12/2024 Montalvo et al.
2024/0422560 A1 12/2024 Montalvo
2025/0007686 A1 1/2025 Andrews et al.
2025/0024267 A1 1/2025 Montalvo
2025/0039153 A1 1/2025 Andrews et al.
2025/0055768 A1 2/2025 Groff
2025/0056238 A1 2/2025 Montalvo et al.
2025/0139662 A1 5/2025 Sueda
2025/0184231 A1* 6/2025 Park ........................ H04L 41/16
2025/0203380 A1 6/2025 Montalvo
2025/0293942 A1 9/2025 Li et al.
2025/0331053 A1 10/2025 Wei et al.

FOREIGN PATENT DOCUMENTS

WO 2015084959 A1 6/2015
WO 2015153225 A1 10/2015
WO 2018184682 A1 10/2018
WO 2018204917 A1 11/2018
WO 2020079678 A1 4/2020

OTHER PUBLICATIONS

"IEEE Standard for Definitions and Concepts for Dynamic Spectrum Access: Terminology Relating to Emerging Wireless Networks, System Functionality, and Spectrum Management—Redline," in IEEE Std 1900.Jan. 2019 (Revision of IEEE Std 1900.1-2008)—Redline , vol., No., pp. 1-144, Apr. 23, 2019.
International Search Report and Written Opinion dated Jul. 27, 2021 issued by the International Application Division, Korean Intellectual Property Office as International Searching Authority in connection with International Application No. PCT/US2021/027911 (9 pages).
R. Roy and T. Kailath, "ESPRIT—estimation of signal parameters via rotational invariance techniques," in IEEE Transactions on Acoustics, Speech, and Signal Processing, vol. 37, No. 7, pp. 984-995, Jul. 1989, doi: 10.1109/29.32276.
S. Dorner, S. Cammerer, J. Hoydis and S. t. Brink, "Deep Learning Based Communication Over the Air," in IEEE Journal of Selected Topics in Signal Processing, vol. 12, No. 1, pp. 132-143, Feb. 2018, doi: 10.1109/JSTSP.2017.2784180.

(56) References Cited

OTHER PUBLICATIONS

T. J. O'Shea, K. Karra and T. C. Clancy, "Learning to communicate: Channel auto-encoders, domain specific regularizers, and attention," 2016 IEEE International Symposium on Signal Processing and Information Technology (ISSPIT), Limassol, Cyprus, 2016, pp. 223-228, doi: 10.1109/ISSPIT.2016.7886039.

T. O'Shea and J. Hoydis, "An Introduction to Deep Learning for the Physical Layer," in IEEE Transactions on Cognitive Communications and Networking, vol. 3, No. 4, pp. 563-575, Dec. 2017, doi: 10.1109/TCCN.2017.2758370.

* cited by examiner

Where $V=\begin{bmatrix} s_1, BW_1, CF_1, bin_{start}\ FFT_1, bin_{stop}\ FFT_1 \\ \vdots \\ s_R, BW_R, CF_R, bin_{start}\ FFT_R, bin_{stop}\ FFT_R \end{bmatrix}$ Carrier 1

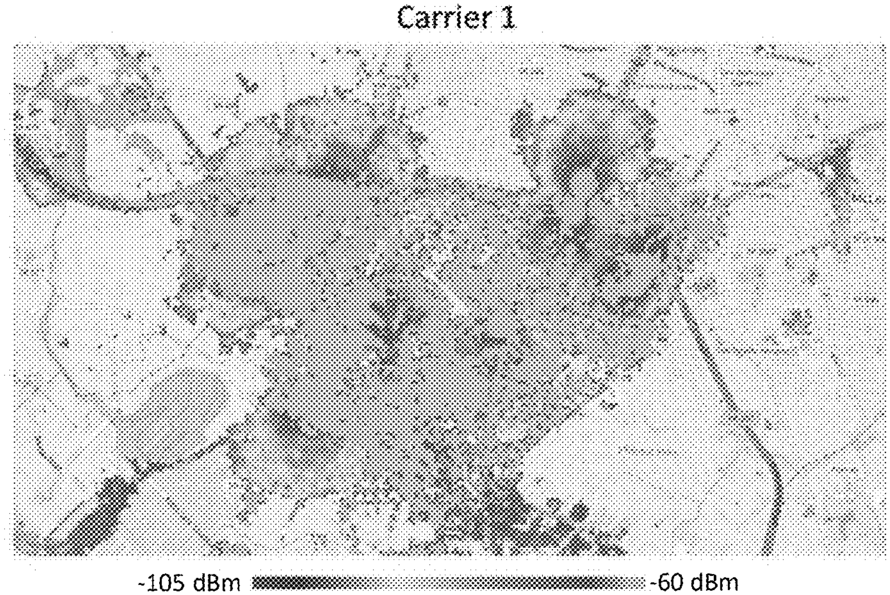

Carrier 2

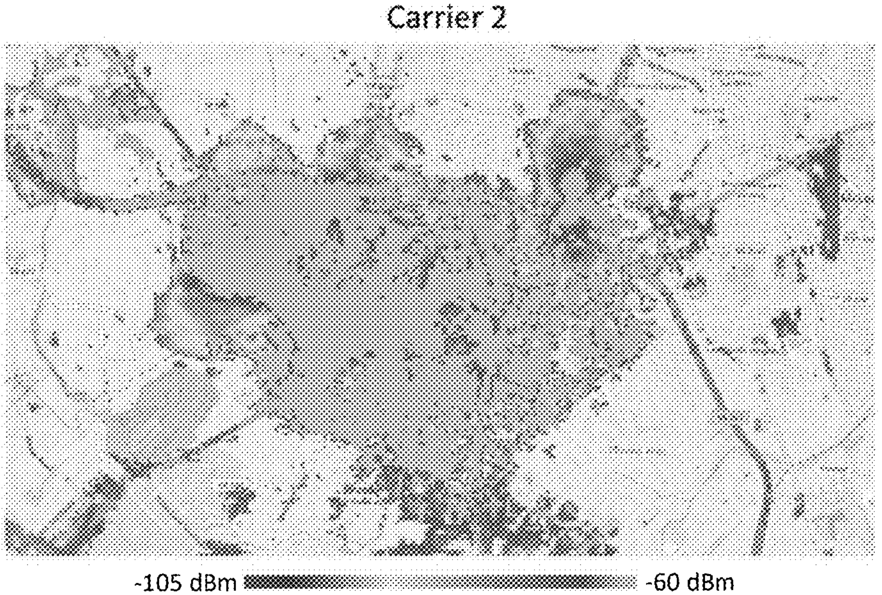

| **Sector coverage performance** | **C1** | **C2** |
|---|---|---|
| Number of sectors | 15 | 20 |
| Average area served by sector, sq-km | 1.42 | 1.06 |
| Min sector serving area, sq-km | 0.41 | 0.24 |
| Max sector serving area, sq-km | 3.5 | 2.94 |
| Average % of served area served by single sector | 6.67 | 5 |

| **Sector traffic performance** | **C1** | **C2** |
|---|---|---|
| Average traffic served by sector, Erl | 6.41 | 4.89 |
| Min traffic served by single sector, Erl | 0.62 | 0.85 |
| Max traffic served by single sector, Erl | 21.04 | 17.95 |
| Average % of traffic served by single sector | 6.67 | 5 |
| Average sector load, % | 10.51 | 8.02 |

FIG. 44

| Interference | C1 | C2 |
|---|---|---|
| Area where C/I < 3dB, sq-km | 1.9 | 5.34 |
| % of served area where C/I < 3dB | 11.86 | 33.37 |
| % of traffic with C/I < 3dB | 11.96 | 29.89 |

Choose $prob_{min}$, $\alpha_{ch}$, and $\alpha_{bin}$.
Determine $k_0$ given n, $\alpha_{ch}$, and $\alpha_{bin}$.
Determine $\beta_{ch}$ $prob = (1 - \alpha_{ch})(1 - \beta_{ch}) \rightarrow \beta_{ch} = 1 - \frac{prob}{(1 - \alpha_{ch})}$
Determine $\beta_{bin}$ given $k_0$, n, and $\beta_{ch}$.

| Channel Index | Count of Scenario AL F.. | Bins Above |
|---|---|---|
| Null | 409.0 | |
| 0 | 16.0 | 2.0 |
| 1 | 47.0 | 25.0 |
| 2 | 50.0 | 9.0 |
| 3 | 201.0 | 60.0 |
| 4 | 301.0 | 214.0 |
| 5 | 8.0 | 10 |
| 6 | 24.0 | 2.0 |
| 7 | 25.0 | 2.0 |
| 8 | 101.0 | 64.0 |
| 9 | 151.0 | 12.0 |
| 10 | 8.0 | 1.0 |
| 11 | 24.0 | 0.0 |
| 12 | 25.0 | 0.0 |
| 13 | 101.0 | 0.0 |
| 14 | 151.0 | 4.0 |

Spectral Correlation Density (SCD) using Machine Learning Image Comparison

SYSTEM, METHOD, AND APPARATUS FOR PROVIDING DYNAMIC, PRIORITIZED SPECTRUM MANAGEMENT AND UTILIZATION

CROSS REFERENCES TO RELATED APPLICATIONS

This application is related to and claims priority from the following U.S. patents and patent applications. This application is a continuation of U.S. patent application Ser. No. 19/066,885, filed Feb. 28, 2025, which is a continuation of U.S. patent application Ser. No. 18/810,105, filed Aug. 20, 2024, which is a continuation of U.S. patent application Ser. No. 18/778,357, filed Jul. 19, 2024, which is a continuation-in-part of U.S. patent application Ser. No. 18/591,848, filed Feb. 29, 2024, which is a continuation-in-part of U.S. patent application Ser. No. 18/511,527, filed Nov. 16, 2023, which is a continuation of U.S. patent application Ser. No. 18/137,765, filed Apr. 21, 2023, which is a continuation of U.S. patent application Ser. No. 17/985,570, filed Nov. 11, 2022, which is a continuation-in-part of U.S. patent application Ser. No. 17/691,683, filed Mar. 10, 2022, which is a continuation of U.S. patent application Ser. No. 17/470,253, filed Sep. 9, 2021, which is a continuation of U.S. application Ser. No. 17/085,635, filed Oct. 30, 2020, which claims the benefit of U.S. Provisional Application No. 63/018,929, filed May 1, 2020. Each of the above listed applications is incorporated herein by reference in its entirety.

BACKGROUND OF THE INVENTION

1. Field of the Invention

The present invention relates to spectrum analysis and management for electromagnetic signals, and more particularly for providing dynamic, prioritized spectrum utilization management.

2. Description of the Prior Art

It is generally known in the prior art to provide wireless communications spectrum management for detecting devices and for managing the space. Spectrum management includes the process of regulating the use of radio frequencies to promote efficient use and gain net social benefit. A problem faced in effective spectrum management is the various numbers of devices emanating wireless signal propagations at different frequencies and across different technological standards. Coupled with the different regulations relating to spectrum usage around the globe effective spectrum management becomes difficult to obtain and at best can only be reached over a long period of time.

Another problem facing effective spectrum management is the growing need from spectrum despite the finite amount of spectrum available. Wireless technologies and applications or services that require spectrum have exponentially grown in recent years. Consequently, available spectrum has become a valuable resource that must be efficiently utilized. Therefore, systems and methods are needed to effectively manage and optimize the available spectrum that is being used.

Prior art patent documents include the following:

U.S. Patent Publication No. 2018/0352441 for Devices, methods, and systems with dynamic spectrum sharing by inventors Zheng, et al., filed Jun. 4, 2018 and published Dec. 6, 2018, is directed to devices, methods, and systems with dynamic spectrum sharing. A wireless communication device includes a software-defined radio, a spectrum sensing sub-system, a memory, and an electronic processor. The software-defined radio is configured to generate an input signal, and wirelessly communicate with one or more radio nodes using a traffic data channel and a broadcast control channel. The spectrum sensing sub-system is configured to sense local spectrum information from the input signal. The electronic processor is communicatively connected to the memory and the spectrum sensing sub-system and is configured to receive the local spectrum information from the spectrum sensing sub-system, receive spectrum information from the one or more radio nodes, and allocate resources for the traffic data channel based on the local spectrum information and the spectrum information that is received from the one or more radio nodes.

U.S. Patent Publication No. 2018/0295607 for Method and apparatus for adaptive bandwidth usage in a wireless communication network by inventors Lindoff, et al., filed Oct. 10, 2017 and published Oct. 11, 2018, is directed to reconfiguration of a receiver bandwidth of the wireless device is initiated to match the second scheduling bandwidth, wherein the second scheduling bandwidth is larger than a first scheduling bandwidth currently associated with the wireless device, and wherein the first and second scheduling bandwidths respectively define the bandwidth used for scheduling transmissions to the wireless device.

U.S. Pat. No. 9,538,528 for Efficient co-existence method for dynamic spectrum sharing by inventors Wagner, et al., filed Oct. 6, 2011 and issued Jan. 3, 2017, is directed to an apparatus that defines a set of resources out of a first number of orthogonal radio resources and controls a transmitting means to simultaneously transmit a respective first radio signal for each resource on all resources of the set. A respective estimated interference is estimated on each of the resources of the set when the respective first radio signals are transmitted simultaneously. A first resource of the set is selected if the estimated interference on the first resource exceeds a first predefined level and, in the set, the first resource is replaced by a second resource of the first number of resources not having been part of the set. Each of the controlling and the estimating, the selecting, and the replacing is performed in order, respectively, for a predefined time.

U.S. Pat. No. 8,972,311 for Intelligent spectrum allocation based on user behavior patterns by inventors Srikanteswara, et al., filed Jun. 26, 2012 and issued Mar. 3, 2015, is directed to a platform to facilitate transferring spectrum rights is provided that includes a database to ascertain information regarding available spectrum for use in wireless communications. A request for spectrum use from an entity needing spectrum may be matched with available spectrum. This matching comprises determining a pattern in user requests overtime to optimize spectrum allocation. The Cloud Spectrum Services (CSS) process allows entities to access spectrum they would otherwise not have; it allows the end user to complete their download during congested periods while maintaining high service quality; and it allows the holder of rental spectrum to receive compensation for an otherwise idle asset.

U.S. Pat. No. 10,536,210 for Interference suppressing method and device in dynamic frequency spectrum access system by inventors Zhao, et al., filed Apr. 14, 2016 and issued Jan. 14, 2020, is directed to an interference suppressing method and device in a dynamic frequency spectrum access (DSA) system. The system includes: a frequency spectrum management device, a primary system including a plurality of primary devices, and a secondary system including a plurality of secondary devices. The method includes: transmitting position information of each of the secondary devices to the frequency spectrum management device; determining, by the frequency spectrum management device, a weight factor for a specific secondary device according to the received position formation; and performing a second-stage precoding, and in the second-stage precoding, adjusting, by using the weight factor, an estimated power of the specific secondary device leaking to the other secondary device.

U.S. Pat. No. 10,582,401 for Large scale radio frequency signal information processing and analysis system by inventors Mengwasser, et al., filed Apr. 15, 2019 and issued Mar. 3, 2020, is directed to a large-scale radio frequency signal information processing and analysis system that provides advanced signal analysis for telecommunication applications, including band capacity and geographical density determinations and detection, classification, identification, and geolocation of signals across a wide range of frequencies and across broad geographical areas. The system may utilize a range of novel algorithms for bin-wise processing, Rayleigh distribution analysis, telecommunication signal classification, receiver anomaly detection, transmitter density estimation, transmitter detection and location, geolocation analysis, telecommunication activity estimation, telecommunication utilization estimation, frequency utilization estimation, and data interpolation.

U.S. Pat. No. 10,070,444 for Coordinated spectrum allocation and de-allocation to minimize spectrum fragmentation in a cognitive radio network by inventors Markwart, et al., filed Dec. 2, 2011 and issued Sep. 4, 2018, is directed to an apparatus and a method by which a fragmentation probability is determined which indicates a probability of fragmentation of frequency resources in at least one network section for at least one network operating entity. Moreover, an apparatus and a method by which frequency resources in at least one network section are allocated and/or de-allocated, priorities of frequency resources are defined for at least one network operating entity individually, and allocating and/or de-allocating of the frequency resources for the at least one network operating entity is performed based on the priorities. For allocating and/or de-allocating of the frequency resources, also the fragmentation probability may be taken into account.

U.S. Patent Publication No. 2020/0007249 for Wireless signal monitoring and analysis, and related methods, systems, and devices by inventors Derr, et al., filed Sep. 12, 2019 and published Jan. 2, 2020, is directed to wireless signal classifiers and systems that incorporate the same may include an energy-based detector configured to analyze an entire set of measurements and generate a first single classification result, a cyclostationary-based detector configured to analyze less than the entire set of measurements and generate a second signal classification result; and a classification merger configured to merge the first signal classification result and the second signal classification result. Ensemble wireless signal classification and systems and devices the incorporate the same are disclosed. Some ensemble wireless signal classification may include energy-based classification processes and machine learning-based classification processes. Incremental machine learning techniques may be incorporated to add new machine learning-based classifiers to a system or update existing machine learning-based classifiers.

U.S. Patent Publication No. 2018/0324595 for Spectral sensing and allocation using deep machine learning by inventor Shima, filed May 7, 2018 and published Nov. 8, 2018, is directed to methods and systems for identifying occupied areas of a radio frequency (RF) spectrum, identifying areas within that RF spectrum that are unusable for further transmissions, and identifying areas within that RF spectrum that are occupied but that may nonetheless be available for additional RF transmissions are provided. Implementation of the method then systems can include the use of multiple deep neural networks (DNNs), such as convolutional neural networks (CNN's), that are provided with inputs in the form of RF spectrograms. Embodiments of the present disclosure can be applied to cognitive radios or other configurable communication devices, including but not limited to multiple inputs multiple output (MIMO) devices and 5G communication system devices.

U.S. Patent Publication No. 2017/0041802 for Spectrum resource management device and method by inventors Sun, et al., filed May 27, 2015 and published Feb. 9, 2017, is directed to a spectrum resource management device: determines available spectrum resources of a target communication system, so that aggregation interference caused by the target communication system and a communication system with a low right against a communication system with a high right in a management area does not exceed an interference threshold of the communication system with a high right; reduces available spectrum resources of the communication system with a low right, so that the interference caused by the communication system with a low right against the target communication system does not exceed an interference threshold of the target communication system; and updates the available spectrum resources of the target communication system according to the reduced available spectrum resources of the communication system with a low right, so that the aggregation interference does not exceed the interference threshold of the communication system with a high right.

U.S. Pat. No. 9,900,899 for Dynamic spectrum allocation method and dynamic spectrum allocation device by inventors Jiang, et al., filed Mar. 26, 2014 and issued Feb. 20, 2018, is directed to a dynamic spectrum allocation method and a dynamic spectrum allocation device. In the method, a centralized node performs spectrum allocation and transmits a spectrum allocation result to each communication node, so that the communication node operates at a corresponding spectrum resource in accordance with the spectrum allocation result and performs statistics of communication quality measurement information. The centralized node receives the communication quality measurement information reported by the communication node, and determines whether or not it is required to trigger the spectrum re-allocation for the communication node in accordance with the communication quality measurement information about the communication node. When it is required to trigger the spectrum re-allocation, the centralized node re-allocates the spectrum for the communication node.

U.S. Pat. No. 9,578,516 for Radio system and spectrum resource reconfiguration method thereof by inventors Liu, et al., filed Feb. 7, 2013 and issued Feb. 21, 2017, is directed to a radio system and a spectrum resource reconfiguration method thereof. The method comprises: a Reconfigurable Base Station (RBS) divides subordinate nodes into groups according to attributes of the subordinate nodes, and sends a reconfiguration command to a subordinate node in a designated group, and the RBS and the subordinate node execute reconfiguration of spectrum resources according to the reconfiguration command; or, the RBS executes reconfiguration of spectrum resources according to the reconfiguration command; and a subordinate User Equipment (UE)

accessing to a reconfigured RBS after interruption. The reconfiguration of spectrum resources of a cognitive radio system can be realized.

U.S. Pat. No. 9,408,210 for Method, device and system for dynamic frequency spectrum optimization by inventors Pikhletsky, et al., filed Feb. 25, 2014 and issued Aug. 2, 2016, is directed to a method, a device and a system for dynamic frequency spectrum optimization. The method includes: predicting a traffic distribution of terminal(s) in each cell of multiple cells; generating multiple frequency spectrum allocation schemes for the multiple cells according to the traffic distribution of the terminal(s) in each cell, wherein each frequency spectrum allocation scheme comprises frequency spectrum(s) allocated for each cell; selecting a frequency spectrum allocation scheme superior to a current frequency spectrum allocation scheme of the multiple cells from the multiple frequency spectrum allocation schemes according to at least two network performance indicators of a network in which the multiple cells are located; and allocating frequency spectrum(s) for the multiple cells using the selected frequency spectrum allocation scheme. This improves the utilization rate of the frequency spectrum and optimizes the multiple network performance indicators at the same time.

U.S. Pat. No. 9,246,576 for Apparatus and methods for dynamic spectrum allocation in satellite communications by inventors Yanai, et al., filed Mar. 5, 2012 and issued Jan. 26, 2016, is directed to a communication system including Satellite Communication apparatus providing communication services to at least a first set of communicants, the first set of communicants including a first plurality of communicants, wherein the communication services are provided to each of the communicants in accordance with a spectrum allocation corresponding thereto, thereby to define a first plurality of spectrum allocations apportioning a first predefined spectrum portion among the first set of communicants; and Dynamic Spectrum Allocations apparatus operative to dynamically modify at least one spectrum allocation corresponding to at least one of the first plurality of communicants without exceeding the spectrum portion.

U.S. Pat. No. 8,254,393 for Harnessing predictive models of durations of channel availability for enhanced opportunistic allocation of radio spectrum by inventor Horvitz, filed Jun. 29, 2007 and issued Aug. 28, 2012, is directed to a proactive adaptive radio methodology for the opportunistic allocation of radio spectrum is described. The methods can be used to allocate radio spectrum resources by employing machine learning to learn models, via accruing data over time, that have the ability to predict the context-sensitive durations of the availability of channels. The predictive models are combined with decision-theoretic cost-benefit analyses to minimize disruptions of service or quality that can be associated with reactive allocation policies. Rather than reacting to losses of channel, the proactive policies seek switches in advance of the loss of a channel. Beyond determining durations of availability for one or more frequency bands statistical machine learning also be employed to generate price predictions in order to facilitate a sale or rental of the available frequencies, and these predictions can be employed in the switching analyses. The methods can be employed in non-cooperating distributed models of allocation, in centralized allocation approaches, and in hybrid spectrum allocation scenarios.

U.S. Pat. No. 6,990,087 for Dynamic wireless resource utilization by inventors Rao, et al., filed Apr. 22, 2003 and issued Jan. 24, 2006, is directed to a method for dynamic wireless resource utilization includes monitoring a wireless communication resource; generating wireless communication resource data; using the wireless communication resource data, predicting the occurrence of one or more holes in a future time period; generating hole prediction data; using the hole prediction data, synthesizing one or more wireless communication channels from the one or more predicted holes; generating channel synthesis data; receiving data reflecting feedback from a previous wireless communication attempt and data reflecting a network condition; according to the received data and the channel synthesis data, selecting a particular wireless communication channel from the one or more synthesized wireless communication channels; generating wireless communication channel selection data; using the wireless communication channel selection data, instructing a radio unit to communicate using the selected wireless communication channel; and instructing the radio unit to discontinue use of the selected wireless communication channel after the communication has been completed.

U.S. Pat. No. 10,477,342 for Systems and methods of using wireless location, context, and/or one or more communication networks for monitoring for, preempting, and/or mitigating pre-identified behavior by inventor Williams, filed Dec. 13, 2017 and issued Nov. 12, 2019, is directed to systems and methods of using location, context, and/or one or more communication networks for monitoring for, preempting, and/or mitigating pre-identified behavior. For example, exemplary embodiments disclosed herein may include involuntarily, automatically, and/or wirelessly monitoring/mitigating undesirable behavior (e.g., addiction related undesirable behavior, etc.) of a person (e.g., an addict, a parolee, a user of a system, etc.). In an exemplary embodiment, a system generally includes a plurality of devices and/or sensors configured to determine, through one or more communications networks, a location of a person and/or a context of the person at the location; predict and evaluate a risk of a pre-identified behavior by the person in relation to the location and/or the context; and facilitate one or more actions and/or activities to mitigate the risk of the pre-identified behavior, if any, and/or react to the pre-identified behavior, if any, by the person.

SUMMARY OF THE INVENTION

The present invention relates to spectrum analysis and management for electromagnetic signals, and more particularly for providing dynamic, prioritized spectrum utilization management. Furthermore, the present invention relates to spectrum analysis and management for electromagnetic (e.g., radio frequency (RF)) signals, and for automatically identifying baseline data and changes in state for signals from a multiplicity of devices in a wireless communications spectrum, and for providing remote access to measured and analyzed data through a virtualized computing network. In an embodiment, signals and the parameters of the signals are identified and indications of available frequencies are presented to a user. In another embodiment, the protocols of signals are also identified. In a further embodiment, the modulation of signals, data types carried by the signals, and estimated signal origins are identified.

It is an object of this invention to prioritize and manage applications in the wireless communications spectrum, while also optimizing application performance.

In one embodiment, the present invention provides a system for spectrum analysis in an electromagnetic environment including at least one monitoring sensor including at least one receiver channel operable to monitor the electromagnetic environment and create measured data based on the electromagnetic environment, a radio receiver front-end subsystem configured to process the measured data, thereby creating processed data, a frequency domain programmable channelizer configured to analyze the processed data, an in-phase and quadrature (I/Q) buffer, a blind detection engine, and a noise floor estimator, wherein the frequency domain programmable channelizer includes buffer services, pre-processing of fast Fourier transform (FFT) bin samples, bin selection, at least one band pass filter (BPF), an inverse fast Fourier transform (IFFT) function to produce at least one IFFT, decomposition, and/or frequency down conversion and phase correction.

In another embodiment, the present invention provides a system for spectrum analysis in an electromagnetic environment including at least one monitoring sensor including at least one receiver channel operable to monitor the electromagnetic environment and create measured data based on the electromagnetic environment, a radio receiver front-end subsystem configured to process the measured data, thereby creating processed data, a frequency domain programmable channelizer configured to analyze the processed data, an in-phase and quadrature (I/Q) buffer, a blind detection engine, and a noise floor estimator, wherein the frequency domain programmable channelizer includes buffer services, pre-processing of the FFT bin samples, bin selection, at least one band pass filter (BPF), an inverse fast Fourier transform (IFFT) function, decomposition, and/or frequency down conversion and phase correction, and wherein the frequency domain programmable channelizer further includes at least one channel definition, at least one channelization vector, at least one FFT configuration, at least one deference matrix, at least one detector configuration, and/or at least one channel detection.

In yet another embodiment, the present invention provides a system for spectrum analysis in an electromagnetic environment including at least one monitoring sensor including at least one receiver channel operable to monitor the electromagnetic environment and create measured data based on the electromagnetic environment, a radio receiver front-end subsystem configured to process the measured data, thereby creating processed data, a frequency domain programmable channelizer configured to analyze the processed data, an in-phase and quadrature (I/Q) buffer, a blind detection engine, a noise floor estimator, and a classification engine, wherein the frequency domain programmable channelizer includes buffer services, pre-processing of the FFT bin samples, bin selection, at least one band pass filter (BPF), an inverse fast Fourier transform (IFFT) function, decomposition, and/or frequency down conversion and phase correction, wherein the frequency domain programmable channelizer further includes at least one channel definition, at least one channelization vector, at least one FFT configuration, at least one deference matrix, at least one detector configuration, and/or at least one channel detection, and wherein the classification engine is operable to generate a query to a static database to classify at least one signal of interest based on information from the frequency domain programmable channelizer.

These and other aspects of the present invention will become apparent to those skilled in the art after a reading of the following description of the preferred embodiment when considered with the drawings, as they support the claimed invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 44 illustrates a signal strength comparison of a first carrier ("Carrier 1") with a second carrier ("Carrier 2") for 700 MHz for a third example.

DETAILED DESCRIPTION

Figure 1:
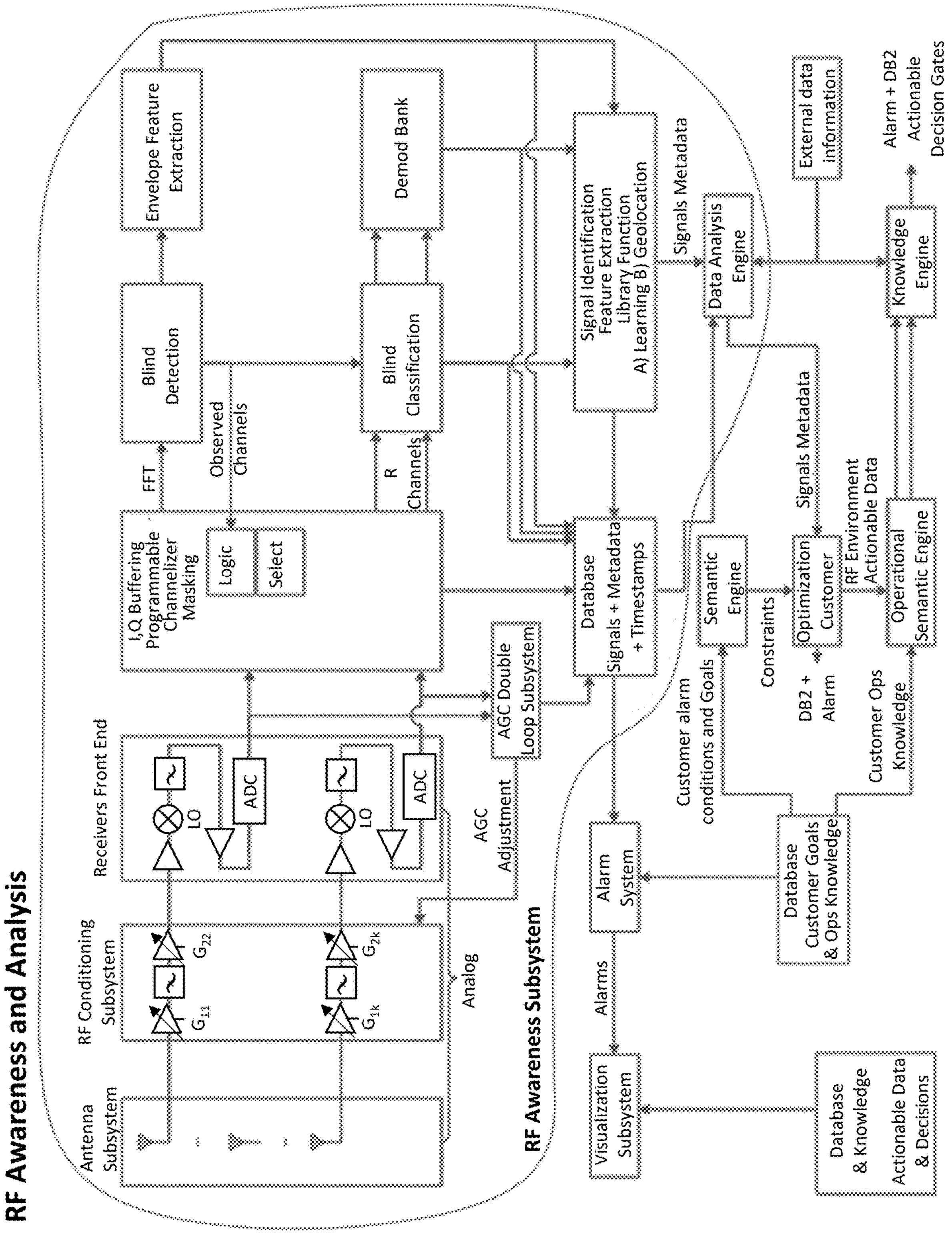
FIG. 1 illustrates one embodiment of an RF awareness and analysis system.

The present invention is generally directed to spectrum analysis and management for electromagnetic signals, and more particularly for providing dynamic, prioritized spectrum utilization management.

In one embodiment, the present invention provides a system for spectrum analysis in an electromagnetic environment including at least one monitoring sensor including at least one receiver channel operable to monitor the electromagnetic environment and create measured data based on the electromagnetic environment, a radio receiver front-end subsystem configured to process the measured data, thereby creating processed data, a frequency domain programmable channelizer configured to analyze the processed data, an in-phase and quadrature (I/Q) buffer, a blind detection engine, and a noise floor estimator, wherein the frequency domain programmable channelizer includes buffer services, pre-processing of fast Fourier transform (FFT) bin samples, bin selection, at least one band pass filter (BPF), an inverse fast Fourier transform (IFFT) function to produce at least one IFFT, decomposition, and/or frequency down conversion and phase correction. In one embodiment, one or more of the at least one monitoring sensor is mounted on a drone, on a vehicle, in or on a street light, in or on a traffic pole, and/or on top of a building. In one embodiment, the frequency domain programmable channelizer includes a comparison at each of the at least one receiver channel, and wherein the comparison provides anomalous detection using a mask with frequency and power. In one embodiment, the frequency domain programmable channelizer includes channelization selector logic for a table lookup of filter coefficient and channelization vectors. In one embodiment, data from the table lookup of filter coefficient and channelization vectors undergoes preprocessing with a mix circular rotator to produce a plurality of blocks of a plurality of points. In one embodiment, a sum is taken of a block of the plurality of blocks and the at least one IFFT is taken of a point of the plurality of points to produce discor overlap samples, and wherein the discor overlap samples are transmitted to a classification engine. In one embodiment, data from the frequency domain programmable channelizer undergoes an N point FFT, wherein a power spectral density (PSD) is calculated for the N point FFT, wherein a complex average FFT is obtained for a plurality of blocks of the N point FFT. In one embodiment, the PSD is transmitted to the noise floor estimator. In one embodiment, the frequency domain programmable channelizer includes at least one channel definition, at least one channelization vector, at least one FFT configuration, at least one deference matrix, at least one detector configuration, and/or at least one channel detection. In one embodiment, the noise floor estimator is operable to estimate a bin-wise noise model, estimate a bin-wise noise plus signal model, determine a bin-level probability of false alarm, a bin-level threshold, a channel-level probability of false alarm, a channel-level level threshold, calculate a detection vector, count a number of elements above the bin-level threshold, determine a probability of false alarm, determine a probability of missed detection, and/or determine an overall detection probability. In one embodiment, the blind detection engine is operable to estimate a number of channels, corresponding bandwidths for the number of channels, and center frequencies using an averaged power spectral density (PSD) of at least one signal of interest. In one embodiment, the system further includes a classification engine, wherein the classification engine is operable to generate a query to a static database to classify at least one signal of interest based on information from the frequency domain programmable channelizer.

In another embodiment, the present invention provides a system for spectrum analysis in an electromagnetic environment including at least one monitoring sensor including at least one receiver channel operable to monitor the electromagnetic environment and create measured data based on the electromagnetic environment, a radio receiver front-end subsystem configured to process the measured data, thereby creating processed data, a frequency domain programmable channelizer configured to analyze the processed data, an in-phase and quadrature (I/Q) buffer, a blind detection engine, and a noise floor estimator, wherein the frequency domain programmable channelizer includes buffer services, pre-processing of the FFT bin samples, bin selection, at least one band pass filter (BPF), an inverse fast Fourier transform (IFFT) function, decomposition, and/or frequency down conversion and phase correction, and wherein the frequency domain programmable channelizer further includes at least one channel definition, at least one channelization vector, at least one FFT configuration, at least one deference matrix, at least one detector configuration, and/or at least one channel detection. In one embodiment, the at least one deference matrix is operable to identify at least one narrowband channel that is a subset of at least one wideband channel. In one embodiment, the at least one FFT configuration is operable to resolve ambiguities between at least two channels by employing a sufficient resolution bandwidth. In one embodiment, the at least one channelization vector is operable to specify normalized power levels per FFT bin for at least one channel. In one embodiment, power levels of the at least one channelization vector are normalized with respect to peak power in a spectrum envelope of at least one channel. In one embodiment, the at least one detector configuration includes a minimum acceptable probability of false alarm and/or a minimum acceptable probability of missed detection. In one embodiment, the at least one channel detection is operable to perform a hypothesis test for at least one bin using information from the noise floor estimator and a maximum probability of false alarm.

In yet another embodiment, the present invention provides a system for spectrum analysis in an electromagnetic environment including at least one monitoring sensor including at least one receiver channel operable to monitor the electromagnetic environment and create measured data based on the electromagnetic environment, a radio receiver front-end subsystem configured to process the measured data, thereby creating processed data, a frequency domain programmable channelizer configured to analyze the processed data, an in-phase and quadrature (I/Q) buffer, a blind detection engine, a noise floor estimator, and a classification engine, wherein the frequency domain programmable channelizer includes buffer services, pre-processing of the FFT bin samples, bin selection, at least one band pass filter (BPF), an inverse fast Fourier transform (IFFT) function, decomposition, and/or frequency down conversion and phase correction, wherein the frequency domain programmable channelizer further includes at least one channel definition, at least one channelization vector, at least one FFT configuration, at least one deference matrix, at least one detector configuration, and/or at least one channel detection, and wherein the classification engine is operable to generate a query to a static database to classify at least one signal of interest based on information from the frequency domain programmable channelizer.

Traditional management of spectrum is static, based on licenses that are geographical and band specific. The Federal Communications Commission (FCC) has allocated spectrum into a table. Utilization is increased by slicing the spectrum into finer slices. Additionally, interference is limited by imposing penalties by strict geographical band utilization rules and licenses. However, these traditional methods of spectrum management do not work with increasing demand and new services coming out. The new services would have to be at higher frequencies (e.g., above 10 GHZ), which is very expensive and requires costly transceiver with a limited distance range.

Spectrum is valuable because it is a finite resource. Further, the demand for spectrum is ever-increasing. The Shannon-Hartley theorem calculates the maximum rate at which information can be transmitted over a communications channel of a specified bandwidth in the presence of noise as follows:

$$C = BW \log_2(1 + SNR)$$

where C is the channel capacity in bits per second, BW is the bandwidth of the channel in Hz, and SNR is the signal-to-noise ratio.

Early attempts at managing spectrum include developing technology that increases spectrum efficiency (i.e., maximizing SNR). Although this results in more bits per Hz, the logarithmic function limits the gains in channel capacity resulting from improving technology. Additional attempts at managing spectrum also include developing technology to enable use of alternate spectrum (e.g., free-space optical (FSO) communication). However, using alternate spectrum, such as higher frequencies, leads to smaller ranges, line of sight limitations, increased elevation of transmission structures, and/or expensive infrastructure.

The missing component to spectrum management is bandwidth management. Bandwidth management provides flexible utilization of the spectrum, enables management of spectrum resources and users, while allowing spectrum usage to be quantified. The majority of applications using the spectrum can coexist if each application knows about the spectrum needs of other applications and how they plan to use the spectrum. However, because the needs of each application are dynamic, a dynamic spectrum management system is needed. The present invention allows autonomous, dynamic sharing of the electromagnetic spectrum to allow maximum utilization by diverse applications according to specific utilization rules (dynamic and/or static) while maintaining minimum interference between applications. This requires new tools that provide dynamic environmental spectral awareness of all signals present in the electromagnetic (e.g., radio frequency (RF)) environment to properly execute utilization rules, which are operable to describe or facilitate sharing spectrum resources among several competing users or protect one service user from others, among others.

5G requires spectrum awareness. Larger blocks of spectrum are required to support higher speeds. Dynamic spectrum sharing is necessary to make the spectrum assets available. Further, visibility of spectrum activity is required to support reliability targets. Interference avoidance and resolution must be embedded. Internet of Things (IoT)/machine communication wireless dependency elevates the need for real-time RF visibility to avoid disruption and safety concerns.

The system of the present invention provides scalable processing capabilities at the edge. Edge processing is fast and reliable with low latency. Environmental sensing processes optimize collection and analytics, making data sets manageable. Advantageously, the system minimizes backhaul requirements, allowing for actionable data to be delivered faster and more efficiently.

Deep learning techniques extract and deliver knowledge from large data sets in near-real time. These deep learning techniques are critical for identifying and classifying signals. Edge analytics further allow third party data (e.g., social media, population information, real estate information, traffic information, geographic information system) to further enrich captured data sets. A semantic engine and inference reasoner leverages insights generated by machine learning and edge analytics. Ontologies are established allowing for the creation of knowledge operable to inform and direct actions and/or decisions.

Referring now to the drawings in general, the illustrations are for the purpose of describing one or more preferred embodiments of the invention and are not intended to limit the invention thereto.

The present invention provides systems, methods, and apparatuses for spectrum analysis and management by identifying, classifying, and cataloging at least one or a multiplicity of signals of interest based on electromagnetic spectrum measurements (e.g., radiofrequency spectrum measurements), location, and other measurements. The present invention uses real-time and/or near real-time processing of signals (e.g., parallel processing) and corresponding signal parameters and/or characteristics in the context of historical, static, and/or statistical data for a given spectrum, and more particularly, all using baseline data and changes in state for compressed data to enable near real-time analytics and results for individual monitoring sensors and for aggregated monitoring sensors for making unique comparisons of data.

The systems, methods, and apparatuses according to the present invention preferably are operable to detect in near real time, and more preferably to detect, sense, measure, and/or analyze in near real time, and more preferably to perform any near real time operations within about 1 second or less. In one embodiment, near real time is defined as computations completed before data marking an event change. For example, if an event happens every second, near real time is completing computations in less than one second. Advantageously, the present invention and its real time functionality described herein uniquely provide and enable the system to compare acquired spectrum data to historical data, to update data and/or information, and/or to provide more data and/or information on open space. In one embodiment, information (e.g., open space) is provided on an apparatus unit or a device that is occupying the open space. In another embodiment, the system compares data acquired with historically scanned (e.g., 15 min to 30 days) data and/or or historical database information in near-real time. Also, the data from each monitoring sensor, apparatus unit, or device and/or aggregated data from more than one monitoring sensor, apparatus unit, and/or device are communicated via a network to at least one server computer and stored on a database in a virtualized or cloud-based computing system, and the data is available for secure, remote access via the network from distributed remote devices having software applications (apps) operable thereon, for example by web access (mobile app) or computer access (desktop app). The at least one server computer is operable to analyze the data and/or the aggregated data.

The system is operable to monitor the electromagnetic (e.g., RF) environment via at least one monitoring sensor. The system is then operable to analyze data acquired from the at least one monitoring sensor to detect, classify, and/or identify at least one signal in the electromagnetic environment. The system is operable to learn the electromagnetic environment, which allows the system to extract environmental awareness. In a preferred embodiment, the system extracts environmental awareness by including customer goals. The environmental awareness is combined with the customer goals, customer defined policies, and/or rules (e.g., customer defined rules, government defined rules) to extract actionable information to help the customer optimize performance according to the customer goals. The actionable information is combined and correlated with additional information sources to enhance customer knowledge and user experience through dynamic spectrum utilization and prediction models.

The systems, methods, and apparatuses of the various embodiments enable spectrum utilization management by identifying, classifying, and cataloging signals of interest based on electromagnetic (e.g., radio frequency) measurements. In one embodiment, signals and parameters of the signals are identified. In another embodiment, indications of available frequencies are presented to a user and/or user equipment. In yet another embodiment, protocols of signals are also identified. In a further embodiment, the modulation of signals, data types carried by the signals, and estimated signal origins are identified. Identification, classification, and cataloging signals of interest preferably occurs in real time or near-real time.

Embodiments are directed to a spectrum monitoring unit that is configurable to obtain spectrum data over a wide range of wireless communication protocols. Embodiments also provide for the ability to acquire data from and send data to database depositories that are used by a plurality of spectrum management customers and/or applications or services requiring spectrum resources.

In one embodiment, the system includes at least one spectrum monitoring unit. Each of the at least one spectrum monitoring unit includes at least one monitoring sensor that is preferably in network communication with a database system and spectrum management interface. In one embodiment, the at least one spectrum monitoring unit and/or the at least one monitoring sensor is portable. In a preferred embodiment, one or more of the at least one spectrum monitoring unit and/or the at least one monitoring sensor is a stationary installation. The at least one spectrum monitoring unit and/or the at least one monitoring sensor is operable to acquire different spectrum information including, but not limited to, frequency, bandwidth, signal power, time, and location of signal propagation, as well as modulation type and format. The at least one spectrum monitoring unit is preferably operable to provide signal identification, classification, and/or geo-location. Additionally, the at least one spectrum monitoring unit preferably includes a processor to allow the at least one spectrum monitoring unit to process spectrum power density data as received and/or to process raw In-Phase and Quadrature (I/Q) complex data. Alternatively, the at least one spectrum monitoring unit and/or the at least one monitoring sensor transmits the data to at least one data analysis engine for storage and/or processing. In a preferred embodiment, the transmission of the data is via a backhaul operation. The spectrum power density data and/or the raw I/Q complex data are operable to be used to further signal processing, signal identification, and data extraction.

The system preferably is operable to manage and prioritize spectrum utilization based on five factors: frequency, time, spatial, signal space, and application goals.

The frequency range is preferably as large as possible. In one embodiment, the system supports a frequency range between 1 MHz and 6 GHz. In another embodiment, the system supports a frequency range with a lower limit of 9 kHz. In yet another embodiment, the system supports a frequency range with a higher limit of 12.4 GHz. In another embodiment, the system supports a frequency range with a higher limit of 28 GHz or 36 GHz. Alternatively, the system supports a frequency range with a higher limit of 60 GHz. In still another embodiment, the system supports a frequency range with a higher limit of 100 GHz. The system preferably has an instantaneous processing bandwidth (IPBW) of 40 MHz, 80 MHz, 100 MHz, or 250 MHz per channel.

The time range is preferably as large as possible. In one embodiment, the number of samples per dwell time in a frequency band is calculated. In one example, the system provides a minimum coverage of 2 seconds. The number of samples per dwell in time in the frequency band is calculated as follows:

$$N_s \geq (IPBW)(2)/\text{channel}$$

The storage required in a buffer is a minimum of 2 seconds per channel per dwell time, which is calculated as follows:

$$\text{storage} = (IPBW)(2)(2\ \text{Bytes})(\text{channels})/(\text{dwell time})$$

Spatial processing is used to divide an area of coverage by a range of azimuth and elevation angles. The area of coverage is defined as an area under a certain azimuth and range. This is implemented by antenna arrays processing, steerable beamforming, array processing, and/or directional antennas. In one embodiment, the directional antennas include at least one steerable electrical or mechanical antenna. Alternatively, the directional antennas include an array of steerable antennas. More antennas require more signal processing. Advantageously, spatial processing allows for better separation of signals, reduction of noise and interference signals, geospatial separation, increasing signal processing gains, and provides a spatial component to signal identification. Further, this allows for simple integration of geolocation techniques, such as time difference of arrival (TDOA), angle of arrival (AOA), and/or frequency difference of arrival (FDOA). This also allows for implementation of a geolocation engine, which will be discussed in detail infra.

Each signal has inherent signal characteristics including, but not limited to a modulation type (e.g., frequency modulation (FM), amplitude modulation (AM), quadrature phase-shift keying (QPSK), quadrature amplitude modulation (QAM), binary phase-shift keying (BPSK), etc.), a protocol used (e.g., no protocol for analog signals, digital mobile radio (DMR), land mobile radio (LMR), Project 25 (P25), NXDN, cellular, long-term evolution (LTE), universal mobile telecommunications system (UMTS), 5G), an envelope behavior (e.g., bandwidth (BW), center frequency (Fc), symbol rate, data rate, constant envelope, peak power to average power ratio (PAR), cyclostationary properties), an interference index, and statistical properties (e.g., stationary, cyclostationary, higher moment decomposition, non-linear decomposition (e.g., Volterra series to cover non-linearities, learning basic model).

The application goals are dependent on the particular application used within the system. Examples of applications used in the system include, but are not limited to, traffic management, telemedicine, virtual reality, streaming video for entertainment, social media, autonomous and/or unmanned transportation, etc. Each application is operable to be prioritized within the system according to customer goals. For example, traffic management is a higher priority application than streaming video for entertainment.

As previously described, the system is operable to monitor the electromagnetic (e.g., RF) environment, analyze the electromagnetic environment, and extract environmental awareness of the electromagnetic environment. In a preferred embodiment, the system extracts the environmental awareness of the electromagnetic environment by including customer goals. In another embodiment, the system uses the environmental awareness with the customer goals and/or user defined policies and rules to extract actionable information to help the customer optimize the customer goals. The system combines and correlates other information sources with the extracted actionable information to enhance customer knowledge through dynamic spectrum utilization and prediction models.

FIG. 1 illustrates one embodiment of an RF awareness and analysis system. The system includes an RF awareness subsystem. The RF awareness subsystem includes, but is not limited to, an antenna subsystem, an RF conditioning subsystem, at least one front end receiver, a programmable channelizer, a blind detection engine, a blind classification engine, an envelope feature extraction module, a demodulation bank, an automatic gain control (AGC) double loop subsystem, a signal identification engine, a feature extraction engine, a learning engine, a geolocation engine, a data analysis engine, and/or a database storing information related to at least one signal (e.g., metadata, timestamps, power measurements, frequencies, etc.). The system further includes an alarm system, a visualization subsystem, a knowledge engine, an operational semantic engine, a customer optimization module, a database of customer goals and operational knowledge, and/or a database of actionable data and decisions.

The antenna subsystem monitors the electromagnetic (e.g., RF) environment to produce monitoring data. The monitoring data is then processed through the RF conditioning subsystem before being processed through the front end receivers. The AGC double loop subsystem is operable to perform AGC adjustment. Data is converted from analog to digital by the front end receivers.

The digital data is then sent through the programmable channelizer, and undergoes I, Q buffering and masking. A fast Fourier transform (FFT) is performed and the blind detection engine performs blind detection. Additionally, the blind classification engine performs blind classification. Information (e.g., observed channels) is shared from the blind detection engine to the blind classification and/or the programmable channelizer (e.g., to inform logic and selection processes). Information from the blind detection engine is also sent to the envelope feature extraction module. Information from the blind classification engine is sent to the demodulation bank.

Information from the envelope feature extraction module, the demodulation bank, and/or the blind classification engine are operable to be used by the signal identification engine, the feature extraction engine, the learning engine, and/or the geolocation engine. Information from the AGC double loop subsystem, the I, Q buffer, masking, the programmable channelizer, the signal identification engine, the feature extraction engine, the learning engine, and the geolocation engine, the envelope feature extraction module, the demodulation bank, and/or the blind classification engine is operable to be stored in the database storing information related to the at least one signal (e.g., signal data, metadata, timestamps).

Information from the database (i.e., the database storing information related to the at least one signal), the signal identification engine, the feature extraction engine, the learning engine, and/or the geolocation engine is operable to be sent to the data analysis engine for further processing.

The alarm system includes information from the database storing information related to the at least one signal and/or the database of customer goals and operational knowledge. Alarms are sent from the alarm system to the visualization subsystem. In a preferred embodiment, the visualization subsystem customizes a graphical user interface (GUI) for each customer. The visualization system is operable to display information from the database of actionable data and decisions. In one embodiment, the alarms are sent via text message and/or electronic mail. In one embodiment, the alarms are sent to at least one internet protocol (IP) address.

The database of customer goals and operational knowledge is also operable to send information to a semantic engine (e.g., customer alarm conditions and goals) and/or an operational semantic engine (e.g., customer operational knowledge). The semantic engine translates information into constraints and sends the constraints to the customer optimization module, which also receives information (e.g., signal metadata) from the data analysis engine. The customer optimization module is operable to send actionable data related to the electromagnetic environment to the operational semantic engine. The customer optimization module is operable to discern which information (e.g., environmental information) has the largest statistically sufficient impact related to the customer goals and operation.

Figure 2:
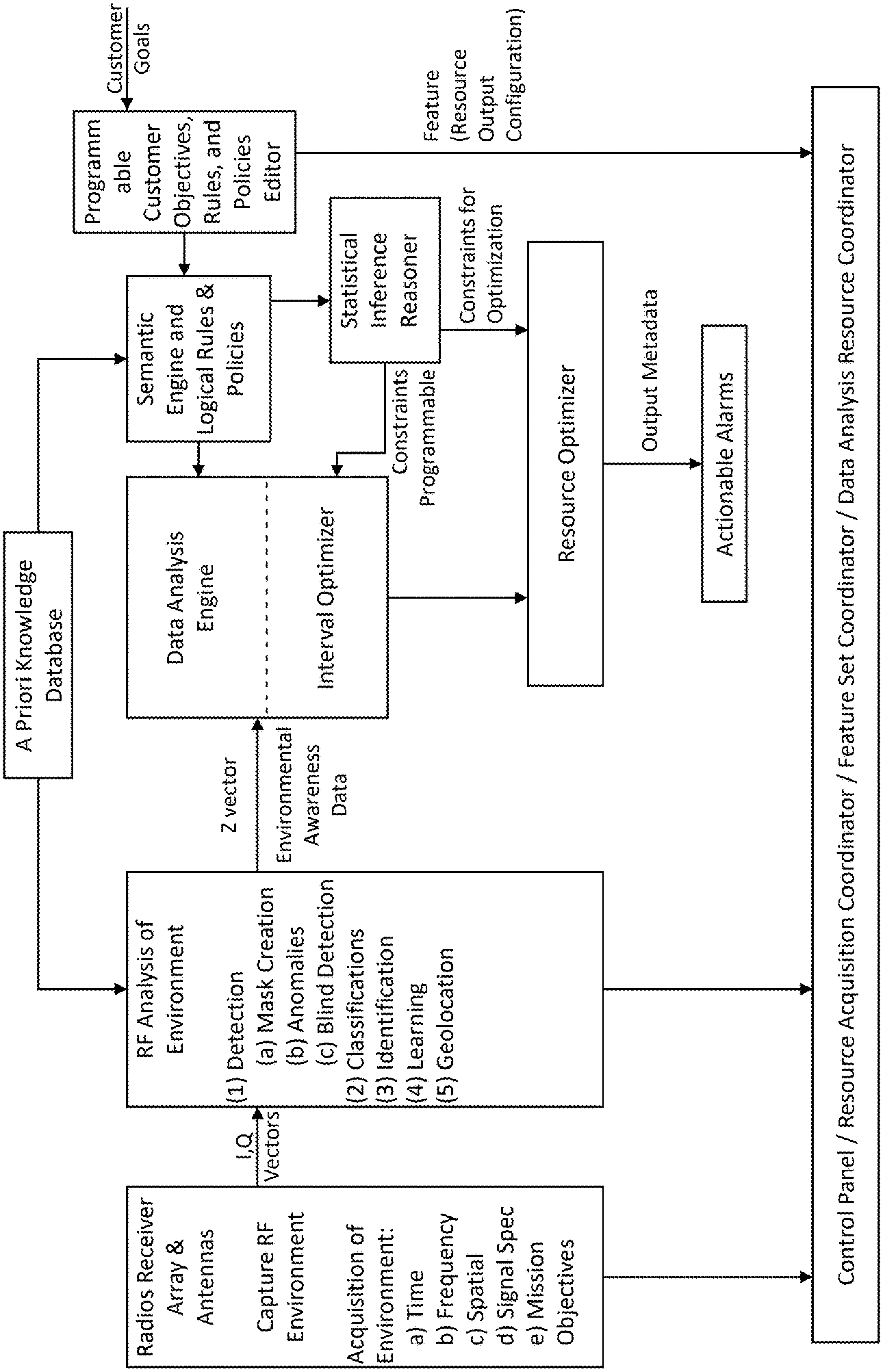
FIG. 2 illustrates another embodiment of the RF awareness and analysis system.

In one embodiment, the system includes at least one monitoring sensor, at least one data analysis engine, at least one application, a semantic engine, a programmable rules and policy editor, a tip and cue server, and/or a control panel as shown in FIG. 2.

The at least one monitoring sensor includes at least one radio server and/or at least one antenna. The at least one antenna is a single antenna (e.g., uni-directional or directional) or an antenna array formed of multiple antennas resonating at different frequency bands and configured in a 1D (linear), 2D (planar), or 3D (area) antenna configuration. The at least one monitoring sensor is operable to scan the electromagnetic (e.g., RF) spectrum and measure properties of the electromagnetic spectrum, including, but not limited to, receiver I/Q data. The at least one monitoring unit is preferably operable to autonomously capture the electromagnetic spectrum with respect to frequency, time, and/or space. In one embodiment, the at least one monitoring sensor is operable to perform array processing.

In another embodiment, the at least one monitoring sensor is mobile. In one embodiment, the at least one monitoring sensor is mounted on a vehicle or a drone. Alternatively, the at least one monitoring sensor is fixed. In one embodiment, the at least one monitoring sensor is fixed in or on a street light and/or a traffic pole. In yet another embodiment, the at least one monitoring sensor is fixed on top of a building.

In one embodiment, the at least one monitoring sensor is integrated with at least one camera. In one embodiment, the at least one camera captures video and/or still images.

In another embodiment, the at least one monitoring sensor includes at least one monitoring unit. Examples of monitoring units include those disclosed in U.S. Pat. Nos. 10,122,479, 10,219,163, 10,231,206, 10,237,770, 10,244,504, 10,257,727, 10,257,728, 10,257,729, 10,271,233, 10,299,149, 10,498,951, and 10,529,241, and U.S. Publication Nos. 20190215201, 20190364533, and 20200066132, each of which is incorporated herein by reference in its entirety.

In a preferred embodiment, the system includes at least one data analysis engine to process data captured by the at least one monitoring sensor. An engine is a collection of functions and algorithms used to solve a class of problems. The system preferably includes a detection engine, a classification engine, an identification engine, a geo-location engine, a learning engine, and/or a statistical inference and machine learning engine. For example, the geolocation engine is a group of functions and geolocation algorithms that are used together to solve multiple geolocation problems.

The detection engine is preferably operable to detect at least one signal of interest in the electromagnetic (e.g., RF) environment. In a preferred embodiment, the detection engine is operable to automatically detect the at least one signal of interest. In one embodiment, the automatic signal detection process includes mask creation and environment analysis using masks. Mask creation is a process of elaborating a representation of the electromagnetic environment by analyzing a spectrum of signals over a certain period of time. A desired frequency range is used to create a mask, and FFT streaming data is also used in the mask creation process. A first derivative is calculated and used for identifying possible maximum power values. A second derivative is calculated and used to confirm the maximum power values. A moving average value is created as FFT data is received during a time period selected by the user for mask creation. For example, the time period is 10 seconds. The result is an FFT array with an average of the maximum power values, which is called a mask.

The classification engine is preferably operable to classify the at least one signal of interest. In one embodiment, the classification engine generates a query to a static database to classify the at least one signal of interest based on its components. For example, the information stored in static database is preferably used to determine spectral density, center frequency, bandwidth, baud rate, modulation type, protocol (e.g., global system for mobile (GSM), code-division multiple access (CDMA), orthogonal frequency-division multiplexing (OFDM), LTE, etc.), system or carrier using licensed spectrum, location of the signal source, and/or a timestamp of the at least one signal of interest. In an embodiment, the static database includes frequency information gathered from various sources including, but not limited to, the Federal Communication Commission, the International Telecommunication Union, and data from users. In one example, the static database is an SQL database. The data store is operable to be updated, downloaded or merged with other devices or with its main relational database. In one embodiment, software application programming interface (API) applications are included to allow database merging with third-party spectrum databases that are only operable to be accessed securely. In a preferred embodiment, the classification engine is operable to calculate second, third, and fourth order cumulants to classify modulation schemes along with other parameters, including center frequency, bandwidth, baud rate, etc.

The identification engine is preferably operable to identify a device or an emitter transmitting the at least one signal of interest. In one embodiment, the identification engine uses signal profiling and/or comparison with known database(s) and previously recorded profile(s) to identify the device or the emitter. In another embodiment, the identification engine states a level of confidence related to the identification of the device or the emitter.

The geolocation engine is preferably operable to identify a location from which the at least one signal of interest is emitted. In one embodiment, the geolocation engine uses statistical approximations to remove error causes from noise, timing and power measurements, multipath, and non-line of sight (NLOS) measurements. By way of example, the following methods are used for geolocation statistical approximations and variances: maximum likelihood (nearest neighbor or Kalman filter); least squares approximation; Bayesian filter if prior knowledge data is included; and the like. In another embodiment, time difference of arrival (TDOA) and frequency difference of arrival (FDOA) equations are derived to assist in solving inconsistencies in distance calculations. In still another embodiment, angle of arrival (AOA) is used to determine geolocation. In yet another embodiment, power distribution ratio versus azimuth measurements are used to determine geolocation. In a preferred embodiment, geolocation is performed using Angle of Arrival (AOA), Time Difference of Arrival (TDOA), Frequency Difference of Arrival (FDOA), and power distribution ratio measurements. Several methods or combinations of these methods are operable to be used with the present invention because geolocation is performed in different environments, including but not limited to indoor environments, outdoor environments, hybrid (stadium) environments, inner city environments, etc.

The learning engine is preferably operable to learn the electromagnetic environment. In one embodiment, the learning engine uses statistical learning techniques to observe and learn an electromagnetic environment over time and identify temporal features of the electromagnetic environment (e.g., signals) during a learning period. In a preferred embodiment, the learning engine is operable to learn information from the detection engine, the classification engine, the identification engine, and/or the geolocation engine. In one embodiment, the learning function of the system is operable to be enabled and disabled. When the learning engine is exposed to a stable electromagnetic environment and has learned what is normal in the electromagnetic environment, it will stop its learning process. In a preferred embodiment, the electromagnetic environment is periodically reevaluated. In one embodiment, the learning engine reevaluates and/or updates the electromagnetic environment at a predetermined timeframe. In another embodiment, the learning engine reevaluates and/or updates the electromagnetic environment is updated after a problem is detected.

The statistical inference and machine learning (ML) engine utilizes statistical learning techniques and/or control theory to learn the electromagnetic environment and make predictions about the electromagnetic environment.

The survey occupancy application is operable to determine occupancy in frequency bands. In another embodiment, the survey occupancy application is operable to schedule occupancy in a frequency band. The survey occupancy application is also used to preprocess at least two signals that exist in the same band based on interference between the at least two signals.

The resource brokerage application is operable to optimize resources to improve application performance. In a preferred embodiment, the resource brokerage application is operable to use processed data from the at least one monitoring sensor and/or additional information to determine environmental awareness (e.g., environmental situational awareness). The environmental awareness and/or capabilities of a device and/or a resource are used to determine policies and/or reasoning to optimize the device and/or the resource. The resource brokerage application is operable to control the device and/or the resource. Additionally, the resource brokerage application is operable to control the at least one monitoring sensor.

The certification and compliance application is operable to determine if applications and/or devices are behaving according to rules and/or policies (e.g., customer policies and/or rules, government rules). In another embodiment, the certification and compliance application is operable to determine if the applications and/or the devices are sharing frequency bands according to the rules and/or the policies. In yet another embodiment, the certification and compliance application is operable to determine if the applications and/or the devices are behaving according to non-interferences rules and/or policies.

The sharing application is operable to determine optimization of how applications and/or devices share the frequency bands. In a preferred embodiment, the sharing application uses a plurality of rules and/or policies (e.g., a plurality of customer rules and/or policies, government rules) to determine the optimization of how the applications and/or the devices share the frequency bands. Thus, the sharing application satisfies the plurality of rules and/or policies as defined by at least one customer and/or the government.

The statistical inference and prediction utilization application is operable to utilize predictive analytics techniques including, but not limited to, machine learning (ML), artificial intelligence (AI), neural networks (NNs), historical data, and/or data mining to make future predictions and/or models. The system is preferably operable to recommend and/or perform actions based on historical data, external data sources, ML, AI, NNs, and/or other learning techniques.

The semantic engine is operable to receive data in forms including, but not limited to, audio data, text data, video data, and/or image data. In one embodiment, the semantic engine utilizes a set of system rules and/or a set of system policies. In another embodiment, the set of system rules and/or the set of system policies is created using a prior knowledge database. The semantic engine preferably includes an editor and a language dictionary.

The semantic engine preferably further includes a programmable rules and policy editor. The programmable rules and policy editor is operable to include at least one rule and/or at least one policy. In one embodiment, the at least one rule and/or the at least one policy is defined by at least one customer. Advantageously, this allows the at least one customer to dictate rules and policies related to customer objectives.

The system further includes a tip and cue server. The tip and cue server is operable utilize the environmental awareness from the data processed by the at least one data analysis engine in combination with additional information to create actionable data. In a preferred embodiment, the tip and cue server utilizes information from a specific rule set (e.g., customer defined rule set), further enhancing the optimization capabilities of the system. The specific rule set is translated into optimization objectives, including constraints associated with signal characteristics. In a preferred embodiment, the tip and cue server is operable to activate at least one alarm and/or provide at least one report. In another embodiment, the tip and cue server is operable to activate the at least one alarm and/or provide the at least one report according to the specific rule set.

Advantageously, the system is operable to run autonomously and continuously. The system learns from the environment, and, without operator intervention, is operable to detect anomalous signals that either were not there before, or have changed in power or bandwidth. Once detected, the system is operable to send alerts (e.g., by text or email) and begin high resolution spectrum capture, or I/Q capture of the signal of interest. Additionally, the system is operable to optimize and prioritize applications using the learning engine.

Figure 3:
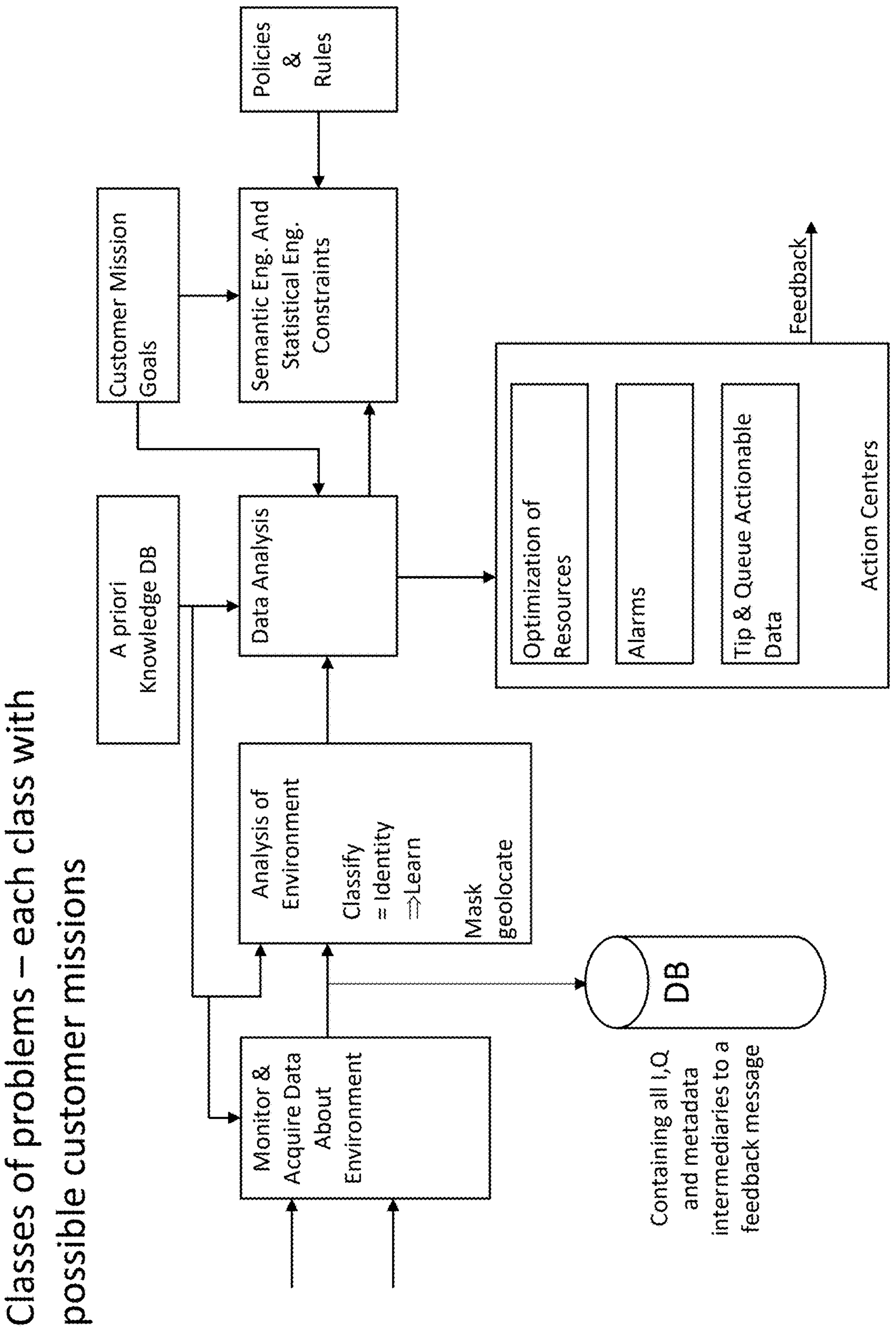
FIG. 3 is a flow diagram of the system according to one embodiment.

FIG. 3 is a flow diagram of the system according to one embodiment.

Figure 4:
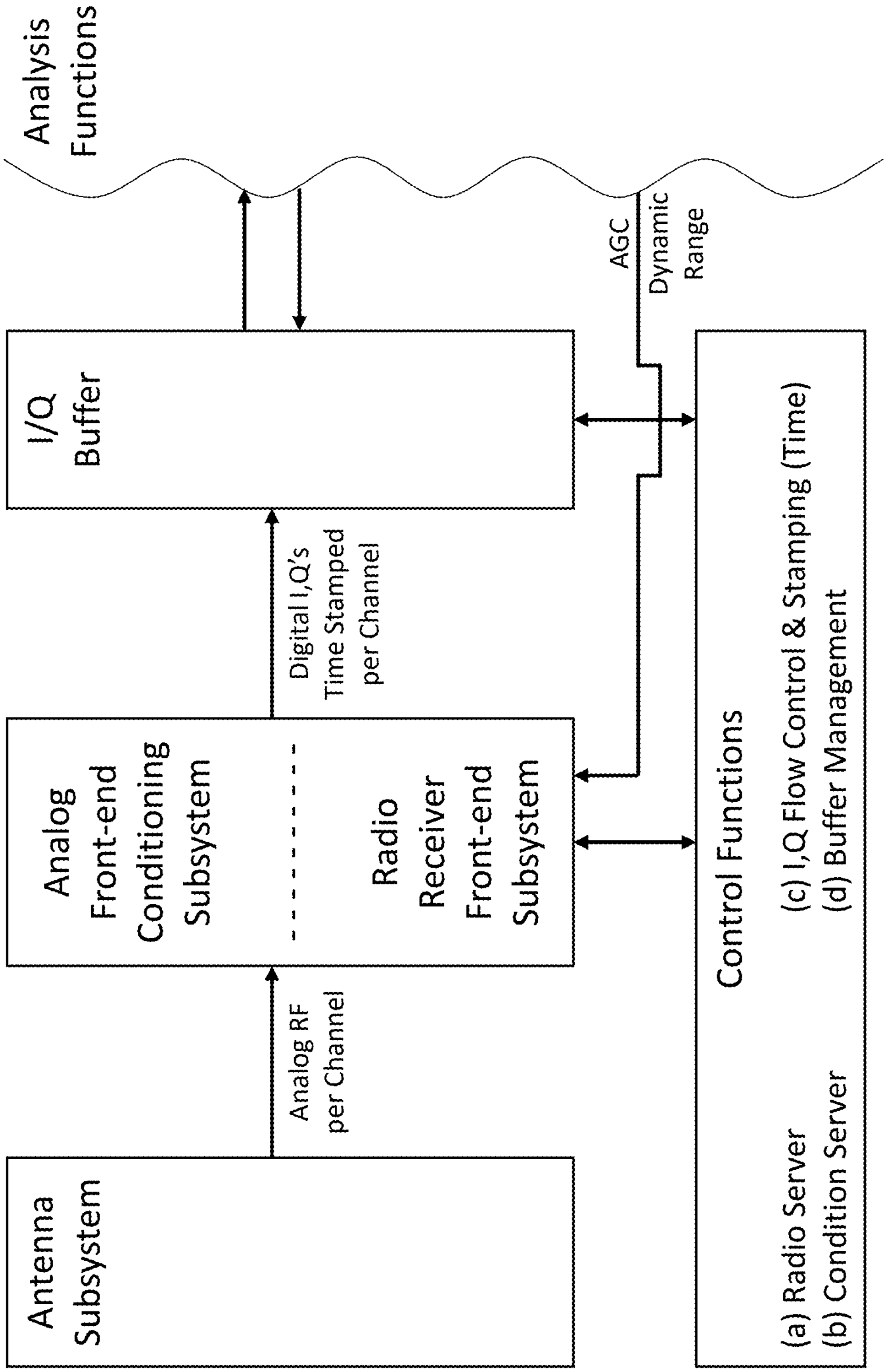
FIG. 4 illustrates the acquisition component of the system.

FIG. 4 illustrates the acquisition component of the system. The system includes an antenna subsystem including at least one antenna, an analog front-end conditioning system, a radio receiver front-end system, and a I/Q buffer. The system is operable to perform control functions including, but not limited to, controlling a radio server, conditioning the radio server, I/Q flow control and/or time stamping, and/or buffer management.

Figure 5:
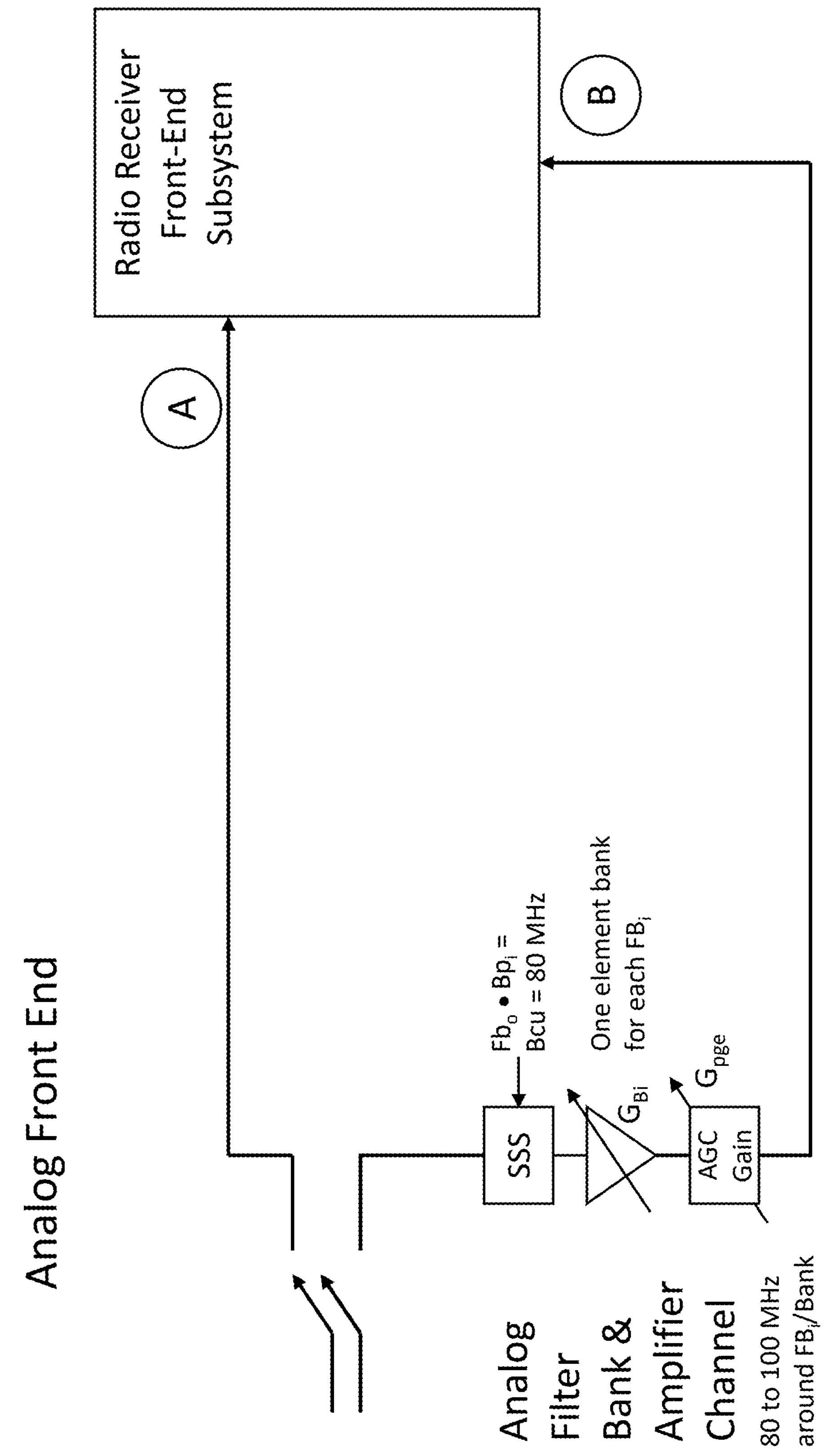
FIG. 5 illustrates one embodiment of an analog front end of the system.

FIG. 5 illustrates one embodiment of an analog front end of the system. In one embodiment, electromagnetic waves are sent directly to a radio receiver front-end subsystem as shown in Path A. Alternatively, the electromagnetic waves are sent through an analog filter bank and amplifier/channel with a filter (SSS), an amplifier (e.g., variable gain amplifier), and an automatic gain controller as shown in Path B before reaching the radio receiver front-end subsystem. In one embodiment, the BCU is 80 MHz. Alternatively, the BCU is 150 MHz. The radio receiver front-end subsystem is described in FIG. 6.

Figure 6:
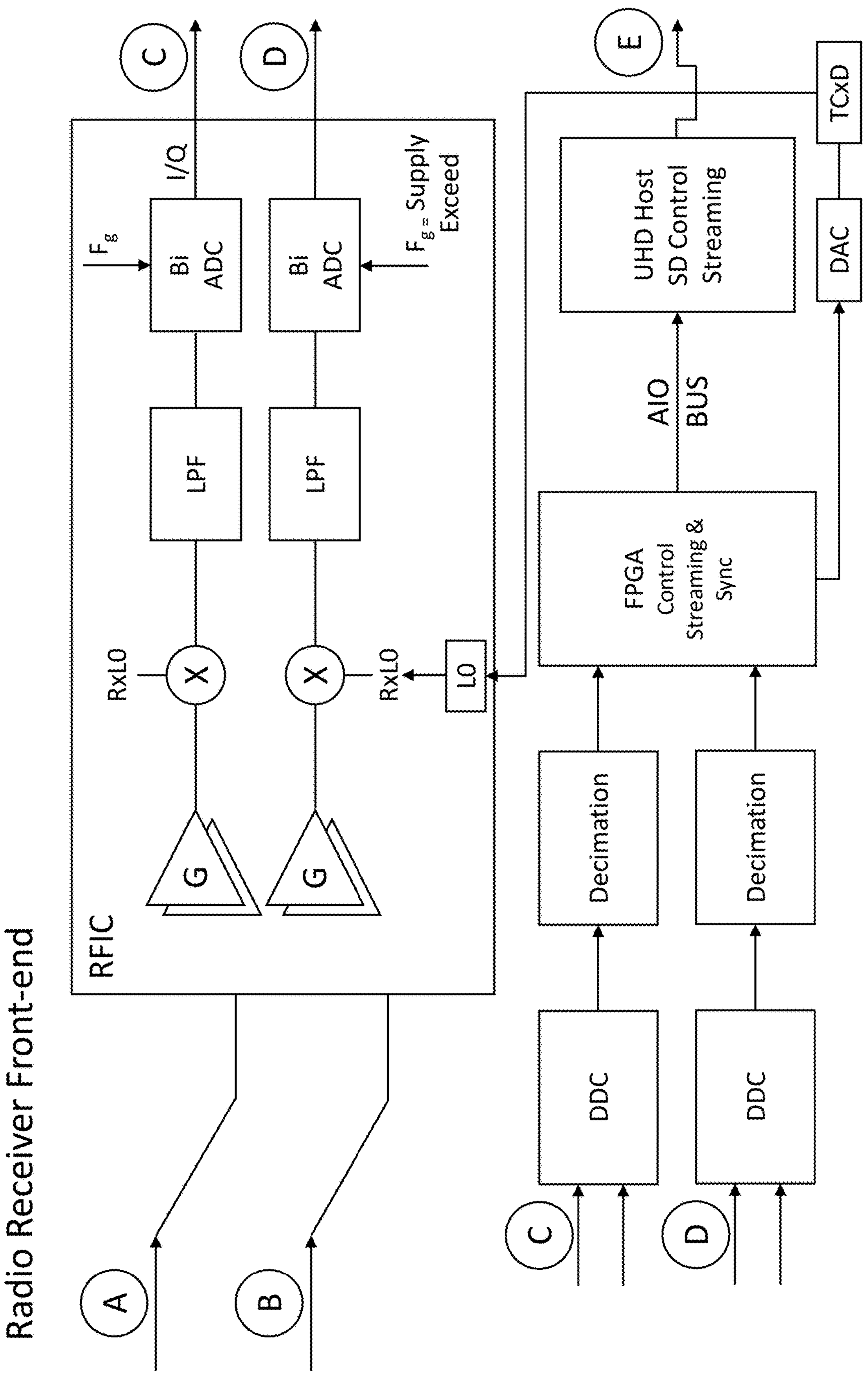
FIG. 6 illustrates one embodiment of a radio receiver front-end subsystem.

FIG. 6 illustrates one embodiment of a radio receiver front-end subsystem. Path A and Path B continue into a radio-frequency integrated circuit (RFIC), and then proceed to a digital down-converter (DDC) before downsampling (e.g., decimation) and moving through a field programmable gate array (FPGA). In one embodiment, signals from the FPGA are operable to be sent to a digital to analog converter (DAC). Alternatively, signals are sent via bus to a Universal Software Radio Peripheral hardware driver (UHD) host and SD controller before continuing to Path E, which is described in FIG. 7.

Figure 7:
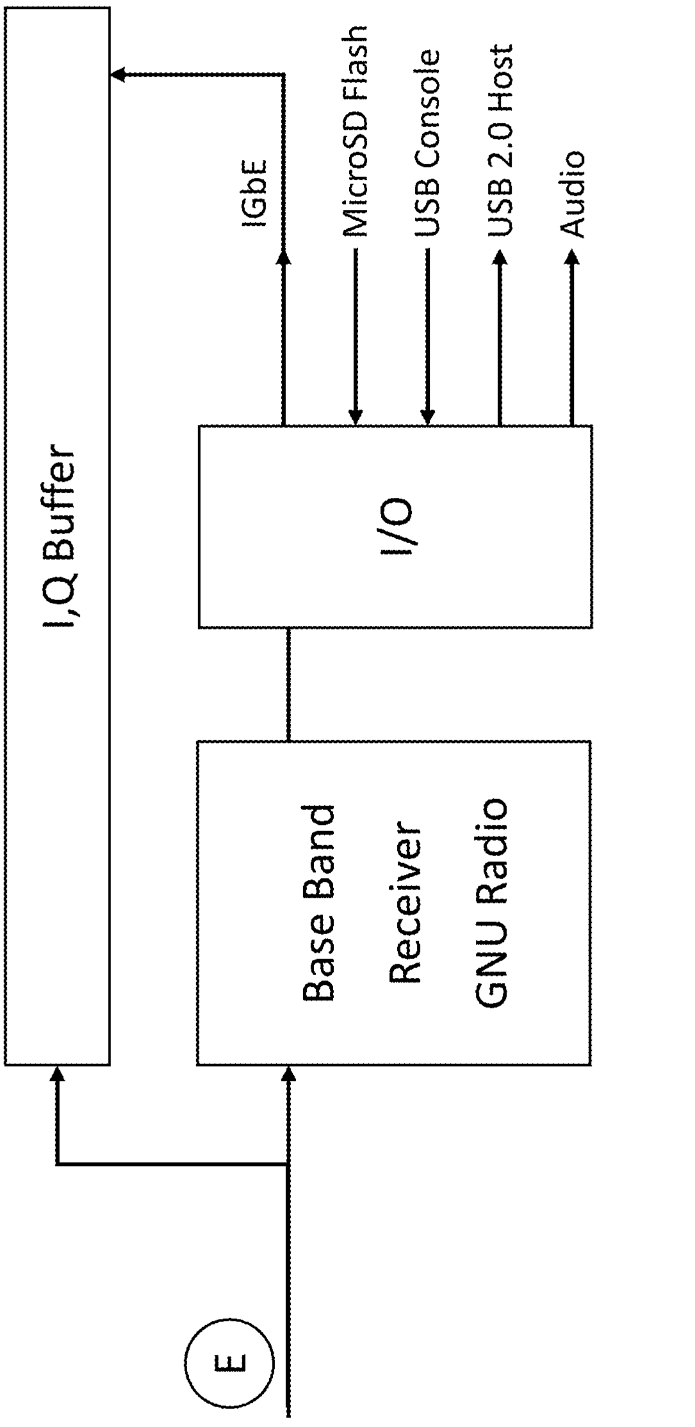
FIG. 7 continues the embodiment of the radio receiver front-end shown in FIG. 6.

FIG. 7 continues the embodiment of the radio receiver front-end shown in FIG. 6 after digitization. In one embodiment, Path E continues to the I, Q buffer. In another embodiment, Path E continues to a baseband receiver. In one embodiment, signals are further processed using signal processing software (e.g., GNU Radio software). In yet another embodiment, the baseband receiver is connected to inputs and/or outputs. In one embodiment, the inputs include, but are not limited to, MicroSD Flash memory and/or a Universal Serial Bus (USB) console. In one embodiment, the outputs include, but are not limited to, USB 2.0 host and/or audio. Alternatively, data from the baseband receiver is sent to the I, Q buffer via the IGbE port.

The system preferably uses multiple receiver channels for the front end. In one embodiment, there are 4 receiver channels. Alternatively, there are 8, 12, 16, or 32 receiver channels. I, Q data is preferably tagged by the receiver channel and receiver antenna (e.g., bandwidth, gain, etc.) and then stored in the I, Q buffer before analysis is completed.

Advantageously, the system is hardware agnostic. The system is operable to provide a suggestion for hardware for a particular frequency set. Additionally, the hardware agnostic nature of the system allows for established architecture to persist. The system is cost effective because it also allows for cheaper antennas to be used, as well as less expensive filters, because calibration can be done using the system rather than the antennas and/or filters, as well as post-ADC processing to rectify any performance loss. Because the system processes all signals present in the spectrum and their inter-relationships to extract environmental awareness, so the analog front end does not require elaborate filtering to avoid interference and provide optimum dynamic range. Additionally, the analog front end does not require optimal antennas for all frequency bands and ranges to obtain environmental awareness.

Figure 8:
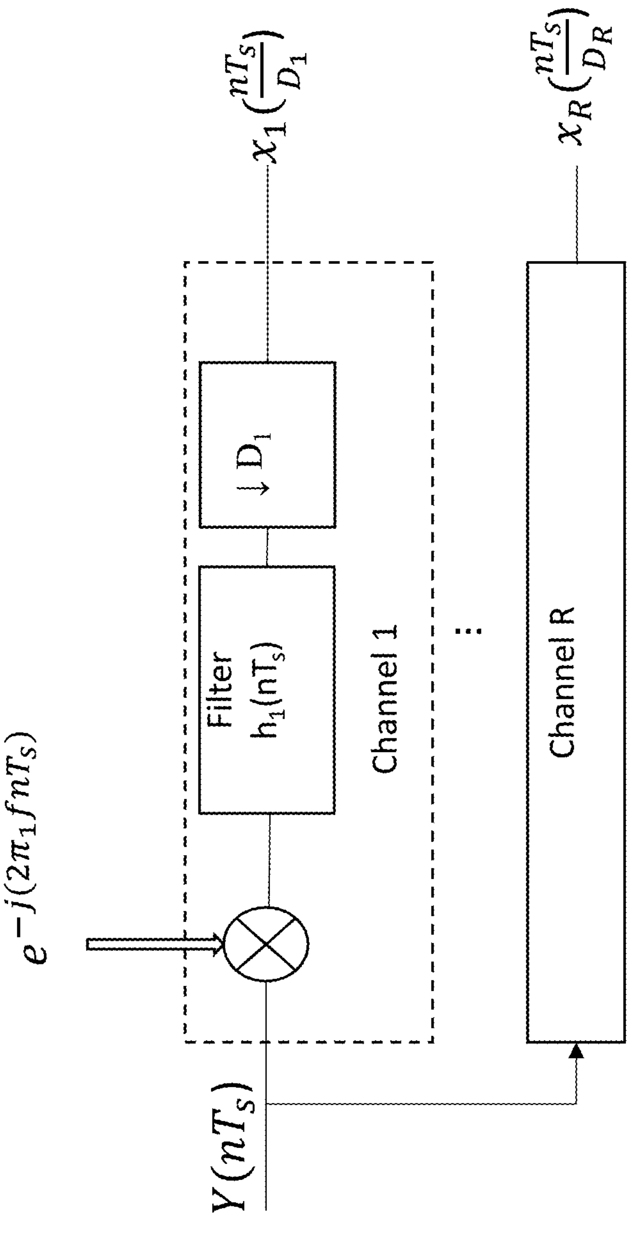
FIG. 8 is an example of a time domain programmable channelizer.

For a time domain programmable channelizer, all filters' impulse responses must be programmable and the number of filters must be programmable. Additionally, the channel bandwidth resolution must be programmable starting from a minimum bandwidth. The center frequency of each channel must also be programmable. Decimation is based on channel bandwidth and desired resolution. However, these requirements are difficult to implement for channels with variable bandwidth and center frequency. Wavelet filters can be used effectively if the center frequency and channel's bandwidth follow a tree structure (e.g., Harr and Deubauchi wavelets). FIG. 8 is an example of a time domain programmable channelizer.

Figure 9:
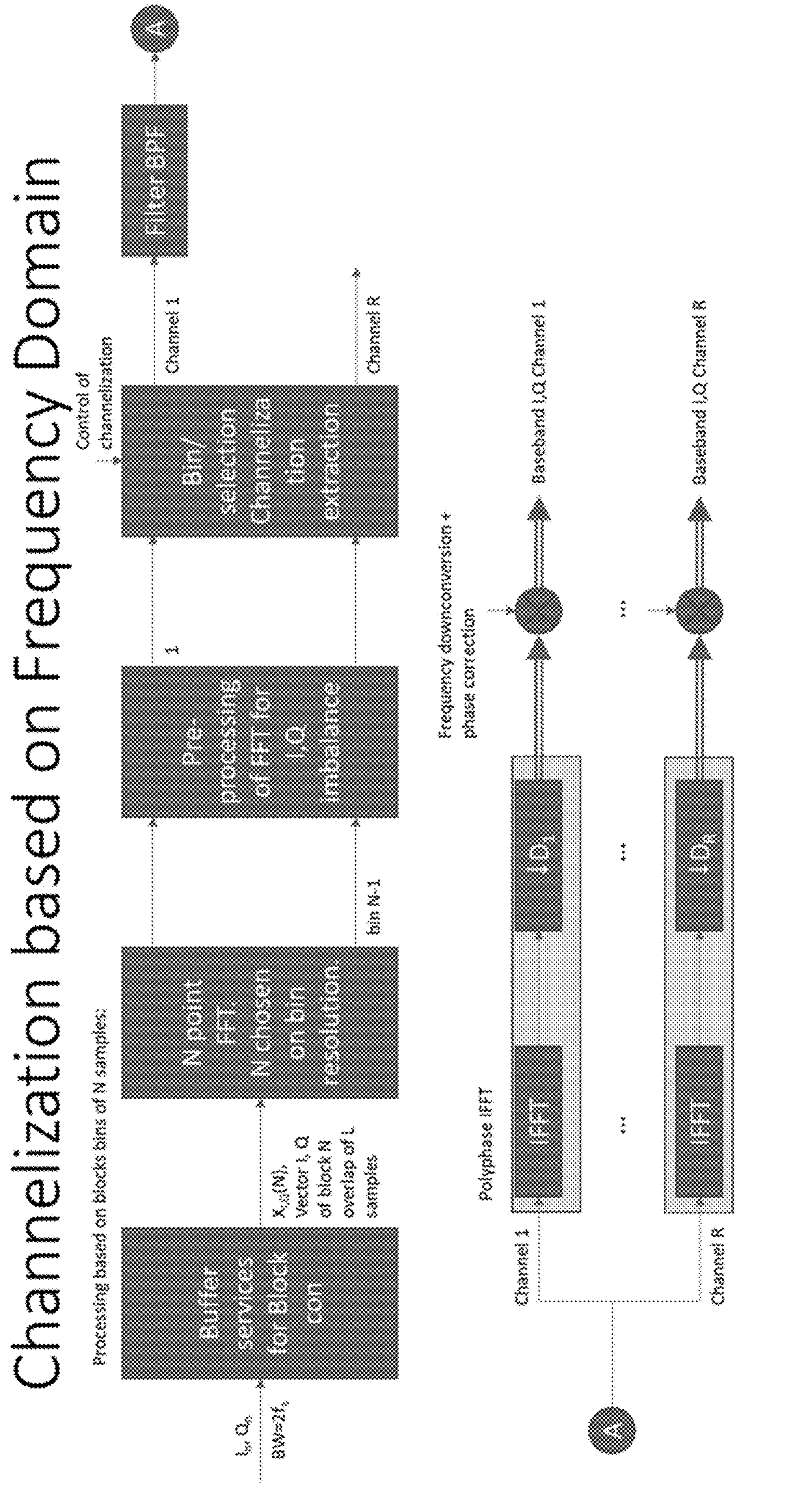
FIG. 9 is an example of a frequency domain programmable channelizer.

In a preferred embodiment, the system includes a frequency domain programmable channelizer as shown in FIG. 9. The programmable channelizer includes buffer services, pre-processing of the FFT bin samples, bin selection, at least one band pass filter (BPF), an inverse fast Fourier transform (IFFT) function, decomposition, and/or frequency down conversion and phase correction to yield baseband I, Q for channels 1 through R. The IFFT function and decimation function are done to obtain each decomposed channel I, Q at the proper sampling rate.

Advantageously, the frequency domain programmable channelizer is more computationally efficient than a time domain programmable channelizer because each filter is just a vector in the frequency domain and the filtering operation is just a vector multiplication, decomposing the input signal into multiple channels of differing bandwidths is parsing the vector representing the input signal frequency domain content into a subvector of different length.

Figure 10:
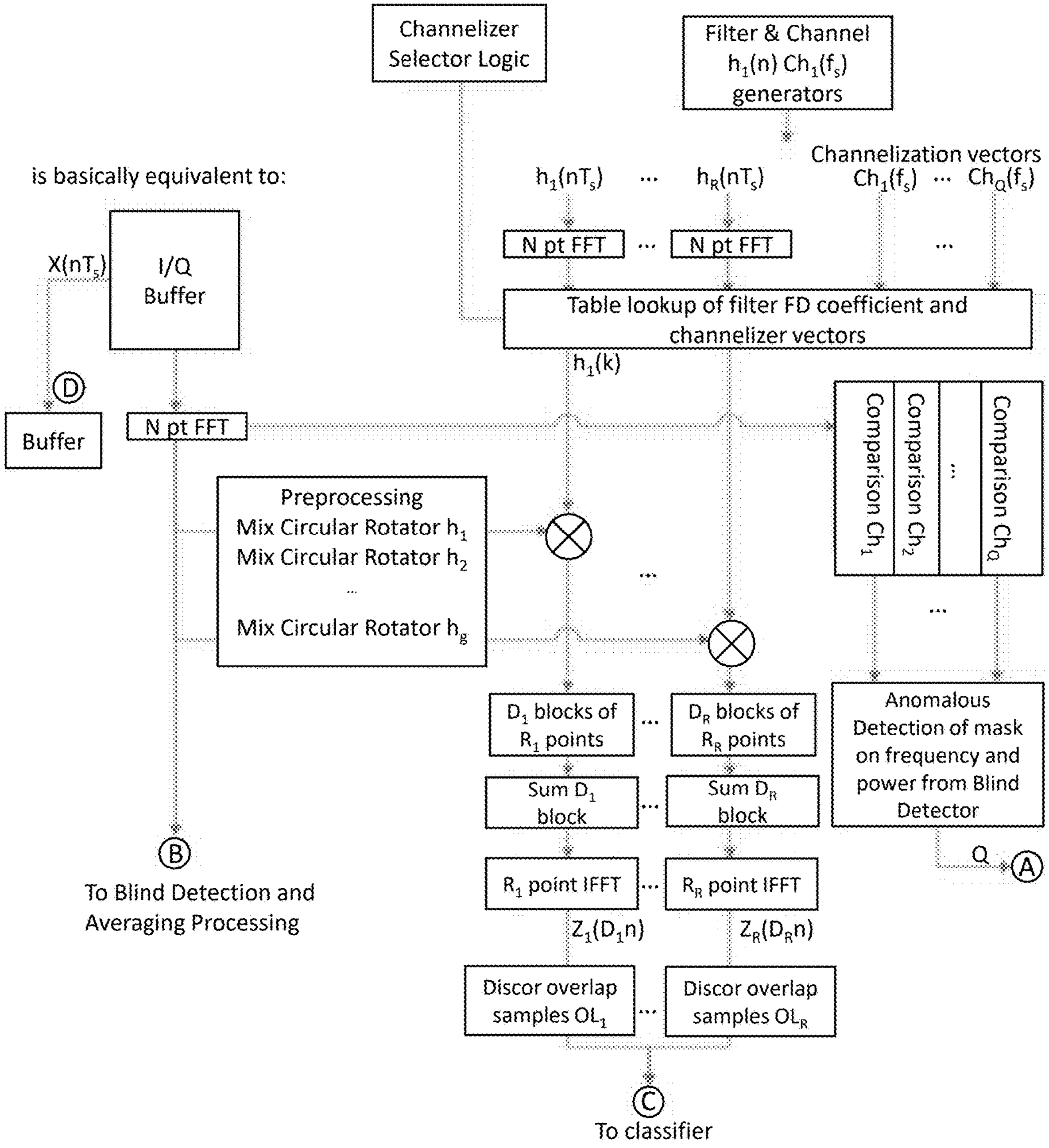
FIG. 10 is another embodiment of a programmable channelizer.

FIG. 10 is another embodiment of a programmable channelizer. Data enters the filter and channel generators with channelization selector logic for a table lookup of filter coefficient and channelization vectors. The programmable channelizer includes a comparison at each channel, which provides anomalous detection using a mask with frequency and power, which is then sent to the learning engine and/or the alarm system ("A"). Data processed with the FFT is sent to the blind detection engine and/or for averaging processing ("B"). In one embodiment, average processing includes blind detection of channel bandwidths and center frequency and comparison to resulting frequency domain channelization. Data from the table lookup of filter coefficient and channelization vectors undergoes preprocessing with a mix circular rotator to produce $D_1$ blocks of $R_1$ points. A sum is taken of the $D_1$ block, and an $R_1$ point IFFT is taken to produce discor overlap samples $OL_1$. This process occurs (e.g., in parallel) for $D_1$ blocks of $R_1$ points through DR blocks of RR points to produce $OL_1$ through OLR, which are then sent to the classification engine ("C"). All data from the I, Q buffer is preferably stored in a buffered database ("D"). In one embodiment, the I, Q buffer is partitioned into N blocks with L oversamples. In one embodiment, the original sample rate is decimated by $D_1$ where i is from 1 to R.

Figure 53:
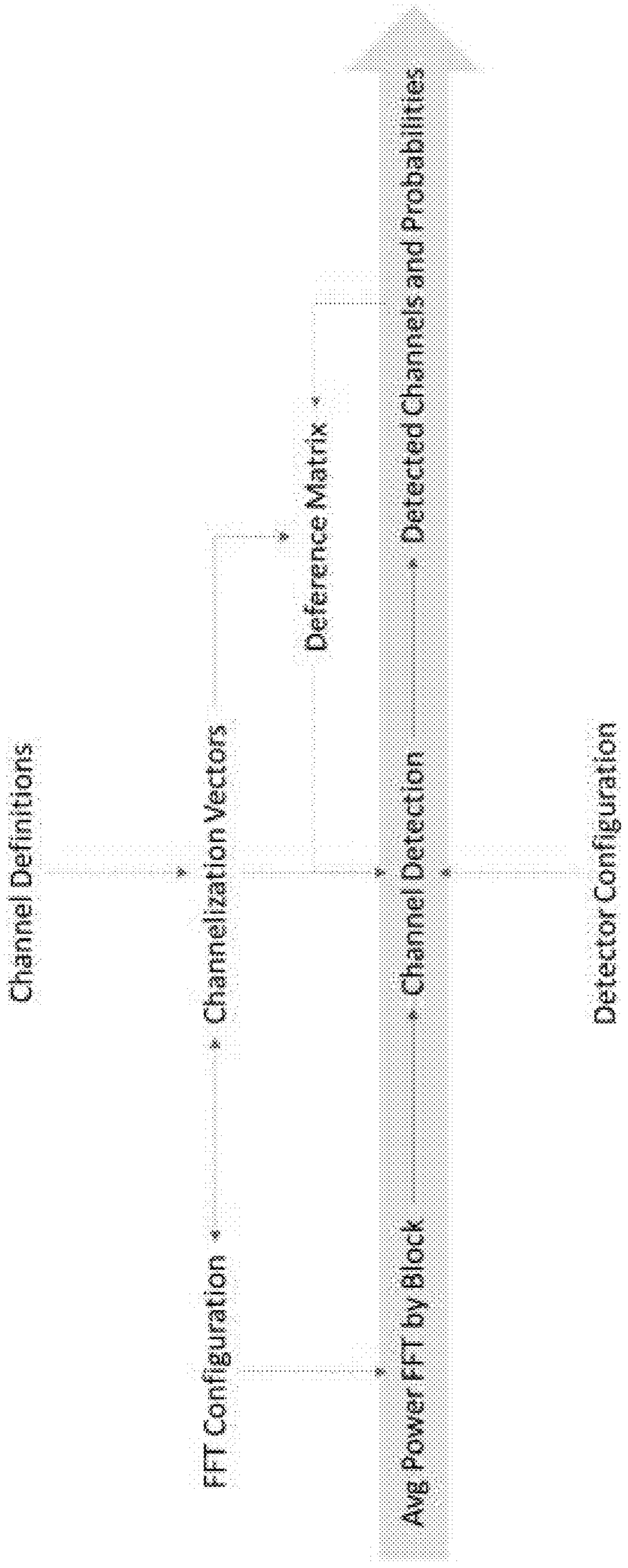
FIG. 53 illustrates one embodiment of a flow diagram of a channelizer configuration.

FIG. 53 illustrates one embodiment of a flow diagram of a channelizer configuration. Channel Definitions define the channels to detect. Channelization Vectors define the channels within the context of FFT. FFT Configuration configures FFT with sufficient resolution bandwidth (RBW) to resolve ambiguity among the Channel Definitions. A Deference Matrix identifies narrowband (NB) channels that are subsets of wideband (WB) channels to avoid false detection and/or to detect simultaneous channels. Detector Configuration sets acceptable probability of False Alarm and probability thresholds for detection. Channel Detection determines which channels are present subject to the Detector Configuration and the Deference Matrix.

In one embodiment, the FFT Configuration is operable to capture channels in their entirety. In one embodiment, the FFT Configuration is operable to capture channels with a minimum number of points to support detection probabilities. In one embodiment, the FFT Configuration is operable to resolve ambiguities between channels by employing a sufficiently small RBW.

In one embodiment, a channelization vector is operable to specify normalized power levels per FFT bin for at least one channel (e.g., each channel). In one embodiment, the channelization vector power levels are preferably normalized with respect to peak power in the channel's spectrum envelope.

In one embodiment, a deference matrix is operable to identify channels with bandwidth that falls within the bandwidth of other channels (i.e., channels with wider bands). In one embodiment, the channels defer to the channels with wider bands. In one embodiment, the detector is operable to evaluate narrower band channels before the detector evaluates wider band channels. In one embodiment, positive detection of wider band channels is operable to further constrain criteria that defines the positive detection of deferring narrower band channels.

In one embodiment, noise floor estimation is operable to define the mean and standard deviation of noise from the average power FFT (e.g., block). In one embodiment, statistics are operable to be on a channel span level, a block containing multiple channels, or a bin level. In one embodiment, the statistics are operable to be used by the channel detector to set criteria for asserting channel detection.

In one embodiment, detector configuration is operable to set a minimum acceptable probability of false alarm. In one embodiment, the detector configuration is operable to set a minimum acceptable probability of missed detection.

In one embodiment, channel detection is operable to evaluate presence of channels in order of increasing bandwidths (i.e., narrowband channels before wideband channels). In one embodiment, the channel detection is operable to perform a hypothesis test for each bin using Noise Floor Estimation and maximum probability of false alarm. In one embodiment, the hypothesis test includes a first hypothesis that a bin contains only noise ($H_0$) and/or a second hypothesis that a bin contains noise and signal (Ha). In one embodiment, the channel detection is operable to determine the probability that S≤s bins within a given channel's bandwidth reject the "Noise only" hypothesis. In one embodiment, the channel detection is operable to assert that a channel is detected if the probability is greater than $\beta_{min}$. In one embodiment, the channel detection is operable to adjust the hypothesis test for deferring narrowband channels if detection probability is greater than p. In one embodiment, the channel detection is operable to set a new mean and a new standard deviation.

Figure 54:
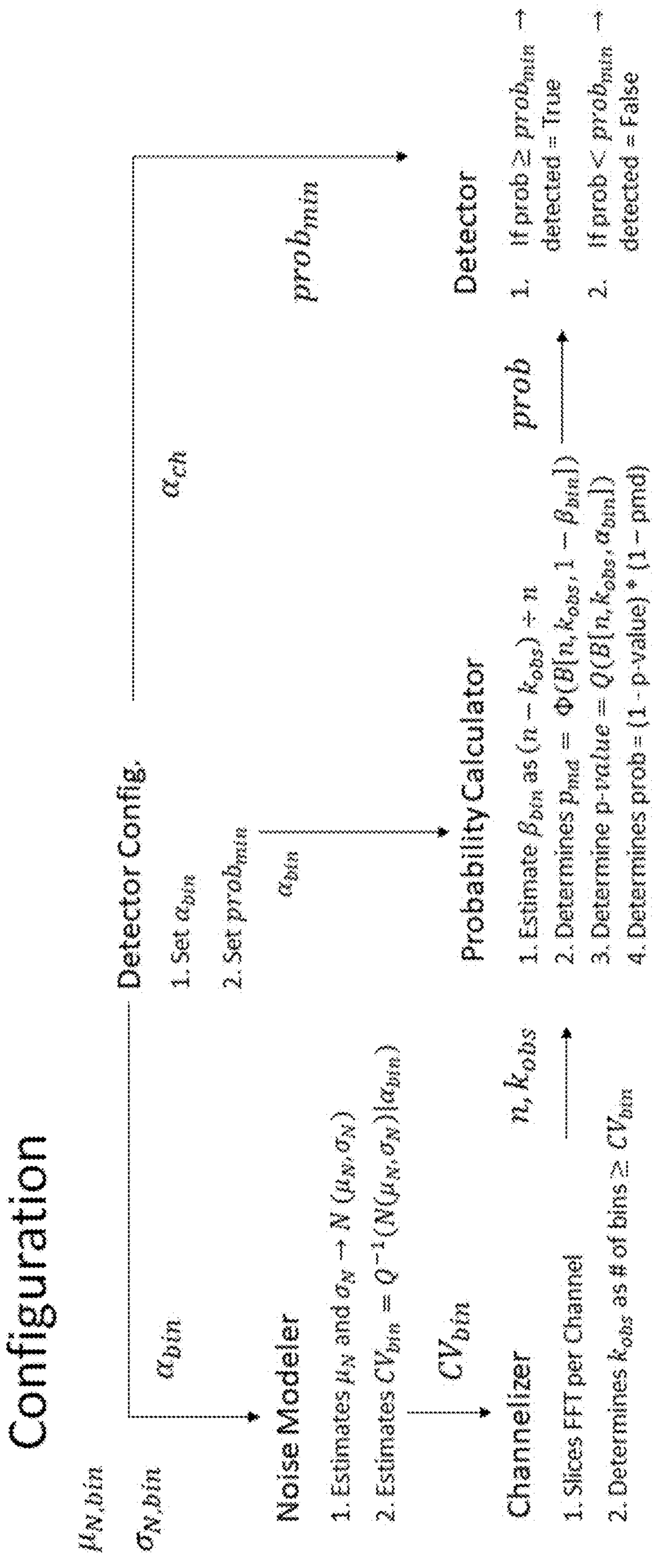
FIG. 54 illustrates another embodiment of a flow diagram of a channelizer.

FIG. 54 illustrates another embodiment of a flow diagram of a channelizer. The Detector Configuration is operable to set a probability of false alarm per bin ($\alpha_{bin}$) and a minimum probability ($prob_{min}$). The noise modeler is operable to estimate a mean noise per bin ($\mu_N$) and a standard deviation per bin ($\sigma_N$). In one embodiment, the noise modeler is operable to determine a channelization vector ($CV_{bin}$). The channelizer is operable to slice the FFT per channel and determine $k_{obs}$ as the number of bins above the threshold in the channelization vector. The probability calculator is operable to estimate $B_{bin}$, determine the probability of missed detection ($p_{md}$), determine the probability of false alarm ($p_{fa}$ or p-value), and determine the probability of detection being correct. The detector is operable to determine that a signal is detected if the probability is greater or equal to the minimum probability. The detector is operable to determine that a signal is not detected if the probability is less than the minimum probability.

Figure 55:
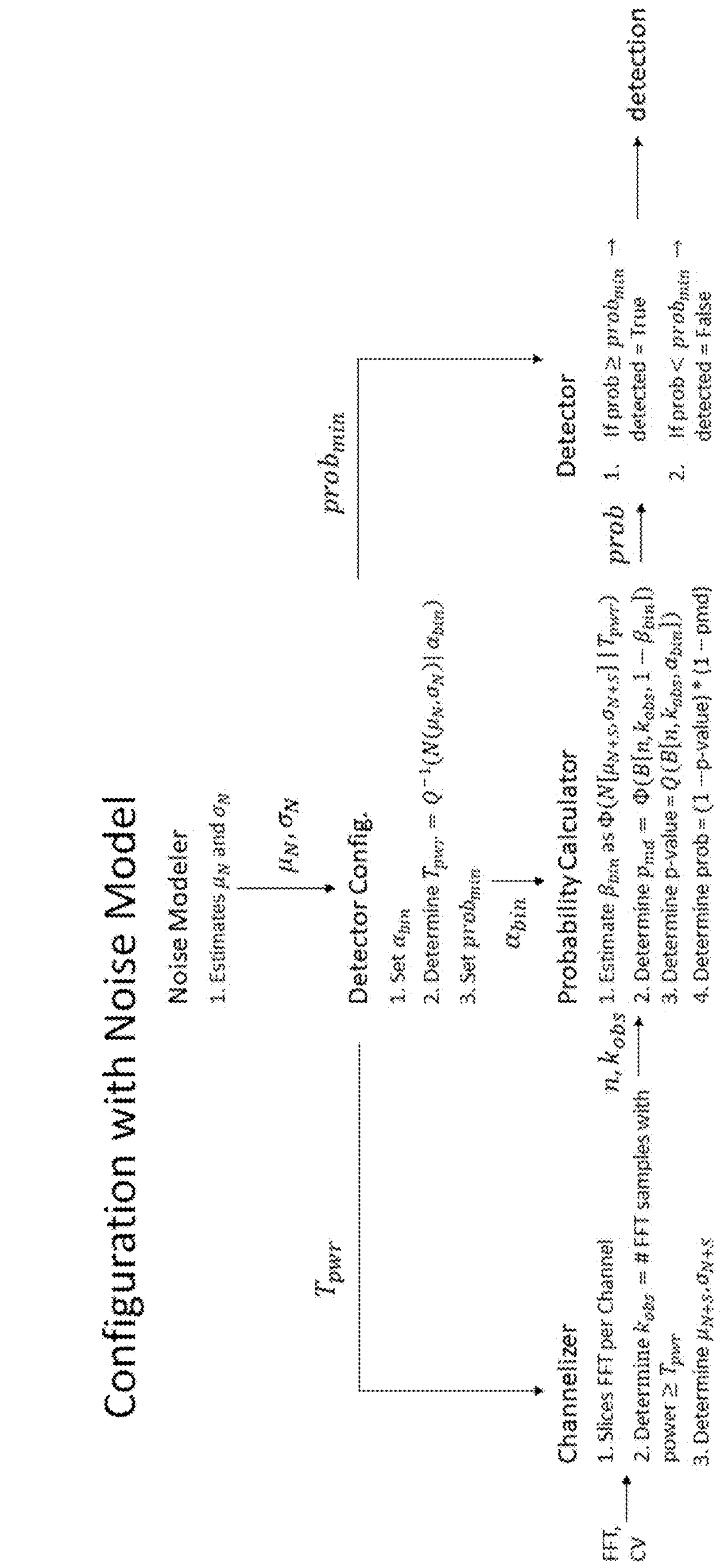
FIG. 55 illustrates yet another embodiment of a flow diagram of a channelizer configuration.

FIG. 55 illustrates yet another embodiment of a flow diagram of a channelizer configuration. The noise modeler is operable to estimate a mean noise per bin ($\mu_N$) and a standard deviation per bin ($\sigma_N$). The Detector Configuration is operable to set a probability of false alarm level per bin ($\alpha_{bin}$), a power threshold ($T_{pwr}$), and a minimum probability of being correct ($prob_{min}$). The channelizer is operable to slice the FFT per channel and determine $k_{obs}$ as the number of bins above the threshold in the channelization vector. The channelizer is operable to determine a mean of the signal and noise per bin ($\mu_N$+s) and a standard deviation of the signal and noise per bin ($\sigma_N$+S). The probability calculator is operable to estimate $B_{bin}$, determine the probability of missed detection, determine the p-value, and determine the probability of being correct. The detector is operable to determine that a signal is detected if the probability is greater or equal to the minimum probability. The detector is operable to determine that a signal is not detected if the probability is less than the minimum probability.

Figure 56A:
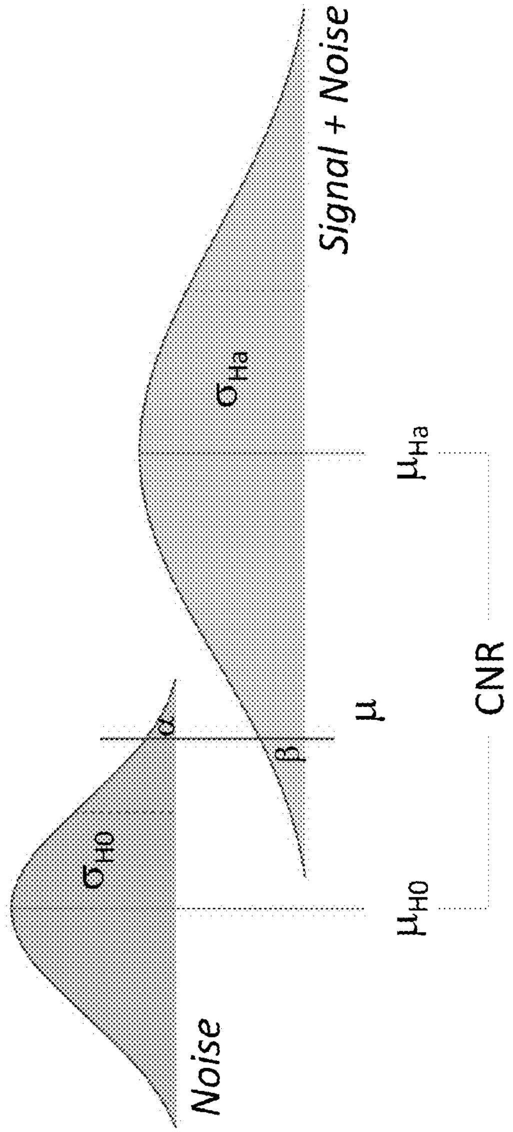
FIG. 56A illustrates one embodiment of probability density functions per bin for noise and a signal with the noise.

FIG. 56A illustrates one embodiment of probability density functions per bin for noise and a signal with the noise. FIG. 56A includes a mean of the noise ($\mu_{H_0}$), a mean of the signal with the noise ($\mu_{H_a}$), a standard deviation of the noise ($\sigma_{H_0}$), a standard deviation of the signal with the noise ($\sigma_{H_a}$), a probability of false detection ($\alpha$), a probability of missed detection ($\beta$), and a carrier-to-noise ratio (CNR). A minimum CNR is determined that satisfies $\alpha$ and $\beta$ given $\sigma_{H_0}$ and $\sigma_{H_a}$. Additionally, given N bins of channel bandwidth (chbw), a number of bins that reject $H_0$ to determine presence of a channel is determined.

In one embodiment, the probability of false detection ($\alpha$) is calculated using the following equation:

$$Pr\{\hat{\mu} = \mu_X | H_0 \cap (X \geq CV)\} = \alpha$$

In one embodiment, the probability of correctly rejecting the noise only hypothesis is equal to the probability of getting as many as s bins with power above the threshold if the noise only hypothesis is true. In one embodiment, the probability of correctly rejecting the noise only hypothesis is calculated using the following equation:

$$Pr\{ABT \leq abt | H_0 \cap NBins = nbins\} = \binom{nbins}{abt}\alpha^{abt}(1-\alpha)^{nbins-abt} \text{ where } abt = \sum_{i=1}^{NBins}(X_i \geq CV)$$

In one embodiment, the CNR is determined as follows:

$$CNR = \frac{\mu_{H_a}}{\mu_{H_0}}$$

In another embodiment, the CNR is determined as follows:

$$CNR = \frac{(\mu_{H_a} - CV)}{(CV - \mu_{H_0})}$$

In one embodiment, $CV=[\mu_{H_0}+\phi(1-\alpha)\sigma_{H_0}]$. The above equation is operable to be substituted as follows:

$$CNR = \frac{(\mu_{H_a} - [\mu_{H_0} + \phi(1-\alpha)\sigma_{H_0}])}{([\mu_{H_0} + \phi(1-\alpha)\sigma_{H_0}] - \mu_{H_0})}$$

The above equation is operable to be substituted as follows:

$$CNR = \frac{(CV + \phi(1-\beta)\sigma_{H_a} - [\mu_{H_0} + \phi(1-\alpha)\sigma_{H_0}])}{([\mu_{H_0} + \phi(1-\alpha)\sigma_{H_0}] - \mu_{H_0})}$$

The above equation is operable to be substituted as follows:

$$CNR = \frac{([\mu_{H_0} + \phi(1-\alpha)\sigma_{H_0}] + \phi(1-\beta)\sigma_{H_a} - [\mu_{H_0} + \phi(1-\alpha)\sigma_{H_0}])}{([\mu_{H_0} + \phi(1-\alpha)\sigma_{H_0}] - \mu_{H_0})}$$

The above equation is operable to be substituted as follows:

$$CNR = \frac{\phi(1-\beta)\sigma_{H_a}}{\phi(1-\alpha)\sigma_{H_0}}$$

In yet another embodiment, the CNR is calculated as follows:

$$CNR = \frac{(s+n)}{n} = \frac{s}{n} + 1 = 10^{SNR\_dB/10} + 1$$

The above equation is operable to be substituted as follows:

$$CNR_{dB} = 10\log_{10}(10^{SNR\_dB/10} + 1)$$

The above equation is operable to be substituted as follows:

$$10^{CNR\_dB/10} = 10^{SNR\_dB/10} + 1$$

The above equation is operable to be substituted as follows:

$$10^{CNR\_dB/10} - 1 = 10^{SNR\_dB/10}$$

The above equation is operable to be substituted as follows:

$$10\log_{10}(10^{CNR\_dB/10} - 1)[\text{dB}] = 10\log_{10}(10^{SNR\_dB/10}) = SNR[\text{dB}]$$

The above equation is operable to be substituted as follows:

$$10\hat{\ }(10\log_{10}(10^{CNR\_dB/10} - 1)) = SNR[\text{mW}]$$

Figure 56B:
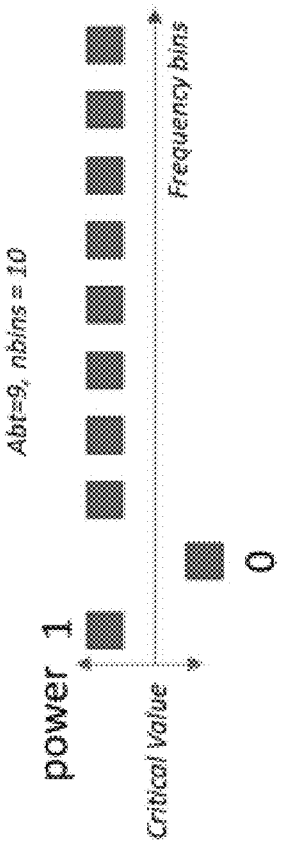
FIG. 56B illustrates an example of a plurality of frequency bins and a critical value or threshold.

FIG. 56B illustrates an example of a plurality of frequency bins and a critical value or threshold. In one embodiment, a frequency bin is assigned a value of "1" if it is above the critical value or threshold and a value of "0" if it is below the critical value or threshold. In the example shown in FIG. 56B, nine frequency bins are assigned a value of "1" and one frequency bin is assigned a value of "0."

Figure 56C:
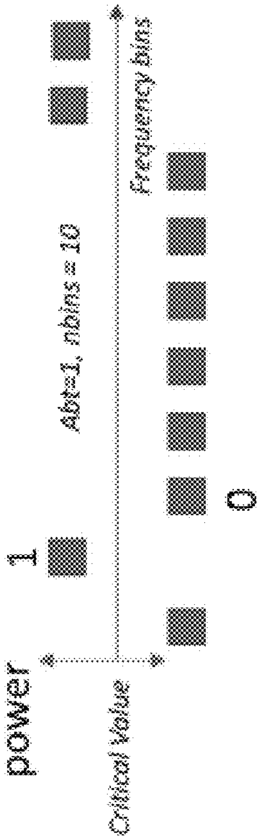
FIG. 56C illustrates another example of a plurality of frequency bins and a critical value or threshold.

FIG. 56C illustrates another example of a plurality of frequency bins and a critical value or threshold. In the example shown in FIG. 56C, three frequency bins are assigned a value of "1" and seven frequency bins are assigned a value of "0."

Figure 57A:
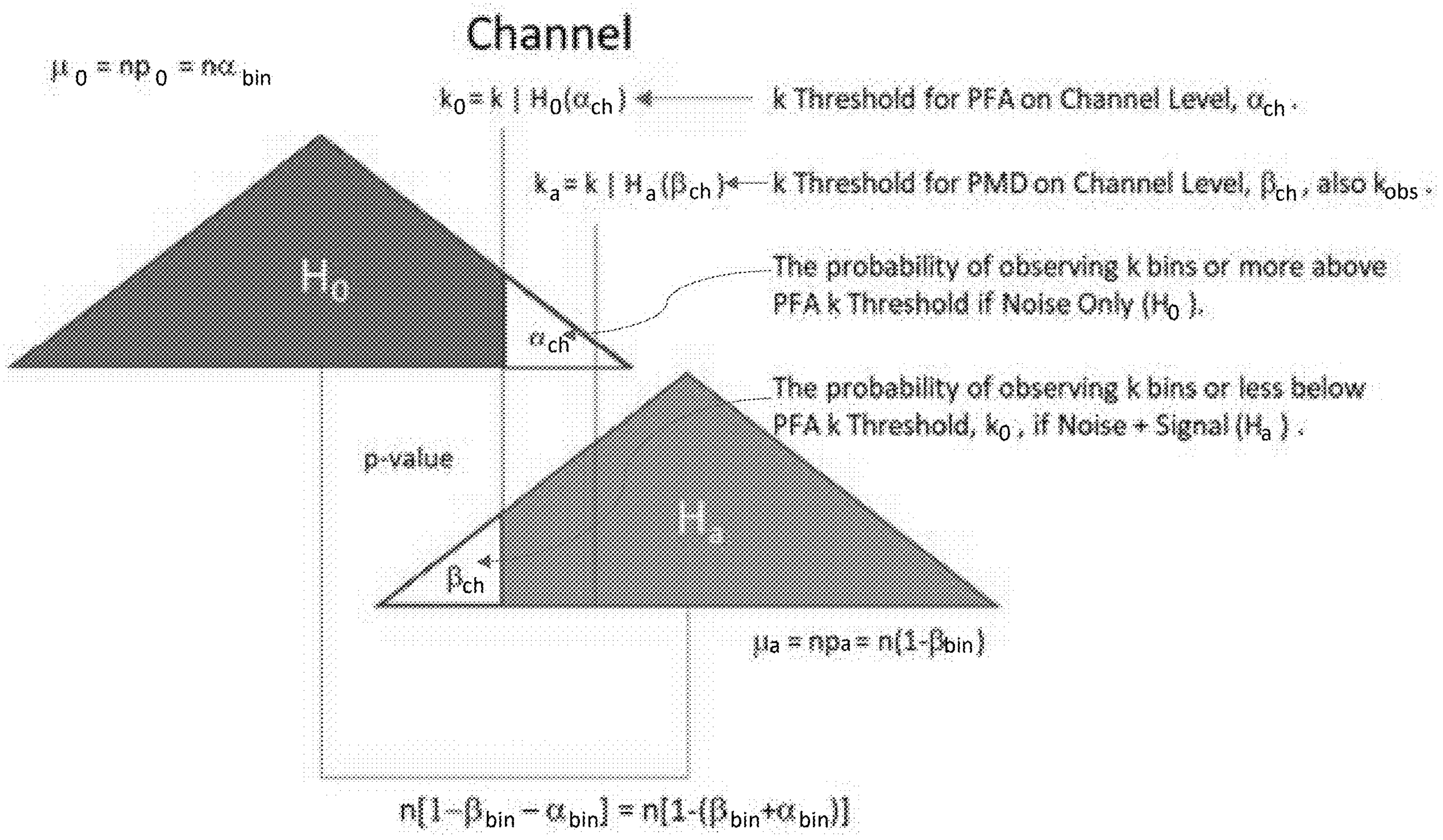
FIG. 57A illustrates one example of probability on the channel level.

FIG. 57A illustrates one example of probability on the channel level. In one embodiment, the system is operable to determine $H_0$, which is the hypothesis that the set of bins contains noise only. In one embodiment, the system is operable to determine Ha, which is the hypothesis that the set of bins contains noise plus signal, making a possible channel. In one embodiment, the system is operable to calculate a threshold for the probability of false alarm ($k_0$) on the channel level ($\alpha_{ch}$). In one embodiment, $k_0$ is calculated as follows:

$$k_0 = k \mid H_0(\alpha_{ch})$$

In one embodiment, the system is operable to calculate a threshold for the probability of missed detection ($k_a$) on the channel level ($\beta_{ch}$). In one embodiment, $k_a$ is equal to $k_{obs}$. In one embodiment, $k_a$ is calculated as follows:

$$k_a = k \mid H_0(\beta_{ch})$$

In one embodiment, the system is operable to select a $prob_{min}$, $\alpha_{ch}$, and $\beta_{ch}$ (e.g., via manual input). In one embodiment, the $prob_{min}$, the $\alpha_{ch}$, and the $\beta_{ch}$ are set manually based on desired goals. For example, and not limitation, in one embodiment, the probability of false alarm for a channel is set at <5% and the probability of missed detection for a channel is set at <5%. In one embodiment, the system is operable to determine $k_0$ given n bins, $\alpha_{ch}$, and $\alpha_{bn}$. In one embodiment, the system is operable to determine $\beta_{ch}$.

Figure 57B:
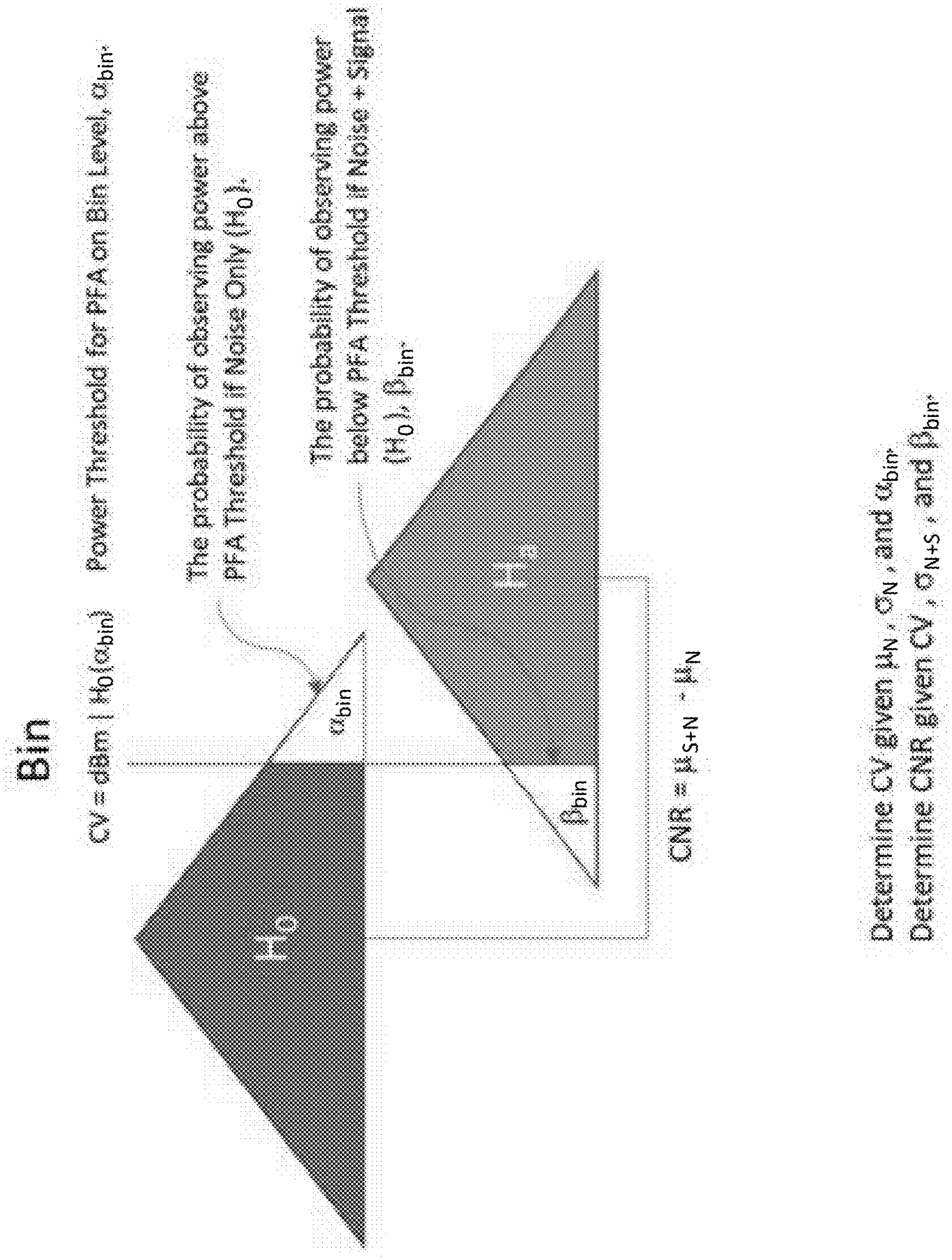
FIG. 57B illustrates one example of probability on the bin level.

FIG. 57B illustrates one example of probability on the bin level. In one embodiment, a power threshold for the probability of false alarm on the bin level is calculated. In one embodiment, the channelization vector is calculated using the following equation:

$$CV = \text{dBm}/H_0(\alpha_{bin})$$

Figure 58A:
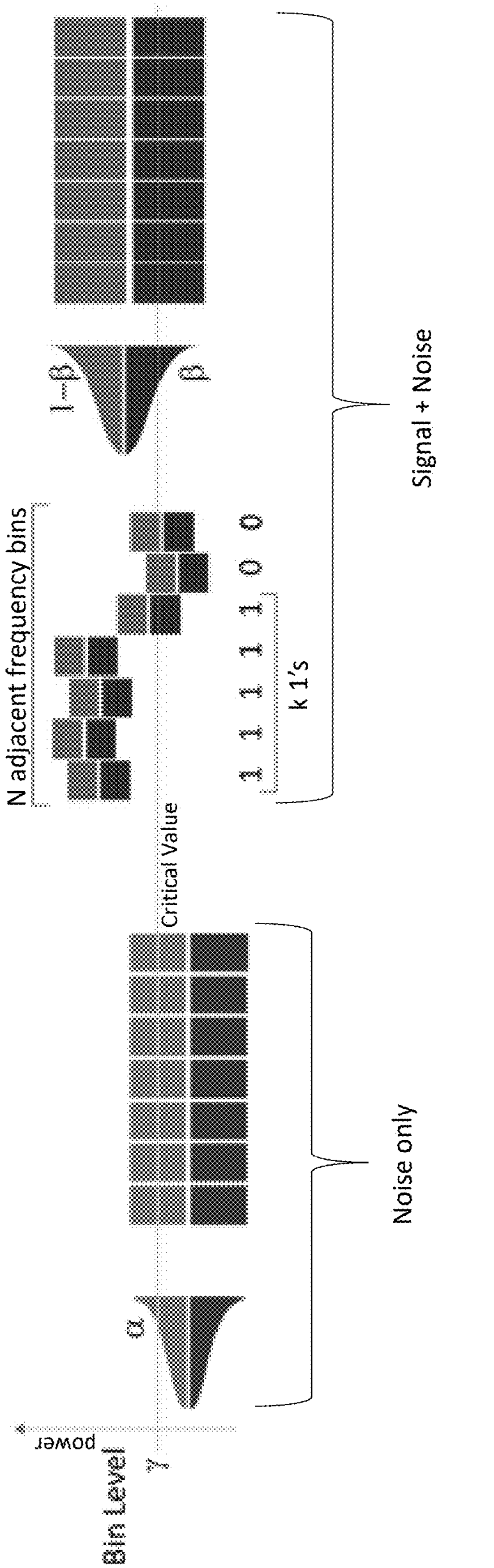
FIG. 58A illustrates an example showing a critical value (Y), power levels of a noise signal, and power levels of a signal with noise.

FIG. 58A illustrates an example showing a critical value (γ), power levels of a noise signal, and power levels of a signal with noise. In the example shown in FIG. 58A, the received noise mean and variance is estimated. The noise power is assumed to be Gaussian and independent and identically distributed. The probability of false alarm at the bin level (α) is specified. The critical value is set accordingly. The received mean and variance is measured, and the signal is placed into N adjacent frequency bins. The signal with noise power is also assumed to be Gaussian and independent and identically distributed. The probability of missed detection at the bin level (β) is determined with respect to the critical value.

Figure 58B:
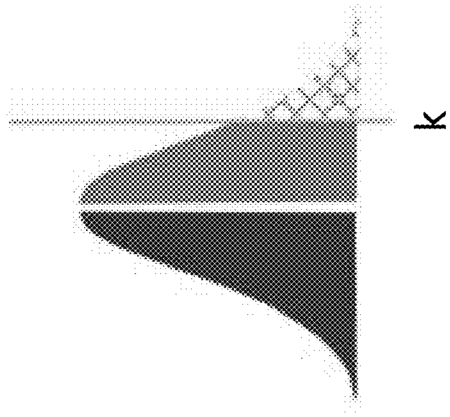
FIG. 58B illustrates an example of the probability of false alarm for a noise signal.

FIG. 58B illustrates an example of the probability of false alarm for a noise signal.

Figure 58C:
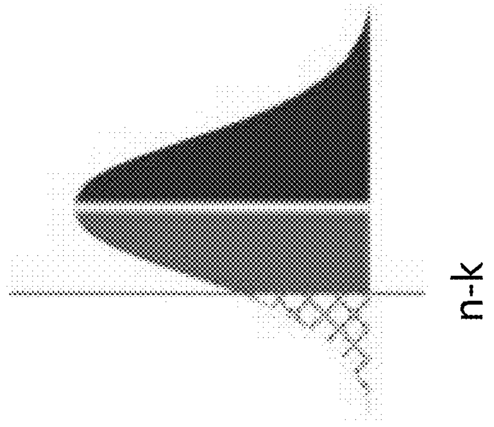
FIG. 58C illustrates an example of the probability of missed detection for a signal with noise.

FIG. 58C illustrates an example of the probability of missed detection for a signal with noise.

Figure 59:
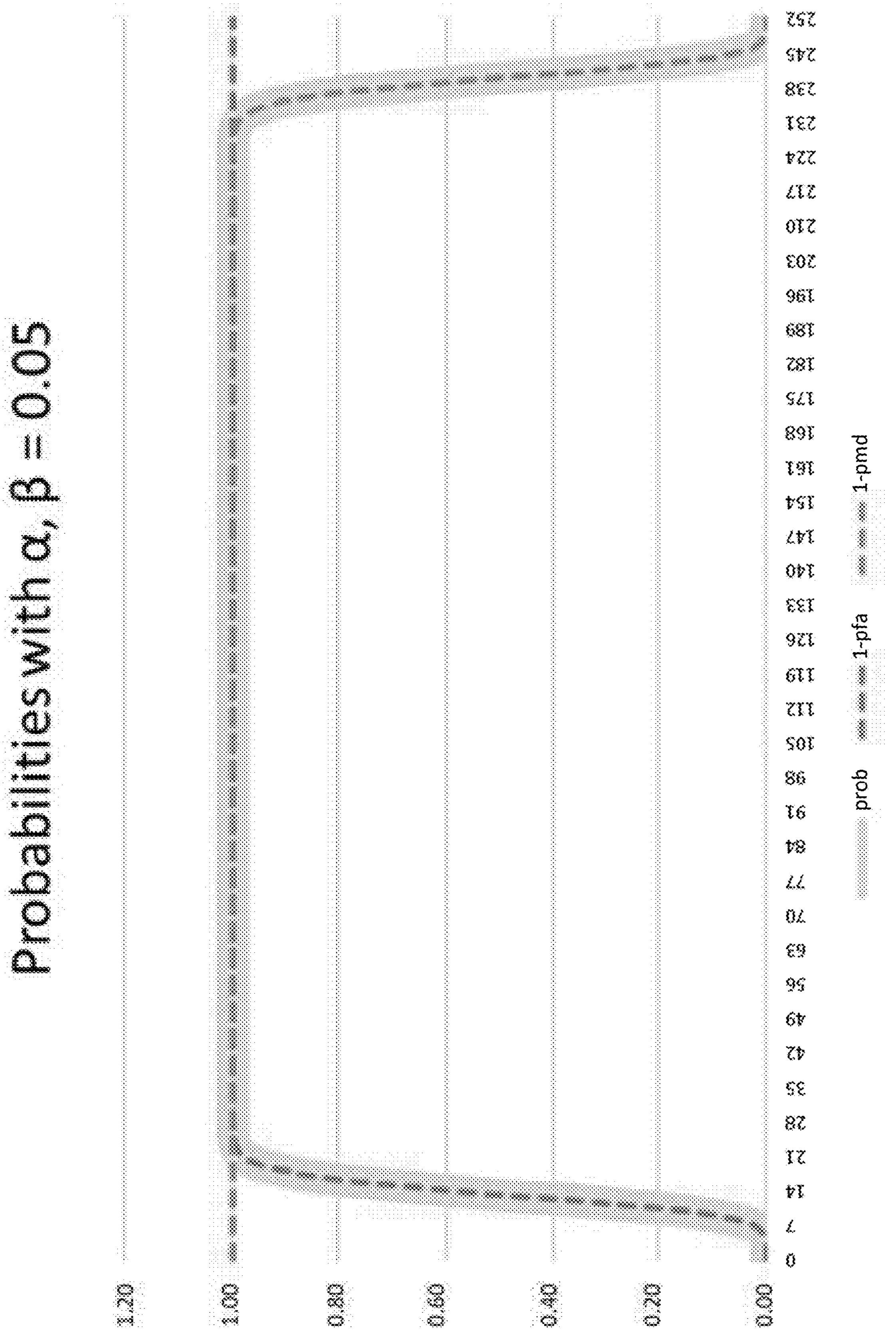
FIG. 59 illustrates one example of probabilities.

FIG. 59 illustrates one example of probabilities. In the example shown in FIG. 59, the probability of false detection (α) is equal to 0.05 and the probability of missed detection (β) is equal to 0.05. The probability of channel presence is estimated as follows when the probability of false detection and the probability of missed detection are small:

$$\text{probability of channel presence} = [1 - (\alpha + \beta)]$$

Thus, for α=0.05 and β=0.05, the probability of channel presence=0.9.

Figure 60:
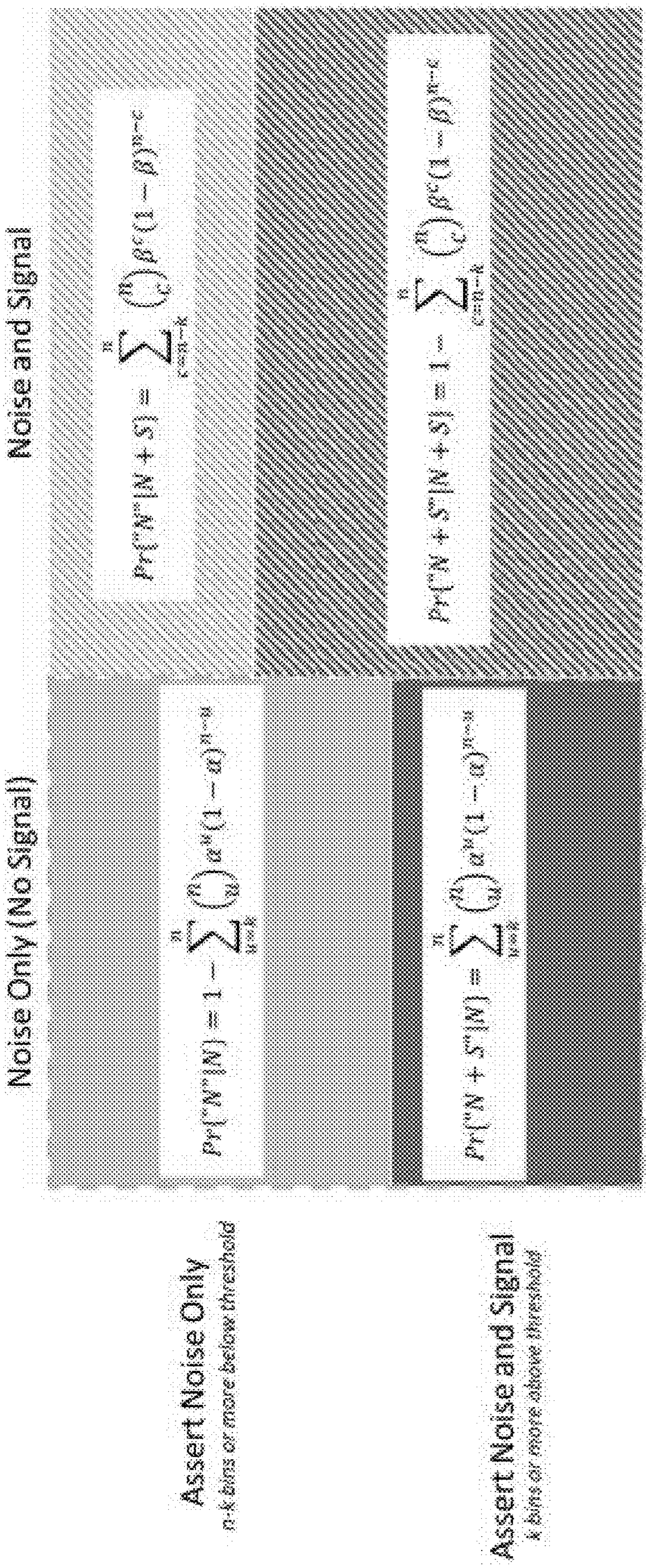
FIG. 60 illustrates an example of equations for hypothesis testing with channels for the following scenarios: (1) Noise Only (No Signal), Assert Noise Only, (2) Noise Only (No Signal), Assert Noise and Signal, (3) Noise and Signal, Assert Noise Only, and (4) Noise and Signal, Assert Noise and Signal.

FIG. 60 illustrates an example of equations for hypothesis testing with channels for the following scenarios: (1) Noise Only (No Signal), Assert Noise Only, (2) Noise Only (No Signal), Assert Noise and Signal, (3) Noise and Signal, Assert Noise Only, and (4) Noise and Signal, Assert Noise and Signal. Assert Noise Only is used when n-k bins or more below the threshold. Assert Noise and Signal is used when k bins or more are above the threshold.

In one embodiment, Noise Only (No Signal), Assert Noise Only uses the following equation:

$$Pr\{\text{"}N\text{"} \mid N\} = 1 - \sum_{u=k}^{n} \binom{n}{u} \alpha^u (1-\alpha)^{n-u}$$

In one embodiment, Noise Only (No Signal), Assert Noise and Signal uses the following equation:

$$Pr\{\text{"}N+S\text{"} \mid N\} = \sum_{u=k}^{n} \binom{n}{u} \alpha^u (1-\alpha)^{n-u}$$

In one embodiment, Noise and Signal, Assert Noise Only uses the following equation:

$$Pr\{\text{"}N\text{"} \mid N+S\} = \sum_{c=n-k}^{n} \binom{n}{c} \beta^c (1-\beta)^{n-c}$$

In one embodiment, Noise and Signal, Assert Noise and Signal uses the following equation:

$$Pr\{\text{"}N+S\text{"} \mid N+S\} = 1 - \sum_{c=n-k}^{n} \binom{n}{c} \beta^c (1-\beta)^{n-c}$$

Figure 61:
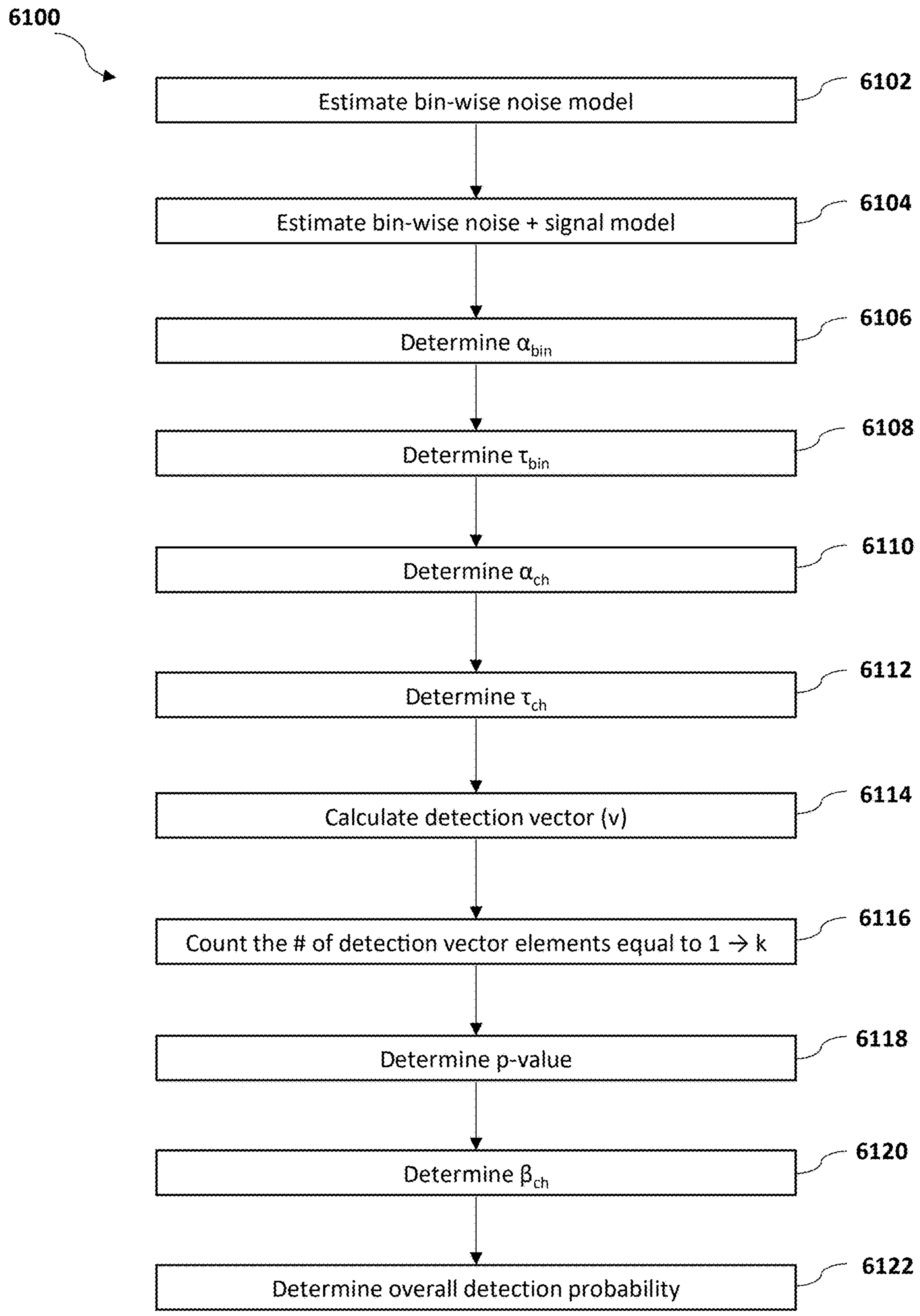
FIG. 61 illustrates one example of an algorithm used in a channelizer.

FIG. 61 illustrates one example of an algorithm used in a channelizer. The algorithm 6100 includes estimating the bin-wise noise model 6102. In one embodiment, the bin-wise noise model is obtained from a noise floor estimator. In one embodiment, the bin-wise noise model is calculated using the following equation:

$$H_0 = \mathcal{N}(\mu_N, \sigma_N^2)$$

The algorithm 6100 includes estimating the bin-wise noise model 6104. In one embodiment, the bin-wise noise and signal model is obtained from the FFT or block FFT. In one embodiment, the bin-wise noise and signal model is calculated using the following equation:

$$H_a = \mathcal{N}(\mu_{NS}, \sigma_{NS}^2)$$

The algorithm 6100 includes determining a bin-level probability of false alarm ($P_{FA}=\alpha_{bin}$) 6106. The algorithm 6100 further includes determining a bin-level threshold 6108. In one embodiment, the bin-level threshold is calculated using the following equation:

$$\tau_{bin} = Q^{-1}(\alpha_{bin} \mid H_0)$$

where Q(·) is the complementary error function (ERFC) for Gaussian distributions.

The algorithm 6100 includes determining a channel-level probability of false alarm ($a_{chan}$) 6110. The algorithm 6100 further includes determining a channel-level threshold 6112. In one embodiment, the channel-level threshold is calculated using the following equation:

$$\tau_{chan} = Q^{-1}(\alpha_{chan} \mid [H_0, n, \alpha_{bin}])$$

The algorithm 6100 includes calculating a detection vector (v) 6114. In one embodiment, an element of the detection vector is calculated as follows:

$$= \begin{cases} 0, & \text{if } x_i < \tau_{bin} \\ 1, & \text{if } x_i \geq \tau_{bin} \end{cases}$$

The algorithm 6100 includes counting the number of detection vector elements equal to 1 and comparing to k 6116. The algorithm 6100 further includes determining the p-value 6118, where the p-value is the probability of false alarm. In one embodiment, the p-value is calculated using the following equation:

$$\text{p-value} = 1 - \sum_{i=0}^{k} \binom{n}{i} \alpha_{bin}^{i} (1-\alpha_{bin})^{n-i} + \binom{n}{k} \alpha_{bin}^{k} (1-\alpha_{bin})^{n-k}$$

The algorithm 6100 includes determining the probability of missed detection ($\beta_{chan}$) 6120. In one embodiment, the probability of missed detection is calculated using the following equation:

$$P_{MD} = \beta_{chan} = \phi(H_a, n, \tau_{chan}, \alpha_{bin}) = \sum_{i=0}^{\tau_{chan}} \binom{n}{i} \alpha^i (1-\alpha)^{n-i}$$

The algorithm 6100 includes determining the overall detection probability 6122. In one embodiment, the overall detection probability is calculated using the following equation:

$$\text{probability} = (1 - P_{FA})(1 - P_{MD})$$

Figure 62A:
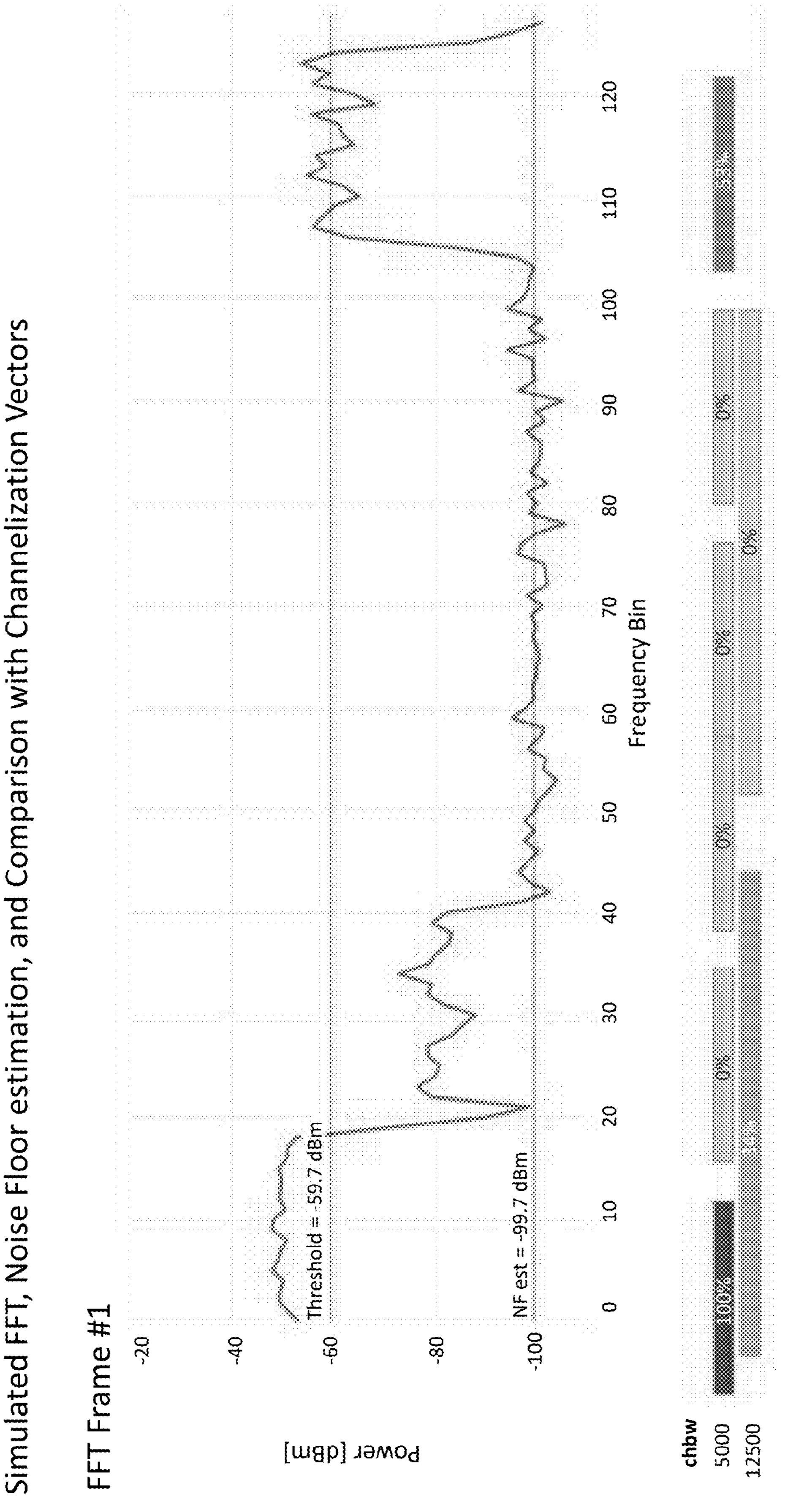
FIG. 62A illustrates one example of a simulated fast Fourier transform (FFT), noise floor estimation, and comparison with channelization vectors.

FIGS. 62A-62G illustrate examples of information provided in at least one graphical user interface (GUI). FIG. 62A illustrates one example of a simulated FFT, noise floor estimation, and comparison with channelization vectors. In the example shown in FIG. 62A, FFT Frame #1 has a threshold of −59.7 dBm and a noise floor estimate of −99.7 dBm.

Figure 62B:
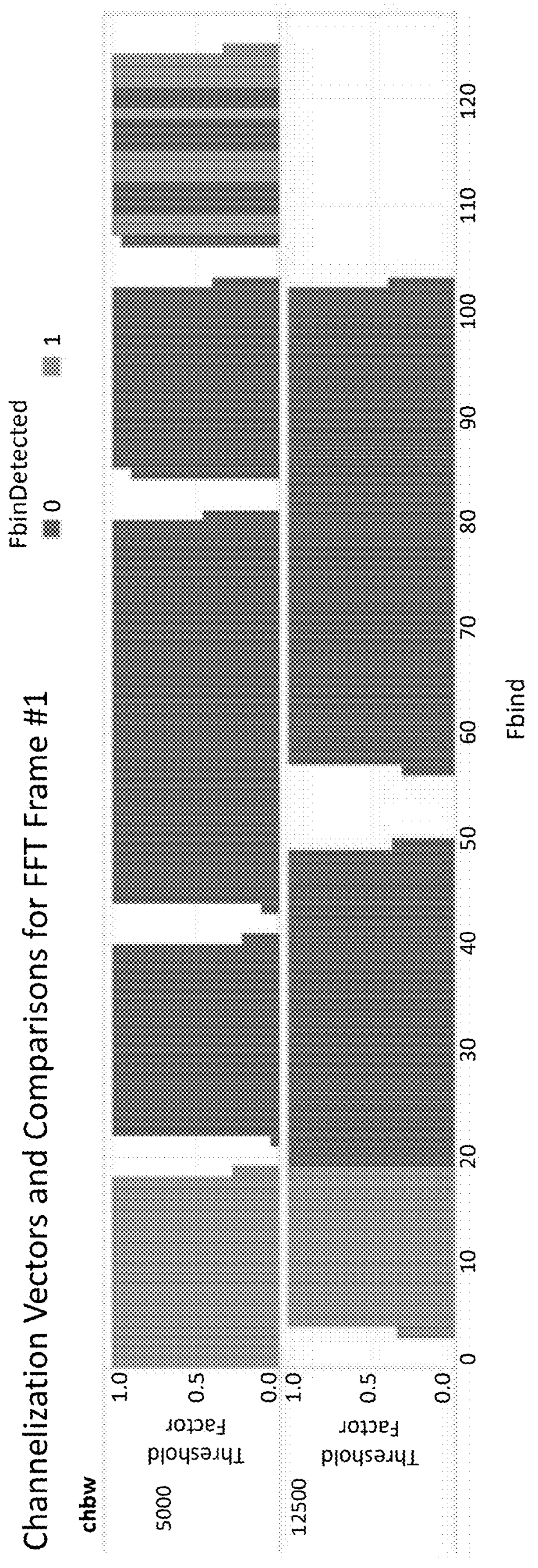
FIG. 62B illustrates channelization vectors and comparisons for the FFT frame shown in FIG. 62A.

FIG. 62B illustrates channelization vectors and comparisons for the FFT frame shown in FIG. 62A. A smaller channel bandwidth leads to a higher probability of detection than a larger channel bandwidth. The smaller channel bandwidth has a probability of 100% in the lower frequency bins and a probability of 53% in the higher frequency bins for the signal above the threshold. The larger channel bandwidth has a probability of 34% in the lower frequency bins.

Figure 62C:
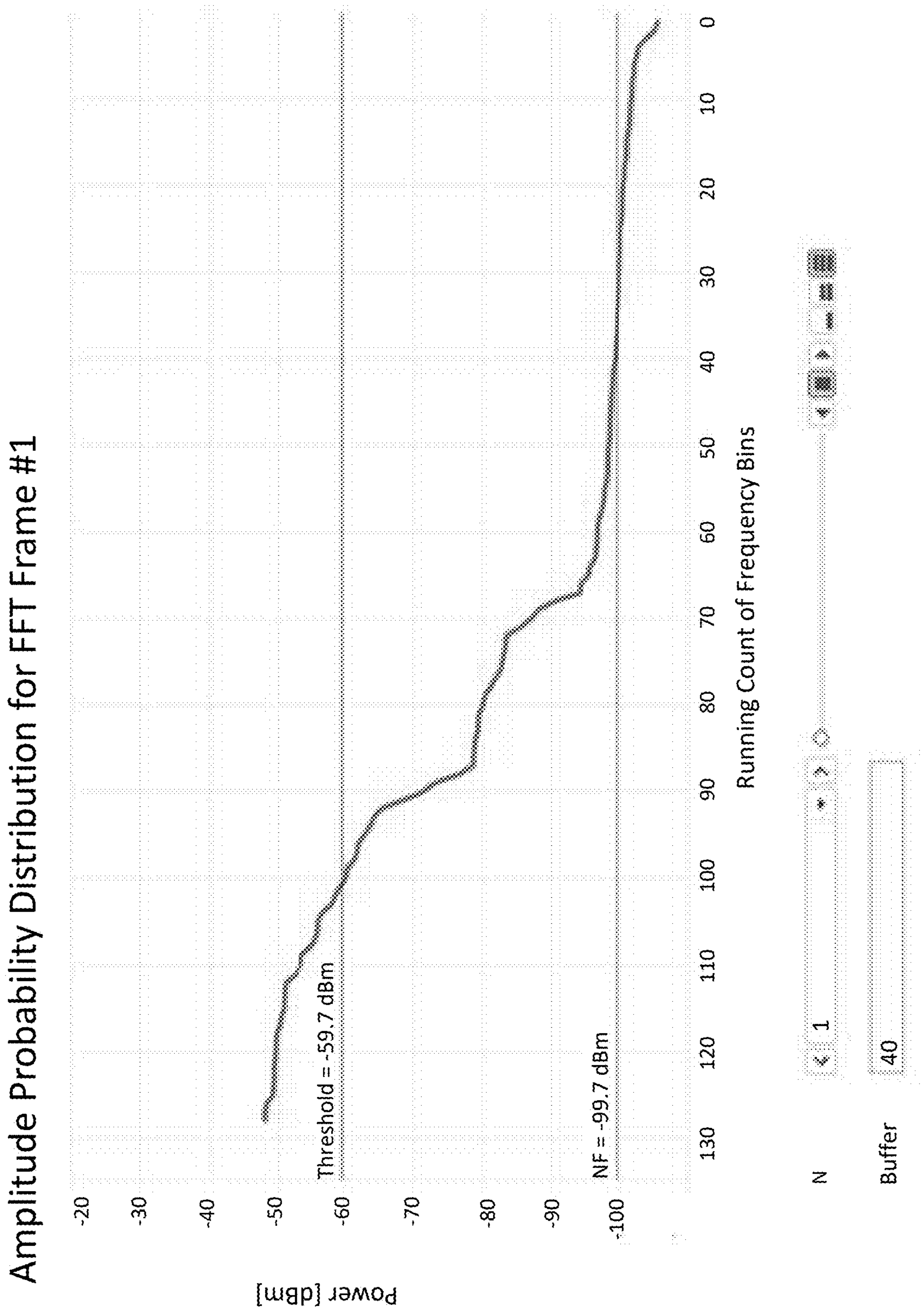
FIG. 62C illustrates amplitude probability distribution for the FFT frame shown in FIG. 62A.

FIG. 62C illustrates amplitude probability distribution for the FFT frame shown in FIG. 62A.

Figure 62D:
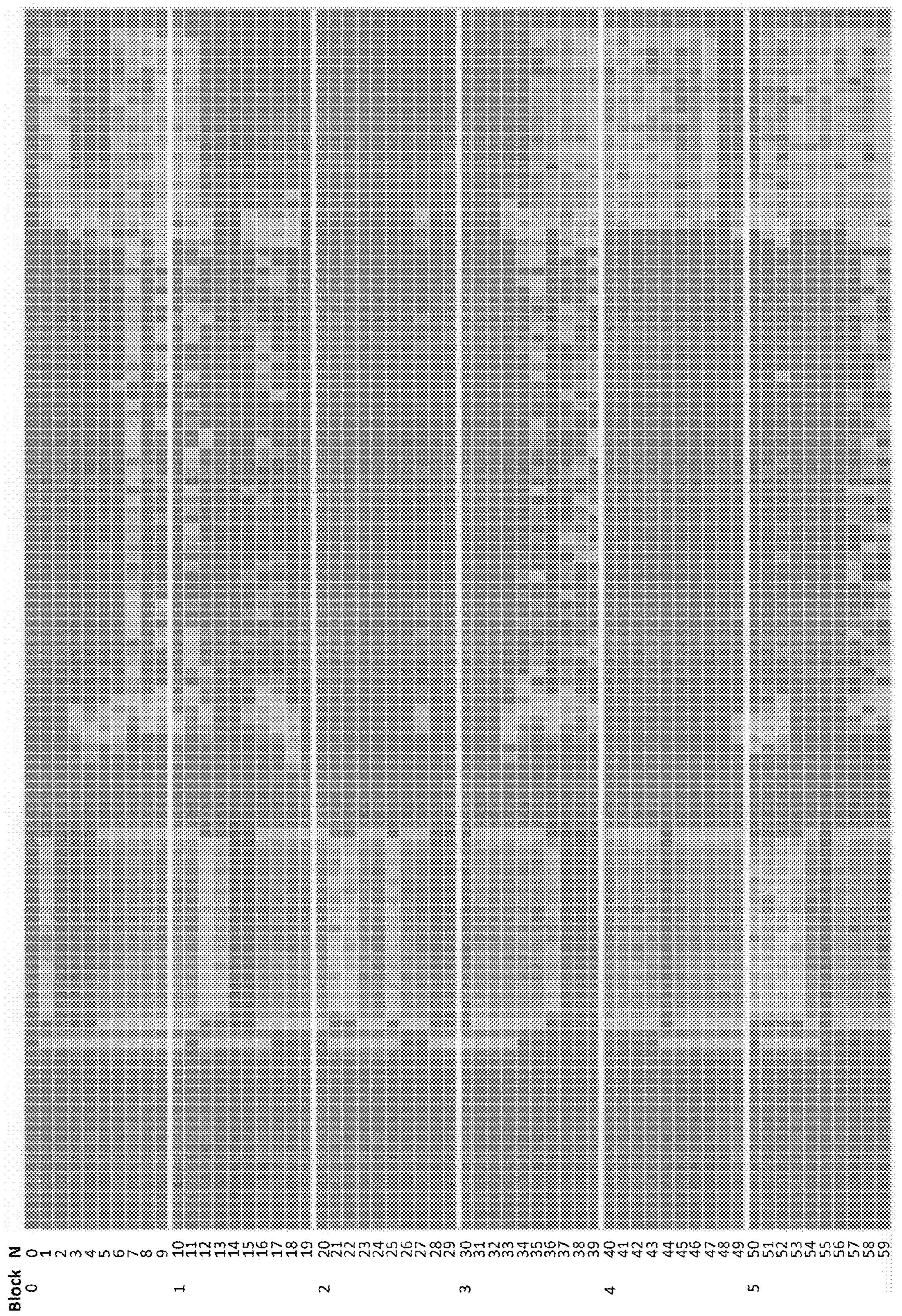
FIG. 62D illustrates FFT frames grouped by block for the FFT frame shown in FIG. 62A.

FIG. 62D illustrates FFT frames grouped by block for the FFT frame shown in FIG. 62A.

Figure 62E:
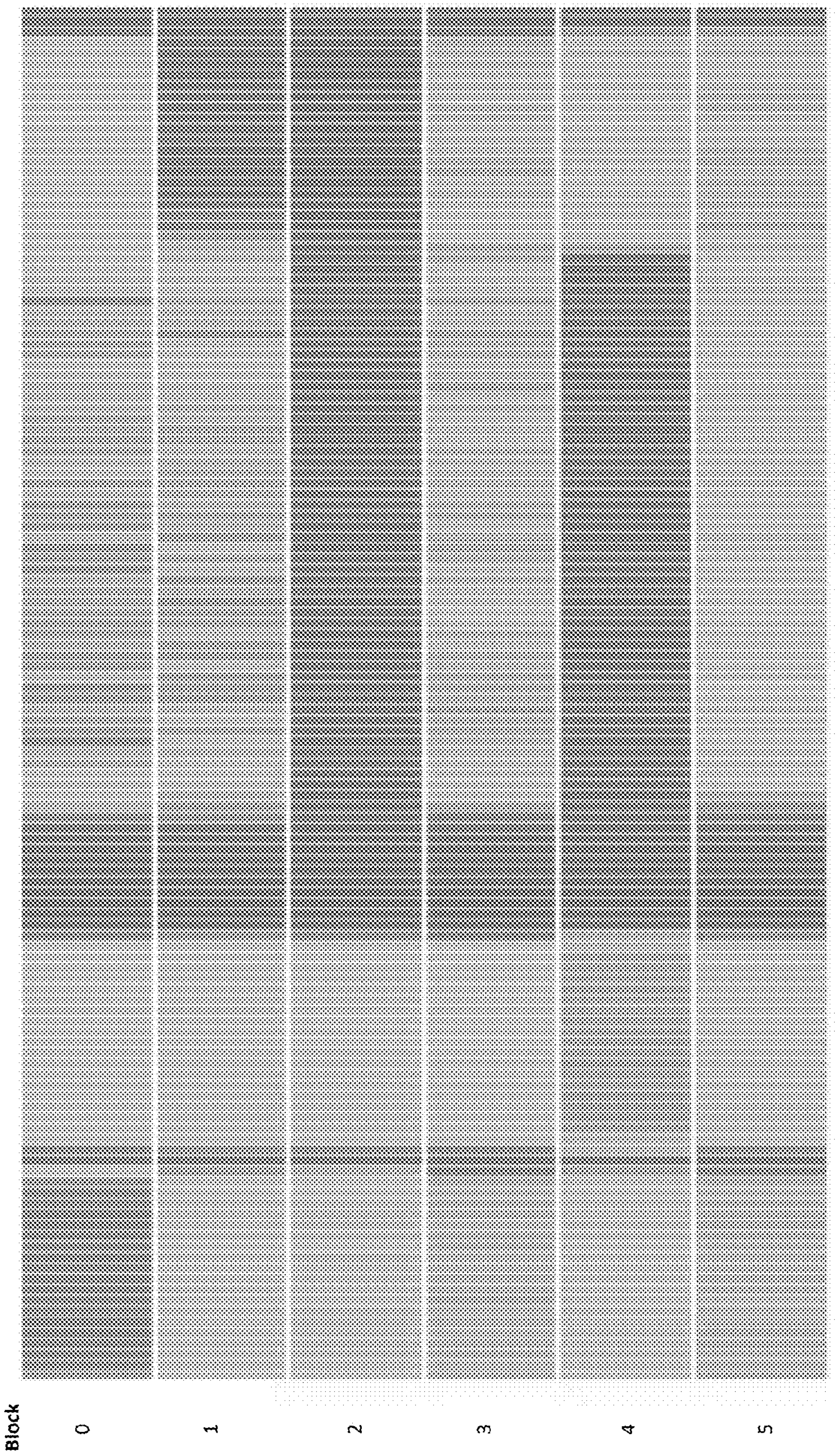
FIG. 62E illustrates average power FFT by block for the FFT frame shown in FIG. 62A.

FIG. 62E illustrates average power FFT by block for the FFT frame shown in FIG. 62A.

Figure 62F:
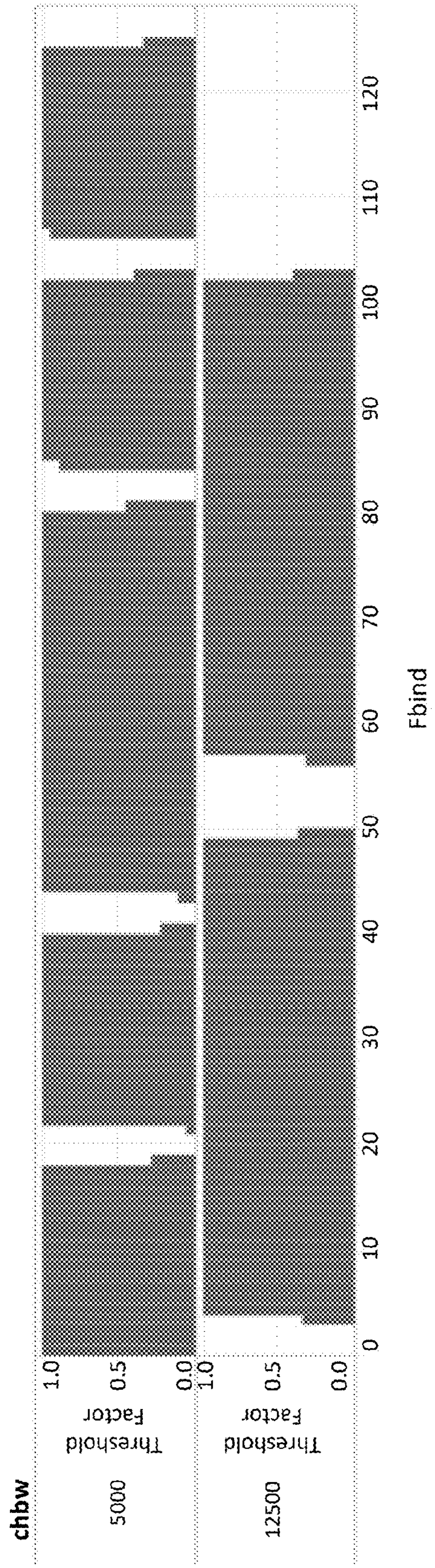
FIG. 62F illustrates the channelization vectors for the FFT frame shown in FIG. 62A. The x-axis indicates the frequency of the bin.

FIG. 62F illustrates the channelization vectors for the FFT frame shown in FIG. 62A. The x-axis indicates the frequency of the bin.

Figure 62G:
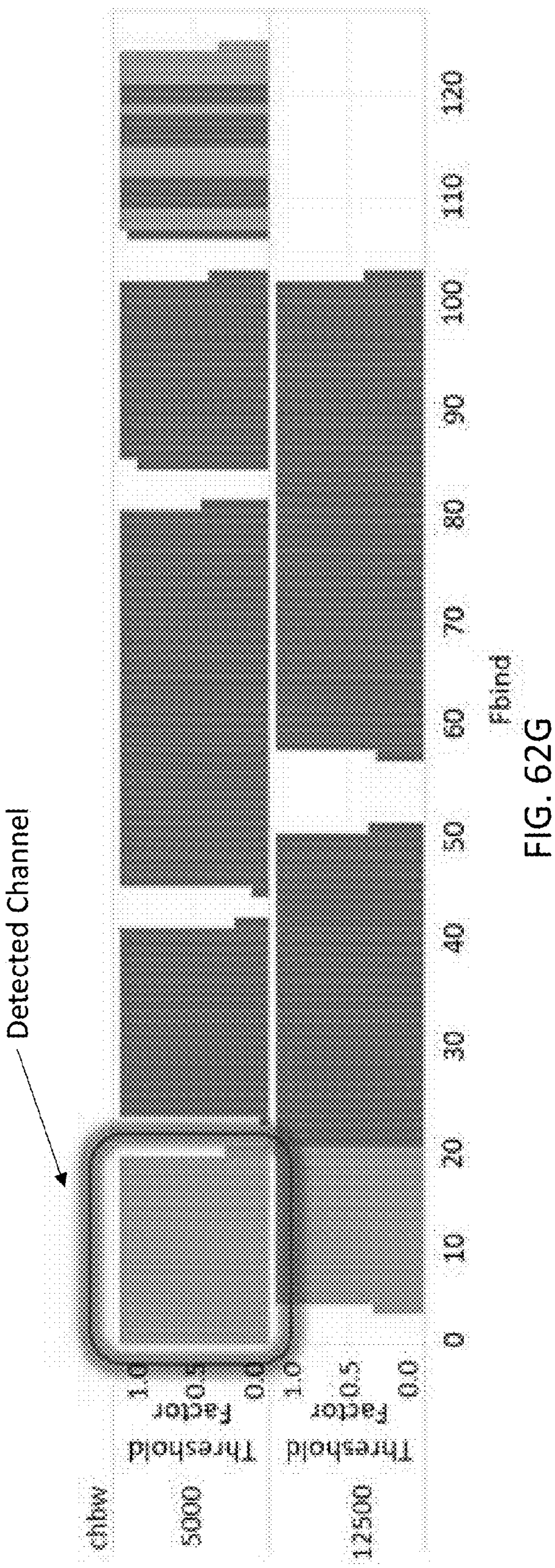
FIG. 62G illustrates the comparison vectors for the FFT frame shown in FIG. 62A.

FIG. 62G illustrates the comparison vectors for the FFT frame shown in FIG. 62A.

Figure 63A:
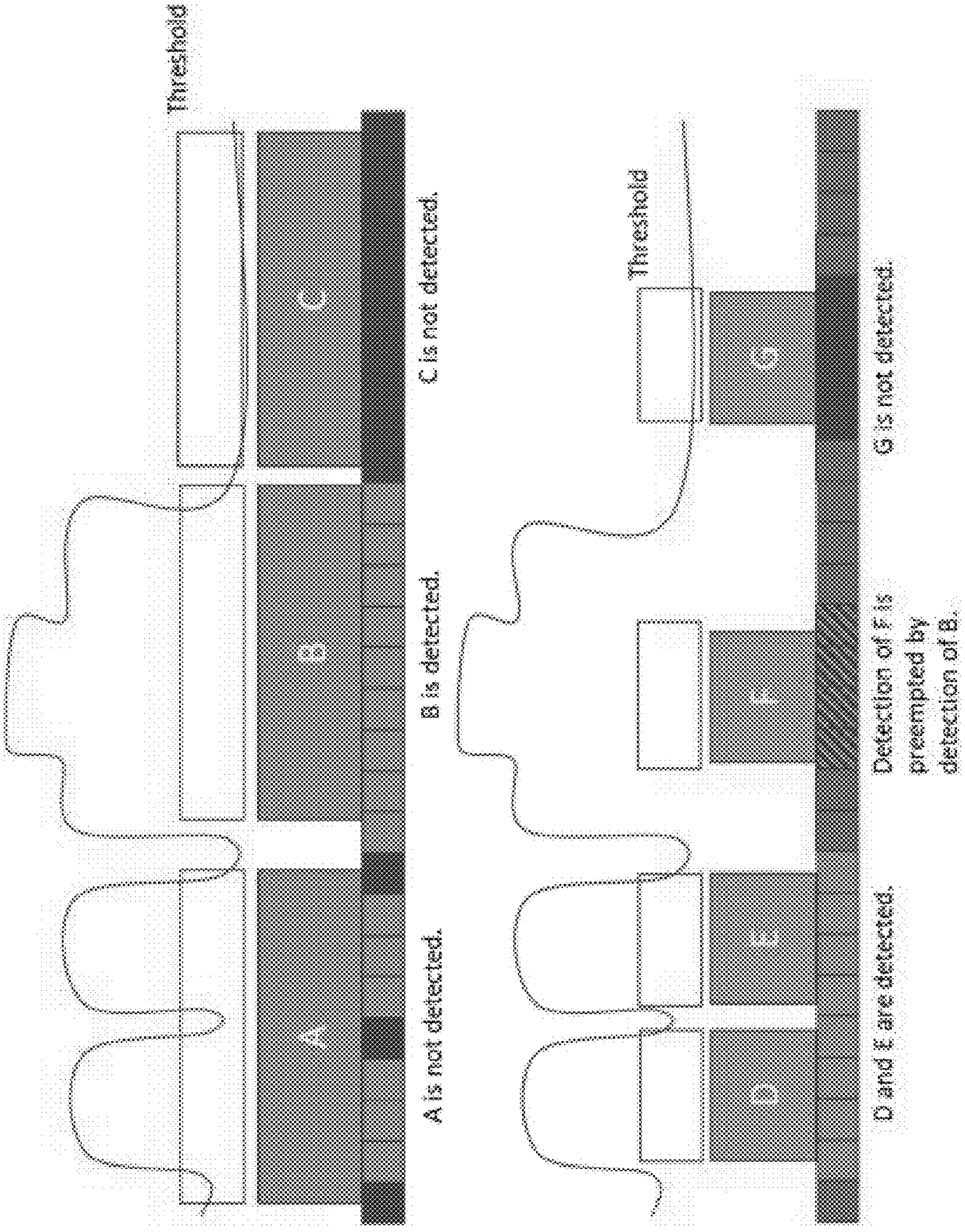
FIG. 63A illustrates one embodiment of preemption by wideband detection.

FIG. 63A illustrates one embodiment of preemption by wideband detection. In one embodiment, the system determines which narrowband channels are proper subsets of wideband channels. In one embodiment, this is recursive across multiple layers. In one embodiment, the FFT is compared to wideband channels after narrowband channels. In one embodiment, if the minimum threshold for detection is satisfied for a channel, that channel is considered detected. In one embodiment, detection of narrowband channels that are proper subsets of wideband channels is preempted. In the example shown in FIG. 63A, channels D, E, and B are detected, and channels A, F, C, and G are not detected. Detection of channel F is preempted by detection of B.

Figure 63B:
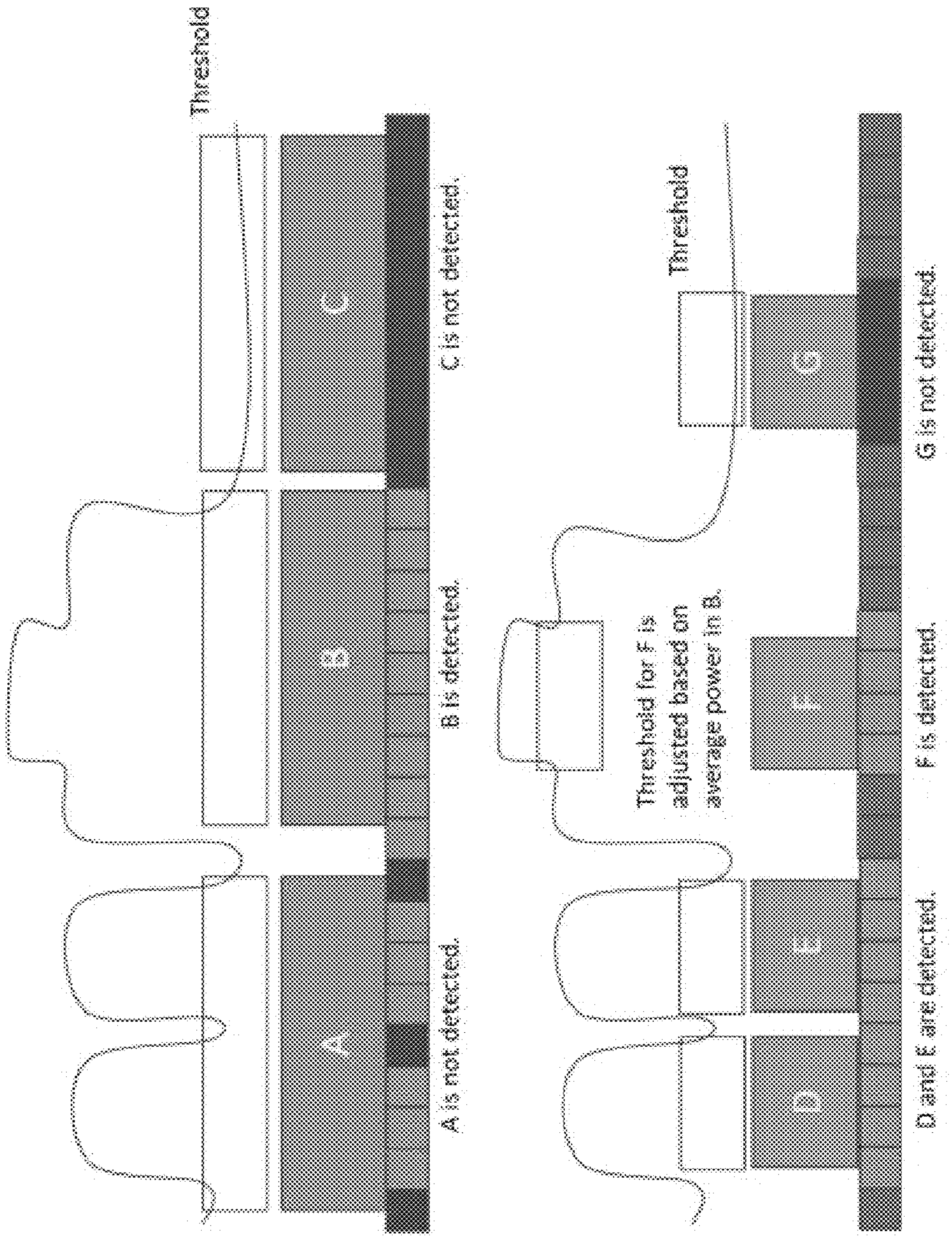
FIG. 63B illustrates the example shown in FIG. 63A accounting for wideband detection.

FIG. 63B illustrates the example shown in FIG. 63A accounting for wideband detection. In one embodiment, the system determines which narrowband channels are proper subsets of wideband channels. In one embodiment, this is recursive across multiple layers. In one embodiment, the FFT is compared to wideband channels after narrowband channels. In one embodiment, if the minimum threshold for detection is satisfied for a channel, that channel is considered detected. In the embodiment shown in FIG. 63B, the average power of the wideband channel is subtracted from the power observed in the FFT slice within the narrowband channel. Alternatively, the bin-level threshold is adjusted. In one embodiment, if the minimum threshold for detection is satisfied for the adjusted narrowband channel, it is considered detected. In the example shown in FIG. 63B, channels D, E, B, and F are detected, and channels A, C, and G are not detected.

Figure 64:
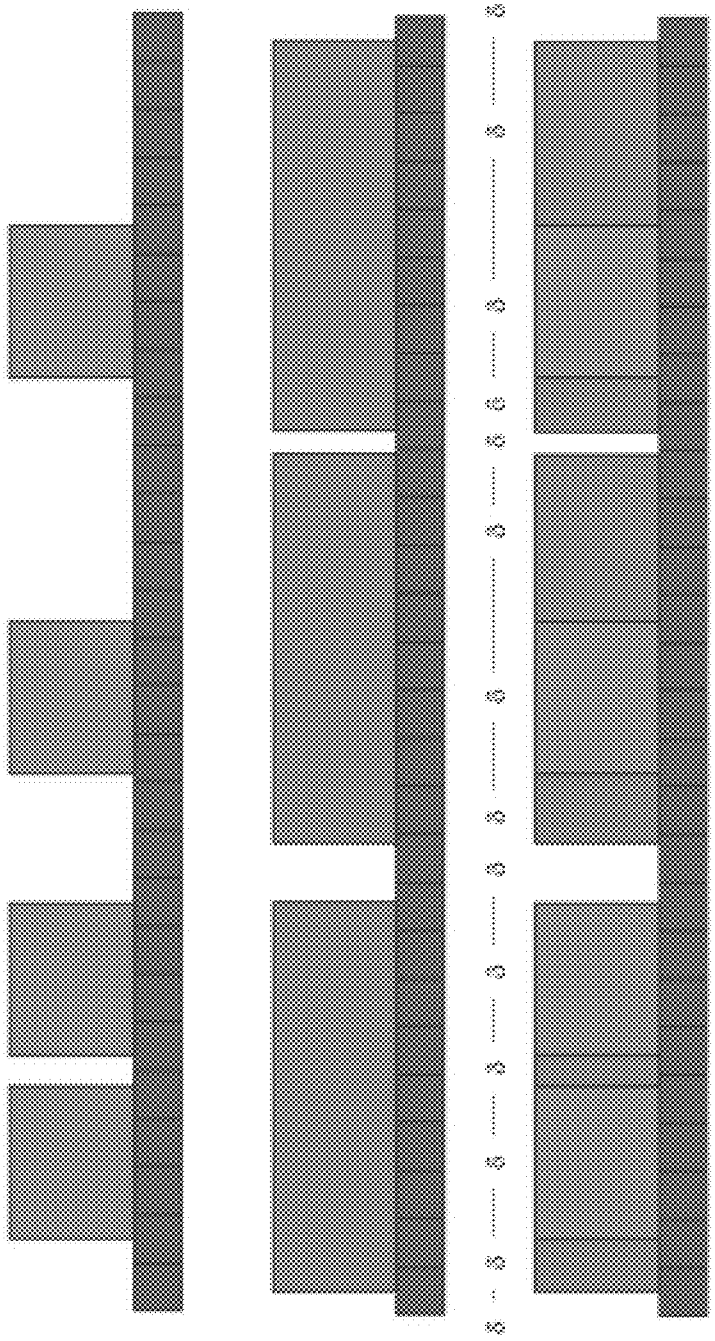
FIG. 64 illustrates one embodiment of maximum resolution bandwidth (RBW) for vector resolution.

FIG. 64 illustrates one embodiment of maximum resolution bandwidth (RBW) for vector resolution. The maximum RBW is greatest common factor of all spacings (δ) from all channels and of the span. A deference matrix is operable to be created showing which overlapping channels, if both individually detected, take precedence in an either-or detection scheme. In one embodiment, it is also possible to detect both channels with varying levels of likelihood.

Figure 65A:
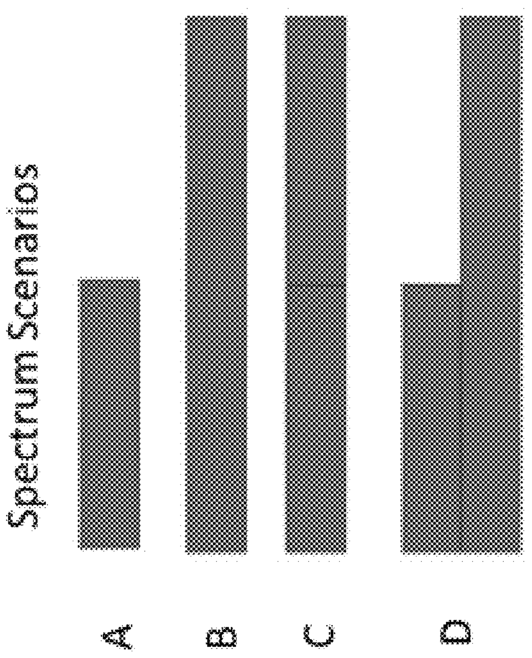
FIG. 65A illustrates one example of a spectrum scenario.

FIG. 65A illustrates one example of a spectrum scenario. The set includes 0 and/or 1. That is, S={0,1}. The number of permutations is equal to $2^N$, where N is the number of bins. For example, if the number of bins is 50, the number of permutations is equal to 250. If the number of bins is 100, the number of permutations is equal to $2^{100}$.

Figure 65B:
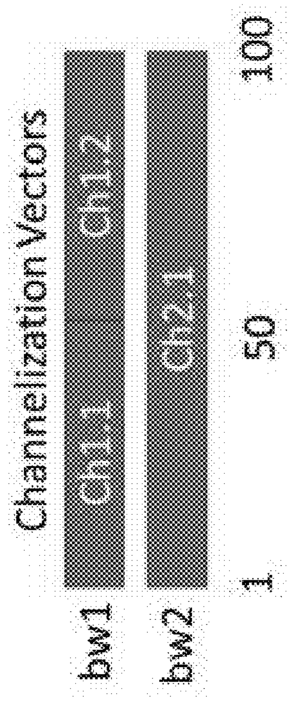
FIG. 65B illustrates an embodiment of channelization vectors.

FIG. 65B illustrates an embodiment of channelization vectors. In one embodiment, the channelization vector includes a smaller bandwidth (bw1), resulting in two channels (channel 1.1 and channel 1.2). In another embodiment, the channelization vector includes one channel (channel 2.1).

Figure 66A:
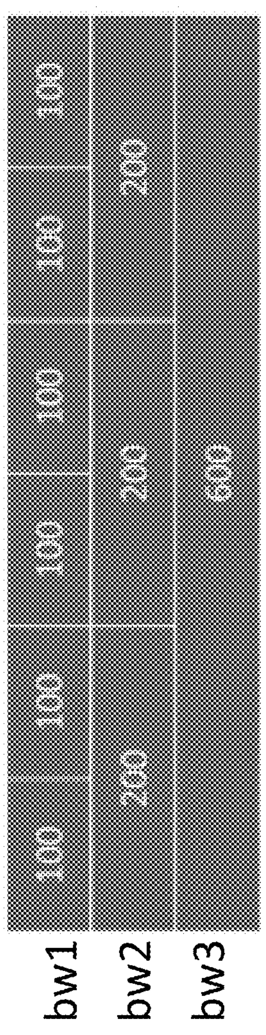
FIG. 66A illustrates one example of bandwidth selection.

FIG. 66A illustrates one example of bandwidth selection. In the example shown in FIG. 66A, bandwidth 1 (bw1) is 100 bins, bandwidth 2 (bw2) is 200 bins, and bandwidth 3 (bw3) is 600 bins.

Figure 66B:
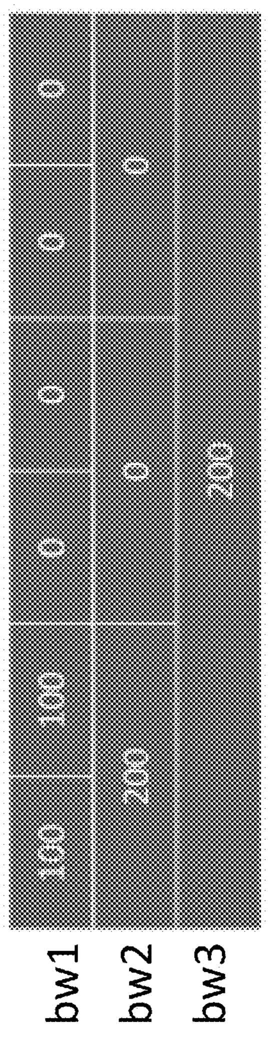
FIG. 66B illustrates an example using the bandwidth selection in FIG. 66A.

FIG. 66B illustrates an example using the bandwidth selection in FIG. 66A. In the example shown in FIG. 66B, the first two channels detect a signal in bw1, the first channel detects a signal in bw2, and the channel only detects a signal in ⅓ of bw3. Therefore, no signal is detected in bw3.

Figure 67A:
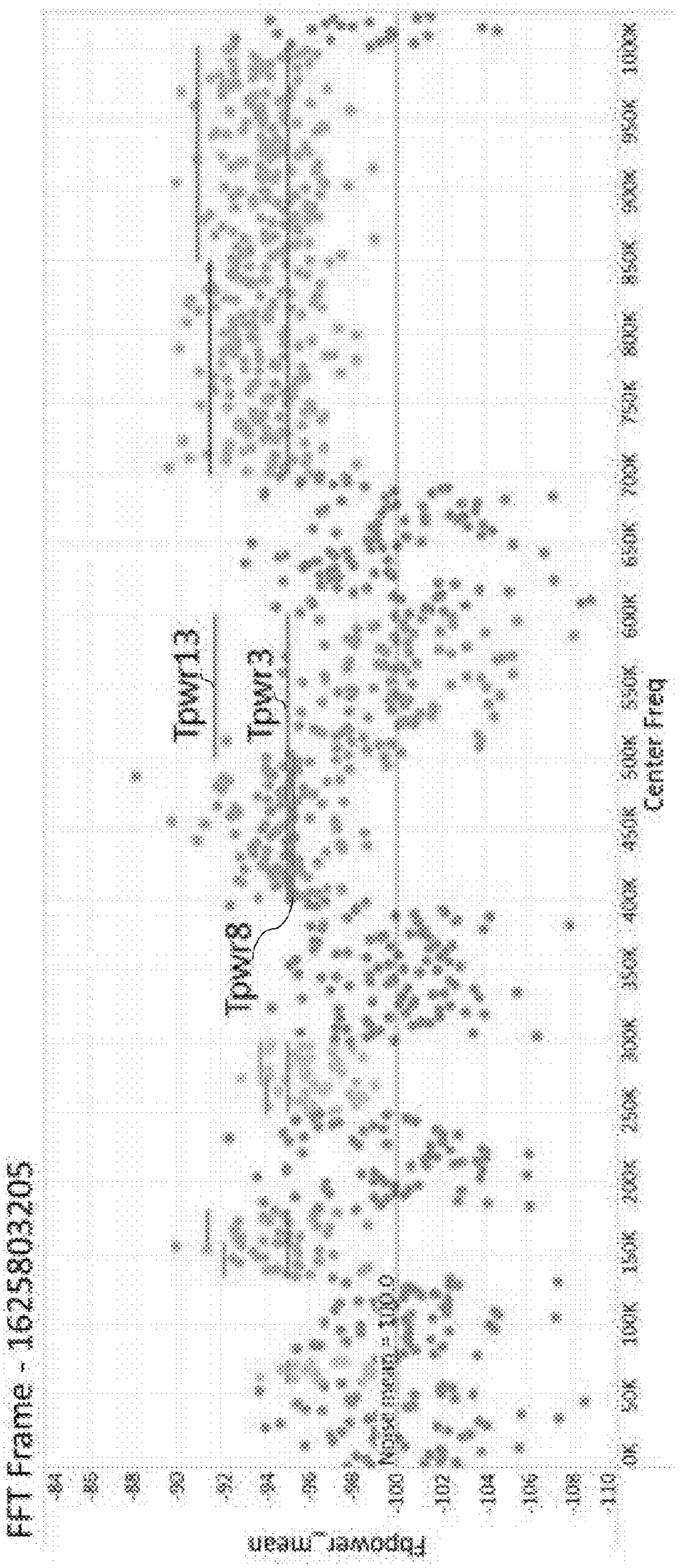
FIG. 67A illustrates another example of an FFT frame illustrating the center frequency on the x-axis and the frequency bin mean power level (Fbpower_mean) on the y-axis.

FIGS. 67A-67D illustrate additional examples of information provided in at least one graphical user interface (GUI). FIG. 67A illustrates another example of an FFT frame illustrating the center frequency on the x-axis and the frequency bin mean power level (Fbpower_mean) on the y-axis. The example shown in FIG. 67A includes a plurality of threshold powers (e.g., Tpwr3, Tpwr8, Tpwr13).

Figure 67B:
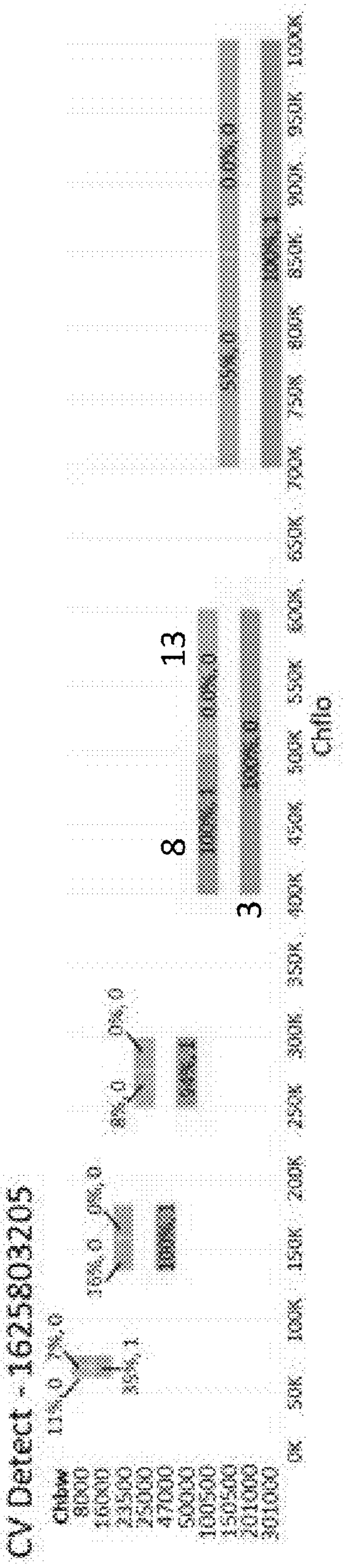
FIG. 67B illustrates channelization vectors and comparisons for the FFT frame shown in FIG. 67A.

FIG. 67B illustrates channelization vectors and comparisons for the FFT frame shown in FIG. 67A. The graph illustrates possible channel flow composition (chflo) and their probabilities. As shown in FIG. 67B, Tpwr3 and Tpwr8 are detected, while Twpr13 is not detected.

Figures 67C, 67D:
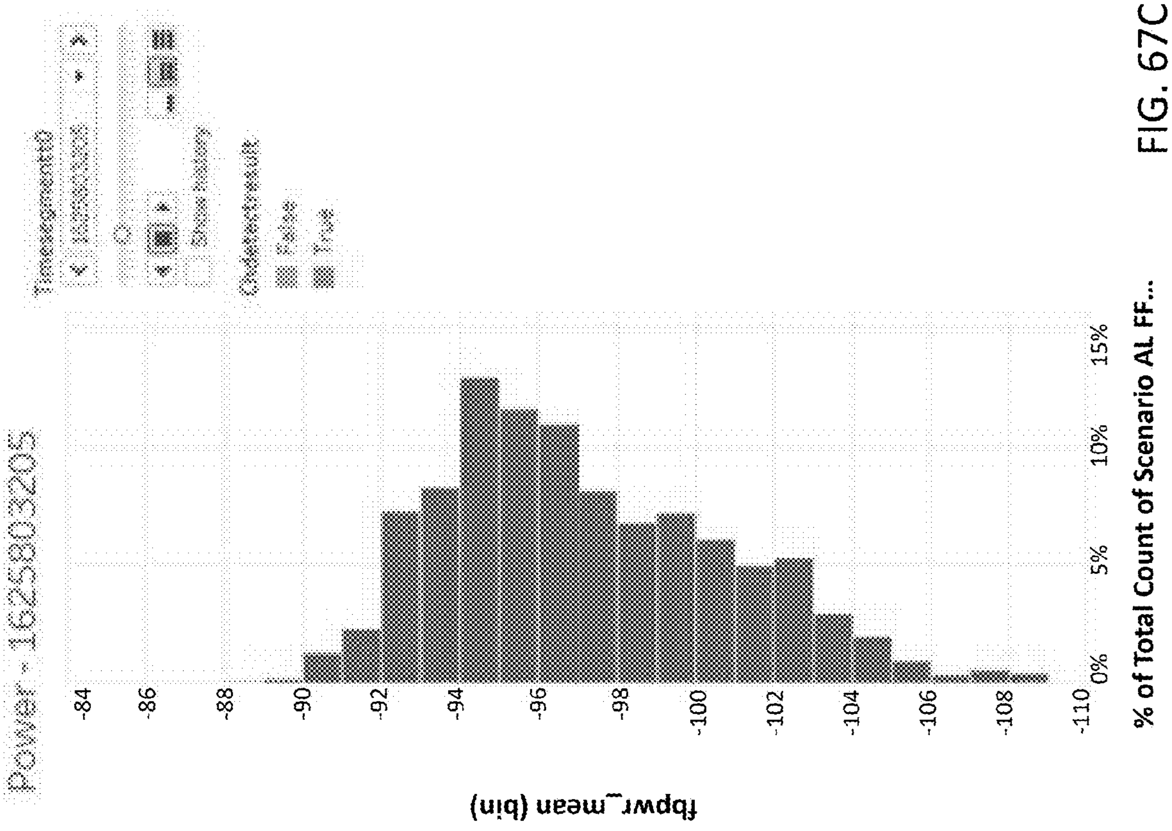
FIG. 67C illustrates a graph for the FFT frame shown in FIG. 67A.
FIG. 67D illustrates a table for the FFT frame shown in FIG. 67A.

FIG. 67C illustrates a graph for the FFT frame shown in FIG. 67A. The graph illustrates the number of bins of a particular power level (mass function) per channel. The x-axis is the percentage of bins at a particular power level for the channel. For example, around 15% of the bins in the channel are at a level of −95 dbfs.

FIG. 67D illustrates a table for the FFT frame shown in FIG. 67A. The table provides a channel index, a count, and a number of bins above the threshold for that channel. The table shows for different channel indexes a minimum number of bins of signal with noise to determine that the channel is occupied with a probability of false alarm below the desired threshold.

Figure 68A:
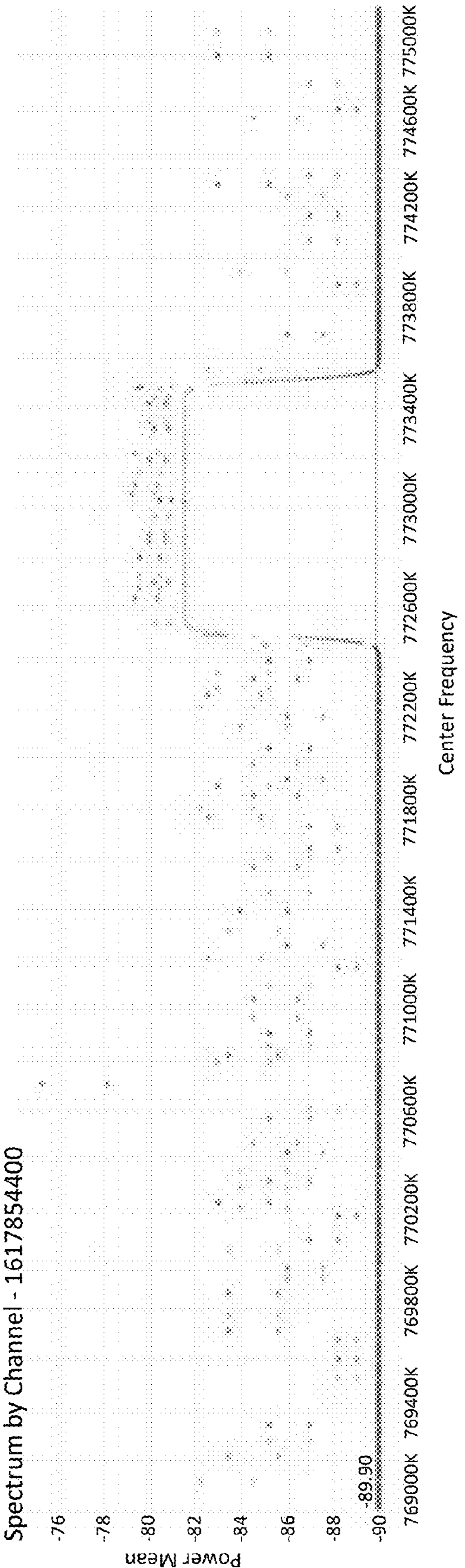
FIG. 68A illustrates an example of spectrum by channel.
Figure 68B:
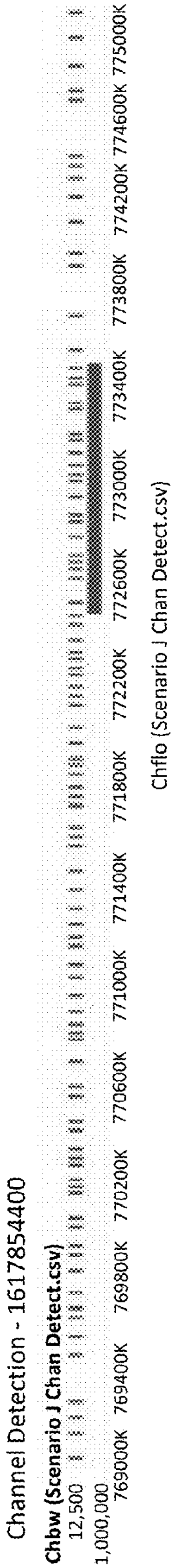
FIG. 68B illustrates an example of channel detection for the spectrum shown in FIG. 68A.
Figure 68C:
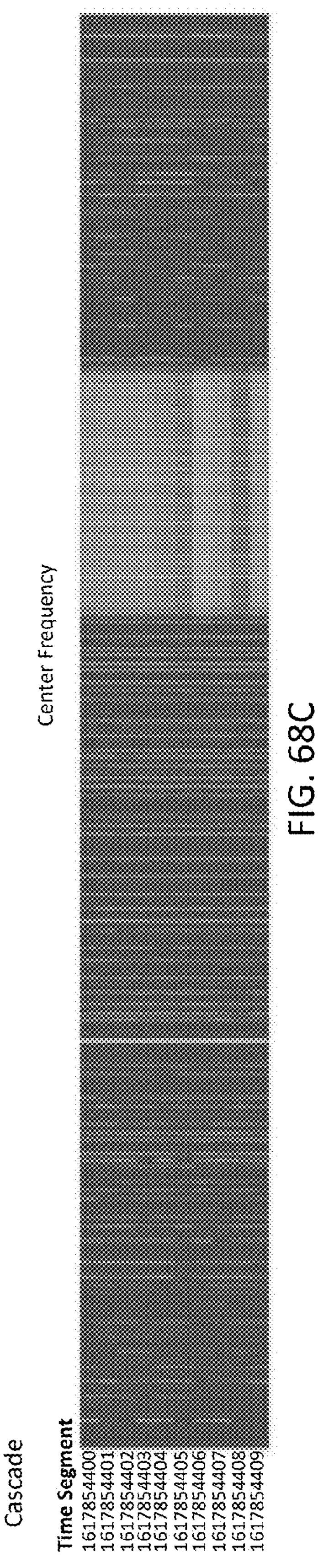
FIG. 68C illustrates an example of a cascade for the spectrum shown in FIG. 68A.

FIGS. 68A-68C illustrate further examples of information provided in at least one graphical user interface (GUI). FIG. 68A illustrates an example of spectrum by channel.

FIG. 68B illustrates an example of channel detection for the spectrum shown in FIG. 68A.

FIG. 68C illustrates an example of a cascade for the spectrum shown in FIG. 68A.

Figure 69B:
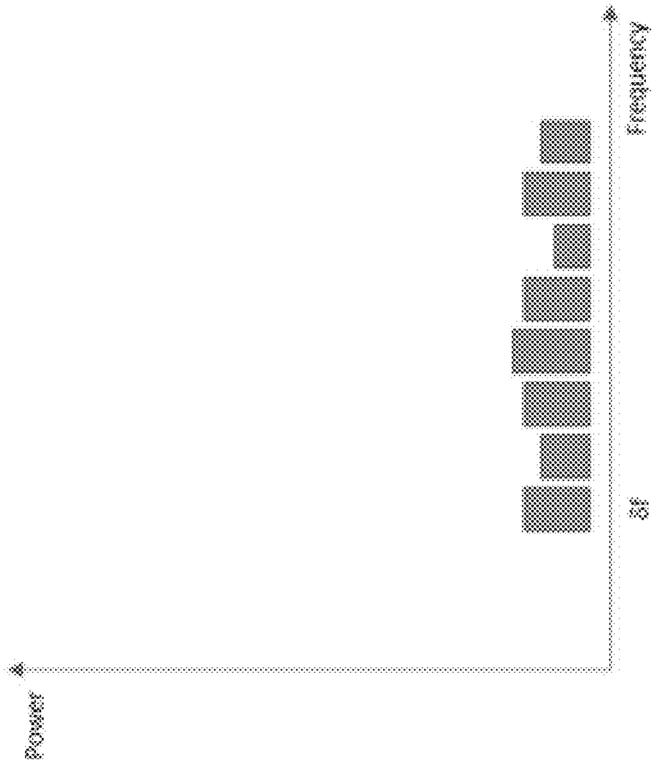
FIG. 69B illustrates an example of a graph of total noise power.
Figure 69A:
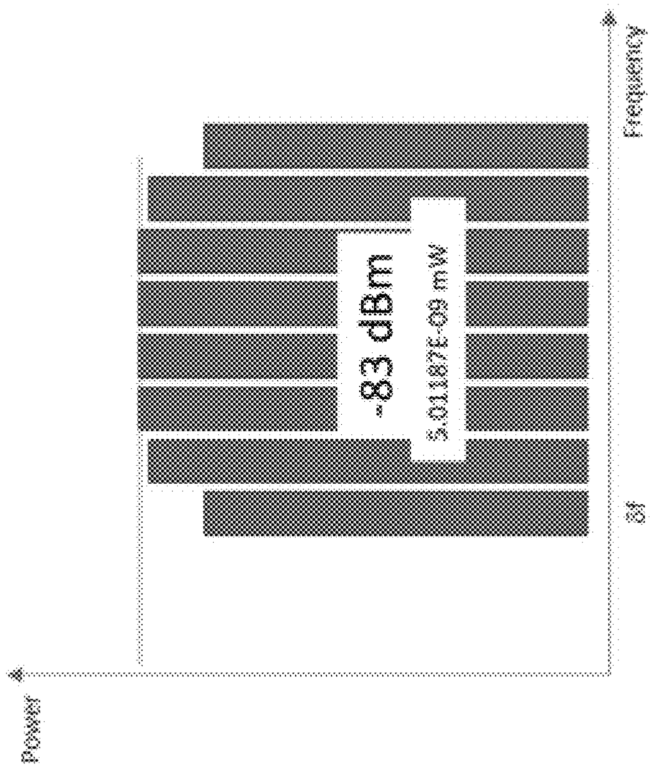
FIG. 69A illustrates an example of a graph of total signal power.

FIG. 69A illustrates an example of a graph of total signal power. In one embodiment, total signal power is calculated using the following equation:

$$\text{Total Signal Power} = \frac{1}{chbw}\sum\nolimits_b P_{s,i}$$

FIG. 69B illustrates an example of a graph of total noise power. In one embodiment, total noise power is calculated using the following equation:

$$\text{Total Noise Power} = \frac{1}{chbw}\sum\nolimits_b P_{n,i}$$

In one embodiment, the signal to noise ratio is calculated using the following equation:

$$SNR = \frac{\sum_b P_{s,i}\delta f}{\sum_b P_{n,i}\delta f}$$

Figure 70A:
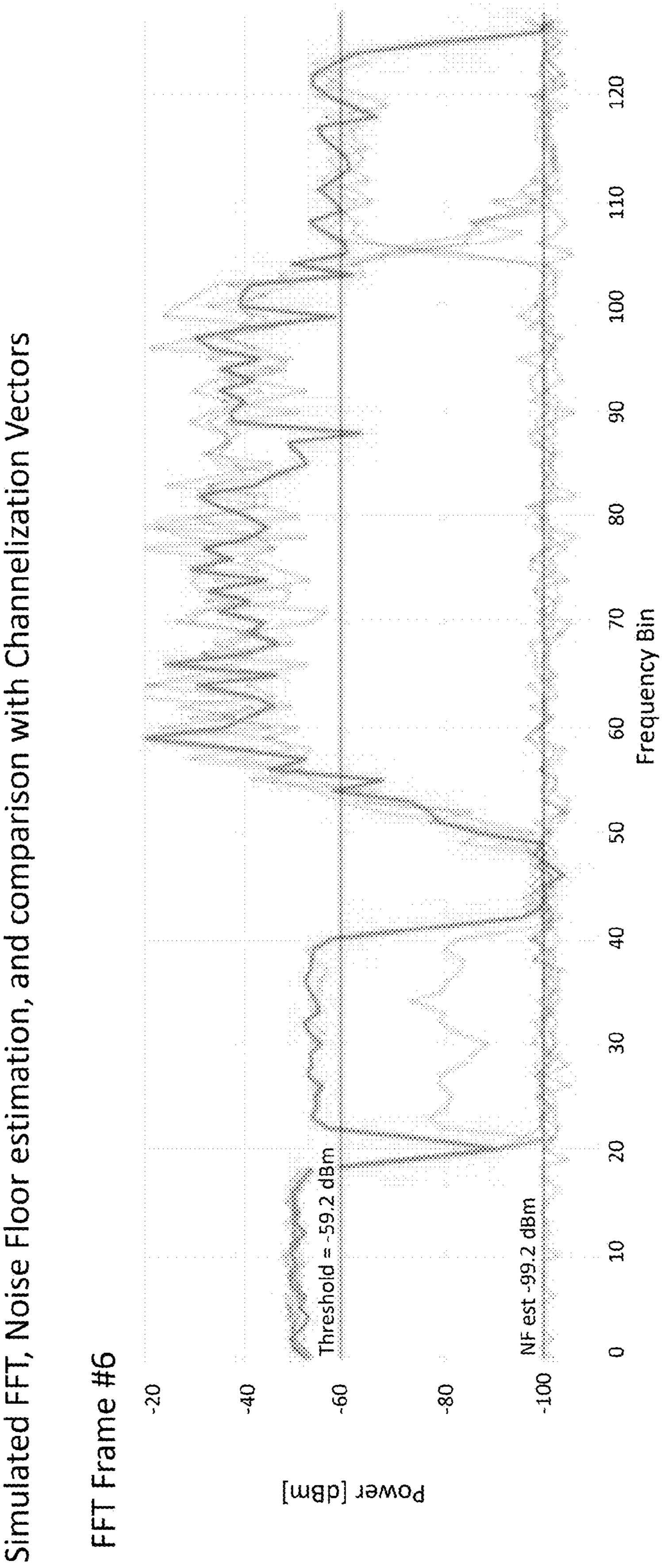
FIG. 70A illustrates another example of a simulated FFT, noise floor estimation, and comparison with channelization vectors.
Figure 70B:
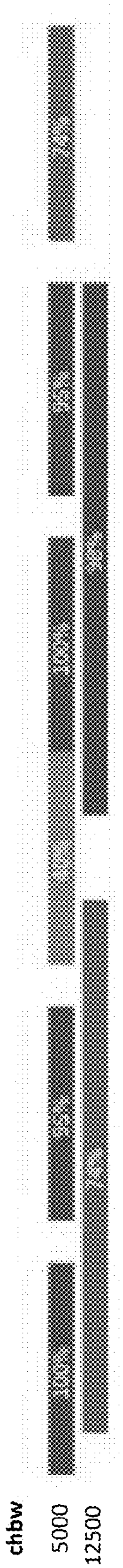
FIG. 70B illustrates channelization vectors and comparisons for the FFT frame shown in FIG. 70A.
Figure 70C:
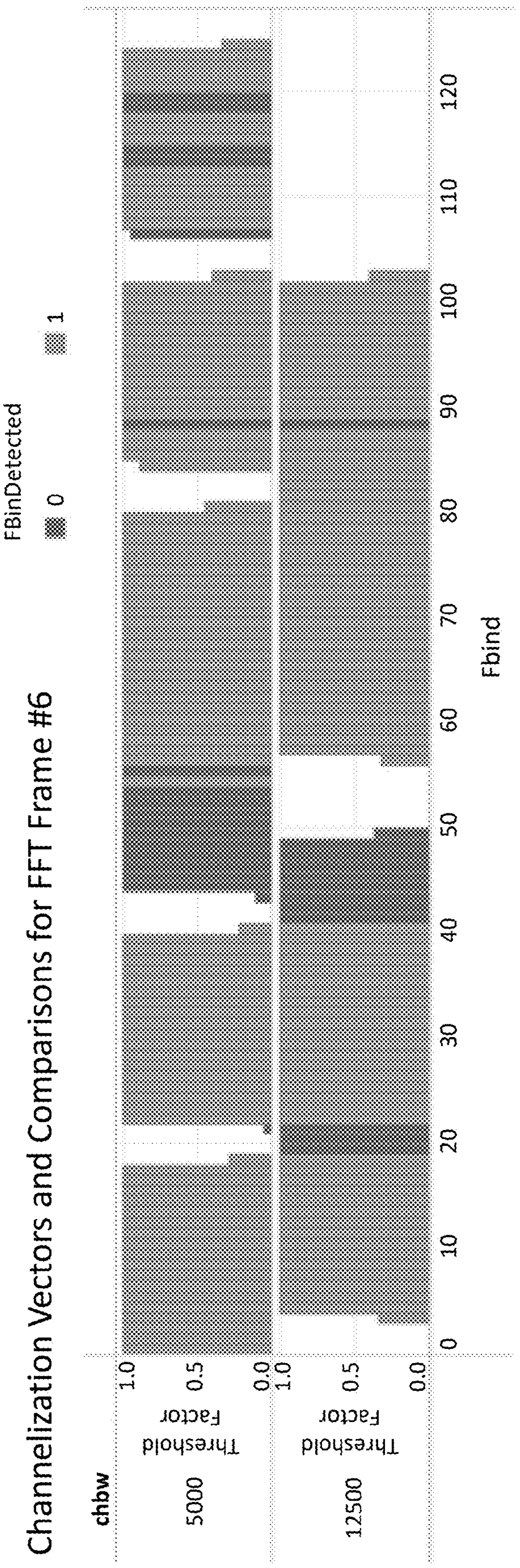
FIG. 70C illustrates channelization vectors and comparisons for the FFT frame shown in FIG. 70A.

FIGS. 70A-70C illustrate further examples of information provided in at least one graphical user interface (GUI). FIG. 70A illustrates another example of a simulated FFT, noise floor estimation, and comparison with channelization vectors. In the example shown in FIG. 70A, FFT Frame #6 has a threshold of −59.2 dBm and a noise floor estimate of −99.2 dBm.

FIG. 70B illustrates channelization vectors and comparisons for the FFT frame shown in FIG. 70A. As described previously, a smaller channel bandwidth leads to a higher accuracy of detection than a larger channel bandwidth. The smaller channel bandwidth has a probability of 100% and 95% in the two lowest frequency bins and a probability of 74% in the highest frequency bin for the signal above the threshold. The larger channel bandwidth has a probability of 74% in the lowest frequency bin and 98% in the second frequency bin. However, the larger channel bandwidth does not account for the drop in signal shown in the third frequency bin of the smaller channel bandwidth, which results in only a 40% probability of detection in the smaller channel bandwidth.

FIG. 70C illustrates channelization vectors and comparisons for the FFT frame shown in FIG. 70A.

FIGS. 71A-73D illustrate using Spectral Correlation Density (SCD) analysis for detection of signals in the RF environment. The use of the Spectral Correlation Density (SCD) computation is used to improve the detection of transmitted signals with cyclo-stationary properties. SCD improves the SNR compared to a simple blind detection approach based on FFT analysis of the received signals. This then is operable to be used in addition to computation of the cyclo-stationary moments and their ratio to classify the modulation of the received signals. In one embodiment, the system uses a SCD computation engine for detection of signals in the RF environment while improving the SNR of the signal.

The SCD is the spectrum of the correlation between different shifts of a signal to different frequencies. The following correlation function is the cyclic autocorrelation function (CAF).

$$R_x^\alpha[l] = \left\langle x[n]x*[n-l]e^{-j2\pi\alpha n}\right\rangle e^{j\pi\alpha l}$$

In the CAF, x[n] is the received sample signal composed of one of more signals in the RF environment. A signal is cyclostationary if its CAF is nonzero for some period of time t and some frequencies a. The frequency a is the cycle frequency and the set of frequencies a for which the CAF is non-zero is the cycle spectrum. This is further described in "Cyclostationarity in Communications and Signal Processing" by William A. Gardner (IEEE Press, 1994), which is incorporated herein by reference in its entirety. The SCD is the Fourier Transform of the CAF and is represented as:

$$S_x^\alpha(f) - \sum_{t=-\infty}^{\infty} R_x^\alpha(l)e^{-j2\pi fl}$$

The method of SCD estimation is based on the FFT Accumulation Method (FAM) and uses the script found in "Implementation of cyclic spectral analysis methods" by Nancy J. Carter (Calhoun: The NPS Institutional Archive, 1992), which is incorporated herein by reference in its entirety.

The FAM consists of the following steps:

1) Select the α resolution da and the f resolution df. These parameters are converted to $N_p=f_s/d\alpha$ and $N=f_s/df$ where $f_s$ is the sampling frequency. Pick $L=N_p/4$ and then $P=(N-N_p)/L$
2) Convert the input signal to a $P\times N_p$ matrix where each row is shifted by L samples compared to the previous row as follow.

$$\begin{bmatrix} x_1, x_1, \ldots x_{N_p} \\ x_{L+1}, x_{L+2}, \ldots x_{L+N_p} \\ \vdots \\ x_{P*L+1}, x_{P*L+2}, \ldots x_{P*L+N_p} \end{bmatrix}$$

3) Multiply each row by a hamming window of length $N_p$ and take the FFT of it.
4) Shift down to DC each output by multiplying by $$e^{-i\omega t*i_{row}*i_{col}*L/N_p}$$

5) Multiply each column $f_k$ by each other column $f_l$. The result is a matrix of f×α where f=mid frequency=$(f_k+f_l)/2$ and α=cyclic frequency=$(f_k-f_l)$. The size of the matrix is $P\times N_p^2$.
6) Take FFT of each column.

The SCD analysis and/or FAM analysis are operable to be used with the blind detection engine and methods, channelizer, channelization methods, channel estimation methods, and channel equalization methods described in the present application to provide improved SNR ratios for detection of signals. In one embodiment, the SCD analysis and/or the FAM analysis is performed by a SCD analysis engine or a FAM analysis engine connected to the other components of a signal monitoring, detection, and analysis system as described herein. Alternatively, the SCD analysis engine or the FAM analysis engine is incorporated in another component of the present invention, such as a blind detection engine or a channelizer.

Figure 71A:
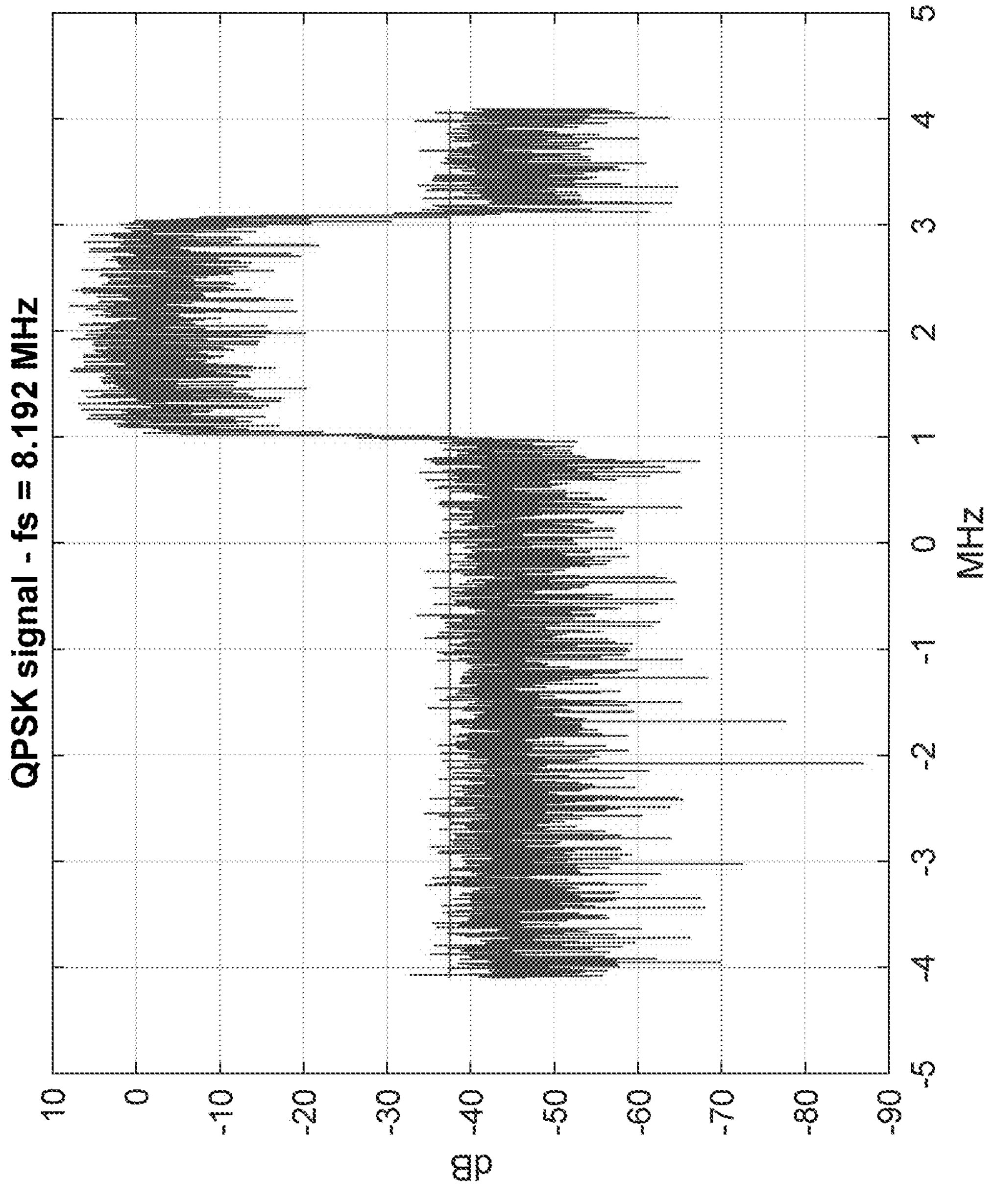
FIG. 71A illustrates one example of a Quadrature Phase Shift Keying (QPSK) signal graph.

FIG. 71A illustrates one example of a Quadrature Phase Shift Keying (QPSK) signal graph. This is a QPSK signal that is centered around 2.048 MHz with a bandwidth of 2.048 MHz. The sampling rate is 8.192 MHz and the excess percent bandwidth is 0.25.

Figure 71B:
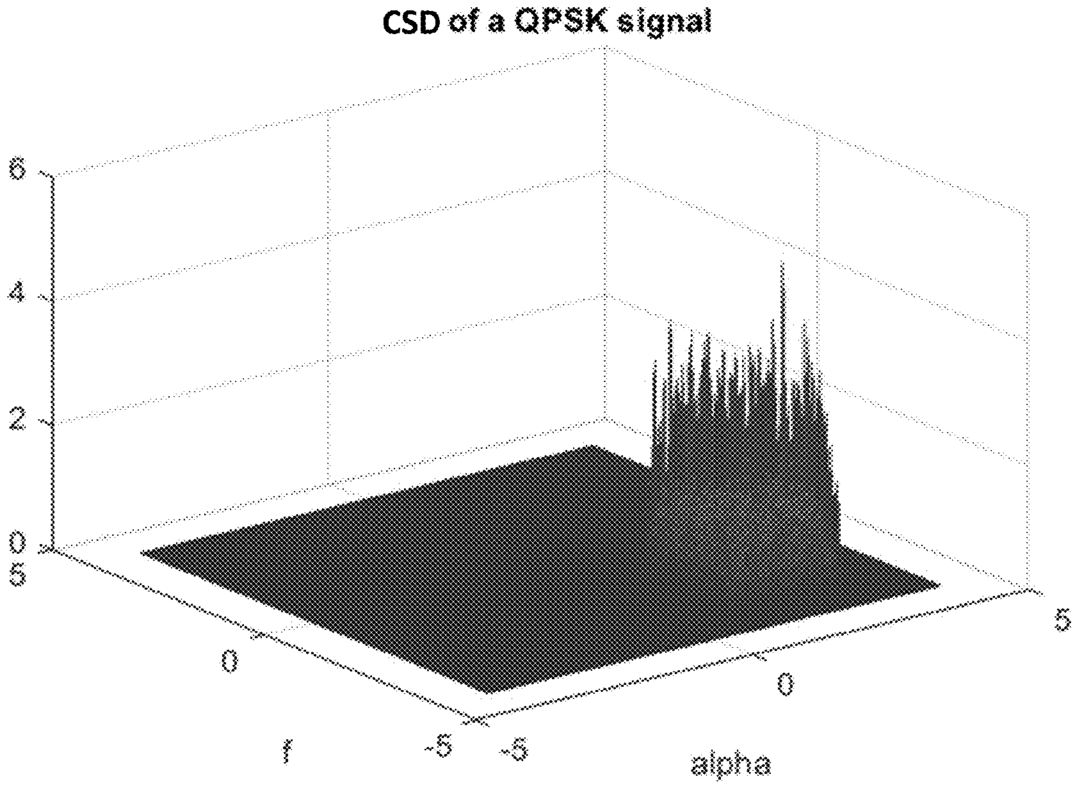
FIG. 71B illustrates the cross-spectral density (CSD) plot of the QPSK signal shown in FIG. 71A.

FIG. 71B illustrates the cross-spectral density (CSD) plot of the QPSK signal shown in FIG. 71A. The parameters that were chosen in this case are d$\alpha$=16000 Hz and df=1000 Hz.

Figure 71C:
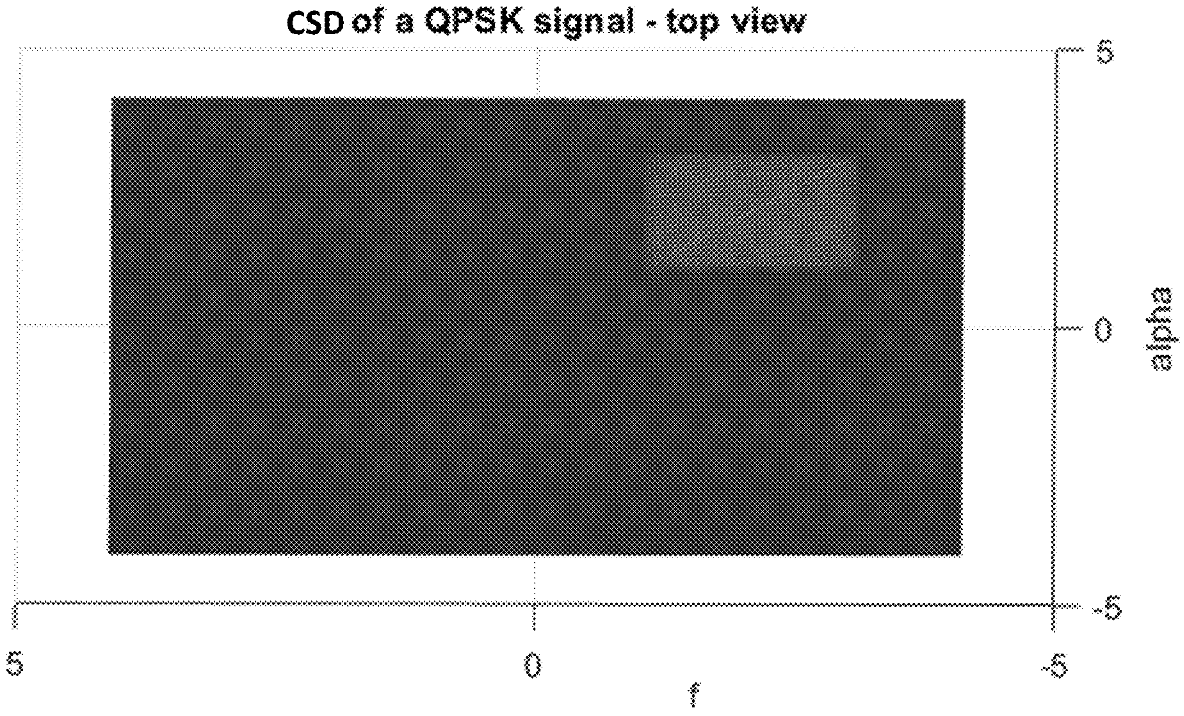
FIG. 71C illustrates a top view of the CSD plot of the QPSK signal shown in FIG. 71B.

FIG. 71C illustrates a top view of the CSD plot of the QPSK signal shown in FIG. 71B. It shows a strong signal on the diagonal $\alpha$=−f.

Figure 71D:
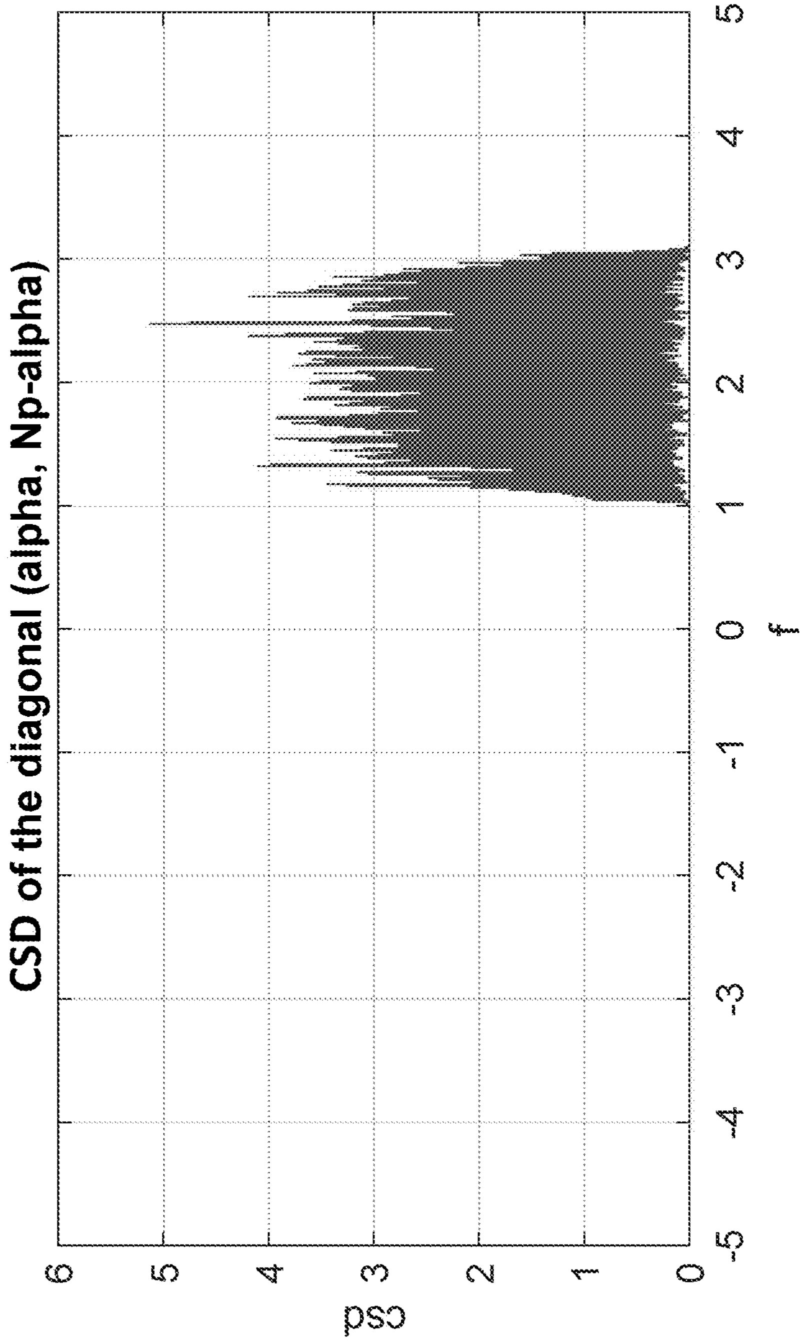
FIG. 71D illustrates the CSD graph of the diagonal of the QPSK signal shown in FIG. 71B and FIG. 71C.

FIG. 71D illustrates the CSD graph of the diagonal of the QPSK signal shown in FIG. 71B and FIG. 71C. The signal is centered at 2 MHz with a bandwidth of 2 MHz. This looks like the original spectrum with a much better SNR.

Figure 72A:
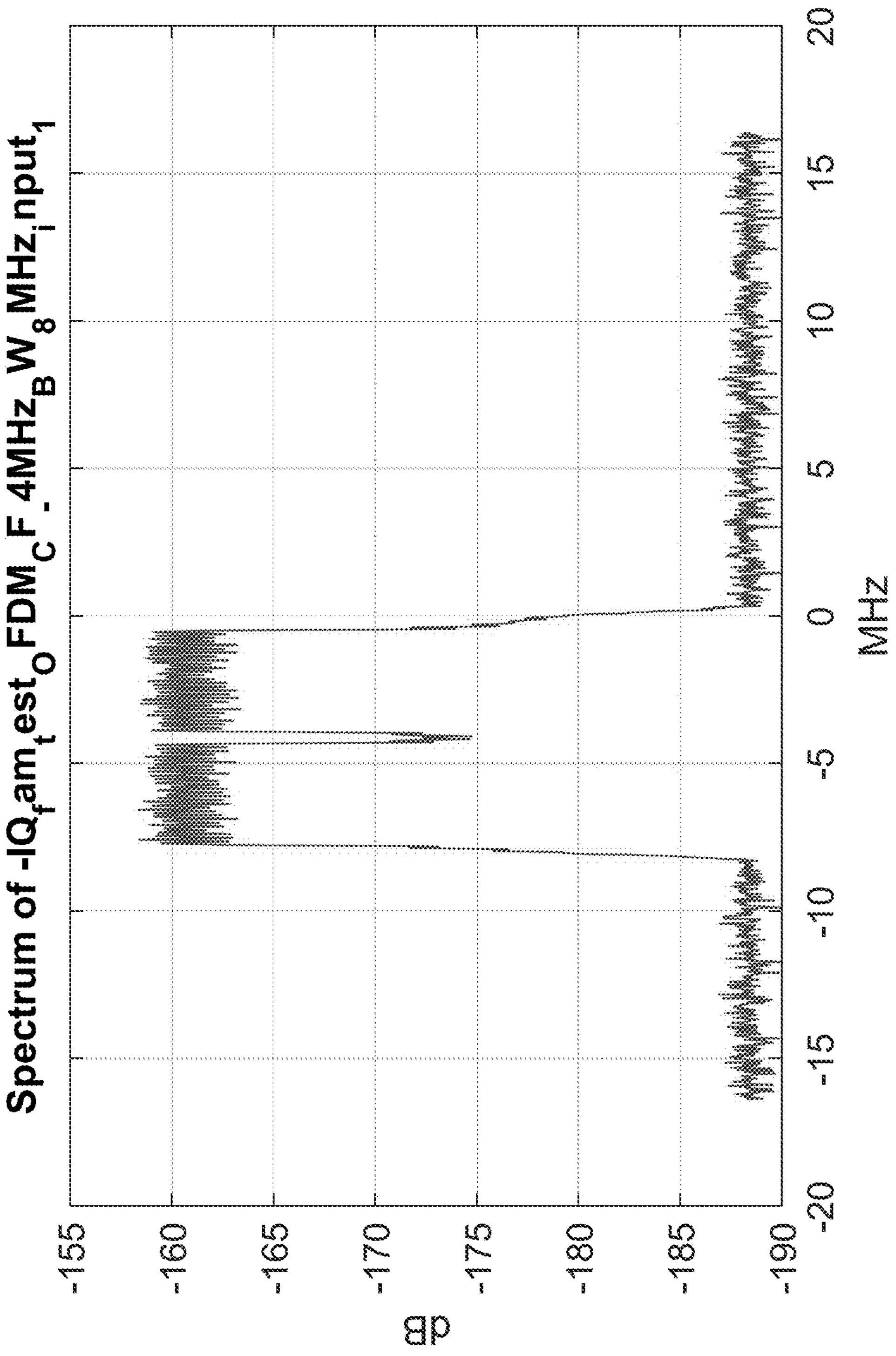
FIG. 72A illustrates one example of an Orthogonal frequency-division multiplexing (OFDM) signal graph.

FIG. 72A illustrates one example of an orthogonal frequency-division multiplexing (OFDM) signal graph of bandwidth 8.192 MHz centered at −4 MHz. The sampling rate is 32.768 MHz.

Figure 72B:
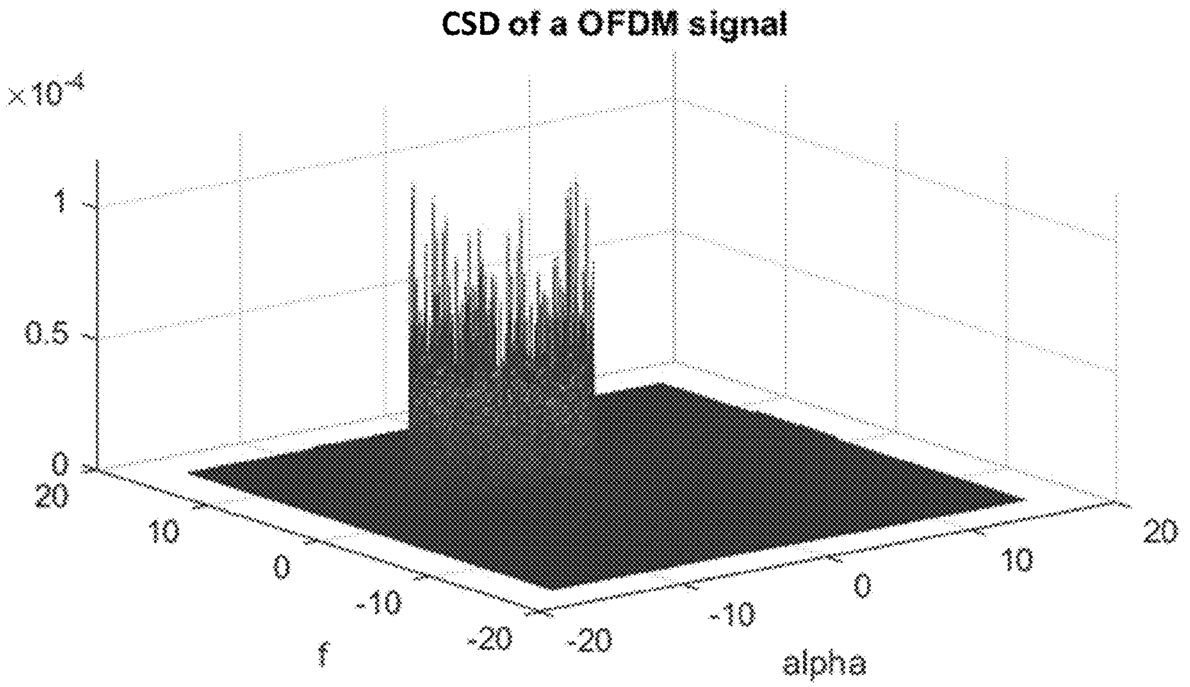
FIG. 72B illustrates the CSD plot of the OFDM signal shown in FIG. 72A.

FIG. 72B illustrates the CSD plot of the OFDM signal shown in FIG. 72A. The CSD of this signal is calculated with da=32000 and df=2000.

Figure 72C:
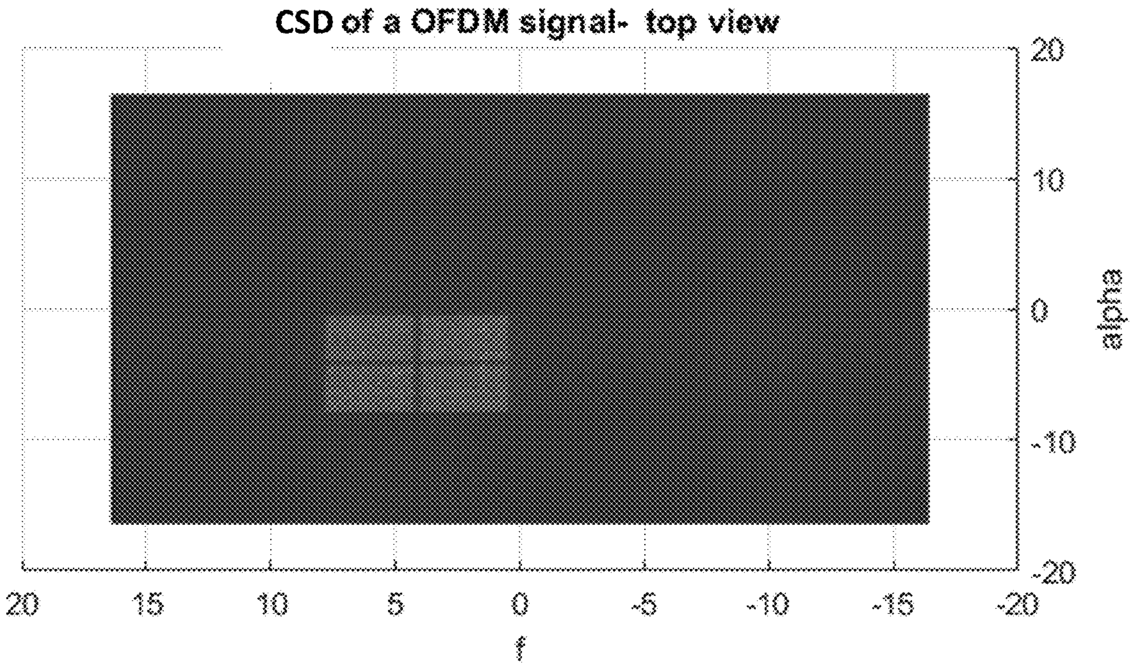
FIG. 72C illustrates a top view of the CSD plot of the OFDM signal shown in FIG. 72B.

FIG. 72C illustrates a top view of the CSD plot of the OFDM signal shown in FIG. 72B.

Figure 72D:
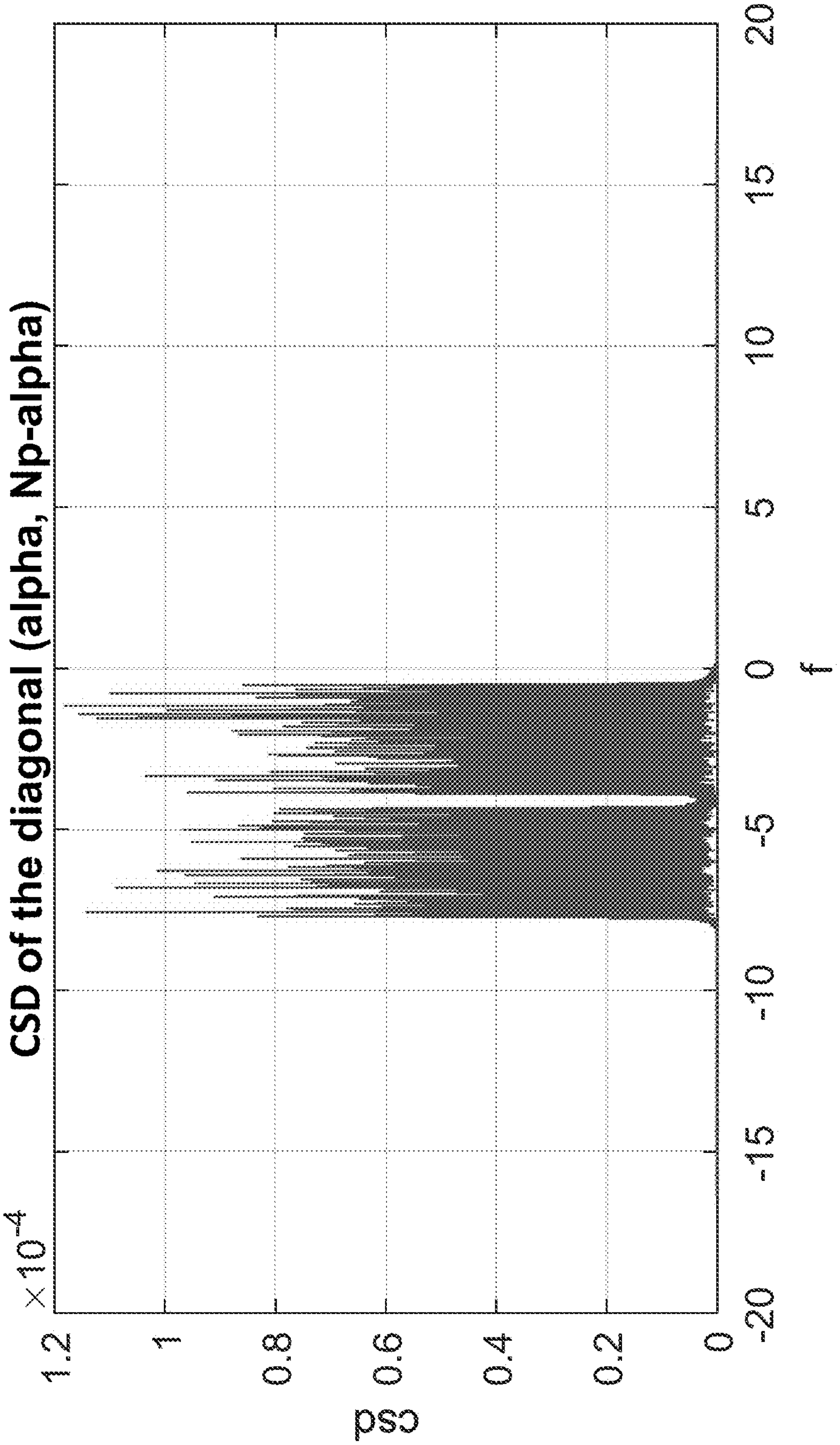
FIG. 72D illustrates the CSD graph of the diagonal of the OFDM signal shown in FIG. 72B and FIG. 72C.

FIG. 72D illustrates the CSD graph of the diagonal of the OFDM signal shown in FIG. 72B and FIG. 72C. The plot looks similar to the spectrum with a center frequency of −4 MHz and bandwidth of 8 MHz, but an improved SNR is provided with this technique.

Figure 73A:
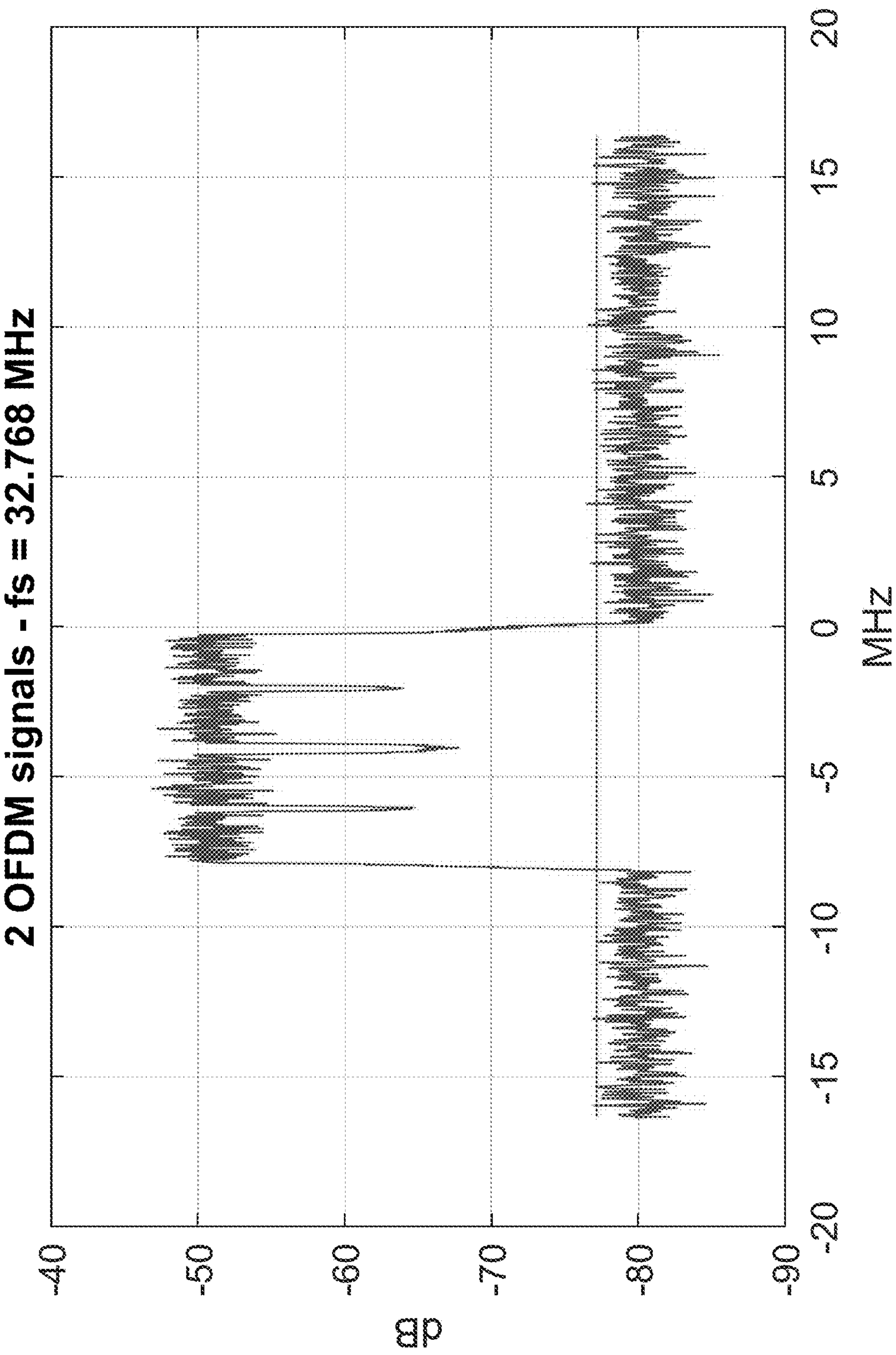
FIG. 73A illustrates one example of a graph of 2 OFDM signals.

FIG. 73A illustrates one example of a graph of 2 OFDM signals that occupy the same frequency band as the OFDM signal in FIG. 72A. The center frequencies are at −2 MHz and −6 MHz and the bandwidth of each one is 4 MHZ.

Figure 73B:
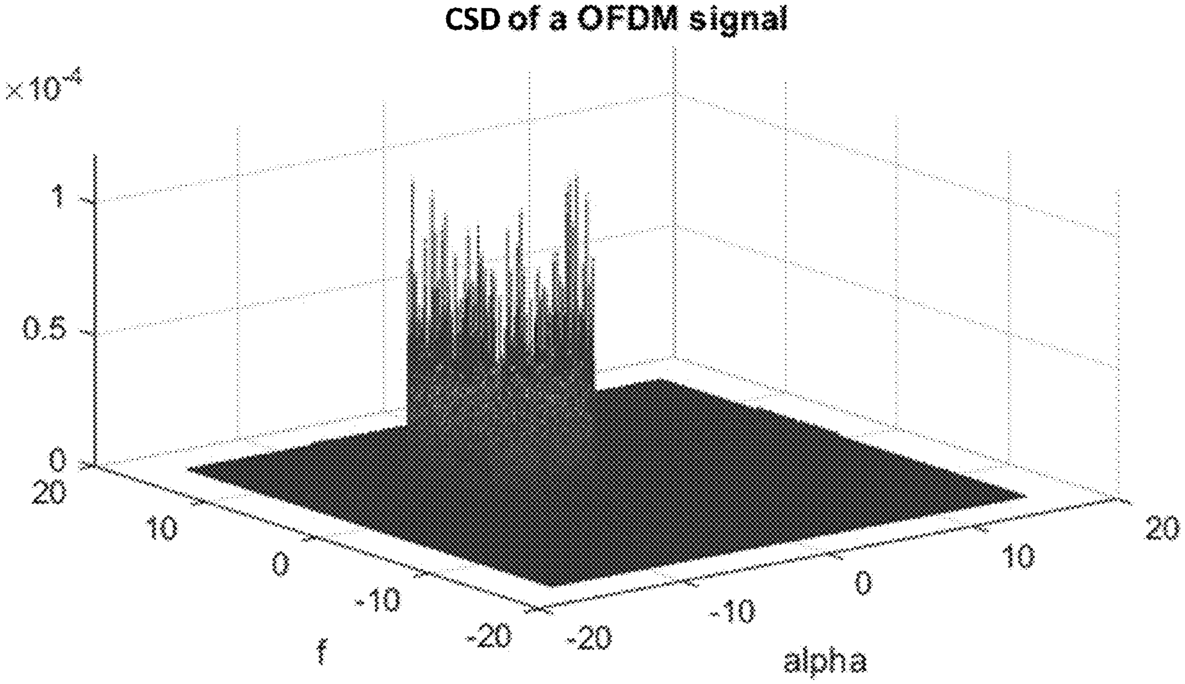
FIG. 73B illustrates the CSD plot of the 2 OFDM signals shown in FIG. 73A.

FIG. 73B illustrates the CSD plot of the 2 OFDM signals shown in FIG. 73A. Here the CSD is calculated with da=32000 and df=2000 as in FIG. 72B.

Figure 73C:
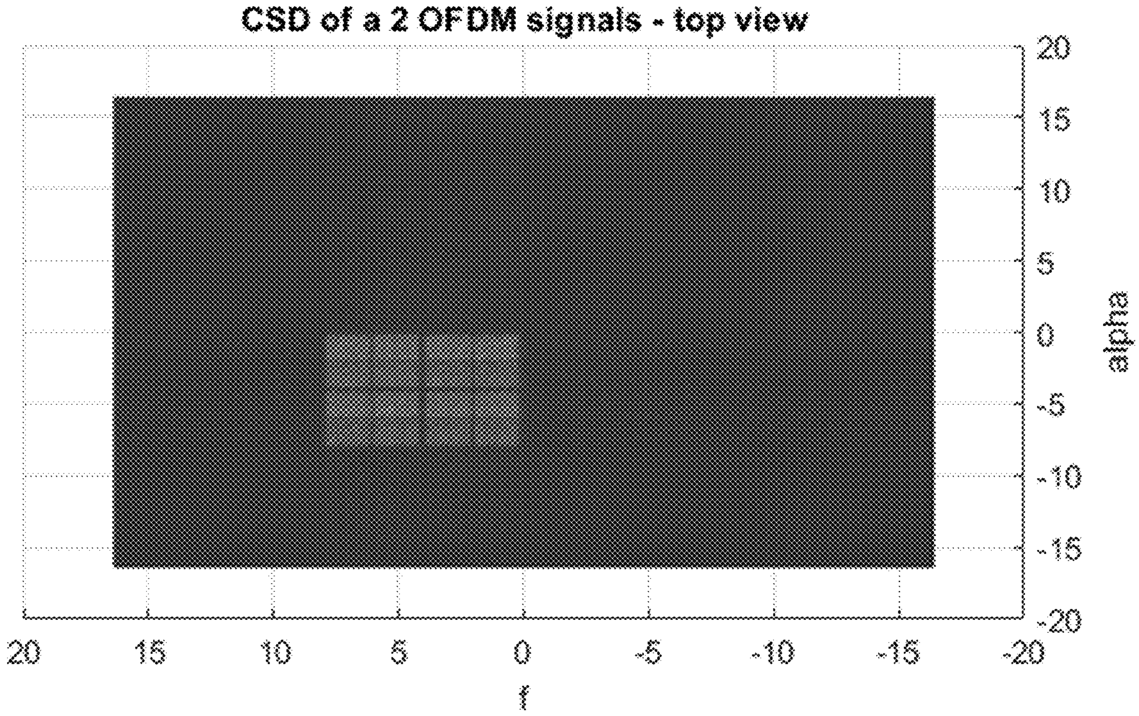
FIG. 73C illustrates a top view of the CSD plot of the 2 OFDM signals shown in FIG. 73B.

FIG. 73C illustrates a top view of the CSD plot of the 2 OFDM signals shown in FIG. 73B.

Figure 73D:
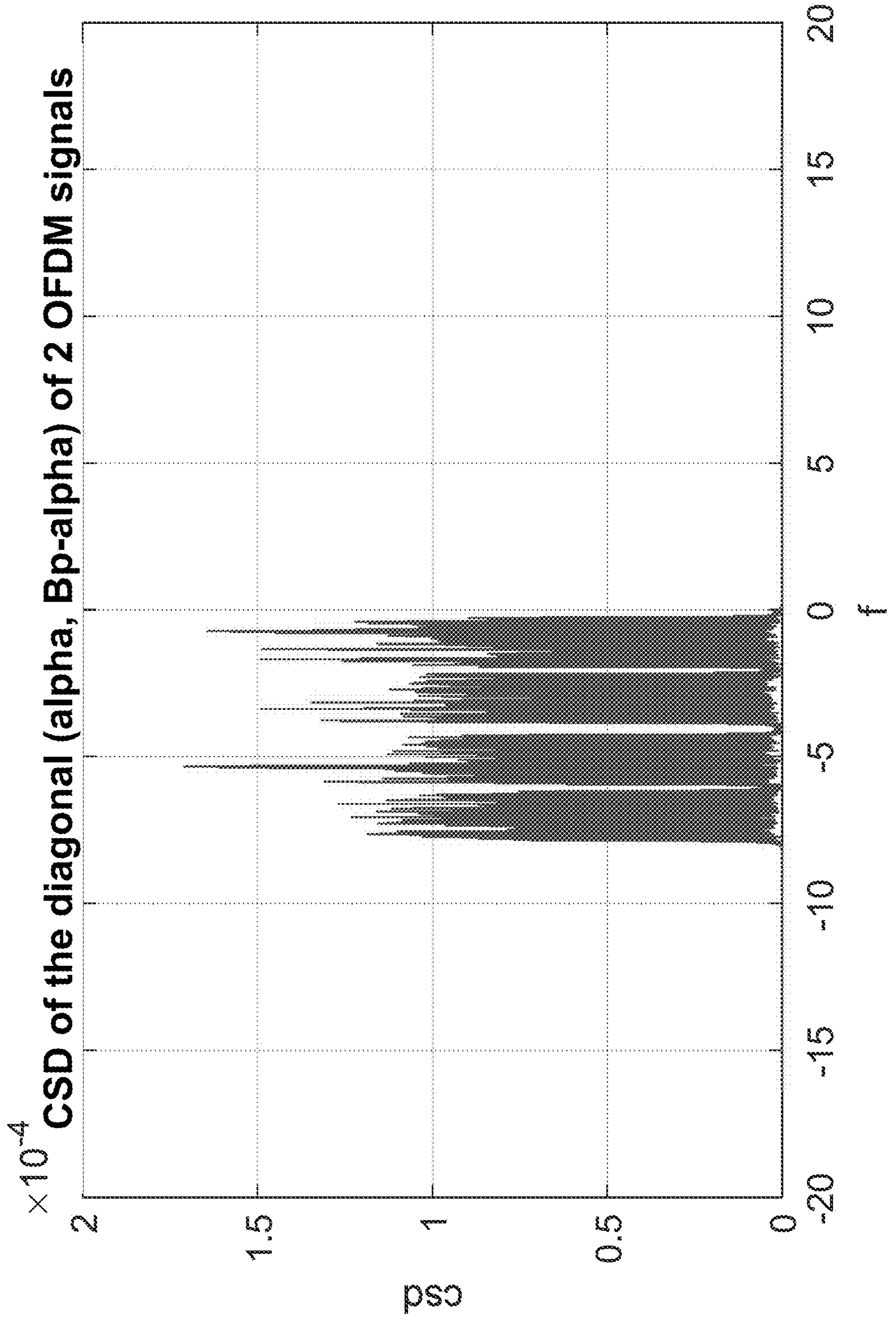
FIG. 73D illustrates the CSD graph of the diagonal of the 2 OFDM signals shown in FIG. 73B and FIG. 73C.

FIG. 73D illustrates the CSD graph of the diagonal of the 2 OFDM signals shown in FIG. 71B and FIG. 71C. The 2 OFDM signals are very clear with SNR that is better than the original the spectrum. This shows that the SCD improves the SNR of signals in noise. The signals are operable to be identified easily compared to the noise. And this solution is operable to create a lower SNR that leads to overall signal processing and interference detection improvements.

Figure 74:
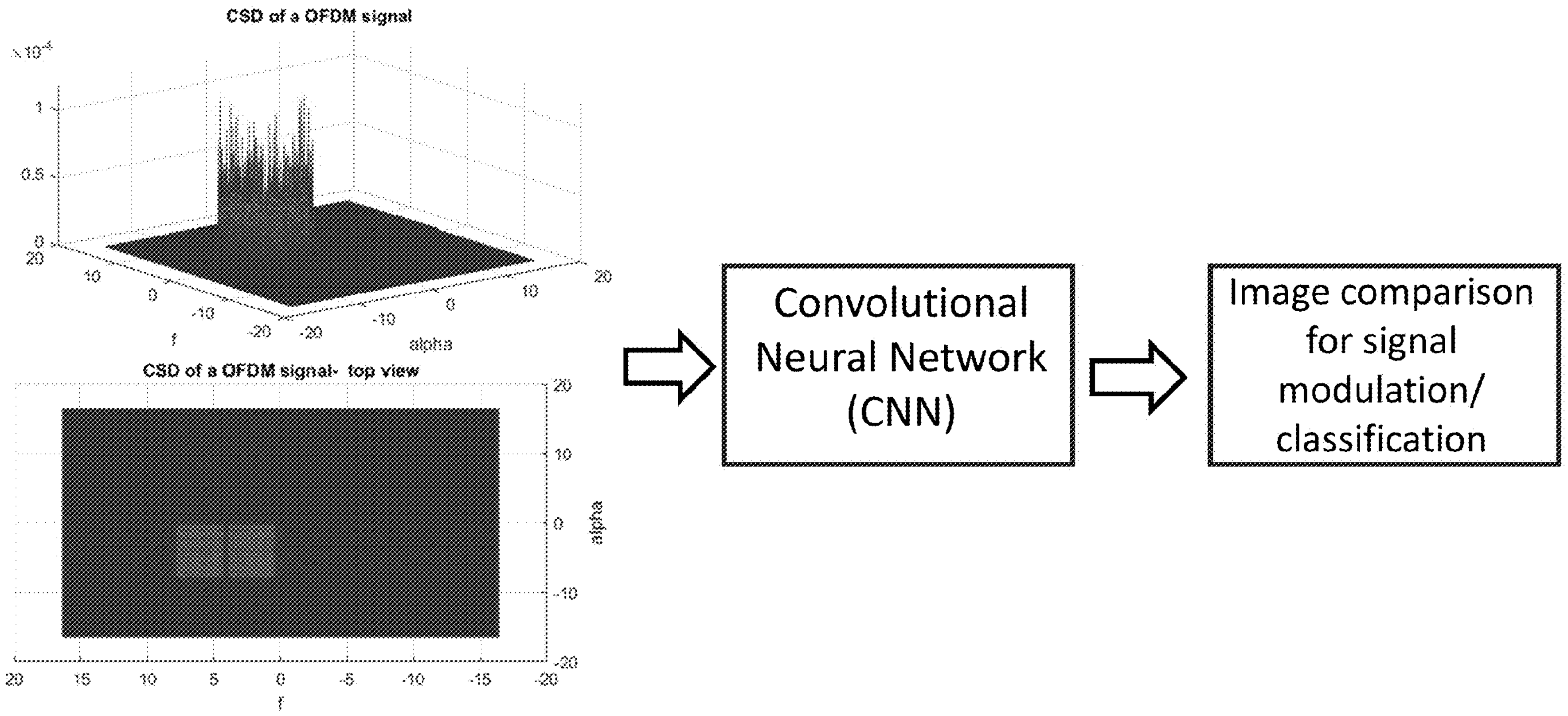
FIG. 74 illustrates a flowchart for CSD using ML image comparison.

FIG. 74 illustrates a flowchart for Spectral Correlation Density (SCD) using ML image comparison. In one embodiment, an alternative method for signal detection and classification involves the use of Spectral Correlation Density (SCD) computation or cross-spectral density (CSD) plots combined with machine learning (ML) and Convolutional Neural Networks (CNNs). A non-limiting example of this approach is enhancing signal detection in noisy environments by leveraging image comparison techniques. The system performs a SCD computation using the FFT Accumulation Method (FAM) to calculate the cyclostationary moment, which generates CSD graphs as 2D or 3D spectral images as described and shown in the current application in FIG. 71A-73D. These images represent the correlation between mid frequency (f) (Hz, MHz, GHz), cyclic frequency/alpha ($\alpha$), and magnitude (CSD) which are corresponding to the X, Y,Z axis of the graph accordingly. These images represent different frequency shifts of a signal, highlighting cyclo-stationary properties.

In one embodiment, the system employs CNNs to process the CSD 2D and/or 3D graphs and identify unique cyclo-stationary patterns associated with different modulation schemes. In one embodiment, the CNN is trained on a diverse dataset of known signal patterns, enabling it to efficiently match input CSD graphs with precomputed templates stored in a database. This pattern matching technique allows the system to accurately classify signals by distinguishing between each modulation scheme. The machine learning of the CNN allows for improved pattern matching of RF signals in an environment over time.

In one embodiment, the system performs real-time signal processing using the FFT Accumulation Method (FAM) to calculate the cyclostationary moment. The real-time CSD graphs generated as 2D or 3D spectral images are continuously updated to reflect the instantaneous correlation between mid frequency (f) (Hz, MHz, GHz), cyclic frequency/alpha ($\alpha$), and magnitude (CSD). This allows for real-time monitoring and analysis of cyclo-stationary properties, which is beneficial for applications such as spectrum monitoring, interference detection, and cognitive radio.

In one embodiment, the system uses machine learning algorithms, such as Convolutional Neural Networks (CNNs), not only to identify unique cyclo-stationary patterns associated with different modulation schemes but also to detect anomalies. The system is trained on a dataset of normal cyclo-stationary patterns and uses this knowledge to identify deviations from the norm, which may indicate the presence of malicious activities or system faults.

In another embodiment, the system utilizes cloud-based resources for processing and storing the CSD graphs. By offloading the computationally intensive tasks to the cloud, the system leverages scalable processing power and storage capacity, enabling the analysis of large volumes of data and long-term storage of CSD graphs for historical analysis and trend identification.

In yet another embodiment, the system includes a user interface that allows users to interactively explore the CSD graphs. Users can manipulate the 2D and 3D spectral images, zoom in on areas of interest, and apply various filters to highlight specific cyclo-stationary properties. This interactive capability enhances the user's ability to analyze and interpret the data, making it easier to identify patterns, anomalies, Intermodulation distortion (IMD), and interference.

In one embodiment, the system features automated reporting and alert mechanisms. The system continuously monitors the CSD graphs for specific cyclo-stationary patterns and generates reports or sends alerts when predefined conditions are met. For example, the system can alert operators when it detects a particular modulation scheme or an unexpected frequency shift, enabling timely responses to potential issues.

In one embodiment, the system integrates a feedback loop to continuously improve the CNN model. The system collects classification results and validates them against known data, updating the model parameters in real-time. This adaptive learning mechanism ensures that the system maintains accuracy across varying signal environments.

In one embodiment, the pattern matching process is further optimized using hardware acceleration. The system leverages GPUs or FPGAs for parallel processing, significantly reducing computational load and processing time. This hardware acceleration makes the system suitable for real-time or near-real-time applications, handling high-throughput signal environments with ease.

In one embodiment, the system incorporates dimensionality reduction techniques to enhance computational efficiency. The system uses Principal Component Analysis (PCA) or t-distributed Stochastic Neighbor Embedding (t-SNE) to reduce the dimensionality of the CSD graphs before feeding them into the CNN. These techniques keep important features of the data while reducing computational complexity, enabling faster and more efficient pattern matching.

In another embodiment, the system employs transfer learning to adapt to new or evolving signal environments. The CNN is initially trained on a broad dataset of known signals and then fine-tuned on specific datasets representing the target environment. The learning data set could apply to similar complex RF environments that have similar parameters. A non-exhaustive list of these environments include: airports, automated manufacturing line (IoT sensors), smart cities, self-driving cars. This approach allows the system to quickly adjust to new modulation schemes or signal conditions without extensive retraining, ensuring accurate and effective pattern matching based on the specific RF environment.

Figure 75:
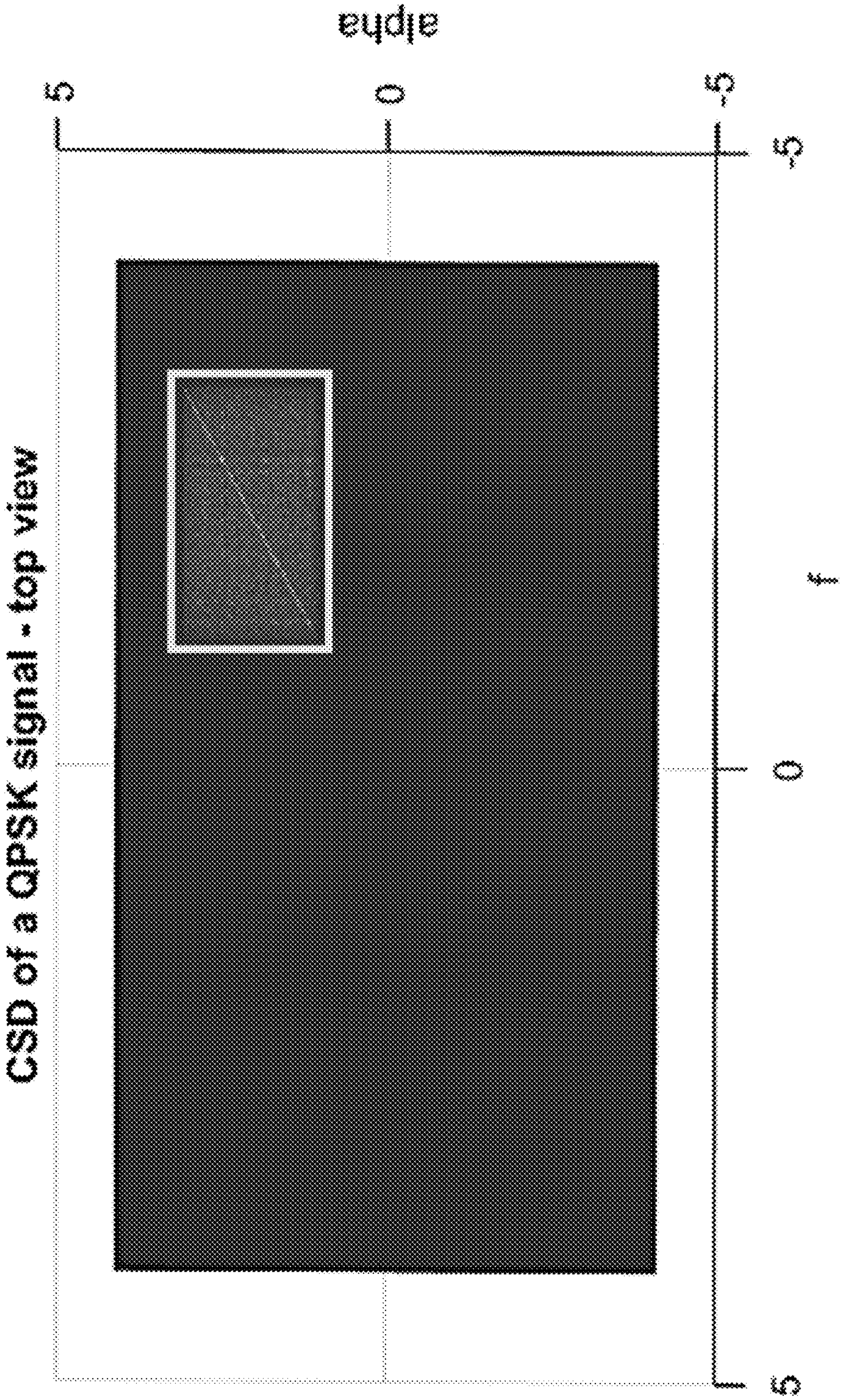
FIG. 75 illustrates a machine learning (ML) image analysis/comparison of the top view of the CSD plot of the QPSK signal.

FIG. 75 illustrates a machine learning (ML) image analysis/comparison of the top view of the CSD plot of the QPSK signal. In one embodiment, the top view comparing mid frequency (f) and cyclic frequency (α) with a color change according to the amplitude has a distinct pattern that corresponds to a traditional QPSK signal. The signal is identified and highlighted in a bonding box by the ML image analysis. The ML algorithm then takes the identified signal and compare the signal properties or visual shape to known/learned modulation patterns. For example, and not limitation the QPSK signal shown in the figure contains a distinct diagonal line going across the signal bounding box that has an increased amplitude shown by a yellow diagonal line indicating the increased amplitude. This pattern is identified by the ML algorithm and the signal is then identified based on the modulation scheme associated with the identified pattern.

Figure 76:
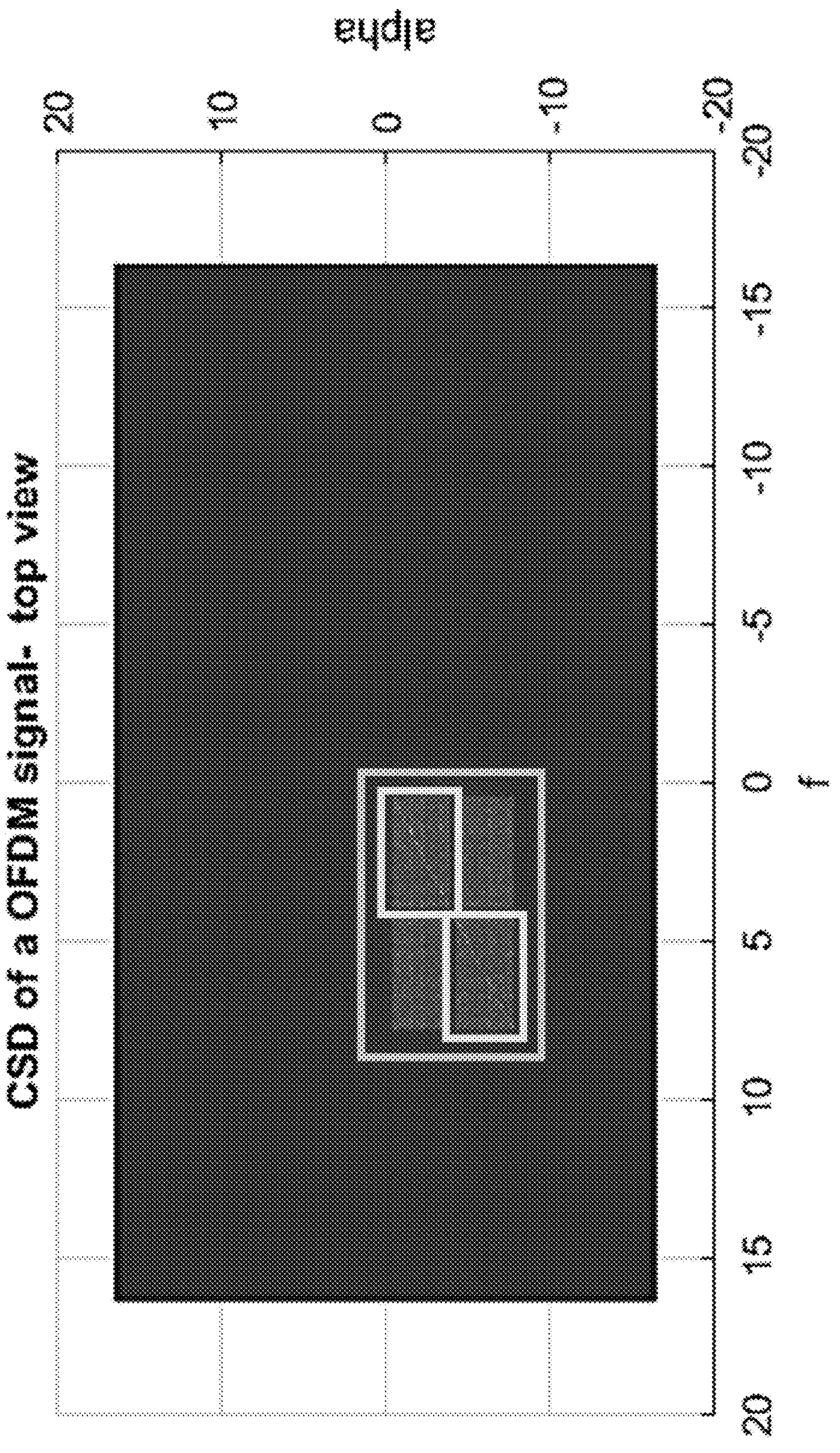
FIG. 76 illustrates a machine learning (ML) image analysis/comparison of the top view of the CSD plot of the OFDM signal.

FIG. 76 illustrates a machine learning (ML) image analysis/comparison of the top view of the CSD plot of the OFDM signal. In one embodiment, the top view comparing mid frequency (f) and cyclic frequency (α) with a color change according to the amplitude has a distinct pattern that corresponds to a traditional OFDM signal shown by the orange bounding box which contains two substantially similar patterns to a QPSK signal shown by the yellow bounding box. The signal is identified and highlighted in a bonding box by the ML image analysis. The ML algorithm then takes the identified signal and compare the signal properties or visual shape to known/learned modulation patterns. For example, and not limitation the OFDM signal shown in the orange bounding box is identified as a signal by the ML algorithm. ML analysis is then done on the larger orange bounding box signal and two signals substantially similar to a QPSK signal shown in the figure in a yellow bounding box contains a distinct diagonal line going across the signal bounding box that has an increased amplitude shown by a yellow diagonal line indicating the increased amplitude. This pattern of two signals similar to a QPSK signals in a pattern which corresponds to a ODFM signal are identified by the ML algorithm and the signal is then identified based on the modulation scheme associated with the identified pattern. The ML algorithm is operable to identify signal pieces that are patterns in a larger signal and identify the larger signal correctly.

Figure 77:
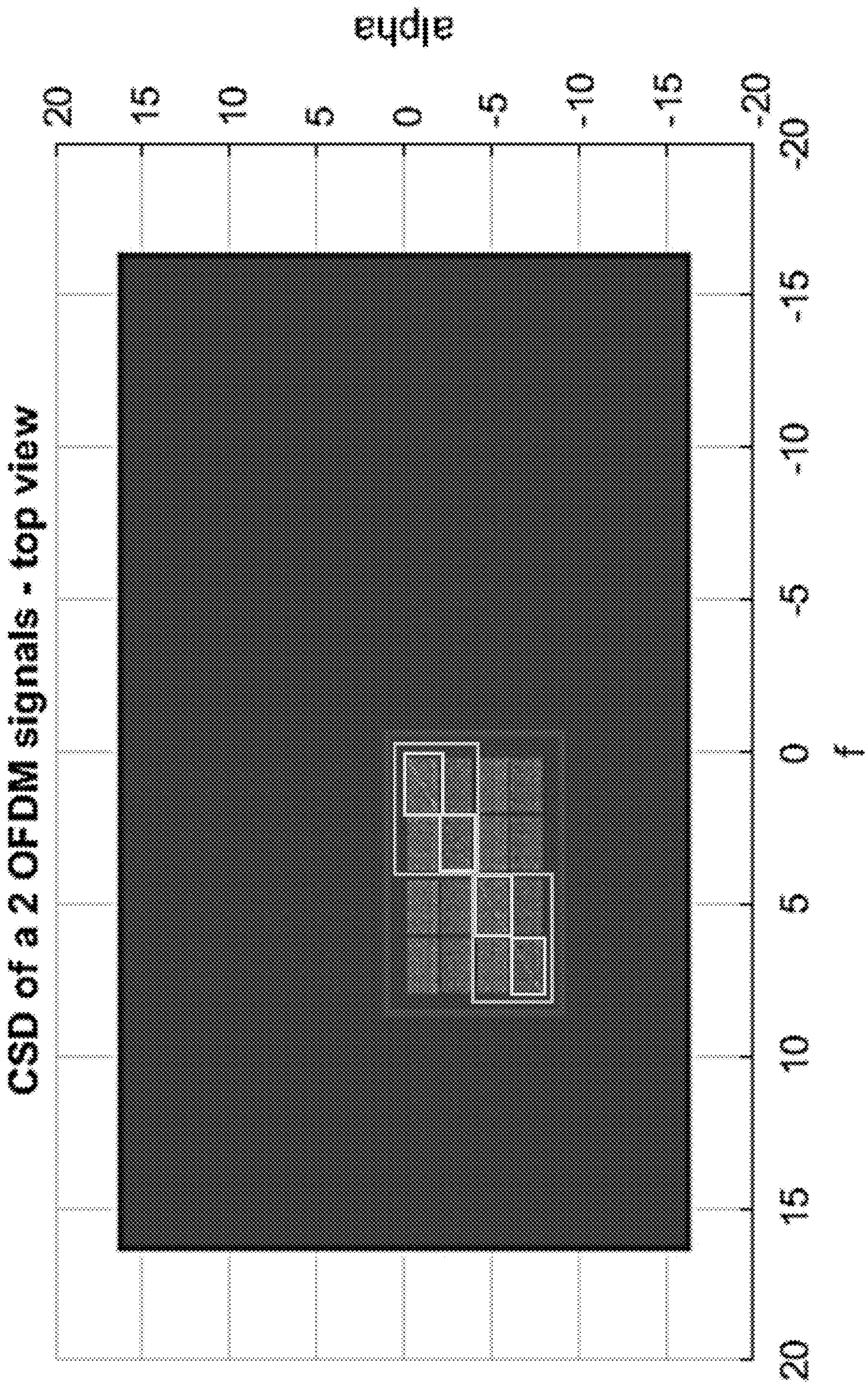
FIG. 77 illustrates a machine learning (ML) image analysis/comparison of the top view of the CSD plot of the 2 OFDM signals.

FIG. 77 illustrates a machine learning (ML) image analysis/comparison of the top view of the CSD plot of the 2 OFDM signals. In one embodiment, the red bounding box represents that large signal energy that is identified by the ML image comparison. The ML algorithm then analyzes the large signal area to find know/learned signal modulation patterns. For example, and not limitation in FIG. 77 four patterns substantially similar to a QPSK signal are identified and classified by the yellow bounding box. The ML image comparison also identifies two separate OFDM signal patterns in the image identified by the orange bounding box. In another embodiment, the image comparison is done by a CNN where patterns are learned based upon prior datasets and the system is operable to recognize different modulation image patterns. The system is operable to report and/or save the modulation type pattern. Reducing the required search area by first identify larger signals by bounding box based on amplitude of the signal reduced the computational complexity of having to image compare an entire graph.

Figure 11:
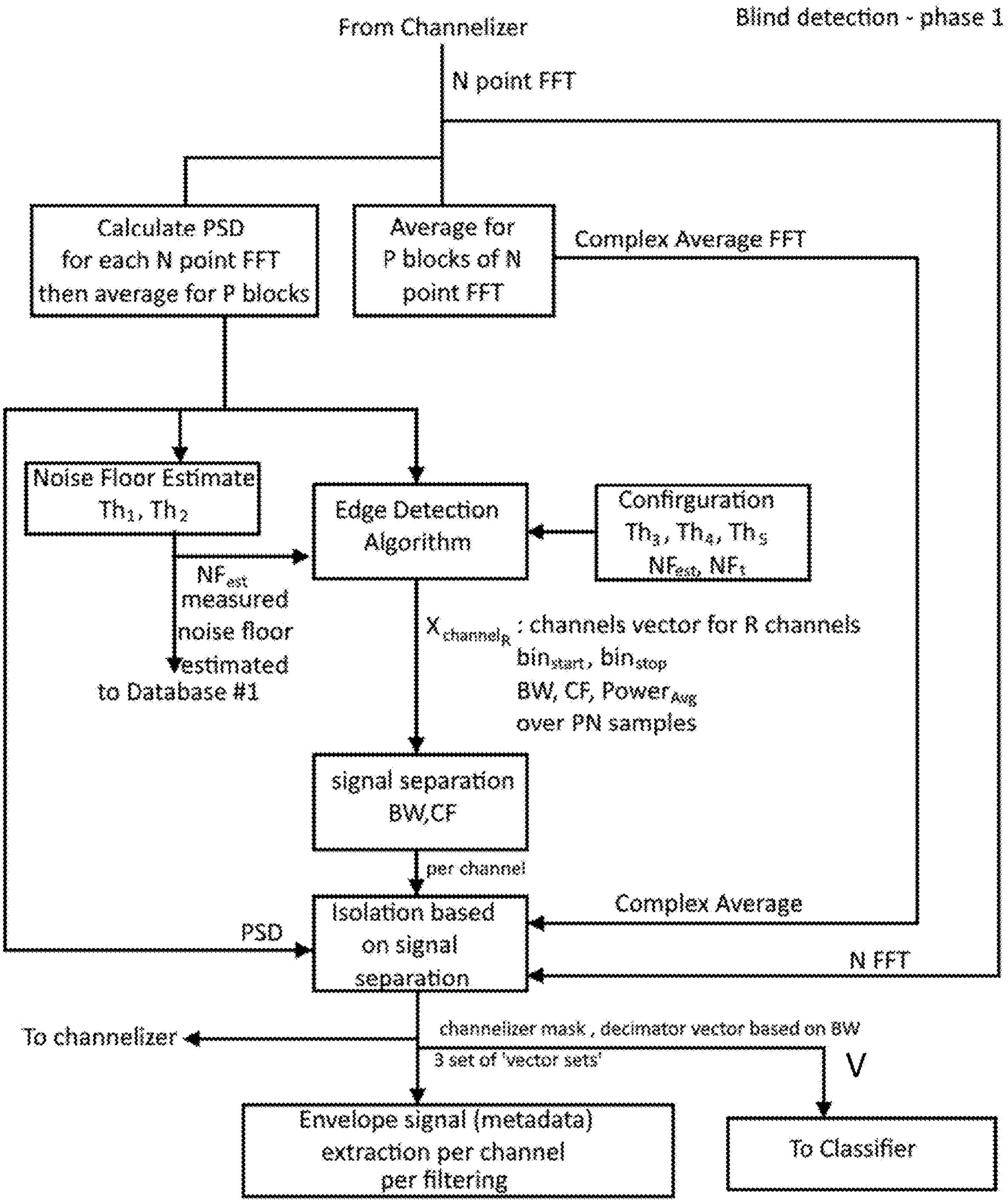
FIG. 11 illustrates one embodiment of a blind detection engine.

Referring back now to FIG. 11, one embodiment of a blind detection engine is shown in FIG. 11. In one embodiment, the blind detection engine is operable to estimate a number of channels and their bandwidths and center frequencies using only an averaged power spectral density (PSD) of the captured signal. Data from the programmable channelizer undergoes an N point FFT. A power spectral density (PSD) is calculated for each N point FFT and then a complex average FFT is obtained for the P blocks of N point FFT. The PSD is sent to a noise floor estimator, an edge detection algorithm, and/or an isolator. Noise floor estimates from the noise floor estimator are sent to the signal database. The edge detection algorithm passes information to a signal separator (e.g., bandwidth, center frequency). The isolator obtains information including, but not limited to, PSD, the bandwidth and center frequency per channel, the complex average FFT, and/or the N point FFT. Information from the isolator is sent to the programmable channelizer, the envelope feature extraction module, and/or the classification engine.

Figure 12:
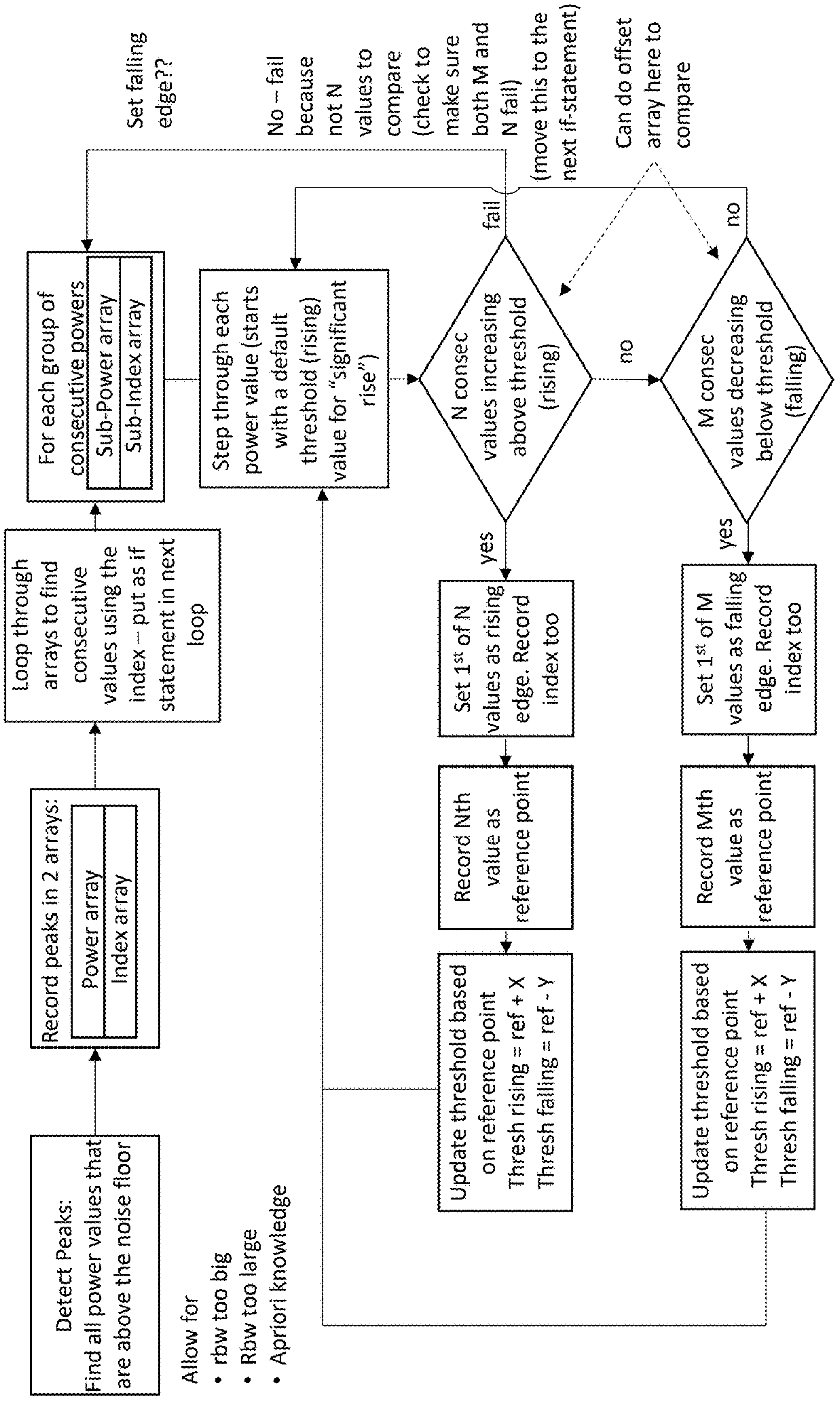
FIG. 12 illustrates an example of an edge detection algorithm.

FIG. 12 illustrates one embodiment of an edge detection algorithm. Peaks are detected for all power values above the noise floor. Peaks are recorded in a power array and/or an index array. Consecutive power values are found by looping through the arrays. For each group of consecutive power values, a sub-power array and/or a sub-index array are created. The blind detection engine steps through each power value starting with a default rising threshold. If N consecutive values are increasing above the rising threshold, a first value of N values is set as the rising edge and the index of the first value of N values is recorded. The Nth value is recorded as a rising reference point. The rising threshold is updated based on the rising reference point, and the blind detection engine continues to scan for rising values. If the blind detection engine does not detect rising values and detects M consecutive values decreasing below a falling threshold, a first value of M values is set as the falling edge and the index of the first value of M values is recorded. The Mth value is recorded as a falling reference point. The falling threshold is updated based on the falling reference point. In one embodiment, x is a value between 1 dB and 2.5 dB. In one embodiment, y is a value between 1 dB and 2.5 dB.

Figure 13:
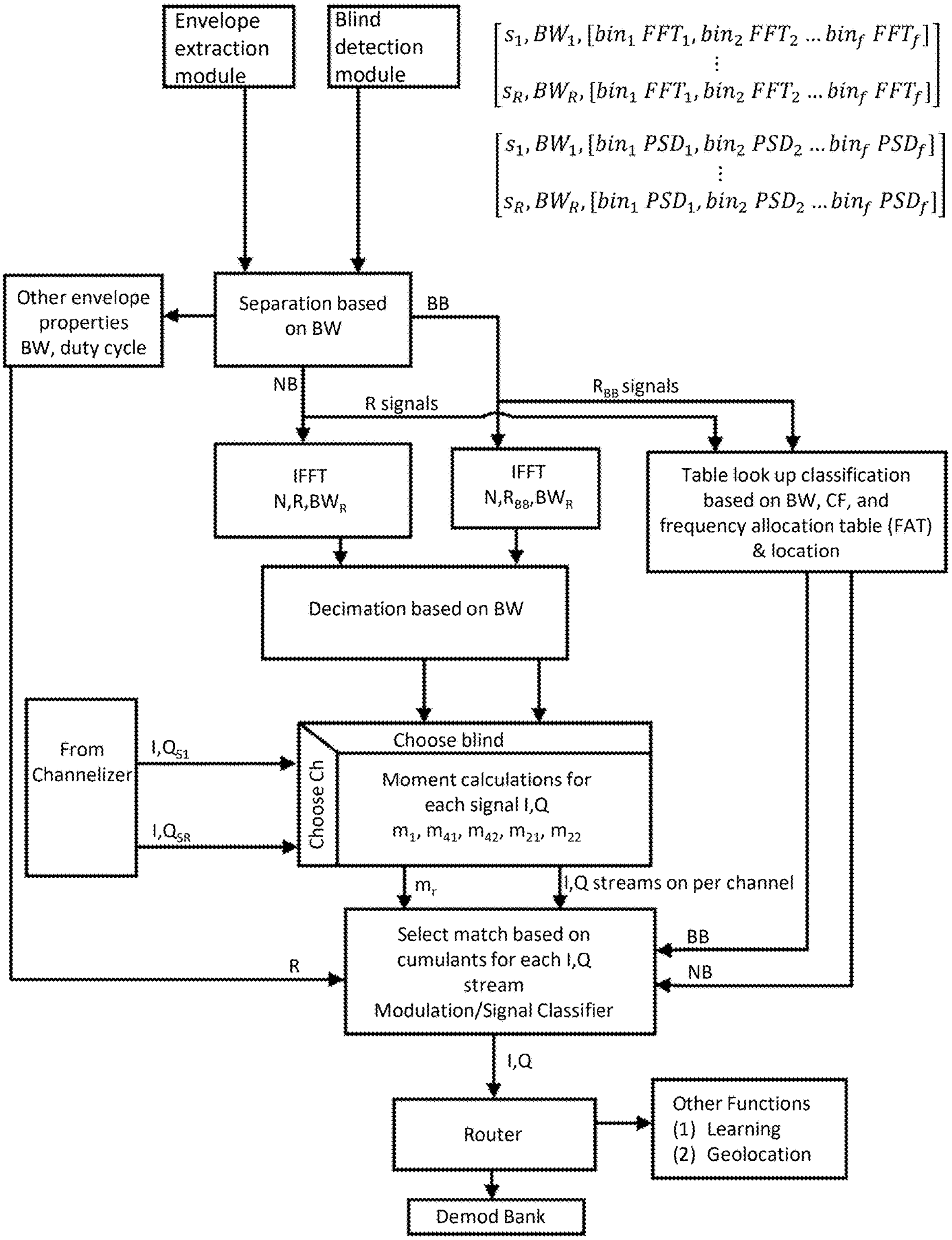
FIG. 13 illustrates an example of a blind classification engine.

The blind classification engine receives information from the blind detection engine as shown in FIG. 13. Signals are separated based on bandwidth and/or other envelope properties (e.g., duty cycle). An IFFT is performed on R signals for narrowband and/or broadband signals. Decimation is then performed based on bandwidth. Moment calculations are performed for each signal I,Q using the decimated values and/or information from the channelizer. In a preferred embodiment, the moment calculations include a second moment and/or a fourth moment for each signal. A match based on cumulants is selected for each I, Q stream, which is sent to the demodulation bank and/or the geolocation engine.

From the definitions of the second and fourth moments, the following equations are used to calculate the cumulants:

$$\hat{C}_{20} = \frac{1}{N}\sum_{n=1}^{n=N}|Y(n)|^2$$

$$\hat{C}_{21} = \frac{1}{N}\sum_{n=1}^{n=N}Y^2(n)$$

$$\hat{C}_{40} = \frac{1}{N}\sum_{n=1}^{n=N}Y^4(n) - 3\hat{C}_{20}^2$$

$$\hat{C}_{41} = \frac{1}{N}\sum_{n=1}^{n=N}Y^3(n)Y^*(n) - 3\hat{C}_{20}\hat{C}_{21}$$

$$\hat{C}_{42} = \frac{1}{N}\sum_{n=1}^{n=N}|Y(n)|^4 - |\hat{C}_{20}|^2 - 2\hat{C}_{21}^2$$

If it assumed that transmitted constellations are normalized to unity average power, which is easily completed by a power factor equal to 0 dB, this results in $\hat{C}_{21}\approx 1$. To calculate a normalized fourth moment is calculated using the following equation:

$$\tilde{C}_{4J} \triangleq \hat{C}_{4J}/\hat{C}_{21} \text{ for } J = 0, 1, 2$$

Advantageously, normalizing the fourth moment cumulants removes any scaling power problems.

Figure 14:
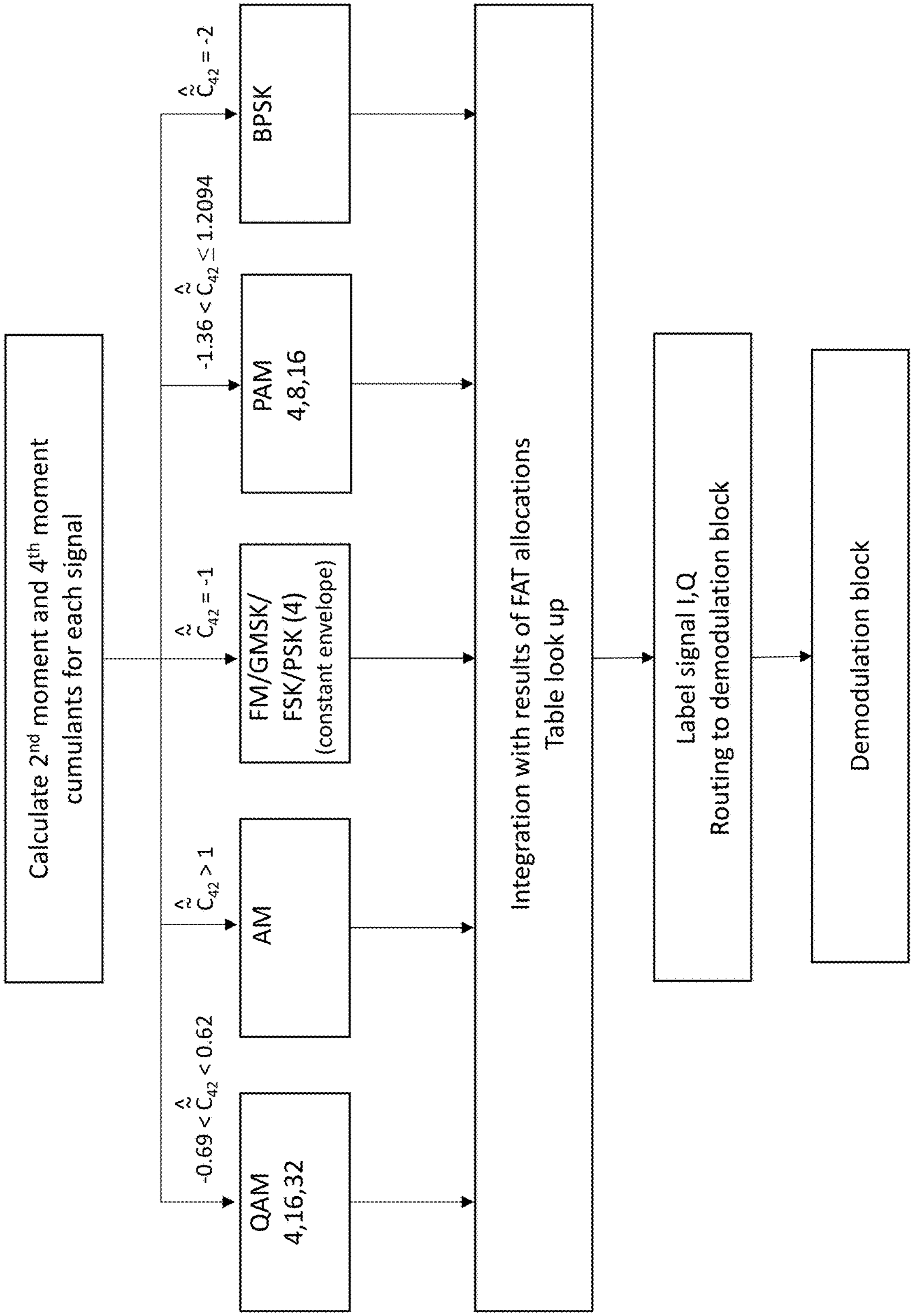
FIG. 14 illustrates details on selection match based on cumulants for modulation selection.

FIG. 14 illustrates details on selection match based on cumulants for modulation selection. As previously described, the cumulants preferably include a second moment and/or a fourth moment for each signal. For example, a fourth moment between −0.9 and 0.62 is a quadrature amplitude modulation (QAM) signal, a fourth moment greater than or equal to 1 is an amplitude modulation (AM) signal, a fourth moment equal to −1 is a constant envelope signal (e.g., frequency modulation (FM), Gaussian minimum-shift keying (GMSK), frequency-shift keying (FSK), or phase-shift keying (PSK)), a fourth moment between −1.36 and 1.209 is a pulse-amplitude modulation (PAM) signal, and a fourth moment equal to −2 is a binary phase-shift keying (BPSK) signal. A type is selected using a look up table, the signal I, Q is labeled with the type, and the information is sent to the demodulation bank.

Additional information about selection match based on cumulants for modulation selection is available in Table 1 below.

TABLE 1

| Type | $\tilde{\tilde{C}}_{40}$ | $\tilde{\tilde{C}}_{42}$ | $\sigma(\tilde{\tilde{C}}_{40})$ | $\sigma(\tilde{\tilde{C}}_{42})$ |
|---|---|---|---|---|
| AM | | >1.0 | | |
| FM | | −1 | | |
| GMSK | | −1 | | |
| FSK | | −1 | | |
| BPSK | −2.00 | −2.00 | 0 | 0 |
| PAM (4) | −1.36 | −1.36 | 2.56 | 2.56 |
| PAM (8) | −1.238 | −1.238 | 4.82 | 4.82 |
| PAM (16) | −1.2094 | −1.2094 | 5.52 | 5.52 |

TABLE 1-continued

| Type | $\tilde{\tilde{C}}_{40}$ | $\tilde{\tilde{C}}_{42}$ | $\sigma(\tilde{\tilde{C}}_{40})$ | $\sigma(\tilde{\tilde{C}}_{42})$ |
|---|---|---|---|---|
| PSK (4) | −1.00 | −1.00 | | |
| QAM (4) | −0.68 | −0.68 | | |
| QAM (16) | −0.64 | −0.64 | 3.83 | 2.24 |
| QAM (32) | −0.61 | −0.61 | 3.89 | 2.31 |

Figure 15:
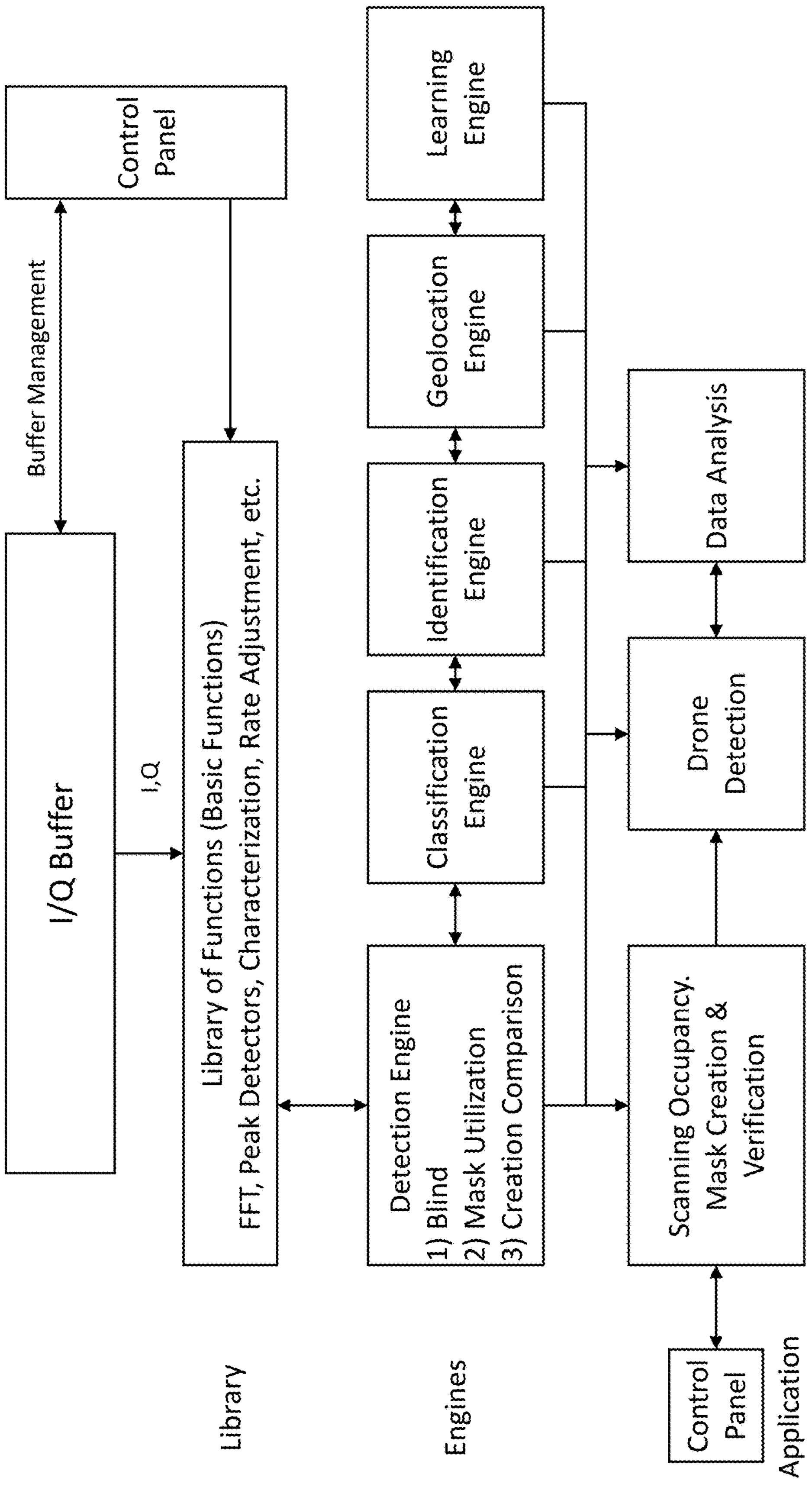
FIG. 15 illustrates a flow diagram according to one embodiment of the present invention.

FIG. 15 illustrates a flow diagram according to one embodiment of the present invention. Data in the I/Q buffer is processed using a library of functions. The library of functions includes, but is not limited to, FFT, peak detection, characterization, and/or rate adjustment. As previously described, the system preferably includes at least one data analysis engine. In one embodiment, the at least one data analysis engine includes a plurality of engines. In one embodiment, the plurality of engines includes, but is not limited to, a detection engine, a classification engine, an identification engine, a geolocation engine, and/or a learning engine. Each of the plurality of engines is operable to interact with the other engines in the plurality of engines. The system is operable to scan for occupancy of the spectrum, create a mask, detect drones, and/or analyze data.

The control panel manages all data flow between the I/Q buffer, library functions, the plurality of engines, applications, and user interface. A collection of basic functions and a particular sequence of operations are called from each of the plurality of engines. Each of the plurality of engines is operable to pass partially processed and/or analyzed data to other engines to enhance functionality of other engines and/or applications. The data from the engines are then combined and processed to build applications and/or features that are customer or market specific.

In one embodiment, a plurality of state machines performs a particular analysis for a customer application. In one embodiment, the plurality of state machines is a plurality of nested state machines. In another embodiment, one state machine is utilized per each engine application. The plurality of state machines is used to control flow of functions and/or an engine's input/output utilization to perform required analyses.

Figure 16:
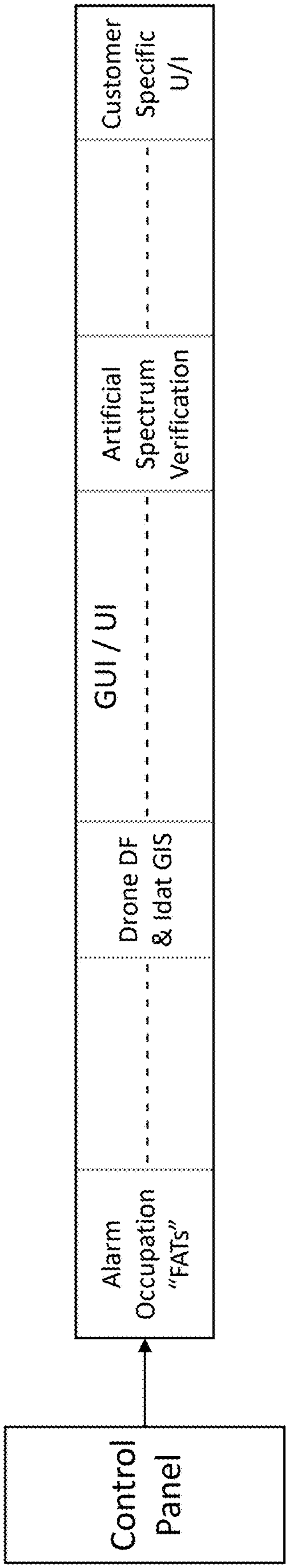
FIG. 16 illustrates control panel functions according to one embodiment.

FIG. 16 illustrates control panel functions according to one embodiment. The control panel is operable to detect occupation of the spectrum, activate an alarm, perform drone detection and direction finding, geolocation, artificial spectrum verification, and provide at least one user interface. The at least one user interface is preferably a graphical user interface (GUI). The at least one user interface (UI) is operable to display output data from the plurality of engines and/or applications. In one embodiment, the at least one UI incorporates third party GIS for coordinate display information. The at least one UI is also operable to display alarms, reports, utilization statistics, and/or customer application statistics. In one embodiment, the at least one UI includes an administrator UI and at least one customer UI. The at least one customer UI is specific to each customer.

In one embodiment, the systems and methods of the present invention provide unmanned vehicle (e.g., drone) detection. The overall system is capable of surveying the spectrum from 20 MHz to at least 6 GHz, not just the common 2.4 GHz and 5.8 GHz bands as in the prior art. The systems and methods of the present invention are operable to detect UVs and their controllers by protocol.

In one embodiment, the systems and methods of the present invention maintain a state-of-the-art learning system and a protocol library for classifying detected signals by manufacturer and controller type. The state-of-the-art learning system and the protocol library are updated as new protocols emerge.

In one embodiment, classification by protocol chipset is utilized to provide valuable intelligence and knowledge for risk mitigation and threat defense. The valuable intelligence and knowledge include effective operational range, supported peripherals (e.g., external or internal camera, barometers, global positioning system (GPS) and dead reckoning capabilities), integrated obstacle avoidance systems, and interference mitigation techniques.

Advantageously, the system is operable to detect drones that are not in the protocol library. Further, the system is operable to detect drones without demodulating command and control protocols. In one embodiment, the system does not include a protocol library. New protocols and new drones are constantly being released. Additionally, a nefarious operator can switch out the chipset of a drone, which would leave an area vulnerable to the modified drone because a system would not be able to identify the signal as a drone if the protocol is not in the protocol library. In one embodiment, the system generates actionable data that indicates that at least one signal is behaving like a drone. The system performs blind detection, which allows the system to detect the drone signal without the protocol library. In one embodiment, the system is operable to detect drones by evaluating an envelope of the command and control signal. In one embodiment, the system detects the drone signal based on a duty cycle and/or changes in power levels of the signal envelope. In one example, an LTE signal is classified by the system as a drone when moving at a high velocity.

Figure 17:
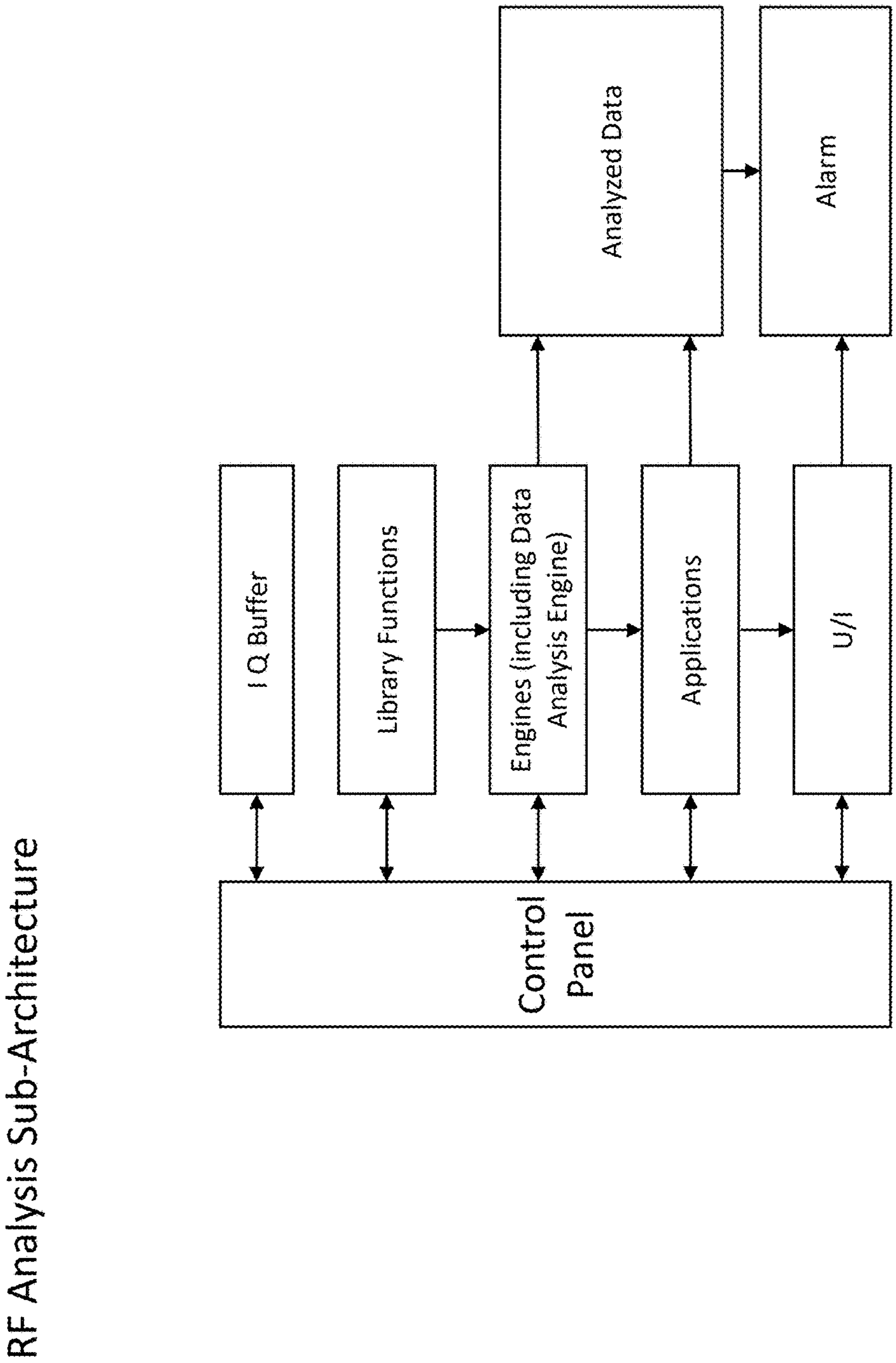
FIG. 17 illustrates one embodiment of an RF analysis sub-architecture of the system.

FIG. 17 illustrates one embodiment of an RF analysis sub-architecture of the system. The control panel interacts with the I/Q buffer, library functions, engines, applications, and/or user interface. The engines include a data analysis engine. Analyzed data from the data analysis engine results in an alarm when an alarm condition is met. The alarm is transmitted via text and/or email, or is visualized on a graphical user interface (GUI) of at least one remote device (e.g., smartphone, tablet, laptop computer, desktop computer).

Figure 18:
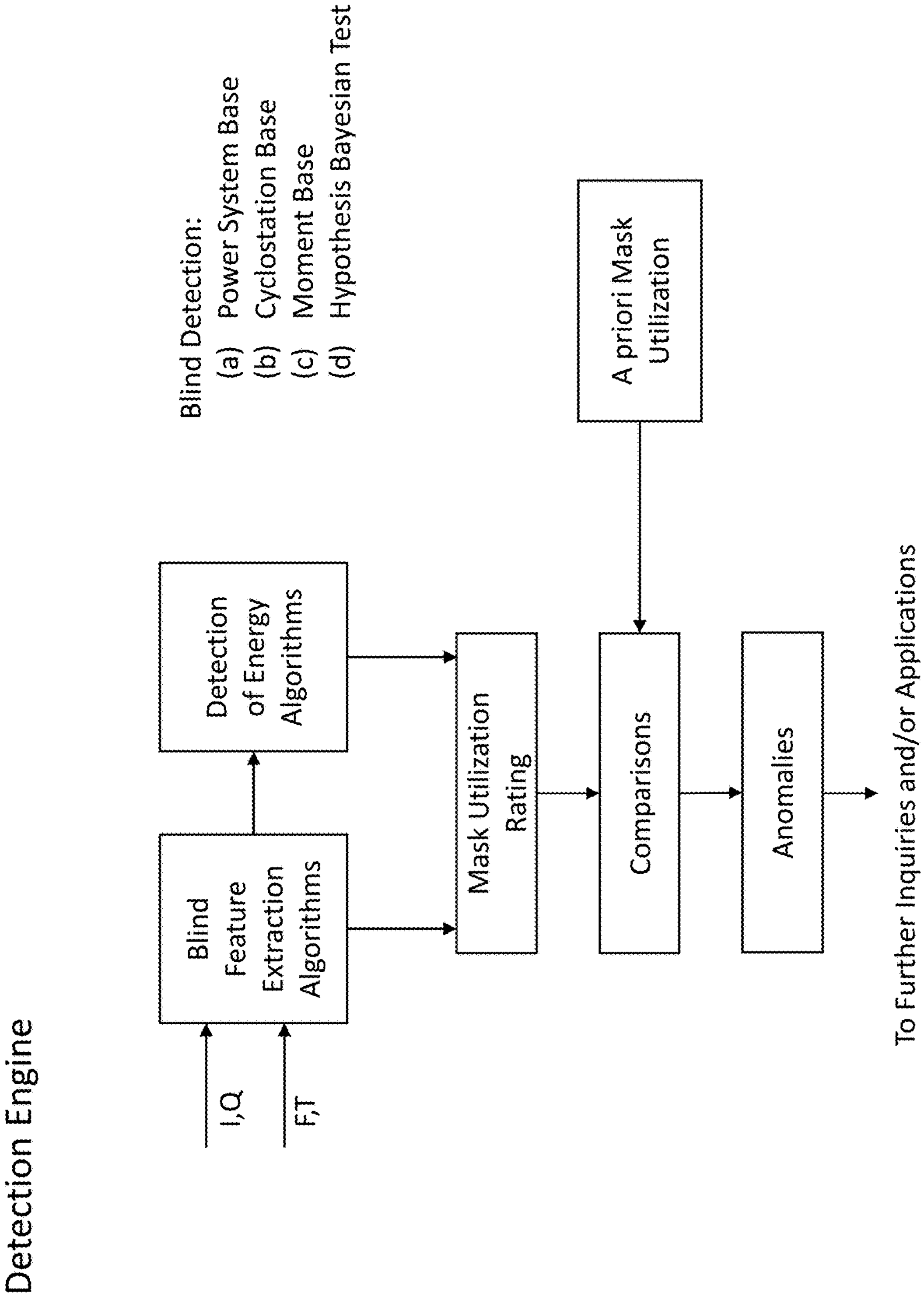
FIG. 18 illustrates one embodiment of a detection engine of the system.

FIG. 18 illustrates one embodiment of a detection engine of the system. The detection engine receives data from the at least one monitoring unit. the detection engine includes blind feature extraction algorithms. A mask is created. The detection engine then performs a mask utilization rating and the mask is compared to previous masks. Anomalies are then detected.

Figure 19:
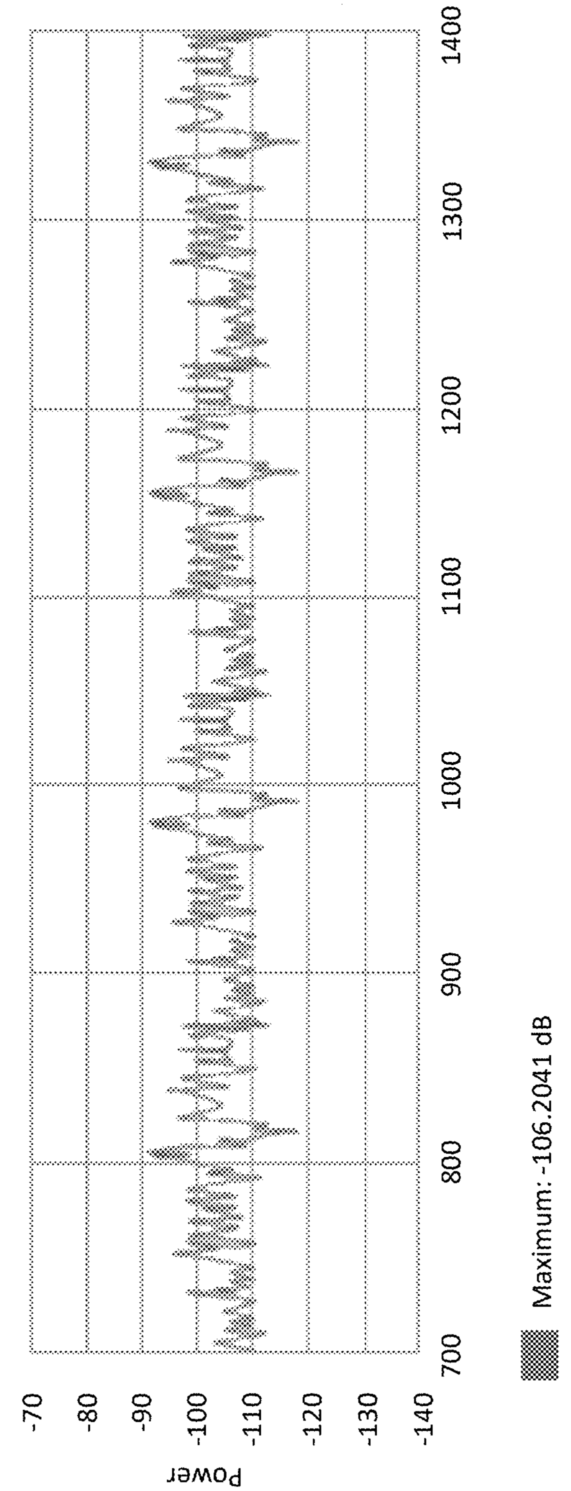
FIG. 19 illustrates a mask according to one embodiment of the present invention.

As previously described, in one embodiment, the data analysis engine is operable to perform mask creation and analyze an electromagnetic (e.g., RF) environment using masks. Mask creation is a process of elaborating a representation of an electromagnetic environment by analyzing a spectrum of signals over a certain period of time. A mask is created with a desired frequency range (e.g., as entered into the system via user input), and FFT streaming data is also used in the mask creation process. A first derivative is calculated and used for identifying maximum power values. A moving average value is created as FFT data is received during a selected time period for mask creation (e.g., via user input). For example, the time period is 10 seconds. The result is an FFT array with an average of maximum power values, which is called a mask. FIG. 19 illustrates a mask according to one embodiment of the present invention.

In one embodiment, the mask is used for electromagnetic environment analysis. In one embodiment, the mask is used for identifying potential unwanted signals in an electromagnetic (e.g., RF) environment. The system is operable to utilize masks based on a priori knowledge and/or masks based on expected behavior of the electromagnetic environment.

Each mask has an analysis time. During its analysis time, a mask is scanned and live FFT streaming data is compared against the mask before next mask arrives. If a value is detected over the mask range, a trigger analysis is performed. Each mask has a set of trigger conditions, and an alarm is triggered into the system if the trigger conditions are met. In one embodiment, there are three main trigger conditions including an alarm duration, a decibel (dB) offset, and a count. The alarm duration is a time window an alarm needs to appear to be considered a trigger condition. For example, the time window is 2 seconds. If a signal is seen for 2 seconds, it passes to the next condition. The dB offset is a threshold value (i.e., dB value) a signal needs to be above the mask to be considered as a potential alarm. The count is the number of times the first two conditions need to happen before an alarm is triggered into the system.

Figure 20:
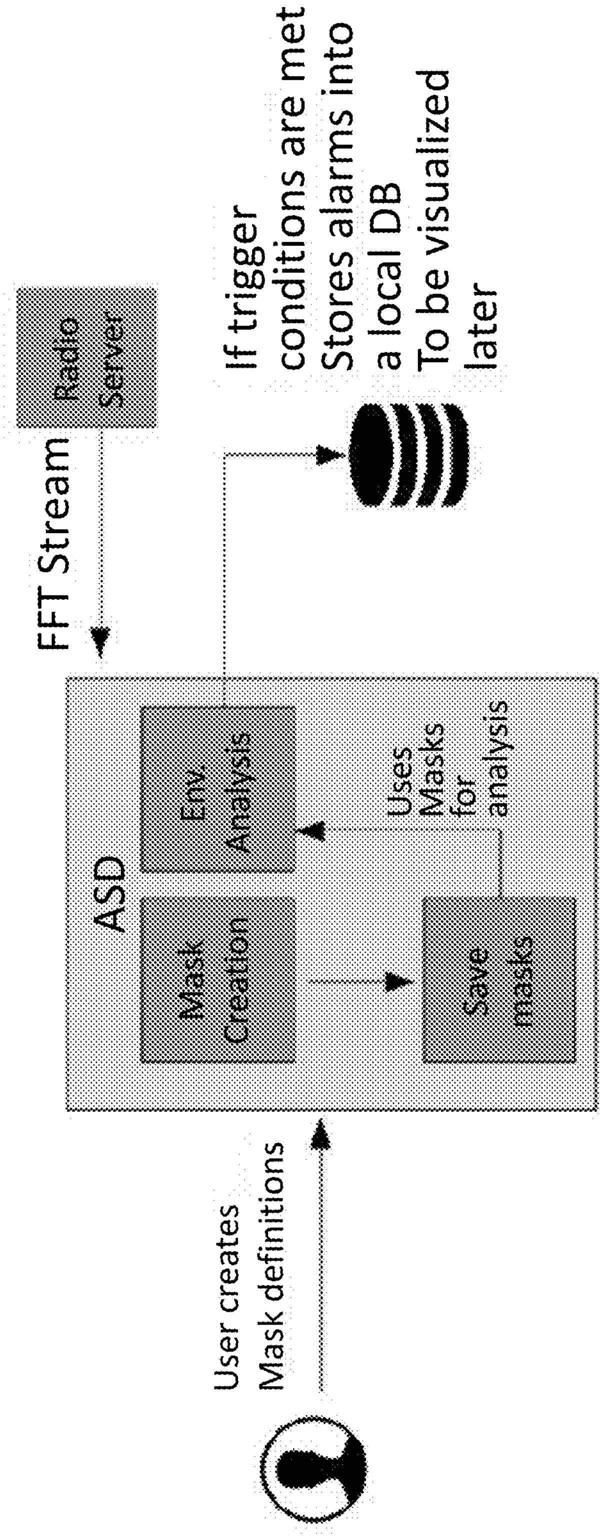
FIG. 20 illustrates a workflow of automatic signal detection according to one embodiment of the present invention.

FIG. 20 illustrates a workflow of automatic signal detection according to one embodiment of the present invention. A mask definition is specified by a user for an automatic signal detection process including creating masks, saving masks, and performing electromagnetic (e.g., RF) environment analysis based on the masks created and FFT data stream from a radio server. In one embodiment, if trigger conditions are met, alarms are triggered and stored to a local database for visualization.

Figure 21:
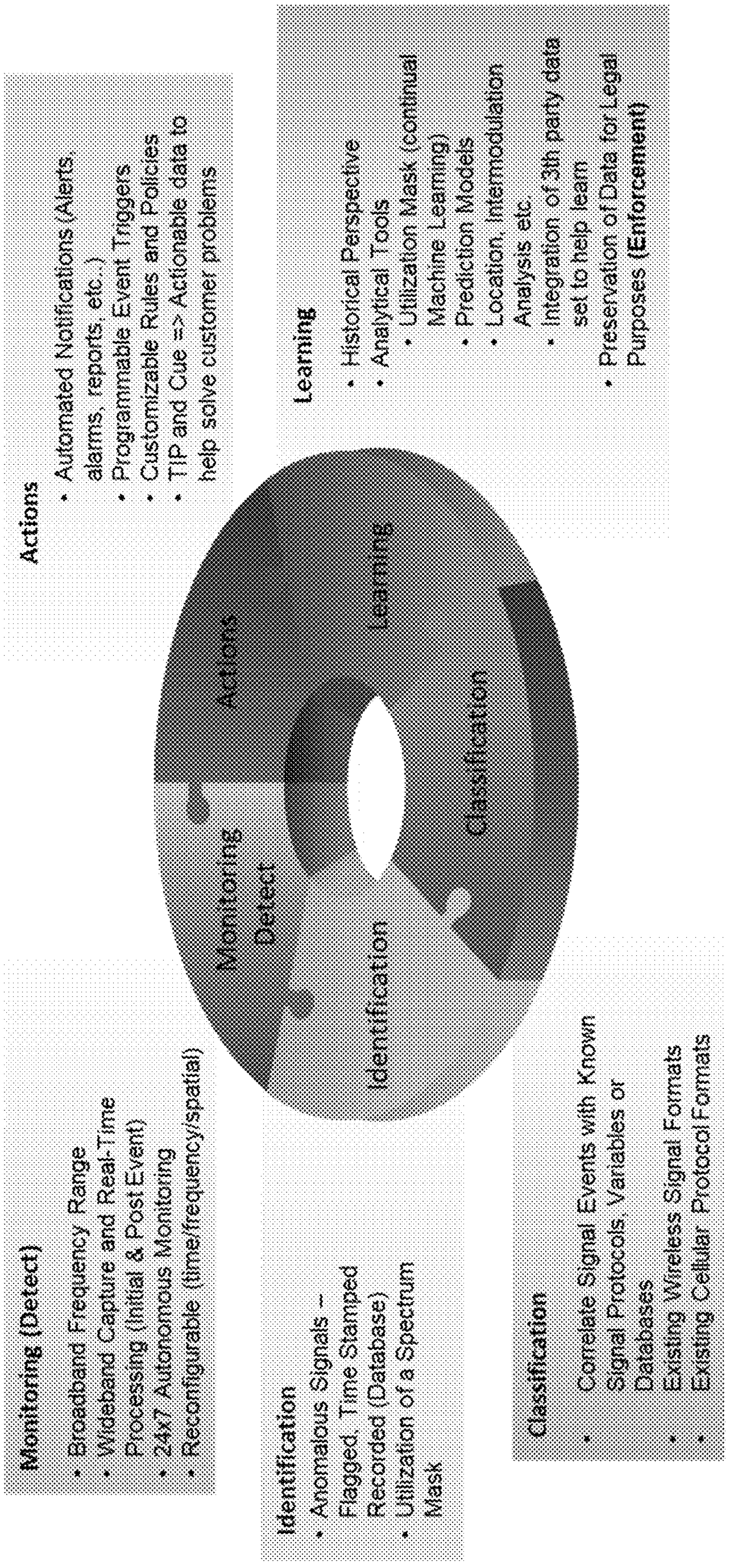
FIG. 21 illustrates components of a Dynamic Spectrum Utilization and Sharing model according to one embodiment of the present invention.

FIG. 21 illustrates components of a Dynamic Spectrum Utilization and Sharing model according to one embodiment of the present invention. By employing the Dynamic Spectrum Utilization and Sharing model, the present invention is operable to perform a plurality of radio frequency (RF) environmental awareness functionalities including, but not limited to, monitoring and/or detection, identification, and/or classification. Monitoring and/or detection functionalities include, but are not limited to, broadband frequency range detection, wideband capture in real-time or near-real-time, initial processing and/or post event processing, 24-hour autonomous monitoring, and/or reconfiguration options relating to time, frequency, and spatial settings. Identification functionalities include, but are not limited to, anomalous signal detection, anomalous signal flagging, anomalous signal time stamp recording, providing an anomalous signal database, and/or utilization of a spectrum mask. In one embodiment, the spectrum mask is a dynamic spectrum mask. Classification functionalities include, but are not limited to, correlating signal events with known signal protocols, correlating signal events with known variables, correlating signal events with known databases, correlating signal events with existing wireless signal formats, and/or correlating signal events with existing cellular protocol formats. Each of the aforementioned functionalities incorporates learning processes and/or procedures. These include, but are not limited to, historical data analysis, data preservation tools, and/or learning analytics. Incorporation of machine learning (ML), artificial intelligence (AI), and/or neural networks (NN) ensures that every aspect of detection, monitoring, identification, and/or classification is performed autonomously. This is compounded through the use of the learning analytics, enabling the use of utilization masks for continual ML, prediction modeling, location analysis, intermodulation analysis, and/or the integration of third-party data sets for increasing overall learning capabilities and/or functionalities of the platform. Moreover, these capabilities and/or functionalities are backed up through secure data preservation services, providing both a secure platform environment and/or data enforcement documentation (i.e., legal documents). Furthermore, the platform is operable to provide automated notifications, programmable event triggers, customizable rules and/or policies, and Tip and Cue practices. Automated notifications include, but are not limited to, alerts, alarms, and/or reports. Advantageously, this functionality enables the platform to react to specific rules and/or policies, as well as incorporating the platform's own awareness and knowledge, creating an optimized platform for any RF environment and/or mission.

Prediction models used by the platform provide an accurate insight into the dynamic spectrum allocation and utilization functionalities. These prediction models enable the platform to autonomously create forecasts for future spectrum usage. In addition, the prediction models used by the platform incorporate descriptive analytics, diagnostic analytics, predictive analytics, and/or prescriptive analytics. Descriptive analytics refers specifically to the data stored, analyzed, and/or used by the platform. Descriptive analytics provides data enabling the platform to act and/or provide a suggested action. Diagnostic analytics refers to how and/or why the descriptive analytics acted and/or suggested an action. Predictive analytics specifically refers to the utilization of techniques including, but not limited to, ML, AI, NNs, historical data, and/or data mining to make future predictions and/or models. Prescriptive analytics refers to the act and/or the suggested act generated by the descriptive analytics. Once this predictive model is in place, the platform is operable to recommend and/or perform actions based on historical data, external data sources, ML, AI, NNs, and/or other learning techniques.

Figure 22:
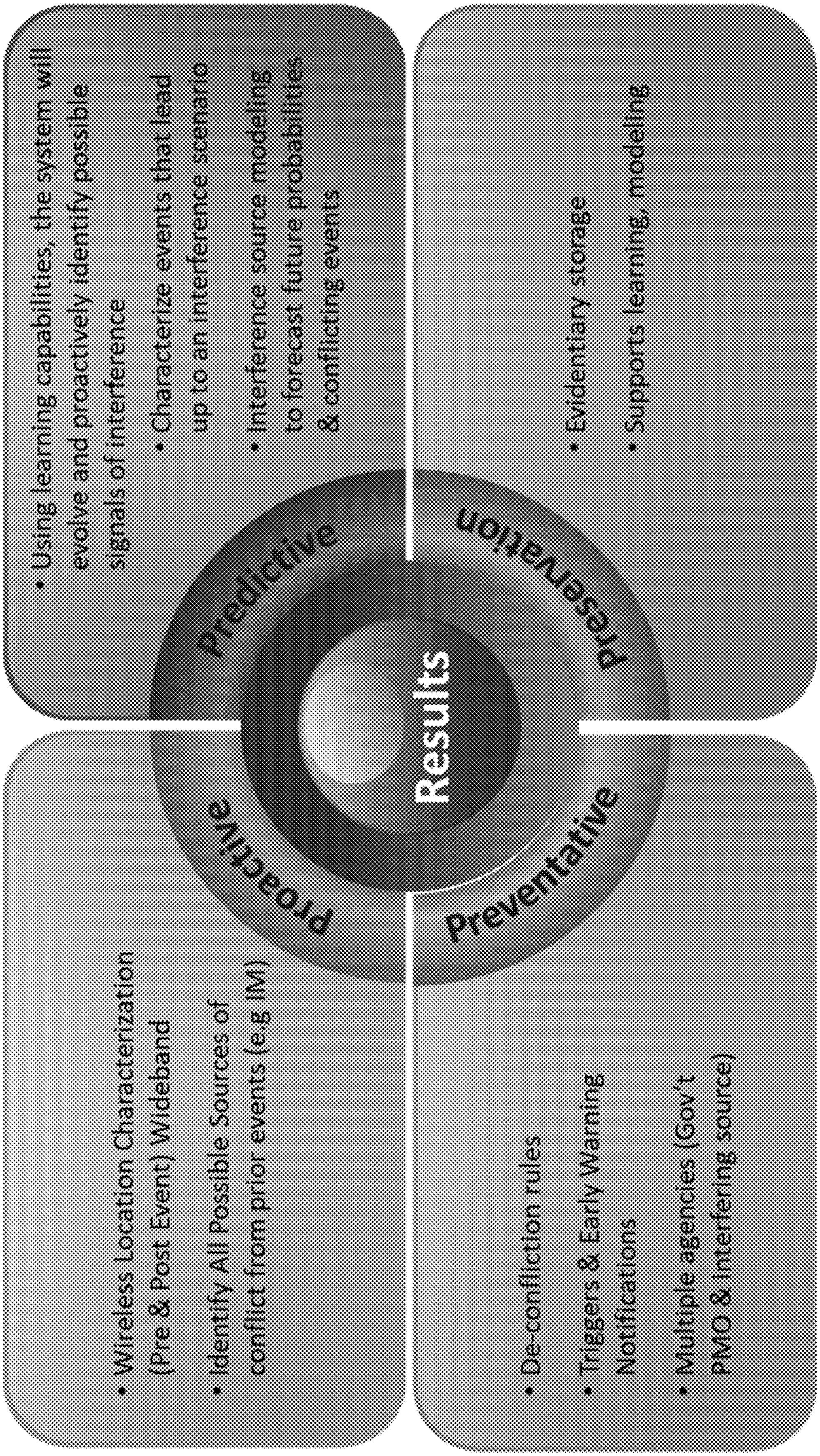
FIG. 22 illustrates a Results model provided by the system according to one embodiment of the present invention.

FIG. 22 illustrates a Results model according to one embodiment of the present invention. The Results model provided by the present invention is centered around four core practices: proactive, predictive, preventative, and preservation. The predictive practice refers to using the aforementioned learning functionalities and capabilities to evolve the platform, enabling the characterization of events that led up to an interference scenario and/or performing interference source modeling to forecast future probabilities and/or conflicting events. The predictive practice is intertwined with the platform remaining proactive, identifying possible signals of interference. While identifying possible signals of interference is a combination of the platform's predictive and proactive capabilities, the platform also remains proactive in performing wireless location characterization for both pre- and post-event scenarios. In addition, the platform's proactive capabilities include, but are not limited to, identifying all possible sources of conflict based on prior events. Furthermore, the platform also focuses on preventative practices. These include, but are not limited to, maintaining a set of de-confliction rules, providing trigger warning notifications and/or early warning notifications, and/or maintaining compatibility with multiple government agencies, including corresponding government project management offices (PMOs) and any interfering sources. In one embodiment, the platform automatically establishes the set of de-confliction rules, where the set of de-confliction rules are operable for editing. In one embodiment, the platform is operable to autonomously edit the set of de-confliction rules. In another embodiment, the platform enables editing of the set of de-confliction rules via user input. Finally, the platform includes preservation components and/or functionalities. These include, but are not limited to, evidentiary storage, learning capabilities, and modeling functionality. Each of these four core practices is interconnected within the platform, enabling dynamic spectrum utilization and sharing.

Geolocation

Geolocation is an additional aspect relating to electromagnetic (e.g., RF) analysis of an environment. The primary functions of the electromagnetic analysis of the environment include, but are not limited to, detection, classification, identification, learning, and/or geolocation. Additionally, the electromagnetic analysis is operable to output environmental awareness data.

The system includes a geolocation engine, operable to use both passive and/or active methods of radio geolocation. In general, radio geolocation refers to the geographic location of man-made emitter sources propagating using radio (electromagnetic) waves as they impinge upon a man-made geo-locator, or receiver. Passive radio geolocation requires no transmission of signals by a geo-locator, whereas active radio geolocation involves a geolocator transmitting signals that interact with an emitter source. Passive methods of geolocation include, but are not limited to, single directional beam antenna response, multidirectional beam antenna response (Amplitude Ratio), multi-antenna element response (Array Processing), line of bearing (LOB)-to-position solutions, and/or general optimization. Multi-antenna element response methods include, but are not limited to, phase interferometry, beamforming, conventional array manifold processing approaches, and/or high-resolution array manifold processing approaches using signals subspace. While these passive methods primarily apply to approaches for Direction Finding (DF) as spatial filtering, passive methods that apply to approaches other than DF as spatial filtering are operable for use by the system. DF refers to the process of estimating the direction of arrival of propagating emitter signals as they impinge on a receiver. Passive methods further include DF approaches based on general optimization including, but not limited to, digital pre-distortion (DPD), convex programming, and/or distributed swarm approaches.

In addition to the previously mentioned passive approaches, the system is operable to apply approaches based on ranging observations including, but not limited to, receiver signal strength indicators (RSSI), time of arrival (TOA), and/or time difference of arrival (TDOA) methods. RSSI approaches relate to the generation of observable data and/or location estimation. TOA and/or TDOA approaches relate to generating observable data from distributed multi antenna systems and/or single antenna systems, and/or location estimation using non-linear optimization and/or constraint linear optimization.

In a preferred embodiment, geolocation is performed using Angle of Arrival (AOA), Time Difference of Arrival (TDOA), Frequency Difference of Arrival (FDOA), and power distribution ratio measurements.

Figure 23:
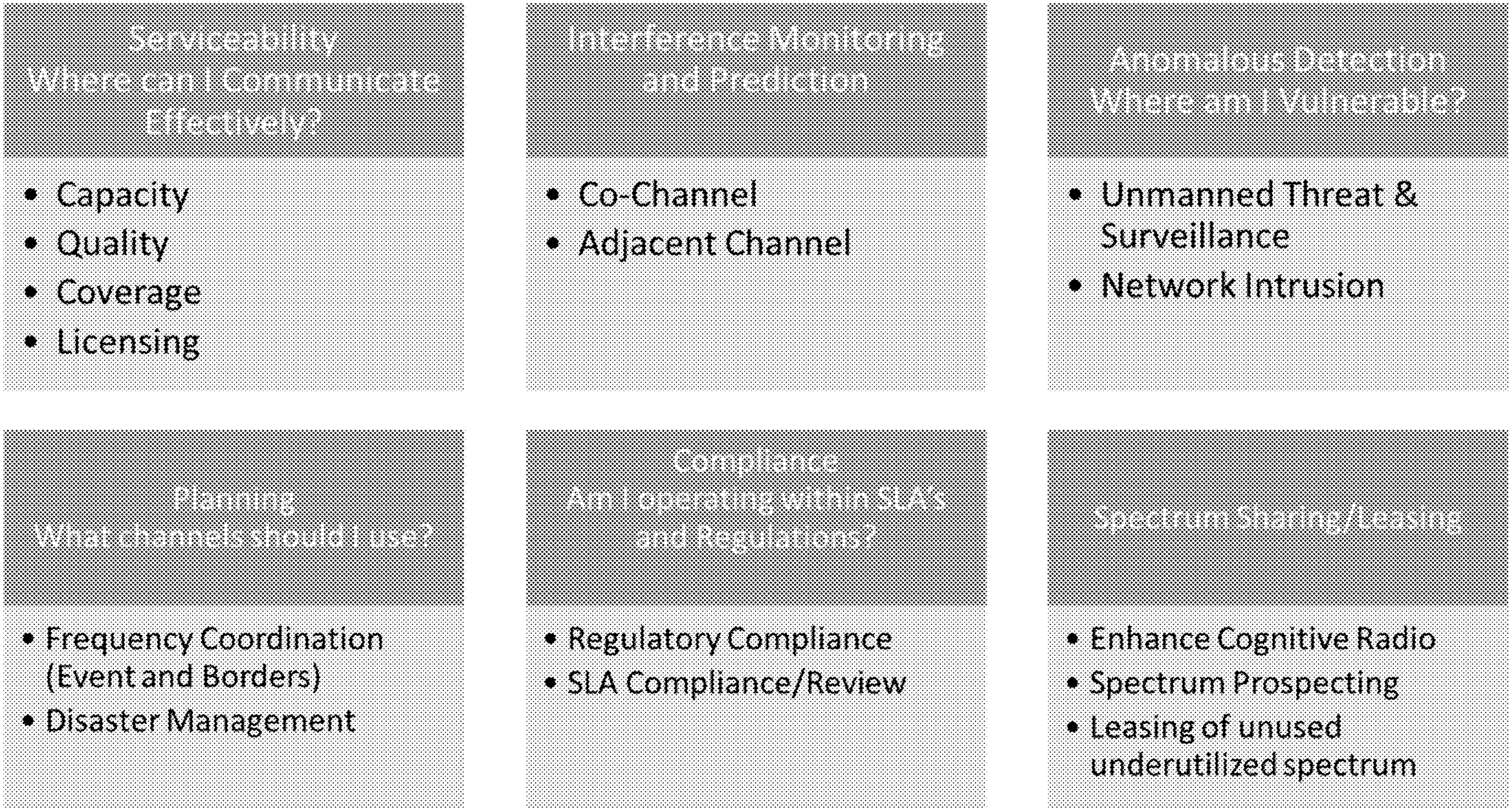
FIG. 23 is a table listing problems that are operable to be solved using the present invention.

FIG. 23 is a table listing problems that are operable to be solved using the present invention, including serviceability, interference, monitoring and prediction, anomalous detection, planning, compliance, and/or spectrum sharing or leasing.

Figure 24:
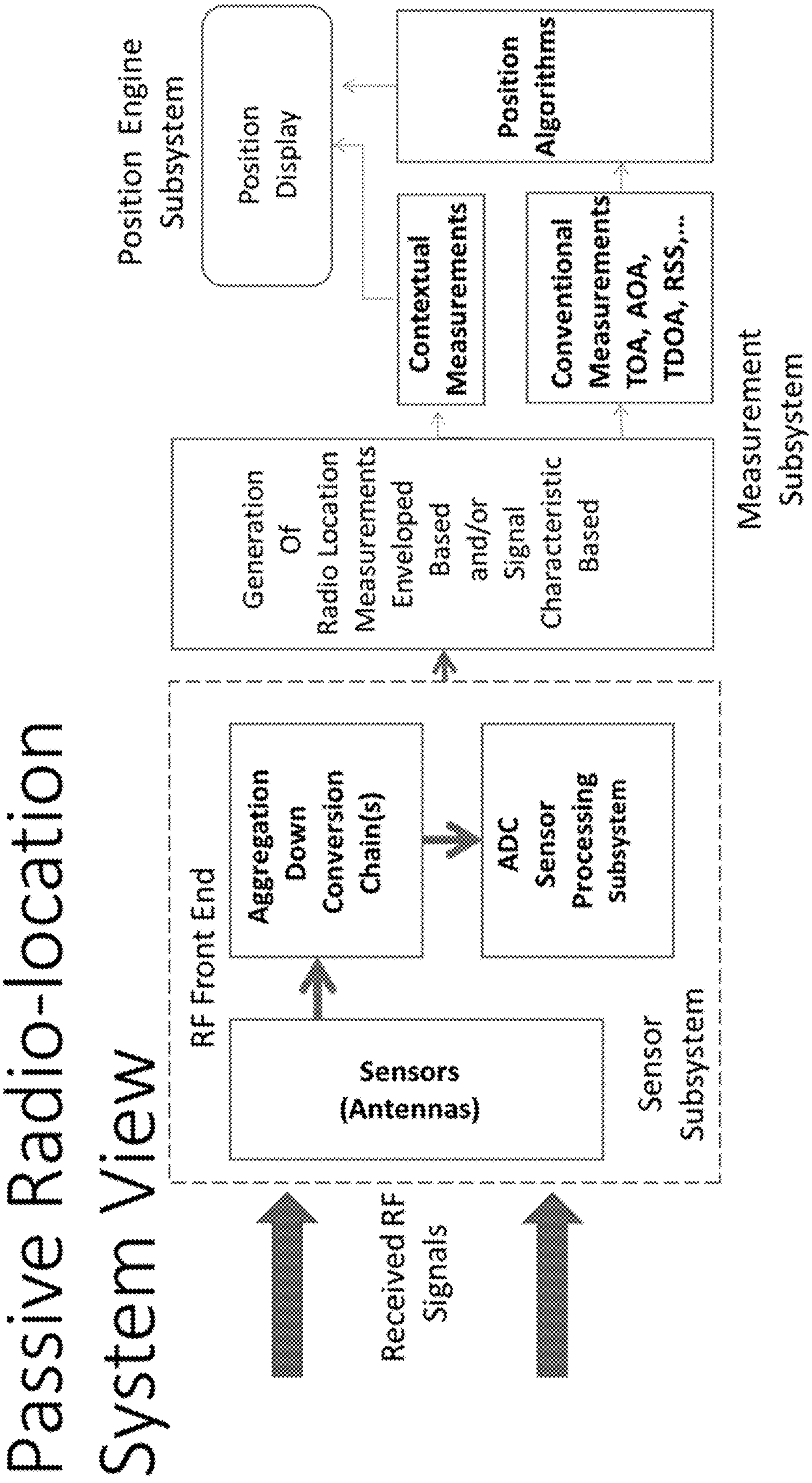
FIG. 24 illustrates a passive geolocation radio engine system view according to one embodiment of the present invention.

FIG. 24 illustrates a passive geolocation radio engine system view according to one embodiment of the present invention. First, a radio frequency (RF) front end receives at least one RF signal. The RF front end includes, but is not limited to, a set of sensors, a sensor subsystem, at least one analog to digital converter (ADC), and/or an ADC sensor processing subsystem. Once the at least one RF signal has been analyzed by the RF front end and/or the sensor subsystem, the at least one RF signal becomes at least one analyzed RF signal. The at least one analyzed RF signal is output to a measurement subsystem. The measurement subsystem is operable to generate radio location measurements. The radio location measurements are envelope-based and/or signal characteristic-based. The measurement subsystem is further operable to generate contextual measurements and/or conventional measurements relating to TOA, AOA, TDOA, receiver signal strength (RSS), RSSI, and/or FDOA. The generated conventional measurements are then analyzed using position algorithms, further enhancing measurement accuracy. Once the contextual measurements are generated and/or the conventional measurements are analyzed using position algorithms, the at least one analyzed RF signal is sent to a position engine subsystem. The position engine subsystem includes a position display. Each of the previously mentioned components, systems, and/or subsystems are operable for network communication.

The geolocation engine is operable to use a plurality of algorithms to determine a location of the at least one signal. The plurality of algorithms includes, but is not limited to, TDOA, FDOA, AOA, power level measurements, and/or graphical geolocation, which is described below. The geolocation is operable to autonomously decide what algorithm(s) to use to determine the location.

Figure 25:
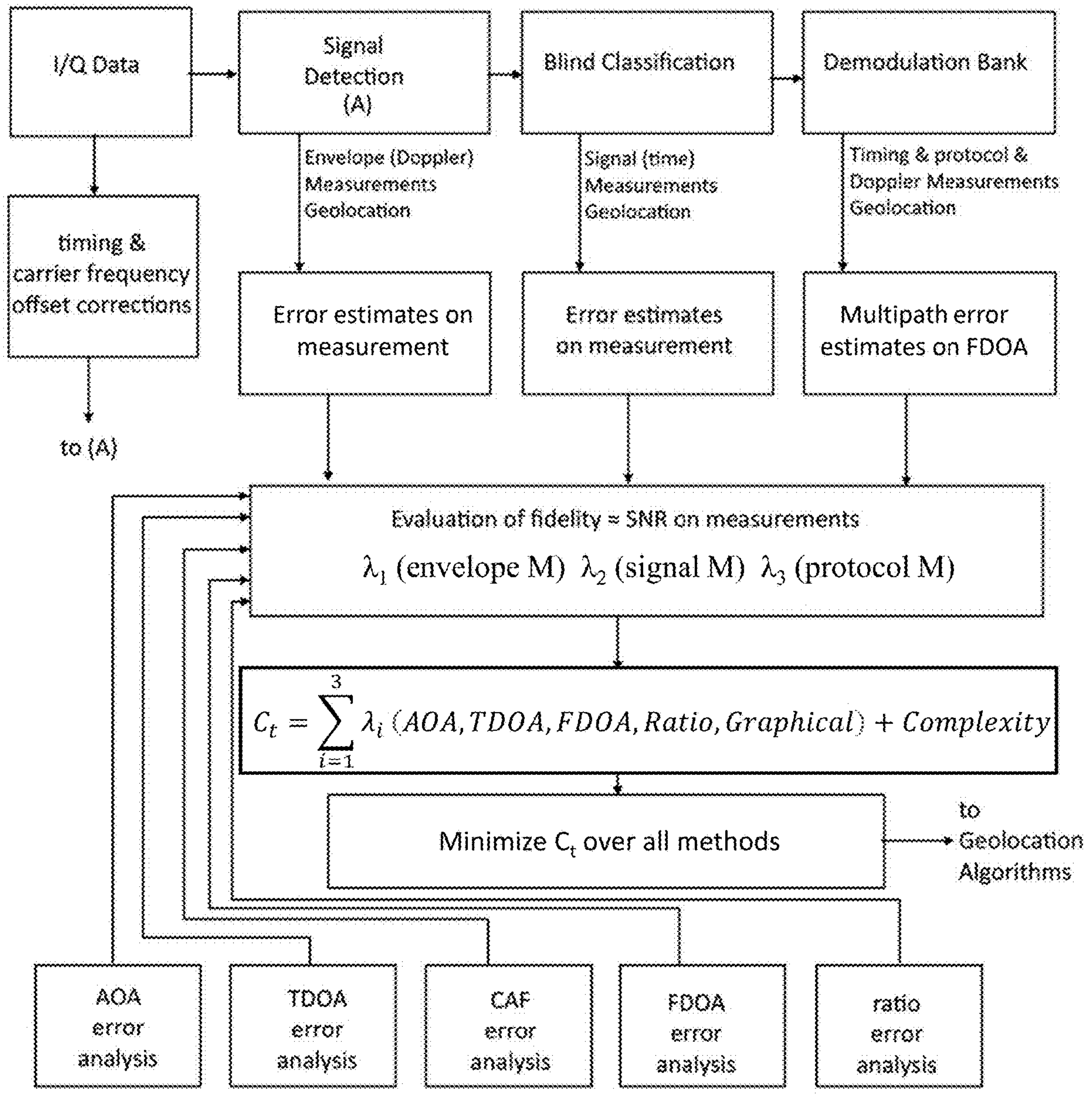
FIG. 25 illustrates one embodiment of an algorithm to select a geolocation method.

FIG. 25 illustrates one embodiment of a method to autonomously select one or more of the plurality of algorithms. Timing and carrier frequency offset corrections are performed on I, Q data and sent to the signal detection engine. The I, Q data (e.g., I, $Q_0$, I, $Q_1$, I, $Q_2$, I, $Q_3$) is sent to the signal detection engine. Information from the signal detection engine is sent to the blind classification engine. Information from the blind classification engine is sent to the demodulation bank. Error estimates are performed on envelope (Doppler) measurements from the signal detection engine, signal (time) domain measurements from the blind classification engine, and timing, protocol, and Doppler measurements from the demodulation bank. An evaluation of fidelity is approximately equal to an SNR of the envelope measurements ($\lambda_1$), signal measurements ($\lambda_2$), and protocol measurements ($\lambda_3$). Error analysis for AOA, TDOA, correlation ambiguity function (CAF) for graphical geolocation, FDOA, and power ratio are used in the evaluation of fidelity. Cris calculated and minimized over all methods to select the at least one geolocation method, where Cris the cost function to be minimized and t denotes a time block used to calculate the geolocation solution.

In one embodiment, the geolocation engine uses graphical geolocation techniques. An area is pictorially represented in a grid. Resolution of the grid determines a position in space. The system is operable to detect the at least one signal in the space and determine a location of the at least one signal using the graphical geolocation techniques. In one embodiment, outputs (e.g., location) to a non-linear equation are used to determine possible inputs (e.g., power measurements). The possible outputs are placed on a two-dimensional map. Inputs are then mapped to form a hypothesis of possible outputs. In one embodiment, the graphical geolocation techniques include an image comparison between the two-dimensional map of the possible outputs and the signal data. In another embodiment, the graphical geolocation techniques further include topology (e.g., mountains, valleys, buildings, etc.) to create a three-dimensional map of the possible outputs. The graphical geolocation techniques in this embodiment include an image comparison between the three-dimensional map of the possible outputs and the signal data.

The geolocation engine is operable to make use of spinning DF, through the use of rotating directional antennas and estimating the direction of arrival of an emitter. The rotating directional antennas measure the received power as a function of the direction, calculating a local maximum assumed direction of the emitter. The geolocation engine is also operable to account for any transient signals that escape detection based on rotation speed. This is accomplished by using at least one broad antenna, reducing the chance of the system missing a signal, as well as reducing angular resolution. Practical considerations for these calculations include, but are not limited to, antenna rotation speed ($\overline{\omega}$), a rate of arrival of signals ($\gamma$), and/or a spatial sampling rate ($F_{PS}$).

The system is further operable to use amplitude ratio methods for geolocation. These methods involve a multi-lobe amplitude comparison. This is performed using a set of fixed directional antennas pointing in different directions. A ratio corresponding to two responses is calculated, account for antenna patterns. This ratio is used to obtain a direction estimate. By not using moving parts and/or antennas, the system is more responsive to transient signals. However, this does require accurate antenna patterns, as these patterns also control system resolution.

General antenna array processing assumes that a signal, s(t), remains coherent as it impinges at each antenna in the array. This enables the delay ($\tau_m$) of the signal at an m-th sensor relative to the signal at the origin of the coordinate system can be expressed as:

$$\tau_m = -(q_m \sin(\theta) + r_m \cos(\theta))/c$$

Where c is the propagation of light and θ is the angle of the signal impinging in the sensor relative to the r-axis. Since the signal is assumed to have a Taylor series decomposition, the propagation delay, $\tau_m$, is equivalent to the phase shift of:

$$\varphi_m = -w\tau_m => e^{j\varphi_m}$$

Thus, the vector x(t) of antenna responses can be written as:

$$\begin{bmatrix} x_1(t) \\ \vdots \\ x_M(t) \end{bmatrix} = \begin{bmatrix} e^{j\varphi_1} \\ \vdots \\ e^{j\varphi_M} \end{bmatrix} e^{j(wt+\phi)}$$

Where $$\phi_m(w,\ \theta) = [q_m sin(\theta) + r_m cos(\theta)]w/c$$

More generally, the sensor has different directionality and frequency characteristics which are modeled by applying different gains and phases to the model above, where the gain and phase of the m-th sensor is denoted as: $g_m(w, \theta)$ and $\phi_m(w, \theta)$ Then, the above equation for x(t) can be expressed as:

$$\begin{bmatrix} x_1(t) \\ \vdots \\ x_M(t) \end{bmatrix} = \begin{bmatrix} g_1(w,\ \theta)e^{j\phi_1(w,\theta)}e^{j\varphi_1} \\ g_M(w,\ \theta)e^{j\phi_m(w,\theta)}e^{j\varphi_M} \end{bmatrix} e^{j(wt+\phi)} = a(w,\ \theta)e^{j(wt+\phi)}$$

Where α(w, θ) is known as the array response vector.

The collection of all array response vectors for all angles θ and all frequencies, w, is known as an array manifold (i.e., a vector space). In general, if the array manifold is known and it is free of ambiguities, then obtaining the k−1 angles ($\theta_1 \ldots \theta_{k-1}$) of k−1 signals if their corresponding array response vector are linearly independent is performed by correlating x(t) with the array response vector of the appropriate angle. In one embodiment, ambiguities refer to the array manifold lacking rank deficiencies to k if the system is trying to resolve k−1 directions at the same frequency. The array manifold does not typically have a simple analytical form and thus the array manifold is approximated using discrete angles for each frequency of interest.

In more general cases, where multiple sinusoidal signals arrive at the array with additive noise, then the x(t) can be expressed as:

$$x(t) = \sum_{i=1}^{I} a(w, \theta_i)s_i(t) + n(t)$$

$$s_i(t) = e^{j(w_i t+\beta_i)} = [a(w, \theta_1) \ \ldots \ a(w, \theta_I)][s_1(t) \ \ldots \ s_I(t)]^T + n(t) = A(w, \Theta)s(t) + n(t)$$

In one embodiment, additive noise refers to thermal noise from sensors and associated electronics, background noise from the environment, and/or other man-made interference sources including, but not limited to, diffuse signals.

Where one or more signals are non-sinusoidal (i.e., broadband), the equivalent can be expressed by its Taylor series over the relevant frequencies. However, when looking for a narrow frequency band of interest, the system is operable to assume an array response vector, α(w, θ), is approximately constant with respect to w over all angles, θ. This implies that the reciprocal of the time required for the signal to propagate across the array is much less than the bandwidth of the signal. If sensor characteristics do not vary significantly across bandwidth, then the dependency on w can be dropped off of the array response vector and/or matrix, resulting in:

$$x(t) = A(\Theta)s(t) + n(t)$$

For example, in an antenna array using a uniform linear array (ULA), a signal source, $s(t)=e^{j(wt+\phi)}$, impinges in the ULA at angle θ. Thus, if the received signal at a first sensor is $x_1(t)=s(t)$, then it is delayed at sensor m by:

$$x_m(t) = e^{-jw\left(\frac{(m-1)d\sin(\theta)}{c}\right)}s(t)$$

In vector form, this is represented as:

$$x(t) = \begin{bmatrix} 1 \\ e^{-jw\left(\frac{d\sin(\theta)}{c}\right)} \\ \vdots \\ e^{-jw\left(\frac{(M-1)d\sin(\theta)}{c}\right)} \end{bmatrix} s(t) = a(w, \theta)s(t)$$

If there are source signals received by the ULA, then:

$$x(t) = A(\Theta)s(t) + n(t)$$

Where $$A(\Theta) = \begin{bmatrix} 1 & \ldots & 1 \\ e^{-jw\left(\frac{d\sin(\theta_1)}{c}\right)} & \ldots & e^{-jw\left(\frac{d\sin(\theta_I)}{c}\right)} \\ \vdots & \vdots & \vdots \\ e^{-jw\left(\frac{(M-1)d\sin(\theta_1)}{c}\right)} & \ldots & e^{-jw\left(\frac{(M-1)d\sin(\theta_I)}{c}\right)} \end{bmatrix}$$

x(t) is the received signal vector (M by 1), $s(t)=[s_1(t) \ldots s/(t)]^T$ is the source signal vector (I by 1), n(t) is the noise signal vector (M by 1), and $A(\Theta)=[a(w, \theta_1), \ldots, a(w, \theta_1)]$ a (M by I) matrix=>Array manifold. In this example, typical assumptions include, but are not limited to, sources of signal(s) are independent and narrow band in relation to dimensions of the ULA (d, Md) and around the same max frequency, all antenna elements are the same, $$d < \frac{\lambda_{max}}{2}$$

to avoid rank ambiguities, the system can resolve M−1 direction angles without rank, and/or noises are uncorrelated.

In another example, array processing is performed for DF using beamforming. Given knowledge of the array manifold, the array can be maneuvered by taking linear combinations of each element response. This is similar to how a fixed, single antenna can be maneuvered mechanically. Thus, $y(t)=w^H x(t)$, where w is interpreted as a Finite Impulse Response (FIR) of a filter in the spatial domain. To calculate the power of y(t), assuming a discretization to N samples, the system uses the following:

$$P_y = \langle |y(n)|^2 \rangle_N = w^H \langle x(n)x(n)^H \rangle_N w = w^H R_{xx} w$$

Where $\langle \cdot \rangle_N$ denotes the time averaging over N sample times and $R_{xx}$ is the measured spatial autocorrelation matrix of the received array output data.

In another example, array processing is performed for DF using beamforming, where $$R_{xx} = \langle x(n)x^H(n) \rangle_n \text{ and } R_{xx} = \langle (A(\Theta)s(n) + n(n))(A(\Theta)s(n) + n(n))^H \rangle_N$$

In one embodiment, the system assumes a source signal is uncorrelated to a noise source, resulting in:

$$R_{xx} = A(\Theta)R_{ss}A^H(\Theta) + R_{nn}$$

Thus, the power of the linear combination and/or spatial filtering of the array vector response elements are expressed as:

$$P_y = W^H\left(A(\Theta)R_{ss}A^H(\Theta) + R_{nn}\right)w$$

In examples where array processing for DF is performed using beamforming, for a single unit magnitude sinusoid impinging the array at angle θ, with no noise becomes:

$$P_y(\theta) = w^H a(\theta_o) a^H(\theta_o) w = |w^H a(\theta_o)|^2$$

Accounting for the Cauchy-Schwarz inequality $|w^H a(\theta_o)|^2 \|w\|^2 \|a(\theta_o)\|^2$, for all vectors w with equality if, and only if, w is proportional to $a(\theta_o)$, the spatial filter that matches the array response at the direction of arrival, $\theta_o$, produces a maximum value for $P_y(\theta)$.

In addition, DF can be accomplished by searching over all possible angles to maximize $P_y(\theta)$, and/or search over all filters w that are proportional to some array vectors responding to an impinging angle θ, a(θ), where Max $\{P_y(\theta)\}_{over\ all\ angles=>filters\ w=a(\theta)}$. When this method is used, the system behaves like a spinning DF system where the resulting beam is changing for each search angle. Advantageously, this method encounters no blind spots due to the rotational and/or rate of arrival of the source signal.

Moreover, when the system is using beamforming techniques and/or processes, the system is operable to search for multiple directions of arrival of different sources with resolutions depending on the width of the beam formed and the height of the sidelobes. For example, a local maximum of the average filter output power is operable to be shifted away from the true direction of arrival (DOA) of a weak signal by a strong source of interference in the vicinity of one of the sidelobes. Alternatively, two closely spaced signals results in only one peak or two peaks in the wrong location.

In yet another example, array processing for DF is performed using a Capon Minimum Variance Distortionless Response (MVDR) approach. This is necessary in cases where multiple source signals are present. The system obtains more accurate estimates of the DOA when formatting the array beam using degrees of freedom to form a beam in the "look" direction and any remaining degrees of freedom to from "nulls" in remaining directions. The result is a simultaneous beam and null forming filter. Forming nulls in other directions is accomplished by minimizing $P_y(\theta)$ while constraining a beam in the look direction. This avoids the trivial solution of w=0. Thus:

$$\min_{over\ all\ w} P_y(\theta) \text{ subject to } w^H a(\theta) = 1$$

The resulting filter, $w_c(\theta)$, is shown as:

$$w_c(\theta) = (a^H(\theta) R_{xx}^{-1} a(\theta))^{-1} R_{xx}^{-1} a(\theta)$$

Using this filter, the filter output power is expressed as:

$$P_{yc}(\theta) = w_c^H(\theta) R_{xx} w_c(\theta) = (a^H(\theta) R_{xx}^{-1} a(\theta))^{-1}$$

Therefore, the Capon approach searches over all DOA angles that the above power has maximized, using $$\max_{over\ all\ angles} (a^H(\theta) R_{xx}^{-1} a(\theta))^{-1}.$$

A Capon approach is able to discern multiple signal sources because while looking at signals impinging at 0, the system attenuates a signal arrive at fifteen degrees by a formed beam.

A Capon approach is one method for estimating an angular decomposition of the average power received by the array, sometimes referred to as a spatial spectrum of the array. The Capon approach is a similar approach to spectrum estimation and/or modeling of a linear system.

The system is further operable to employ additional resolution techniques including, but not limited to, Multiple Signal Classifier (MUSIC), Estimation of Signal Parameters via Rotational Invariance Technique (ESPRITE), and/or any other high-resolution DOA algorithm. These resolution techniques enable the system to find DOAs for multiple sources simultaneously. In addition, these resolution techniques generate high spatial resolution when compared with more traditional methods. In one embodiment, these techniques apply only when determining DOAs for narrowband signal sources.

For example, when using MUSIC-based methods, the system computes an N×N correlation matrix using $$R_x = E\{x(t)x^H(t)\} = AR_sA^H + \sigma_0^2 I,$$

where $$R_s = E\{s(t)s^H(t)\} = \text{diag.}\{\sigma_1^2, \ldots, \sigma_I^2\}.$$

If the signal sources are correlated so that $R_s$ is not diagonal, geolocation will still work while $R_s$ has full rank. However, if the signal sources are correlated such that $R_s$ is rank deficient, the system will then deploy spatial smoothing. This is important, as $R_s$ defines the dimension of the signal subspace. However, For N>I, the matrix $AR_SA^H$ is singular, where $$\det[AR_sA^H] = \det[R_x - \sigma_0^2 I] = 0.$$

But this implies that $$\sigma_0^2$$

is an eigenvalue of $R_x$. Since the dimension of the null space $AR_SA^H$ is N-I, there are N-I such eigenvalues $$\sigma_0^2$$

of $R_x$. In addition, since both $R_x$ and $AR_SA^H$ are non-negative, there are/other eigenvalues $$\sigma_i^2$$

such that $$\sigma_i^2 > \sigma_0^2 > 0.$$

In a preferred embodiment, geolocation is performed using Angle of Arrival (AOA), Time Difference of Arrival (TDOA), Frequency Difference of Arrival (FDOA), and power distribution ratio measurements. Advantageously, using all four measurements to determine geolocation results in a more accurate determination of location. In many instances, only one type of geolocation measurement is available that forces the use of one particular approach (e.g., AOA, TDOA, FDOA), but in many cases geolocation measurements are operable to be derived from behavior of the signals, thus allowing for the use of multiple measurements (e.g., all four measurements) that are combined to obtain a more robust geolocation solution. This is especially important when most of the measurements associated with each approach are extremely noisy.

Learning Engine

In addition, the system includes a learning engine, operable to incorporate a plurality of learning techniques including, but not limited to, machine learning (ML), artificial intelligence (AI), deep learning (DL), neural networks (NNs), artificial neural networks (ANNs), support vector machines (SVMs), Markov decision process (MDP), and/or natural language processing (NLP). The system is operable to use any of the aforementioned learning techniques alone or in combination.

Advantageously, the system is operable for autonomous operation using the learning engine. In addition, the system is operable to continuously refine itself, resulting in increased accuracy relating to data collection, analysis, modeling, prediction, measurements, and/or output.

The learning engine is further operable to analyze and/or compute a conditional probability set. The conditional probability set reflects the optimal outcome for a specific scenario, and the specific scenario is represented by a data model used by the learning engine. This enables the system, when given a set of data inputs, to predict an outcome using a data model, where the predicted outcome represents the outcome with the least probability of error and/or a false alarm.

Without a learning engine, prior art systems are still operable to create parametric models for predicting various outcomes. However, these prior art systems are unable to capture all inputs and/or outputs, thereby creating inaccurate data models relating to a specific set of input data. This results in a system that continuously produces the same results when given completely different data sets. In contrast, the present invention utilizes a learning engine with a variety of fast and/or efficient computational methods that simultaneously calculate conditional probabilities that are most directly related to the outcomes predicted by the system. These computational methods are performed in real-time or near-real-time.

Additionally, the system employs control theory concepts and methods within the learning engine. This enables the system to determine if every data set processed and/or analyzed by the system represents a sufficient statistical data set.

Moreover, the learning engine includes a learning engine software development kit (SDK), enabling the system to prepare and/or manage the lifecycle of datasets used in any system learning application. Advantageously, the learning engine SDK is operable to manage system resources relating to monitoring, logging, and/or organizing any learning aspects of the system. This enables the system to train and/or run models locally and/or remotely using automated ML, AI, DL, and/or NN. The models are operable for configuration, where the system is operable to modify model configuration parameters and/or training data sets. By operating autonomously, the system is operable to iterate through algorithms and/or hyperparameter settings, creating the most accurate and/or efficient model for running predictive system applications. Furthermore, the learning engine SDK is operable to deploy webservices in order to convert any training models into services that can run in any application and/or environment.

Thus, the system is operable to function autonomously and/or continuously, refining every predictive aspect of the system as the system acquires more data. While this functionality is controlled by the learning engine, the system is not limited to employing these learning techniques and/or methods in only the learning engine component, but rather throughout the entire system. This includes RF fingerprinting, RF spectrum awareness, autonomous RF system configuration modification, and/or autonomous system operations and maintenance.

The learning engine uses a combination of physical models and convolutional neural networks algorithms to compute a set of possible conditional probabilities depicting the set of all possible outputs based on input measurements that provide the most accurate prediction of solution, wherein accurate means minimizing the false probability of the solution and also probability of error for the prediction of the solution.

Figure 26:
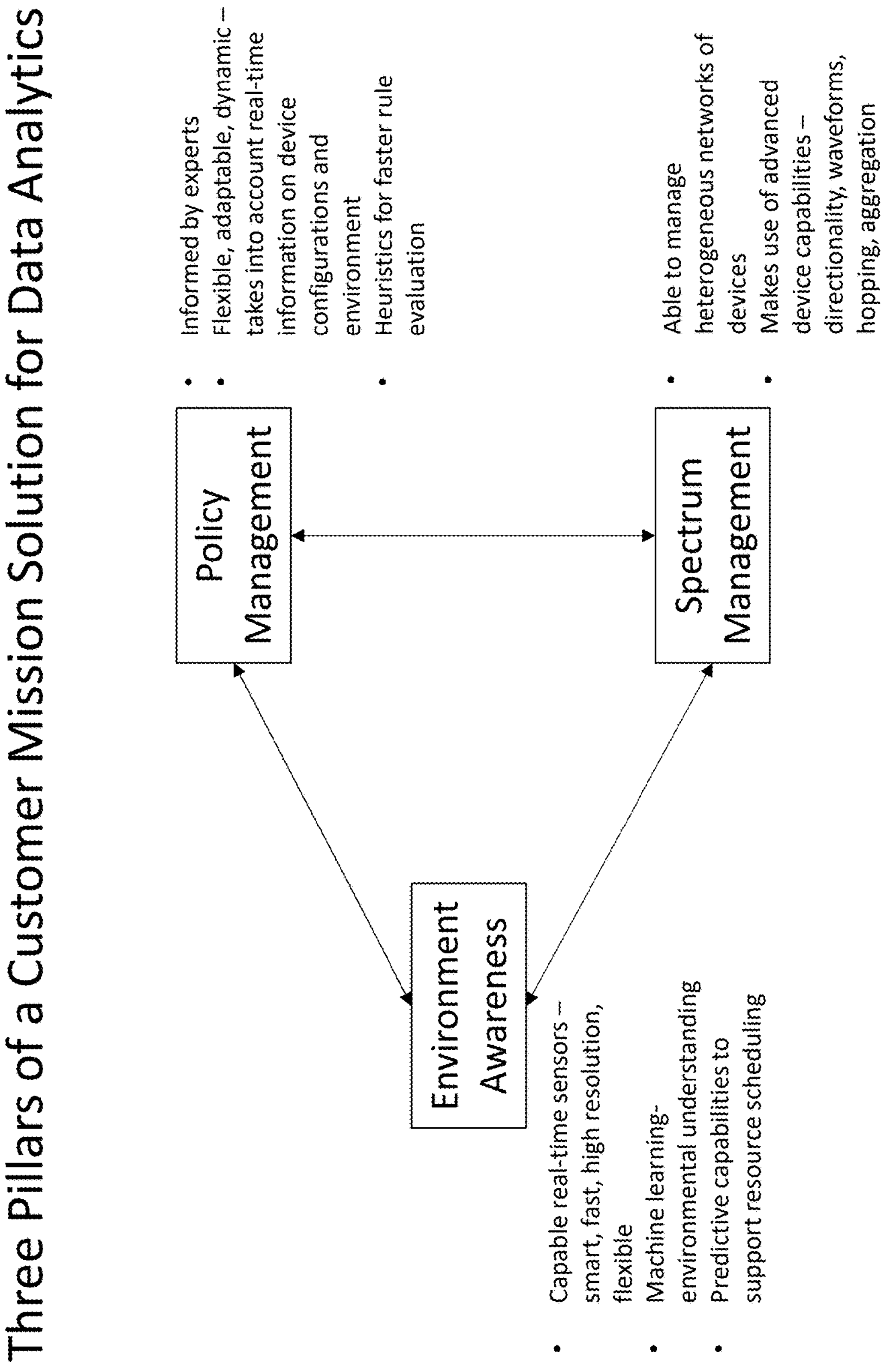
FIG. 26 is a diagram describing three pillars of a customer mission solution.

FIG. 26 is a diagram describing three pillars of a customer mission solution. The three pillars include environmental awareness, policy management, and spectrum management. The system obtains environmental awareness through a plurality of sensors. The plurality of sensors preferably captures real-time information about the electromagnetic environment. Additionally, the system includes machine learning and/or predictive algorithms to enhance environmental understanding and support resource scheduling. Policy management is flexible, adaptable, and dynamic, and preferably takes into account real-time information on device configurations and the electromagnetic environment. The system is preferably operable to manage heterogeneous networks of devices and applications. Spectrum management preferably makes use of advanced device capabilities including, but not limited to, directionality, waveforms, hopping, and/or aggregation.

Figure 27:
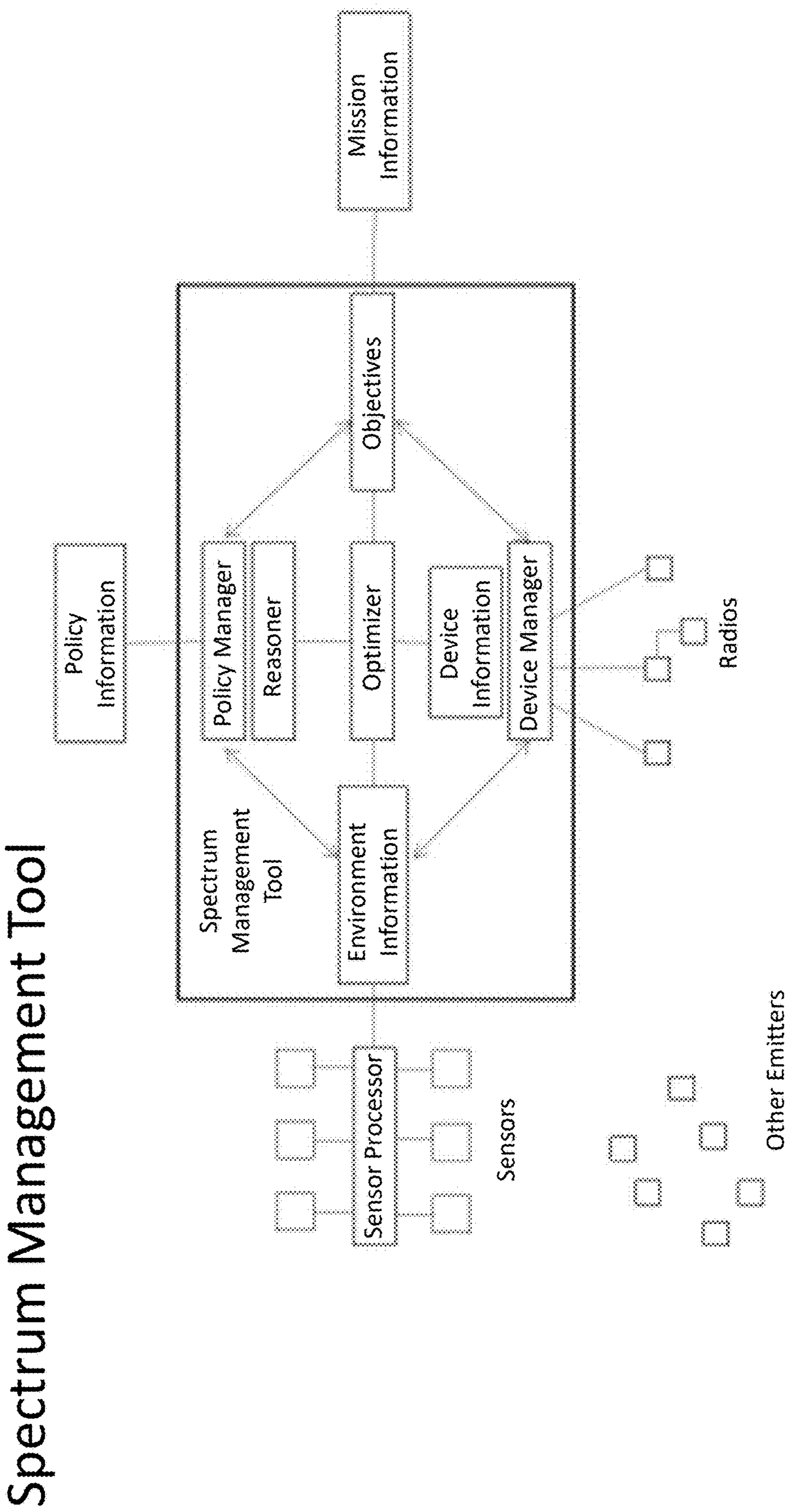
FIG. 27 is a block diagram of one example of a spectrum management tool.

FIG. 27 is a block diagram of one example of a spectrum management tool. The spectrum management tool includes environment information obtained from at least one monitoring sensor and at least one sensor processor. The spectrum management tool further includes a policy manager, a reasoner, an optimizer, objectives, device information, and/or a device manager. The objectives include information from a mission information database. The policy manager obtains information from a policy information database. In another embodiment, the policy manager uses information (e.g., from the policy information database, measurements of the electromagnetic environment) to create policies and/or rules for conditional allowance of resources per signal using the spectrum. These policies and/or rules are then passed to the reasoner to determine optimization conditional constraints to be used by the optimizer with the goal of optimizing the utilization of the spectrum (e.g., based on mission information and objectives) by all signals present according to the policies and/or rules. At the output of the optimizer, resources (bandwidth, power, frequency, modulation, spatial azimuth and elevation focus for transmitter/receiver (TX/RX) sources) as well as interference levels per application is recommended for each signal source. After that, the loop of collecting and environmental awareness is fed to the policy manger and the reasoner.

Figure 28:
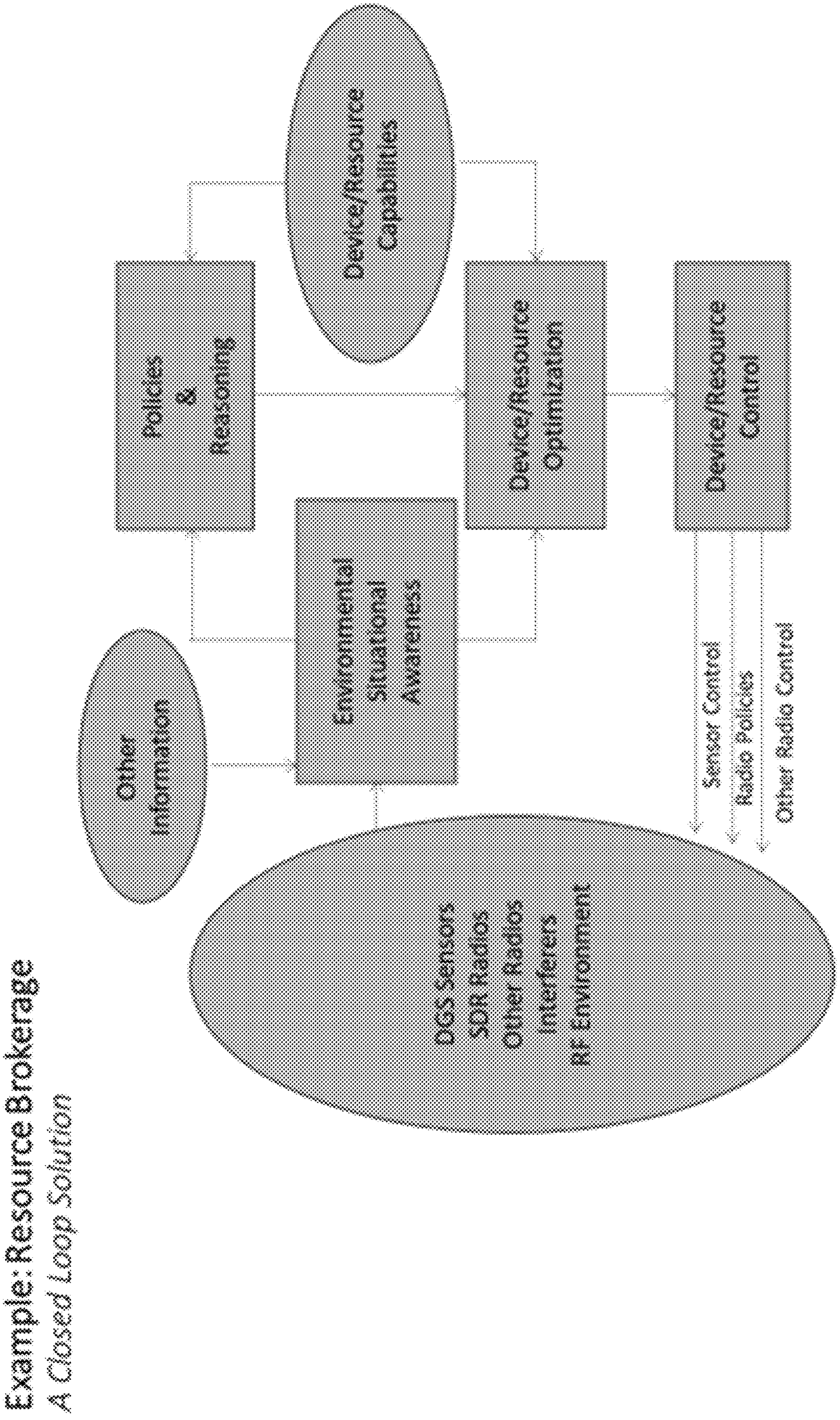
FIG. 28 is a block diagram of one embodiment of a resource brokerage application.

FIG. 28 is a block diagram of one embodiment of a resource brokerage application. As previously described, the resource brokerage application is preferably operable to use processed data from the at least one monitoring sensor and/or additional information to determine environmental awareness (e.g., environmental situational awareness). The environmental awareness and/or capabilities of a device and/or a resource are used to determine policies and/or reasoning to optimize the device and/or the resource. The resource brokerage application is operable to control the device and/or the resource. Additionally, the resource brokerage application is operable to control the at least one monitoring sensor.

Semantic Engine

Figure 29:
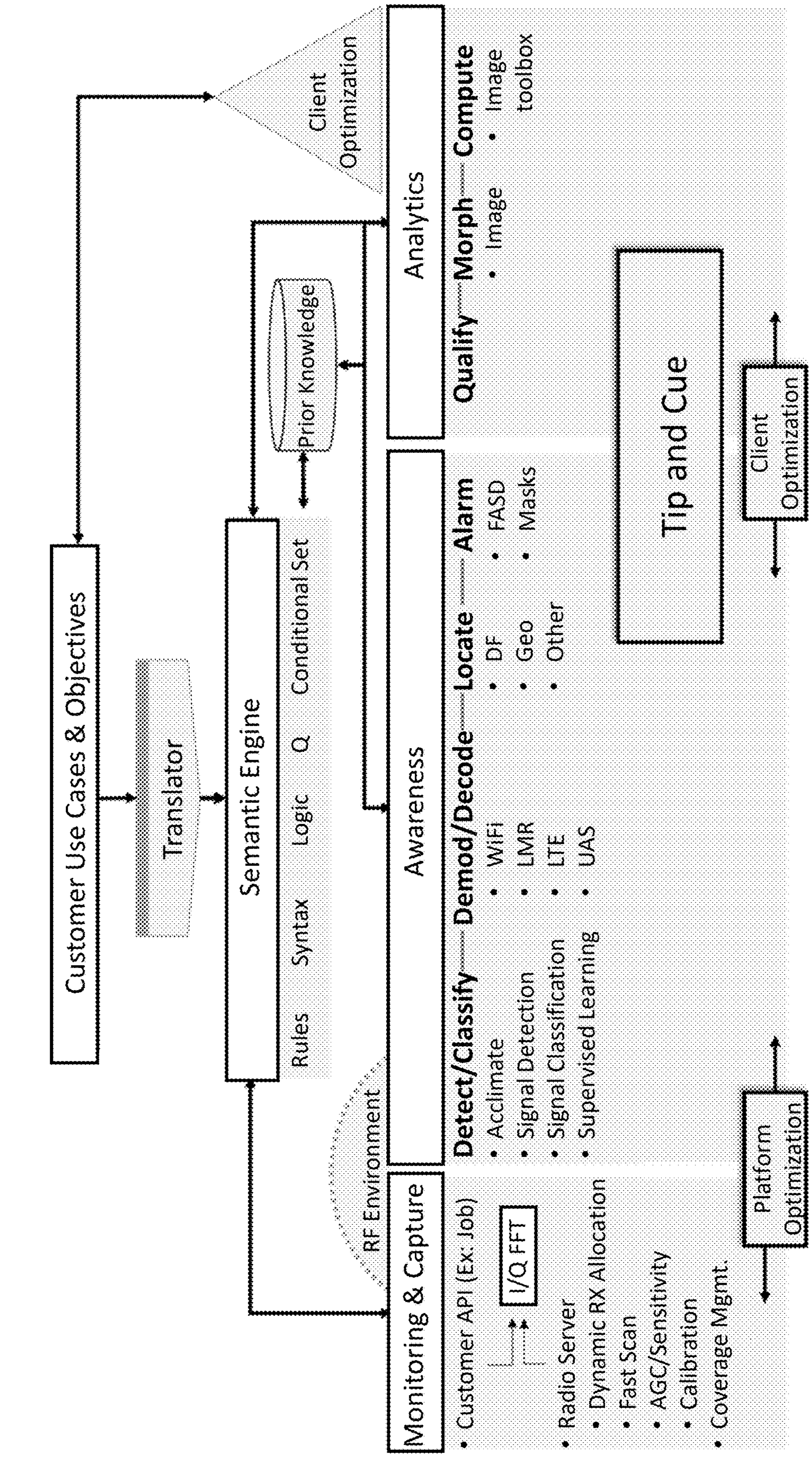
FIG. 29 illustrates another example of a system diagram including an automated semantic engine and translator.

The system further includes an automated semantic engine and/or translator as shown in FIG. 29. The translator is operable to receive data input including, but not limited to, at least one use case, at least one objective, and/or at least one signal. In one embodiment, the at least one use case is a single signal use case. In another embodiment, the at least one use case is a multiple-signal use case. Once the translator receives data input, the translator uses natural language processing (NLP), and/or similar data translation processes and techniques, to convert the data input into actionable data for the automated semantic engine.

By separating the data translation process from the automated semantic engine, the system is operable to provide more processing power once the data input is sent to the automated semantic engine, reducing the overall processing strain on the system.

The automated semantic engine includes a rule component, a syntax component, a logic component, a quadrature (Q) component, and/or a conditional set component. In addition, the semantic engine is operable for network communication with a prior knowledge database, an analytics engine, and/or a monitoring and capture engine. Data is initially sent to the automated semantic engine via the translator. The automated semantic engine is operable to receive data from the translator in forms including, but not limited to, audio data, text data, video data, and/or image data. In one embodiment, the automated semantic engine is operable to receive a query from the translator. The logic component and/or the rule component are operable to establish a set of system rules and/or a set of system policies, where the set of system rules and/or the set of system policies is created using the prior knowledge database.

Advantageously, the automated semantic engine is operable to run autonomously using any of the aforementioned learning and/or automation techniques. This enables the system to run continuously, without requiring user interaction and/or input, resulting in a system that is constantly learning and/or refining data inputs, creating more accurate predictions, models, and/or suggested actions.

Moreover, the automated semantic engine enables the system to receive queries, searches, and/or any other type of search-related function using natural language, as opposed to requiring a user and/or customer to adapt to a particular computer language. This functionality is performed using a semantic search via natural language processing (NLP). The semantic search combines traditional word searches with logical relationships and concepts.

In one embodiment, the automated semantic engine uses Latent Semantic Indexing (LSI) within the automated semantic engine. LSI organizes existing information within the system into structures that support high-order associations of words with text objects. These structures reflect the associative patterns found within data, permitting data retrieval based on latent semantic context in existing system data. Furthermore, LSI is operable to account for noise associated with any set of input data. This is done through LSI's ability to increase recall functionality, a constraint of traditional Boolean queries and vector space models. LSI uses automated categorization, assigning a set of input data to one or more predefined data categories contained within the prior knowledge database, where the categories are based on a conceptual similarity between the set of input data and the content of the prior knowledge database. Furthermore, LSI makes use of dynamic clustering, grouping the set of input data to data within the prior knowledge database using conceptual similarity without using example data to establish a conceptual basis for each cluster.

In another embodiment, the automated semantic engine uses Latent Semantic Analysis (LSA) within the automated semantic engine. LSA functionalities include, but are not limited to, occurrence matrix creation, ranking, and/or derivation. Occurrence matrix creation involves using a term-document matrix describing the occurrences of terms in a set of data. Once the occurrence matrix is created, LSA uses ranking to determine the most accurate solution given the set of data. In one embodiment, low-rank approximation is used to rank data within the occurrence matrix.

In another embodiment, the automated semantic engine uses semantic fingerprinting. Semantic fingerprinting converts a set of input data into a Boolean vector and creates a semantic map using the Boolean vector. The semantic map is operable for use in any context and provides an indication of every data match for the set of input data. This enables the automated semantic engine to convert any set of input data into a semantic fingerprint, where semantic fingerprints are operable to combine with additional semantic fingerprints, providing an accurate solution given the set of input data. Semantic fingerprint functionality further includes, but is not limited to, risk analysis, document search, classifier indication, and/or classification.

In yet another embodiment, the automated semantic engine uses semantic hashing. By using semantic hashing, the automated semantic engine maps a set of input data to memory addresses using a neural network, where semantically similar sets of data inputs are located at nearby addresses. The automated semantic engine is operable to create a graphical representation of the semantic hashing process using counting vectors from each set of data inputs. Thus, sets of data inputs similar to a target query can be found by accessing all of the memory addresses that differ by only a few bits from the address of the target query. This method extends the efficiency of hash-coding to approximate matching much faster than locality sensitive hashing.

In one embodiment, the automated semantic engine is operable to create a semantic map. The semantic map is used to create target data at the center of the semantic map, while analyzing related data and/or data with similar characteristics to the target data. This adds a secondary layer of analysis to the automated semantic engine, providing secondary context for the target data using similar and/or alternative solutions based on the target data. The system is operable to create a visualization of the semantic map.

Traditional semantic network-based search systems suffer from numerous performance issues due to the scale of an expansive semantic network. In order for the semantic functionality to be useful in locating accurate results, a system is required to store a high volume of data. In addition, such a vast network creates difficulties in processing many possible solutions to a given problem. The system of the present invention solves these limitations through the various learning techniques and/or processes incorporated within the system. When combined with the ability to function autonomously, the system is operable to process a greater amount of data than systems making use of only traditional semantic approaches.

By incorporating the automated semantic engine within the system, the system has a greater understanding of potential solutions, given a provided set of data. Semantic engines are regularly associated with semantic searches or searches with meaning or searches with understanding of overall meaning of the query, thus by understanding the searcher's intent and contextual meaning of the search to generate more relevant results. Semantic engines of the present invention, along with a spectrum specific ontology (vocabulary and operational domain knowledge), help automate spectrum utilization decisions based on dynamic observations and extracted environmental awareness, and create and extend spectrum management knowledge for multiple applications.

Tip and Cue Processes

The system uses a set of "tip and cue" processes, generally referring to detection, processing, and/or providing alerts using creating actionable data from acquired RF environmental awareness information in conjunction with a specific rule set, further enhancing the optimization capabilities of the system. The specific rule set is translated into optimization objectives, including constraints associated with signal characteristics. The tip and cue processes of the present invention produce actionable data to solve a plurality of user issues and/or objectives.

Tip and cue processes are performed by an awareness system. The awareness system is operable to receive input data including, but not limited to, a set of use cases, at least one objective, and/or a rule set. The input data is then analyzed by a translator component, where the translator component normalizes the input data. Once normalized, the input data is sent to a semantic engine. The semantic engine is necessary for analyzing unstructured data inputs. Thus, a semantic engine is necessary to understand data inputs and apply contextual analysis as well, resulting in a more accurate output result. This accuracy is primarily accomplished using the previously mentioned learning techniques and/or technologies.

The semantic engine uses the input data to create a set of updated rules, a syntax, a logic component, a conditional data set, and/or Quadrature (Q) data. The semantic engine is operable for network communication with components including, but not limited to, a prior knowledge database, an analytics engine, and/or a monitoring and capture engine. The monitoring and capture engine operates with an RF environment and includes a customer application programming interface (API), a radio server, and/or a coverage management component. The customer API and the radio server are operable to output a set of I-phase and Q-phase (I/Q) data using a Fast Fourier Transform (FFT). The set of I/Q data demonstrates the changes in amplitude and phase in a sine wave. The monitor and capture engine also serves as an optimization point for the system.

The awareness engine operates as both a platform optimization unit and a client optimization unit. The awareness engine is operable to perform functions including, but not limited to, detection, classification, demodulation, decoding, locating, and/or signaling alarms. The detection and/or classification functions assist with incoming RF data acclimation and further includes a supervised learning component, where the supervised learning component is operable to make use of any of the aforementioned learning techniques and/or technologies. The demodulation and/or decode functionalities are operable to access RF data from WIFI, Land Mobile Radio (LMR), Long Term Evolution (LTE) networks, and/or Unmanned Aircraft Systems (UAS). The location component of the awareness engine is operable to apply location techniques including, but not limited to, DF, geolocation, and/or Internet Protocol (IP) based location. The awareness engine is operable to signal alarms using FASD and/or masks. In one embodiment, the masks are dynamic masks.

The analytics engine is operable to perform functions including, but not limited to, data qualification, data morphing, and/or data computing.

The awareness engine, analytics engine, and the semantic engine are all operable for network communication with the prior knowledge database. This enables each of the previously mentioned engines to compare input and/or output with data already processed and analyzed by the system.

The various engines present within the Tip & Cue process further optimize client output in the form of dynamic spectrum utilization and/or allocation. The system uses the Tip & Cue process to provide actionable information and/or actionable knowledge to be utilized by at least one application to mitigate problems of the at least one application and/or to optimize services or goals of the at least one application.

In a preferred embodiment, each customer has a service level agreement (SLA) with the system manager that specifies usage of the spectrum. The system manager is operable act as an intermediary between a first customer and a second customer in conflicts regarding the spectrum. If signals of the first customer interfere with signals of the second customer in violation of one or more of SLAs, the system is operable to provide an alert to the violation. Data regarding the violation is stored in at least one database within the system, which facilitates resolution of the violation. The control plane is operable to directly communicate the first customer (i.e., customer in violation of SLA) and/or at least one base station to modify parameters to resolve the violation.

In one embodiment, the system is used to protect at least one critical asset. Each of the at least one critical asset is within a protection area. For example, a first critical asset is within a first protection area, a second critical asset is within a second protection area, etc. In one embodiment, the protection area is defined by sensor coverage from the at least one monitoring sensor. In other embodiments, the protection area is defined by sensor coverage from the at least one monitoring sensor, a geofence, and/or GPS coordinates. The system is operable to detect at least one signal within the protection area and send an alarm for the at least one signal when outside of allowed spectrum use within the protection area.

The system is further operable to determine what information is necessary to provide actionable information. For example, sensor processing requires a large amount of power. Embedding only the sensors required to provide sufficient variables for customer goals reduces computational and/or power requirements.

Figure 30:
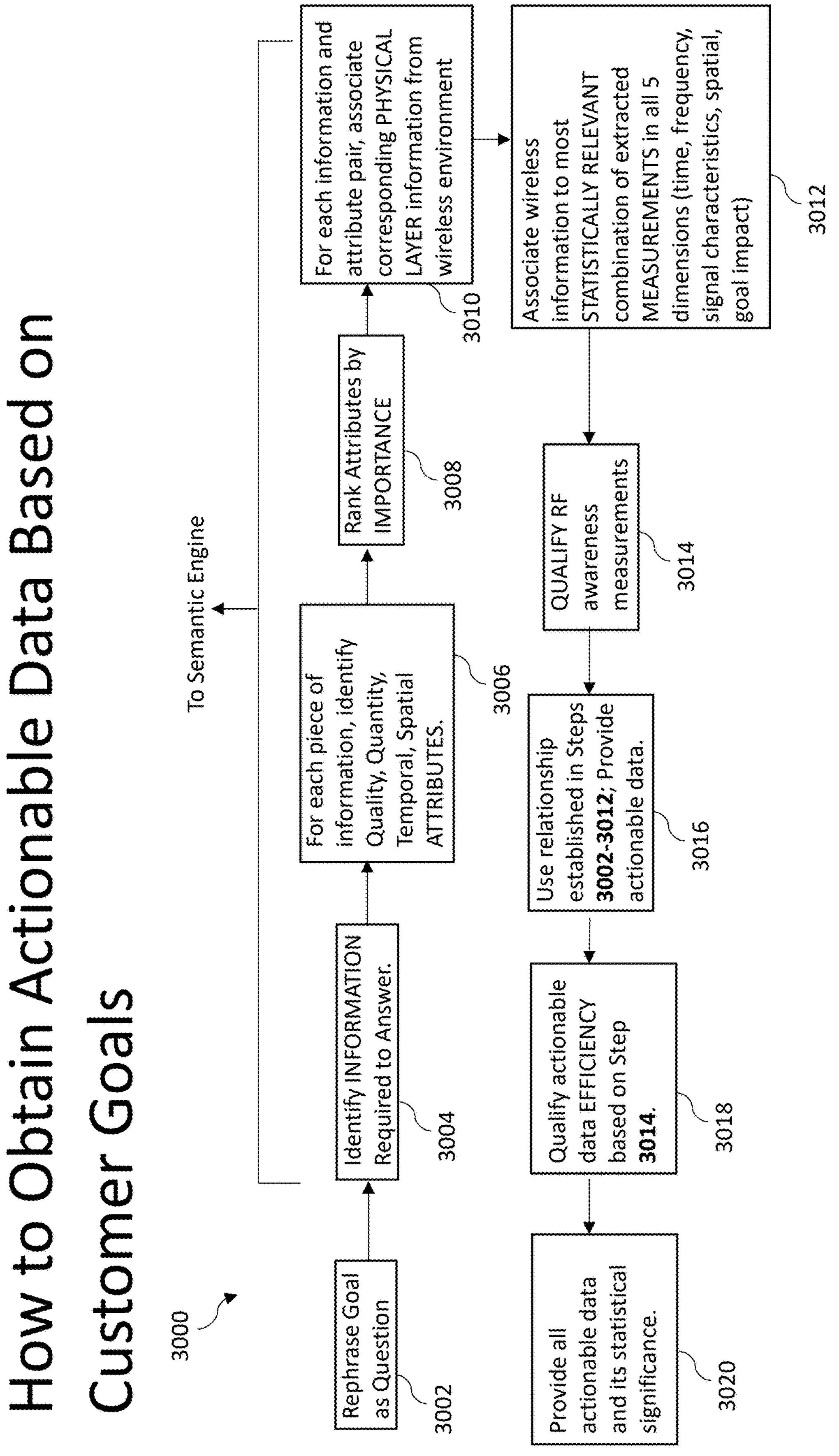
FIG. 30 illustrates a flow diagram of a method to obtain actionable data based on customer goals.
Figure 31:
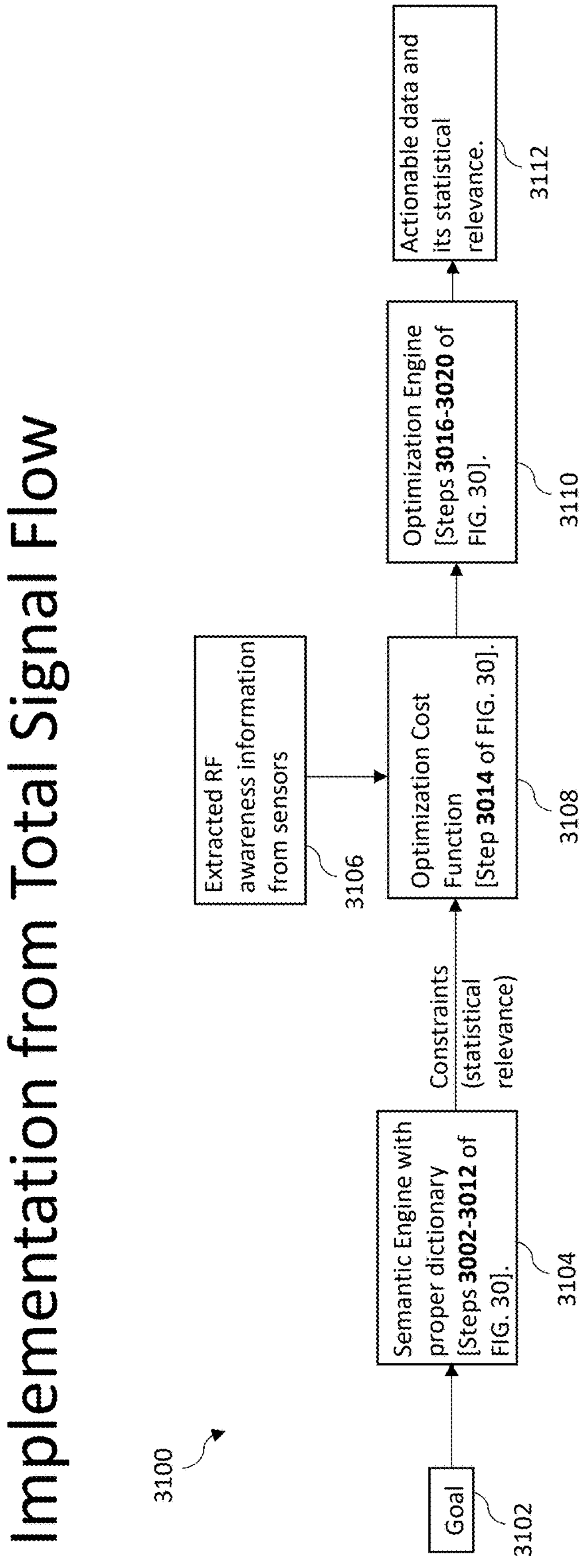
FIG. 31 illustrates a flow diagram of a method of implementation of actionable data and knowledge decision gates from total signal flow.
Figure 32:
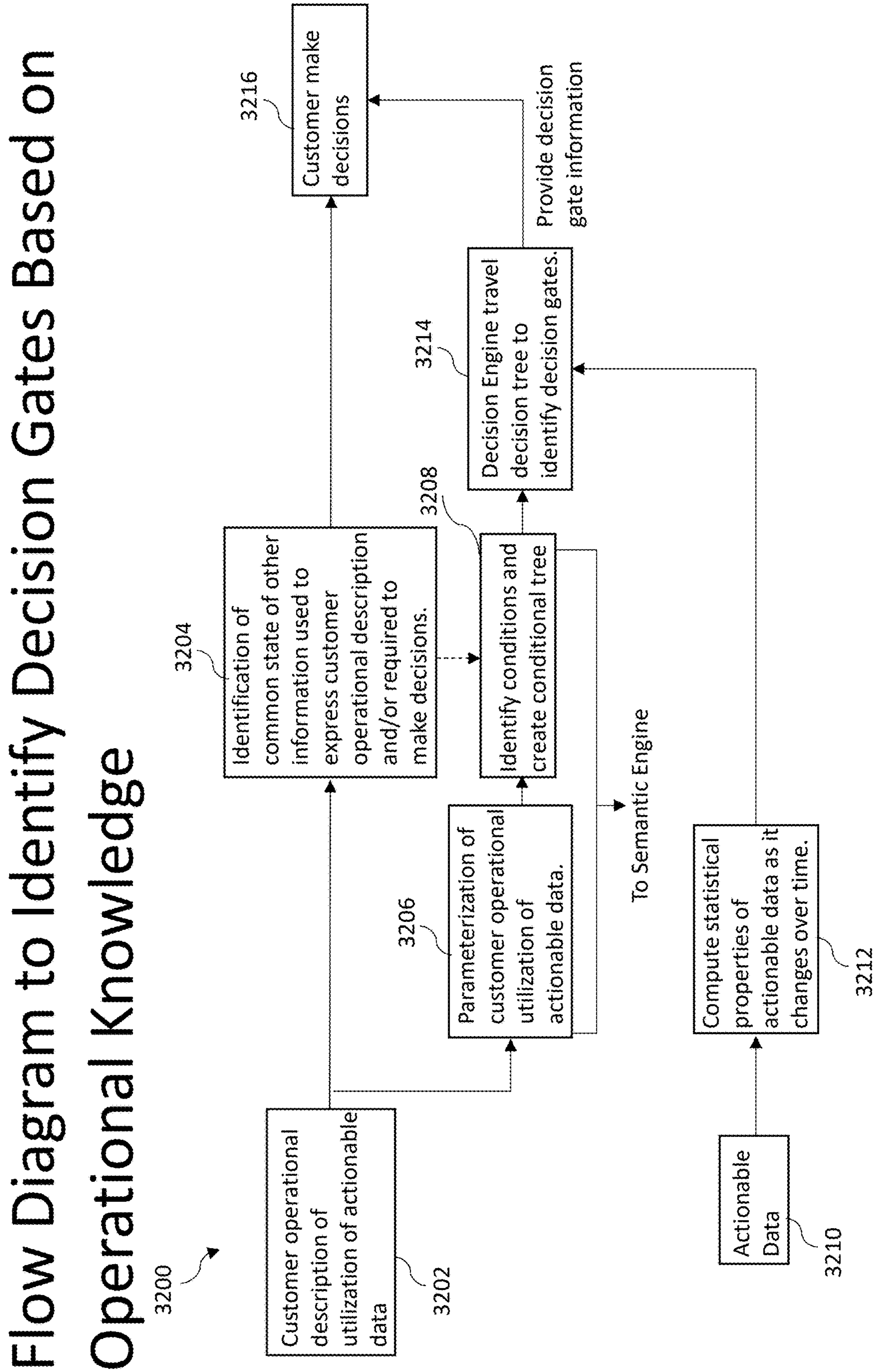
FIG. 32 illustrates a flow diagram of a method to identify knowledge decision gates based on operational knowledge.

FIGS. 30-32 are flow diagrams illustrating the process of obtaining actionable data and using knowledge decision gates. FIG. 30 illustrates a flow diagram of a method to obtain actionable data based on customer goals 3000. A goal is rephrased as a question in Step 3002. Information required to answer the question is identified in Step 3004. Next, quality, quantity, temporal, and/or spatial attributes are identified for each piece of information in Step 3006. In a preferred embodiment, all four attributes (i.e., quality, quantity, temporal, and spatial) are identified in Step 3006. The quality, quantity, temporal, and/or spatial attributes are ranked by importance in Step 3008. For each information and attribute pair, corresponding physical layer information from the wireless environment is associated in Step 3010. All information obtained in steps 3004-3010 is operable to be transmitted to the semantic engine.

Further, wireless information is associated with a most statistically relevant combination of extracted measurements in at least one dimension in Step 3012. The at least one dimension includes, but is not limited to, time, frequency, signal space and/or signal characteristics, spatial, and/or application goals and/or customer impact. In a preferred embodiment, the at least one dimension includes time, frequency, signal space and/or signal characteristics, spatial, and application goals and/or customer impact. The RF awareness measurements are then qualified in Step 3014 and actionable data is provided in Step 3016 based on the relationship established in Steps 3002-3012. Actionable data efficiency is qualified in Step 3018 based on Step 3014. All actionable data and its statistical significance is provided in Step 3020.

FIG. 31 illustrates a flow diagram of a method of implementation of actionable data and knowledge decision gates from total signal flow 3100. A customer goal is rephrased as a question in Step 3102. The customer goal is provided to the semantic engine having a proper dictionary in Step 3104 (as shown in Steps 3002-3012 of FIG. 30). Constraints with statistical relevance from Step 3104 and extracted electromagnetic (e.g., RF) awareness information from sensors in Step 3106 are used in an optimization cost function in Step 3108 (as shown in Step 3014 of FIG. 30). Results from the optimization cost function in Step 3108 are provided to an optimization engine in Step 3110 (as shown in Steps 3016-3020 of FIG. 30) to provide actionable data and its statistical relevance in Step 3112.

FIG. 32 illustrates a flow diagram of a method to identify knowledge decision gates based on operational knowledge 3200. Customer operational description of utilization of actionable data is provided in Step 3202. The customer operational description of utilization of actionable data from Step 3202 is used identify a common state of other information used to express the customer operational description and/or required to make decisions in Step 3204. Further, the customer operational description of utilization of actionable data from Step 3202 is used to provide parameterization of customer operational utilization of actionable data in Step 3206. The parameterization of customer operational utilization of actionable data from Step 3206 is used to identify conditions and create a conditional tree in Step 3208. In one embodiment, the information from Step 3204 is used to identify the conditions and create the conditional tree in Step 3208. Information from Steps 3206-3208 is operable to be transmitted to the semantic engine. Actionable data is provided in Step 3210 and used to compute statistical properties of the actionable data as it changes over time in Step 3212. Information from Steps 3208 and 3212 is used by a decision engine to travel a decision tree to identify decision gates in Step 3214. The identified decision gates from Step 3214 are provided along with the information in Step 3204 to allow the customer to make decisions in Step 3216.

Figure 33:
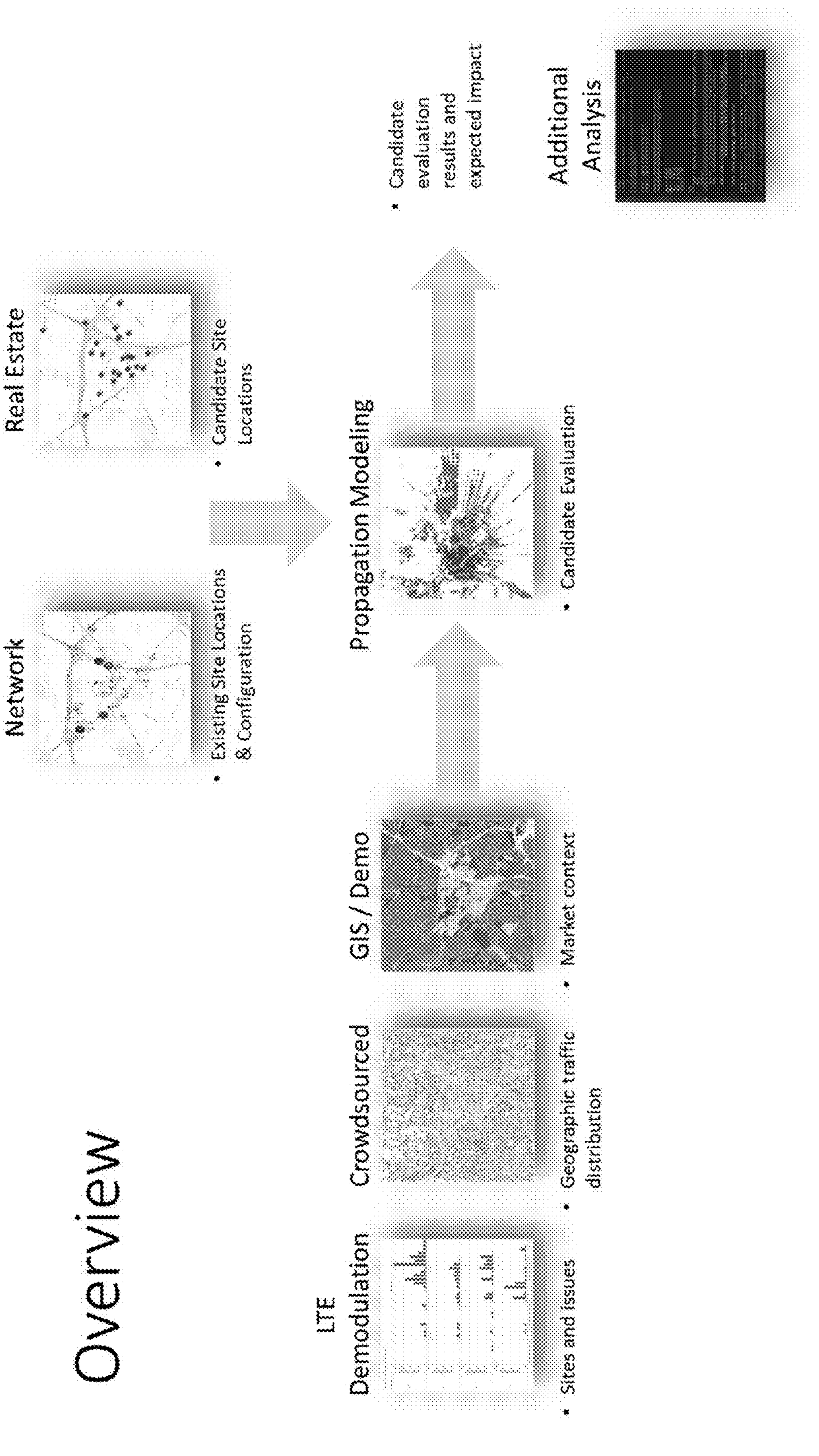
FIG. 33 illustrates an overview of one example of information used to provide knowledge.

FIG. 33 illustrates an overview of one example of information used to provide knowledge. Information including, but not limited to, network information (e.g., existing site locations, existing site configurations), real estate information (e.g., candidate site locations), signal data (e.g., LTE demodulation), signal sites, site issues, crowdsourced information (e.g., geographic traffic distribution), and/or geographic information services (GIS) is used to perform propagation modeling. The propagation models are used to evaluate candidate results and expected impact from any changes (e.g., addition of macrosites, tower). In one embodiment, additional analysis is performed on the candidate results and/or the expected impact.

Example One

In one example, the system is used by a tower company to evaluate if a carrier's performance can be improved by placing at least one additional macrosite on at least one additional tower. If the evaluation shows that the carrier's performance can be improved, it supports a pitch from the tower company to place the at least one macrosite on the at least one additional tower, which would generate revenue for the tower company.

Figure 34:
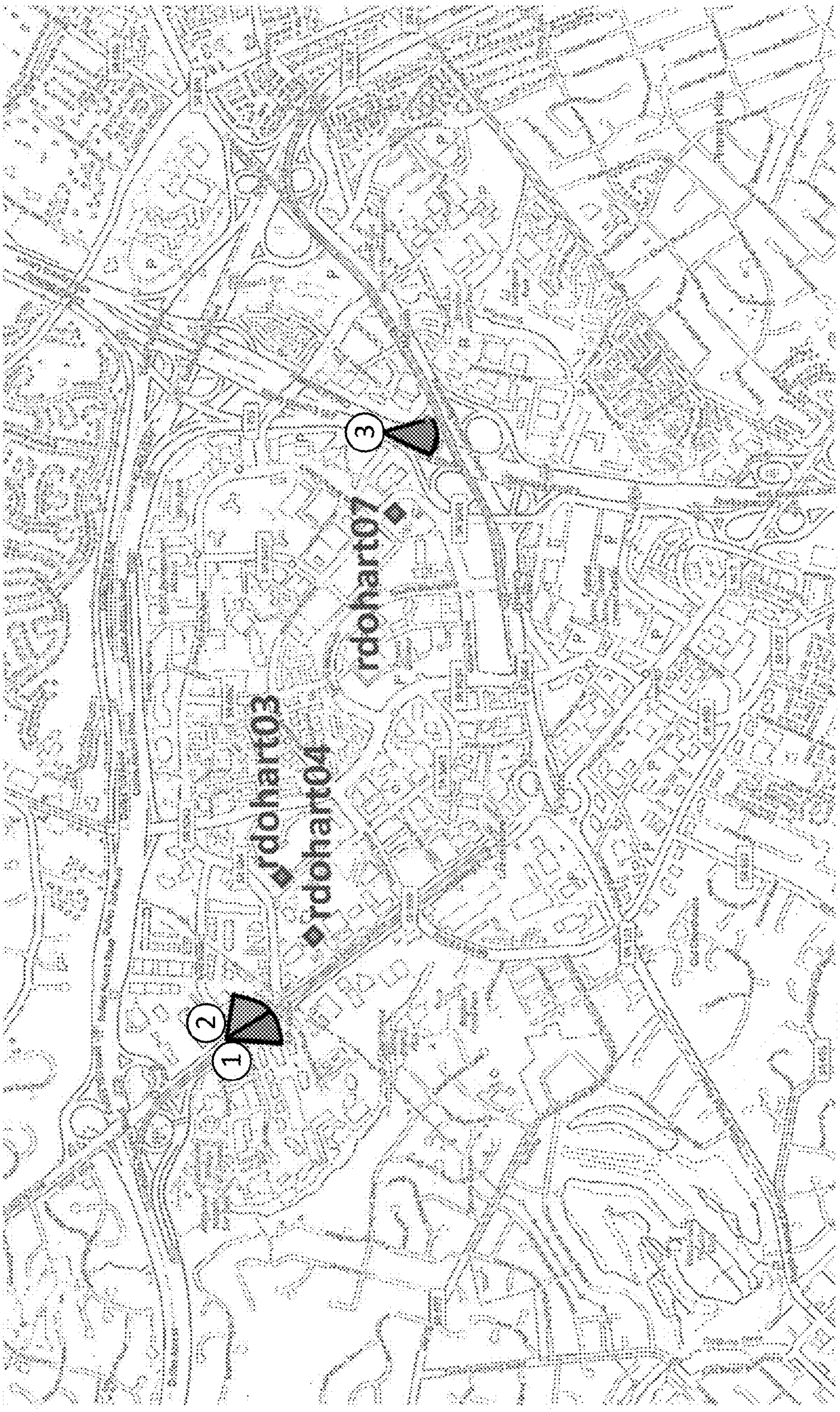
FIG. 34 is a map showing locations of three macrosites, 3 SigBASE units, and a plurality of locations evaluated for alternate or additional site deployment for a first example.

FIG. 34 is a map showing locations of three macrosites ("1" (green), "2" (orange), and "3" (purple)), 3 SigBASE units (orange diamond), and a plurality of locations evaluated for alternate or additional site deployment (green circles).

Figure 35:
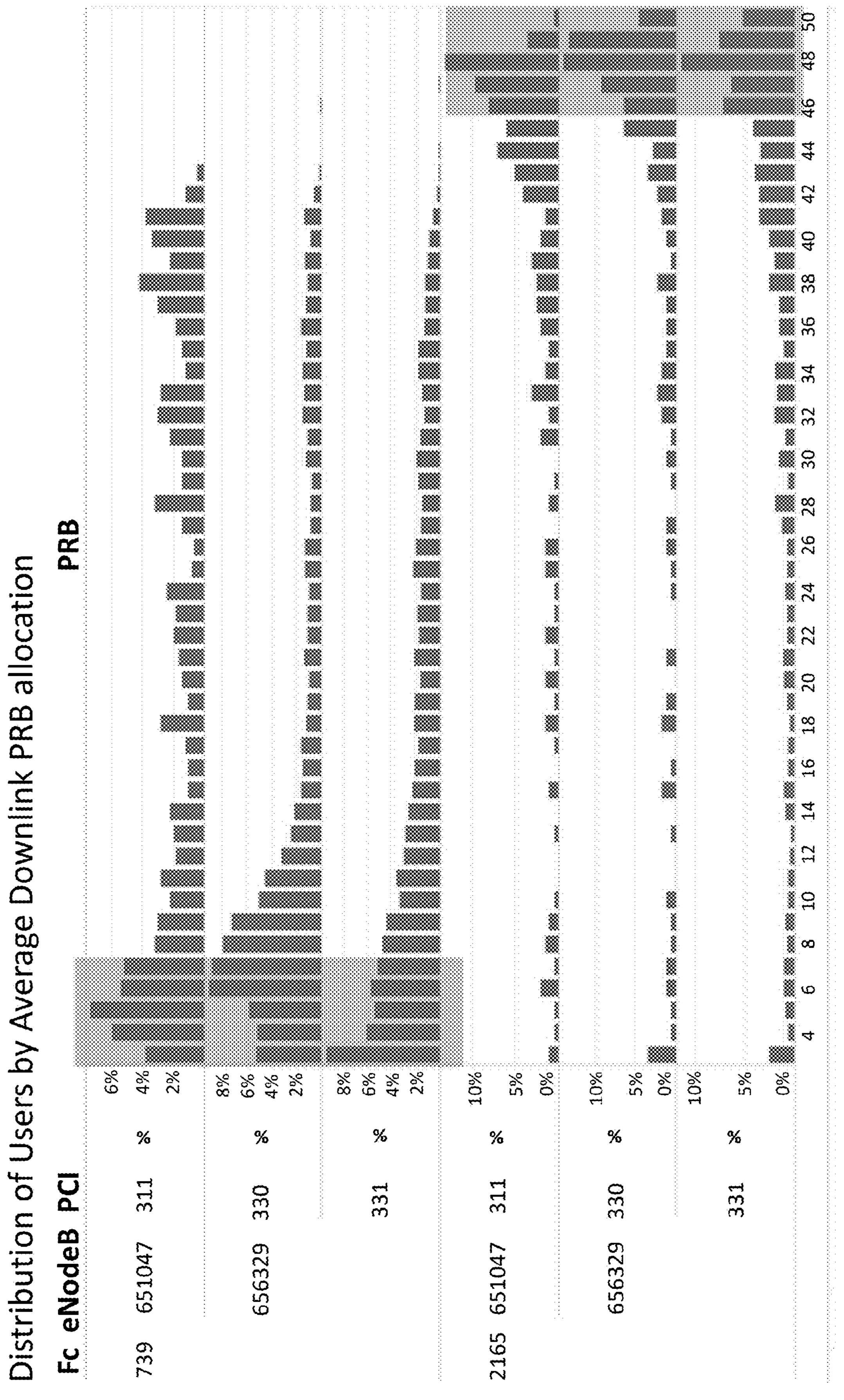
FIG. 35 is a graph of distribution of users by average downlink Physical Resource Block (PRB) allocation for the first example.

FIG. 35 is a graph of distribution of users by average downlink Physical Resource Block (PRB) allocation. Real-time monitoring shows downlink resources allocated to each user. Allocations occur many times per second. A significant concentration of users on 739 MHz are allocated resources for voice service. Most users on 2165 MHz are allocated resources common for high-speed data.

Figure 36:
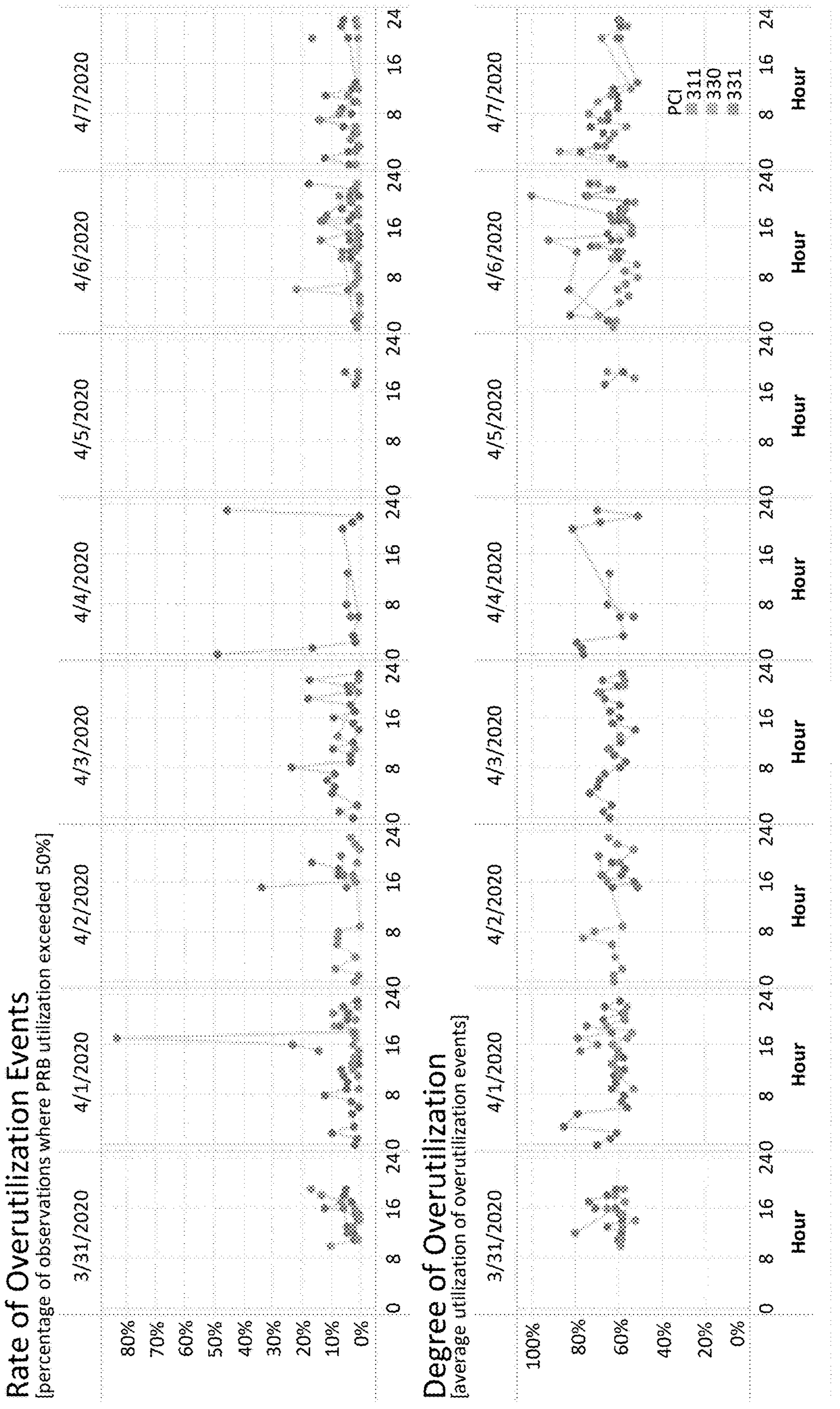
FIG. 36 illustrates rate of overutilization events and degree of overutilization for the first example.

FIG. 36 illustrates rate of overutilization events and degree of overutilization. Real-time monitoring shows the percentage of downlink resources utilized when utilization exceeded 50%. Utilization statistics are generated per second as configured. The rate at which a sector utilization exceeds 50% (overutilized) is presented by hour. the average utilization levels when overutilization occurs describes the severity.

Figure 37A:
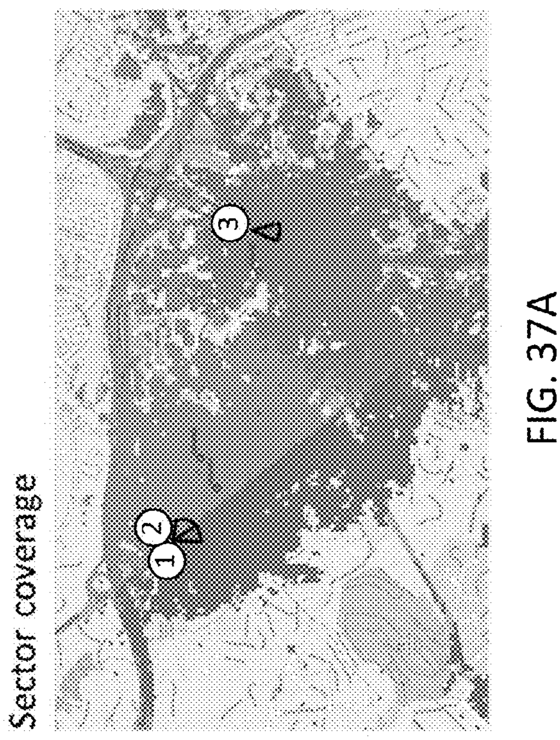
FIG. 37A is a sector coverage map for three macrosites for the first example.

FIG. 37A is a sector coverage map for the three macrosites ("1" (green), "2" (orange), and "3" (purple)).

Figure 37B:
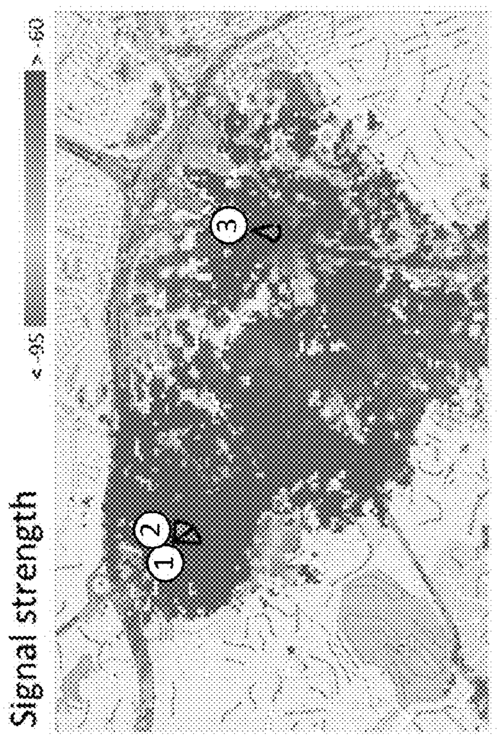
FIG. 37B illustrates signal strength for the sector shown in FIG. 37A for the first example.

FIG. 37B illustrates signal strength for the sector shown in FIG. 37A. This figure displays areas of poor coverage.

Figure 37C:
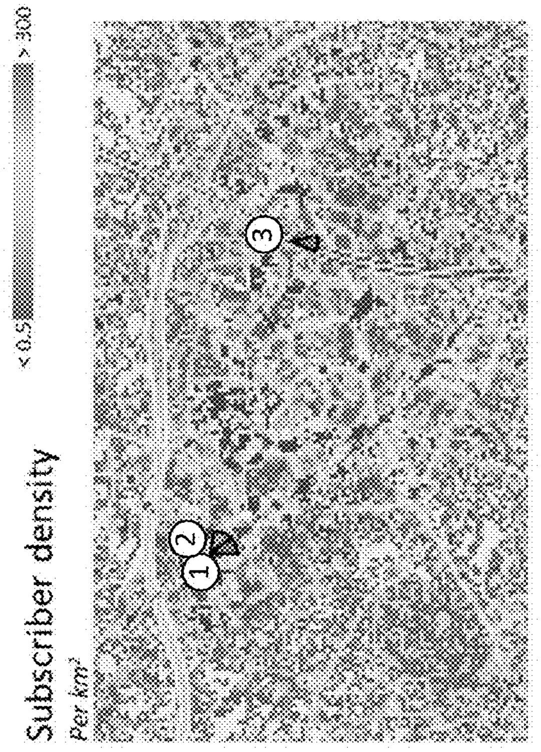
FIG. 37C illustrates subscriber density for the sector shown in FIG. 37A for the first example.

FIG. 37C illustrates subscriber density for the sector shown in FIG. 37A. In one embodiment, data from external sources is used to determine subscriber distribution and density. This figure displays areas of high subscriber demand.

Figure 37D:
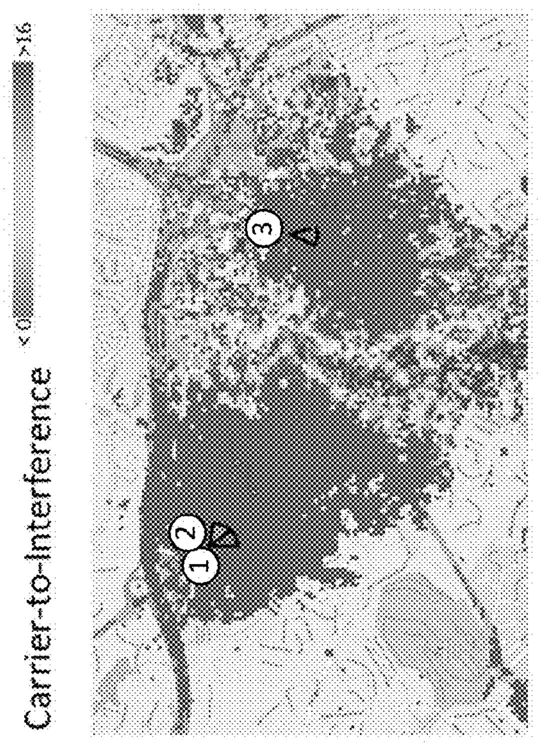
FIG. 37D illustrates carrier-to-interference ratio for the sector shown in FIG. 37A for the first example.

FIG. 37D illustrates carrier-to-interference ratio for the sector shown in FIG. 37A. This figure displays areas of poor quality.

Figure 38B:
FIG. 38B is a map showing locations of the three original macrosites and two additional macrosites for the first example.
Figure 38A:
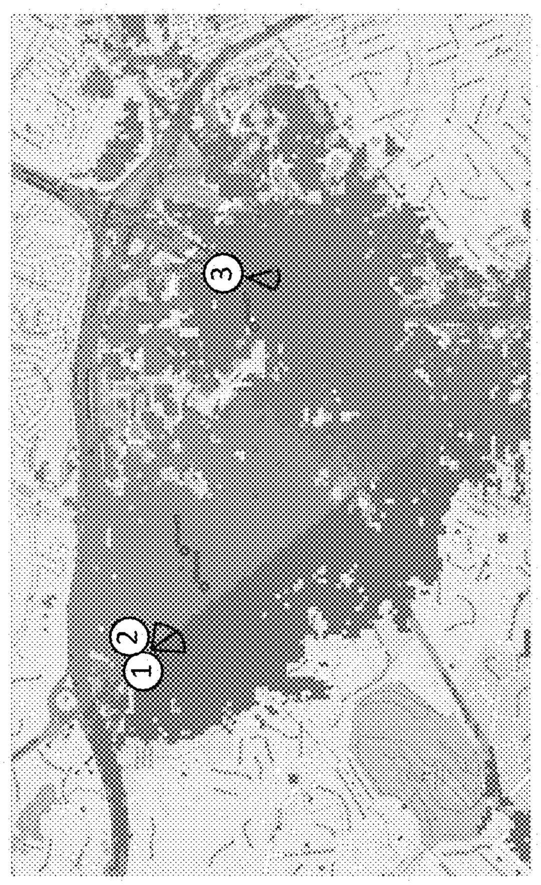
FIG. 38A illustrates the baseline scenario shown in FIG. 34 for the first example.

FIG. 38A illustrates the baseline scenario shown in FIG. 34. FIG. 38B is a map showing locations of the three original macrosites ("1" (green), "2" (orange), and "3" (purple)) and two additional macrosites ("4" (dark blue) and "5" (light blue)).

Figure 39:
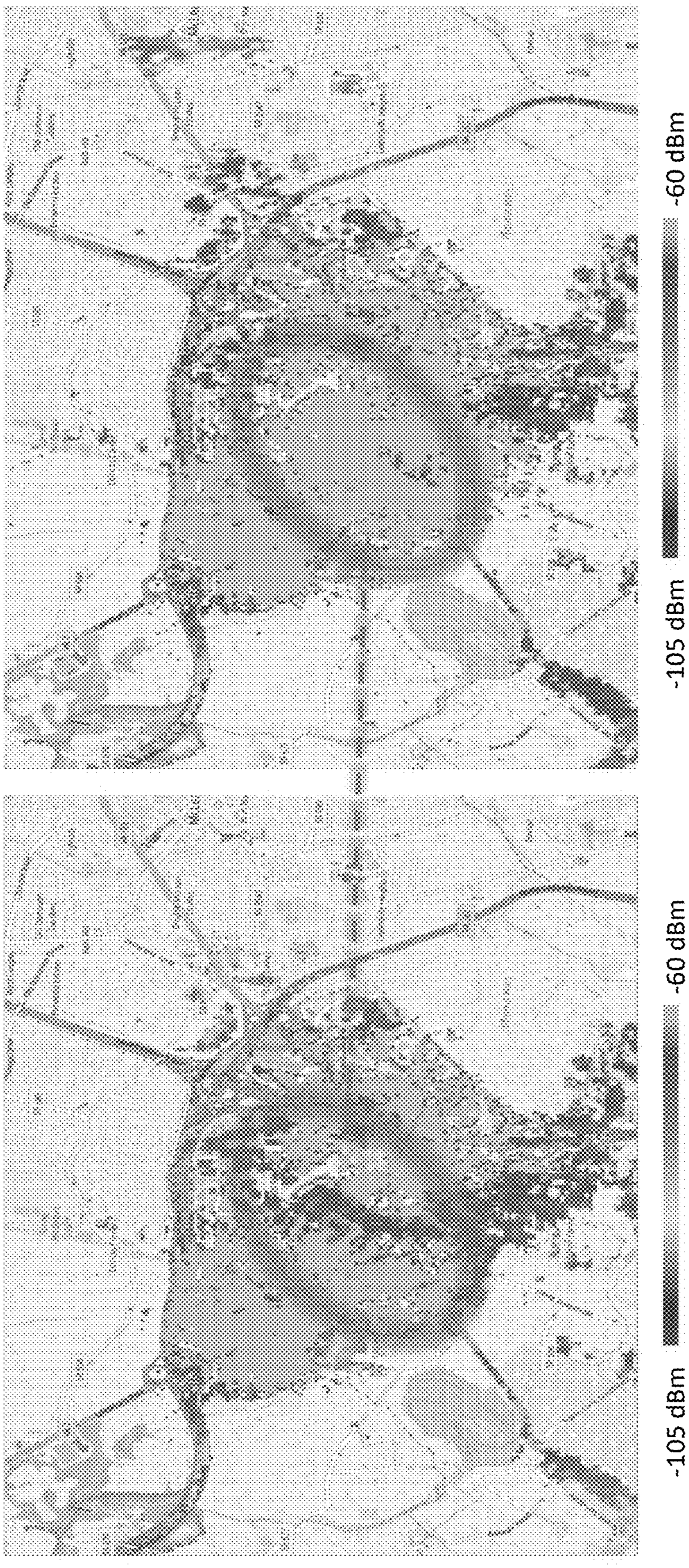
FIG. 39 illustrates signal strength of the baseline scenario from FIG. 38A on the left and the scenario with two additional macrosites from FIG. 38B on the right for the first example.

FIG. 39 illustrates signal strength of the baseline scenario from FIG. 38A on the left and the scenario with two additional macrosites from FIG. 38B on the right. The addition of a 2-sector eNodeB to a tower increases expected coverage by 3 $km^2$ as shown in Table 2 below. A total service area for the baseline is 9.89 $km^2$ and the total service area increases to 13.15 $km^2$ with the two additional macrosites. A total area with a carrier-to-interference ratio less than 5 dB decreases from 1.10 $km^2$ for the baseline to 0.38 $km^2$ with the two additional macrosites. A total area with a carrier-to-interference ratio greater than 5 dB increases from 8.79 $km^2$ for the baseline to 12.77 $km^2$ with the two additional macrosites. Traffic served without harmful interference increases from 16.73 Erlands for the baseline to 25.23 Erlands with the two additional macrosites. Additionally, an increase in traffic served of 40% is expected. Further utilization reduction of 30% is expected for pre-existing sectors. Areas of poor coverage are also reduced.

TABLE 2

| Metric | Baseline | 2-sector site added |
|---|---|---|
| Total service area, sq km | 9.89 | 13.15 |
| Total area with C/I <5 dB, $km^2$ | 1.10 | 0.38 |
| Total area with C/I >5 dB, $km^2$ | 8.79 | 12.77 |
| Traffic served without harmful interference, Erlands | 16.73 | 25.23 |

Figure 40B:
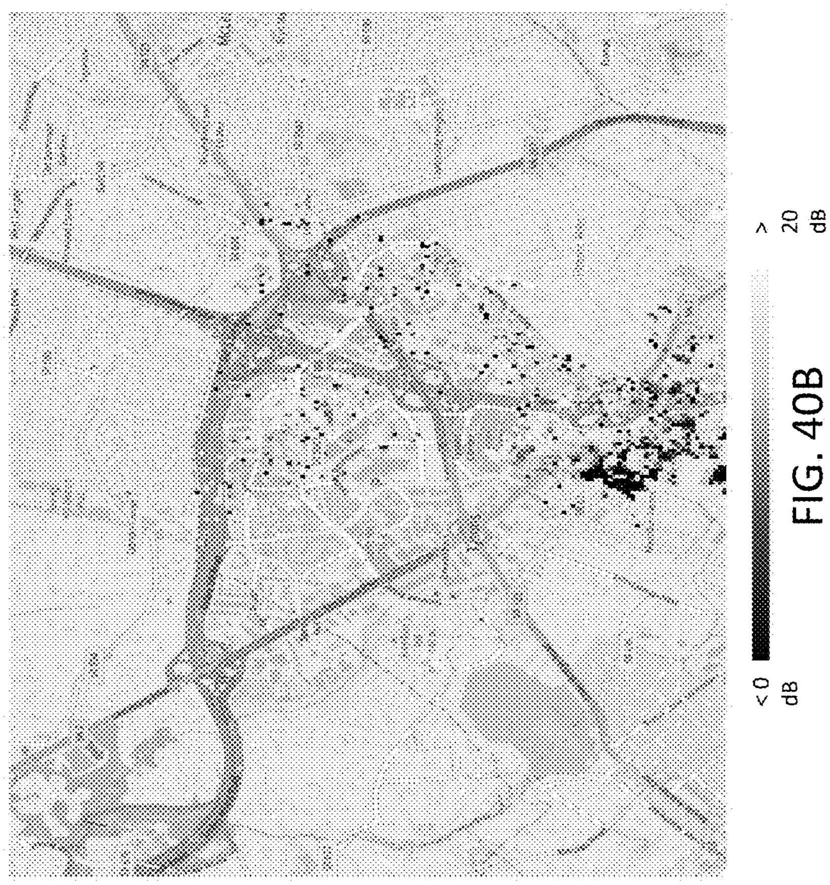
FIG. 40B illustrates carrier-to-interference ratio of the scenario with two additional macrosites for the first example.
Figure 40A:
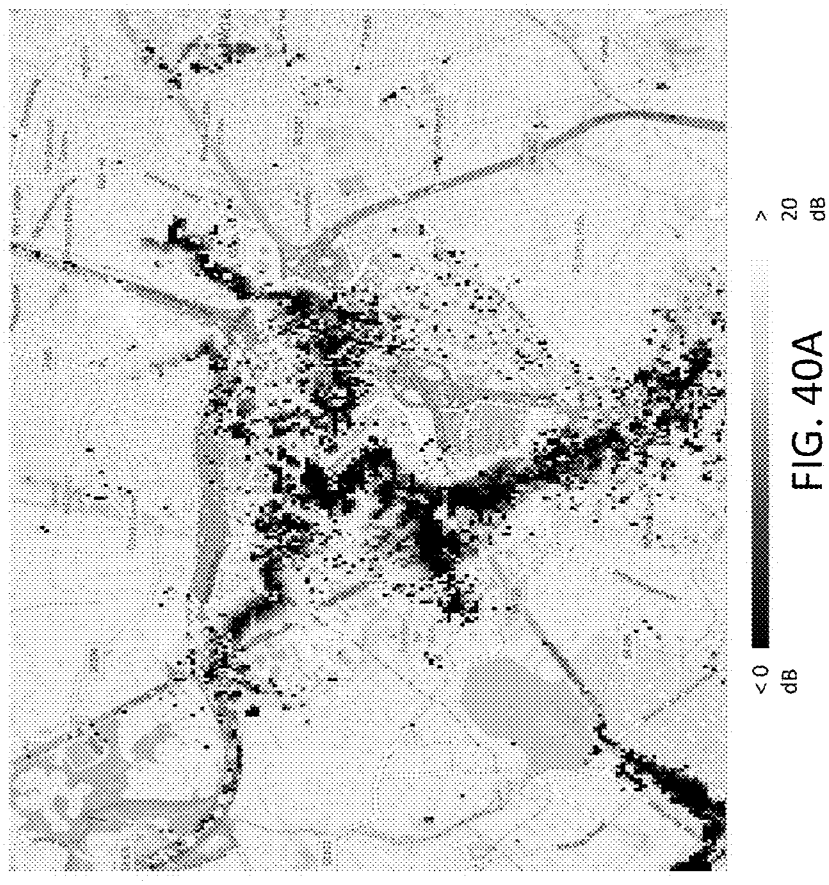
FIG. 40A illustrates carrier-to-interference ratio of the baseline scenario from FIG. 38A for the first example.

FIG. 40A illustrates carrier-to-interference ratio of the baseline scenario from FIG. 38A. FIG. 40B illustrates carrier-to-interference ratio of the scenario with two additional macrosites. The additional two macrosites reduce areas with poor carrier-to-interference.

Example Two

In a second example, the system is also used by a tower company to evaluate if a carrier's performance can be improved by placing at least one additional macrosite on at least one additional tower. If the evaluation shows that the carrier's performance can be improved, it supports a pitch from the tower company to place the at least one macrosite on the at least one additional tower, which would generate revenue for the tower company.

Figure 41:
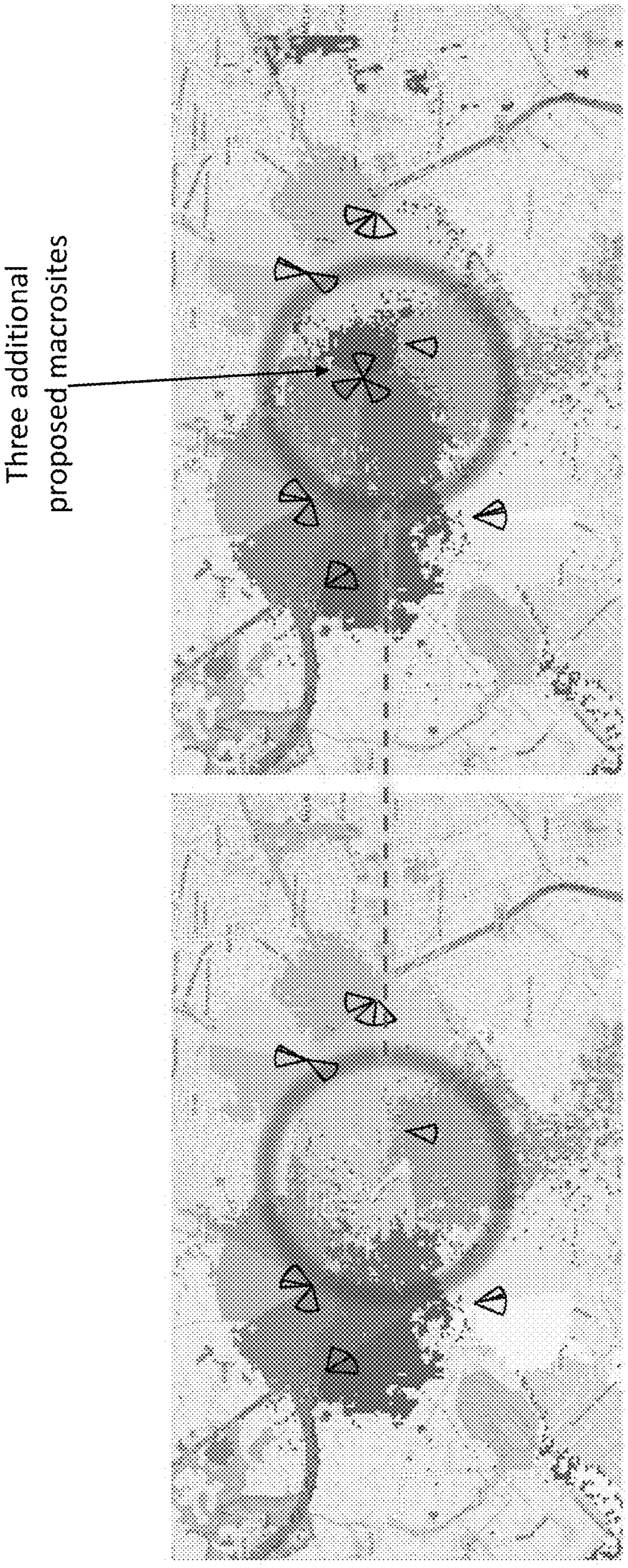
FIG. 41 illustrates a baseline scenario for a second example on the left and a map showing locations of the original macrosites from the baseline scenario with three additional proposed macrosites for the second example on the right.

FIG. 41 illustrates a baseline scenario for the second example on the left and a map showing locations of the original macrosites from the baseline scenario with three additional proposed macrosites on the right.

Figure 42:
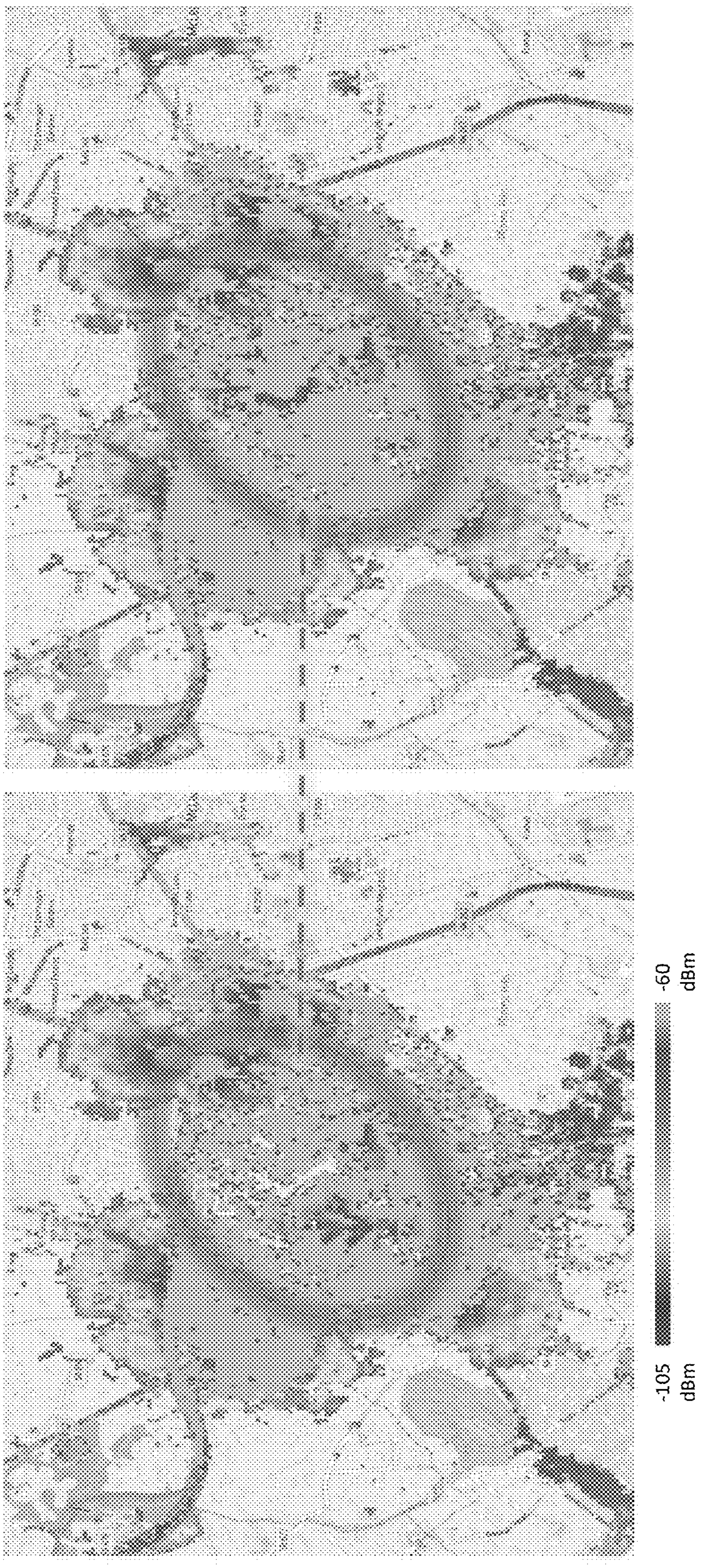
FIG. 42 illustrates signal strength of the baseline scenario from FIG. 41 on the left and the scenario with three additional proposed macrosites from FIG. 41 on the right for the second example.

FIG. 42 illustrates signal strength of the baseline scenario from FIG. 41 on the left and the scenario with three additional proposed macrosites from FIG. 41 on the right. The addition of a 3-sector eNodeB to a tower increases expected coverage by 0.5 $km^2$ as shown in Table 3 below. A total service area for the baseline is 21.3 $km^2$ and the total service area increases to 21.8 $km^2$ with the three additional macrosites. A total area with a carrier-to-interference ratio less than 5 dB increases from 3.0 $km^2$ for the baseline to 3.1 $km^2$ with the three additional macrosites. A total area with a carrier-to-interference ratio greater than 5 dB increases from 18.3 $km^2$ for the baseline to 18.7 $km^2$ with the three additional macrosites. Traffic served without harmful interference increases from 79.7 Erlands for the baseline to 80.9 Erlands with the three additional macrosites. Additionally, an increase in traffic served of 2% is expected. Further utilization reduction of 2% is expected for pre-existing sectors.

TABLE 3

| Metric | Baseline | 487044 Added |
|---|---|---|
| Total service area, sq km | 21.3 | 21.8 |
| Total area with C/I <5 dB, $km^2$ | 3.0 | 3.1 |
| Total area with C/I >5 dB, $km^2$ | 18.3 | 18.7 |
| Traffic served without harmful interference, Erlands | 79.7 | 80.9 |

Figure 43:
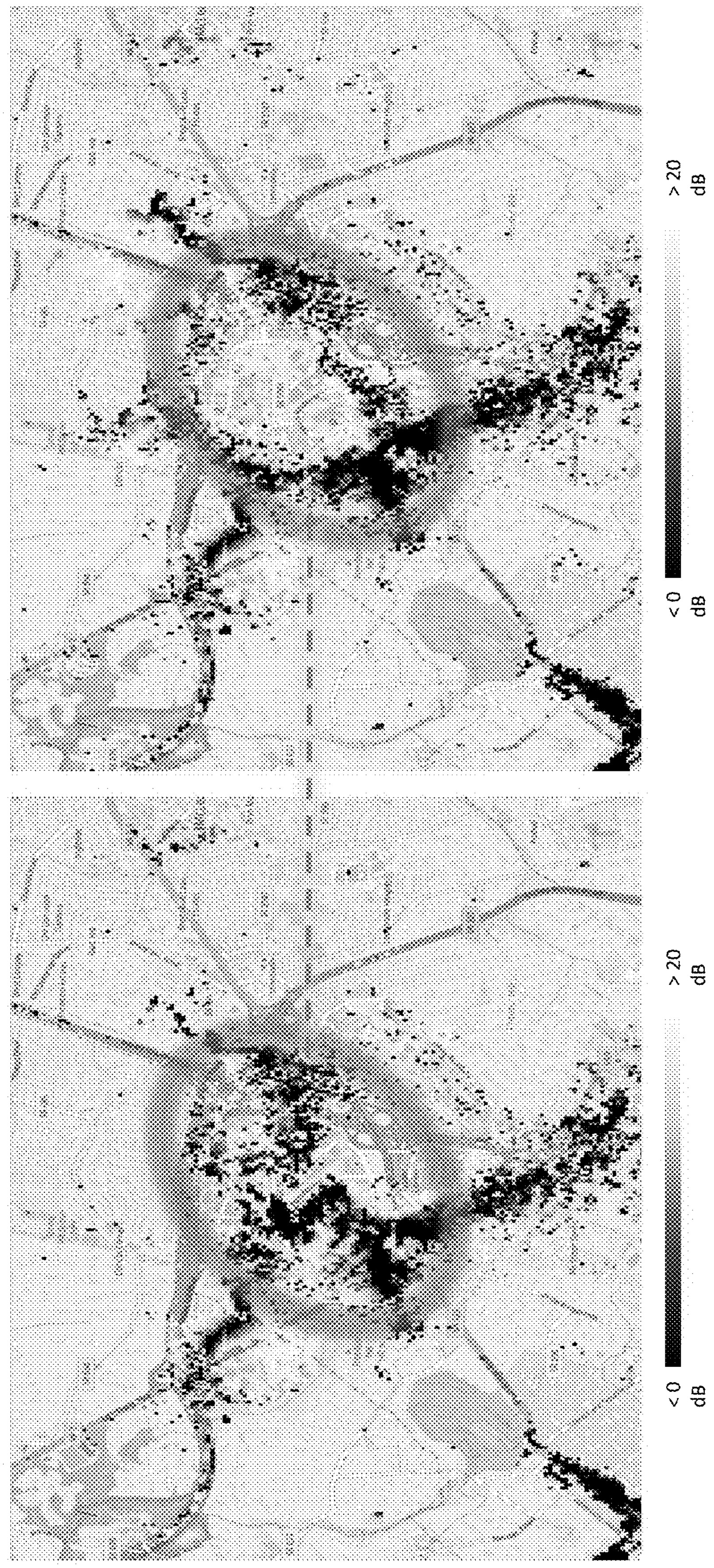
FIG. 43 illustrates carrier-to-interference ratio of the baseline scenario from FIG. 41 for the second example on the left and carrier-to-interference ratio of the scenario with three additional proposed macrosites from FIG. 41 on the right for the second example.

FIG. 43 illustrates carrier-to-interference ratio of the baseline scenario from FIG. 41 on the left and carrier-to-interference ratio of the scenario with three additional proposed macrosites from FIG. 41 on the right. The three additional proposed macrosites slightly reduce areas with poor carrier-to-interference.

Although adding the 3-sector eNodeB does slightly improve performance, this performance improvement is not significant enough to support the addition of the three proposed macrosites to the tower.

Example Three

In a third example, the system is used to evaluate which carrier provides better service.

FIG. 44 illustrates a signal strength comparison of a first carrier ("Carrier 1") with a second carrier ("Carrier 2") for 700 MHz.

Figure 45:
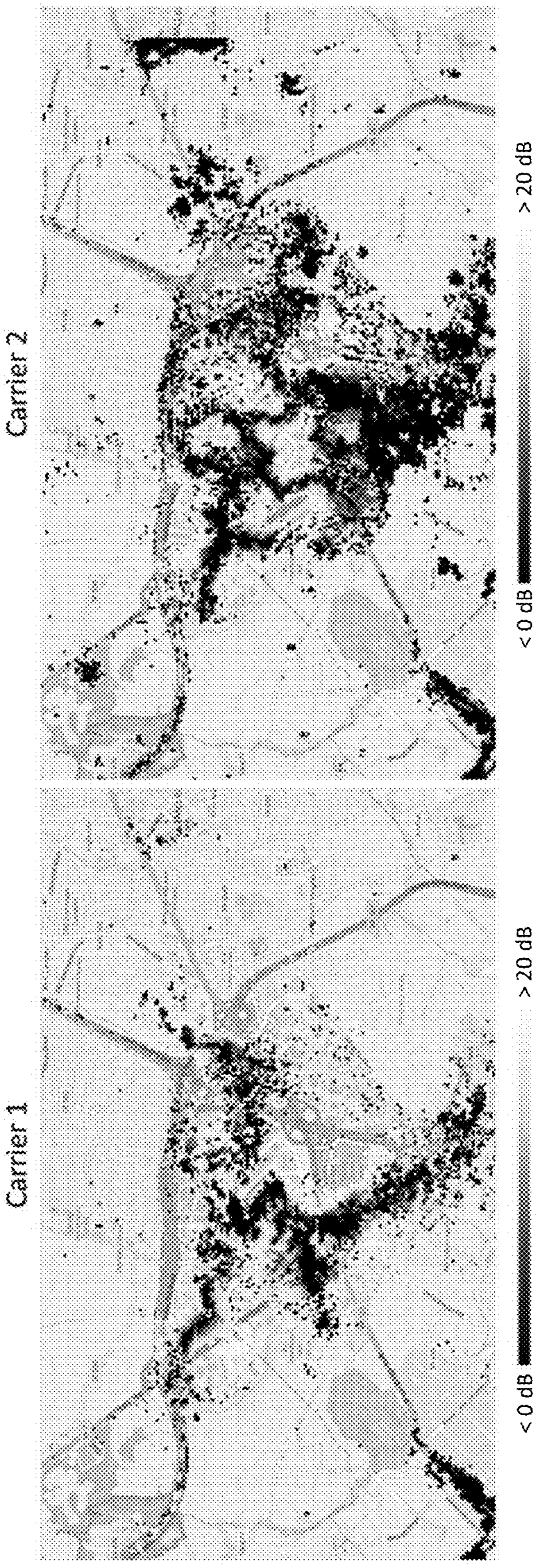
FIG. 45 illustrates carrier-to-interference ratio for Carrier 1 and Carrier 2 for the third example.

FIG. 45 illustrates carrier-to-interference ratio for Carrier 1 and Carrier 2.

Figure 46:
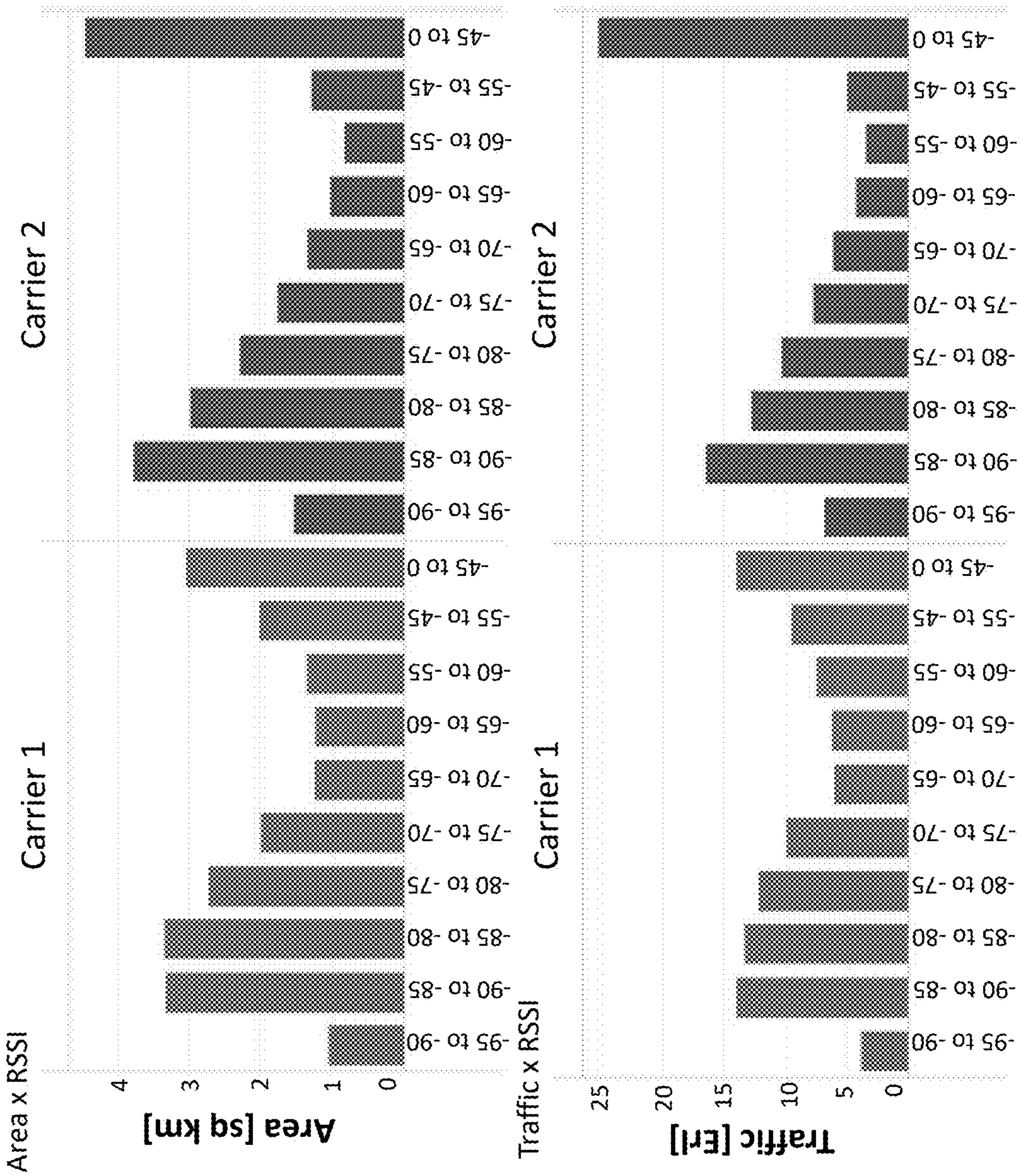
FIG. 46 is a graph of Area vs. RSSI and Traffic vs. RSSI for Carrier 1 and Carrier 2 for the third example.

FIG. 46 is a graph of Area vs. RSSI and Traffic vs. RSSI for Carrier 1 and Carrier 2. Carrier 1 and Carrier 2 serve approximately the same amount of area in the sector.

Figure 47:
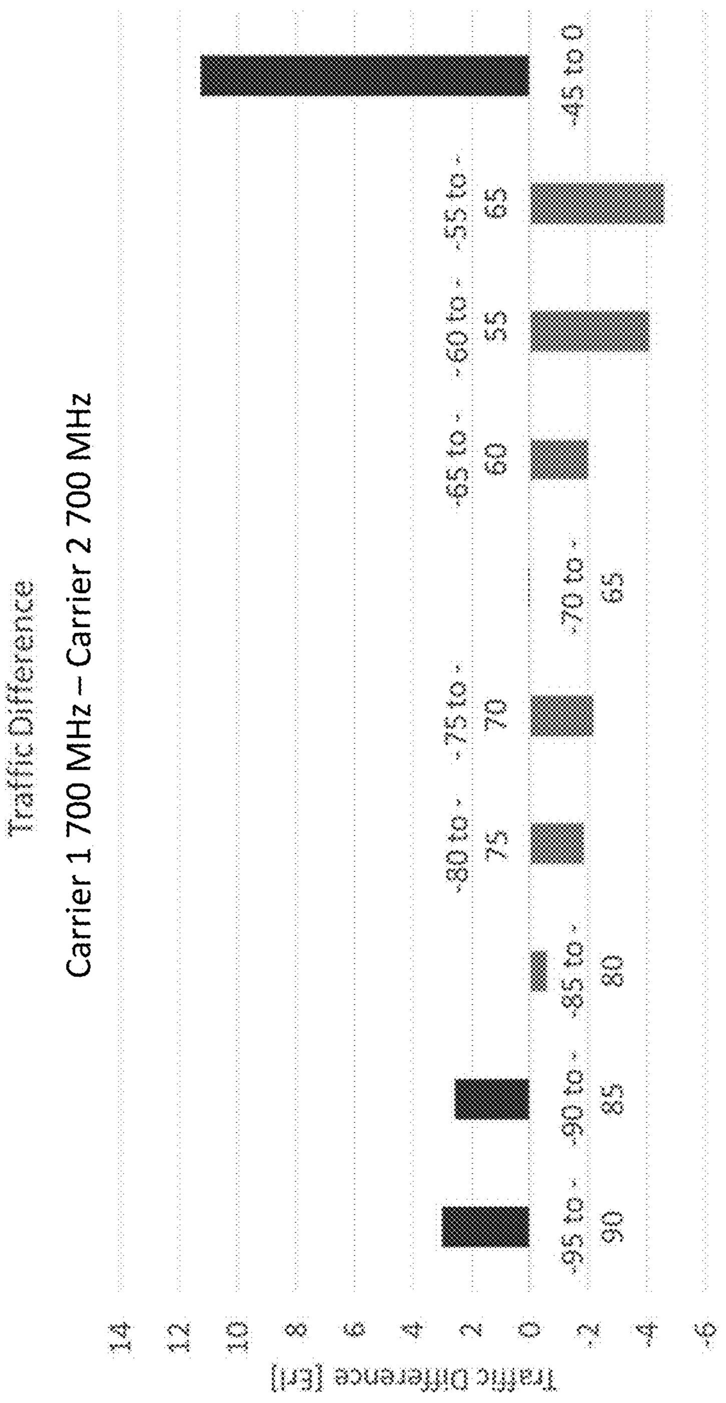
FIG. 47 is a graph of traffic difference for Carrier 1 versus Carrier 2 for the third example.

FIG. 47 is a graph of traffic difference for Carrier 1 versus Carrier 2. Carrier 2 serves more traffic than Carrier 1 at the extremes of coverage, while Carrier 1 serves more traffic in the middle range of coverage.

FIGS. 44-47 illustrate traffic composition for each SigBASE. Different traffic types require different signal-to-noise ratios (SNRs) vs reference signals received power (RSRP). For voice traffic, the SNR is from −6 dB to 0 dB, while the SNR goes upwards of 20 dB for streaming video.

Figure 48:
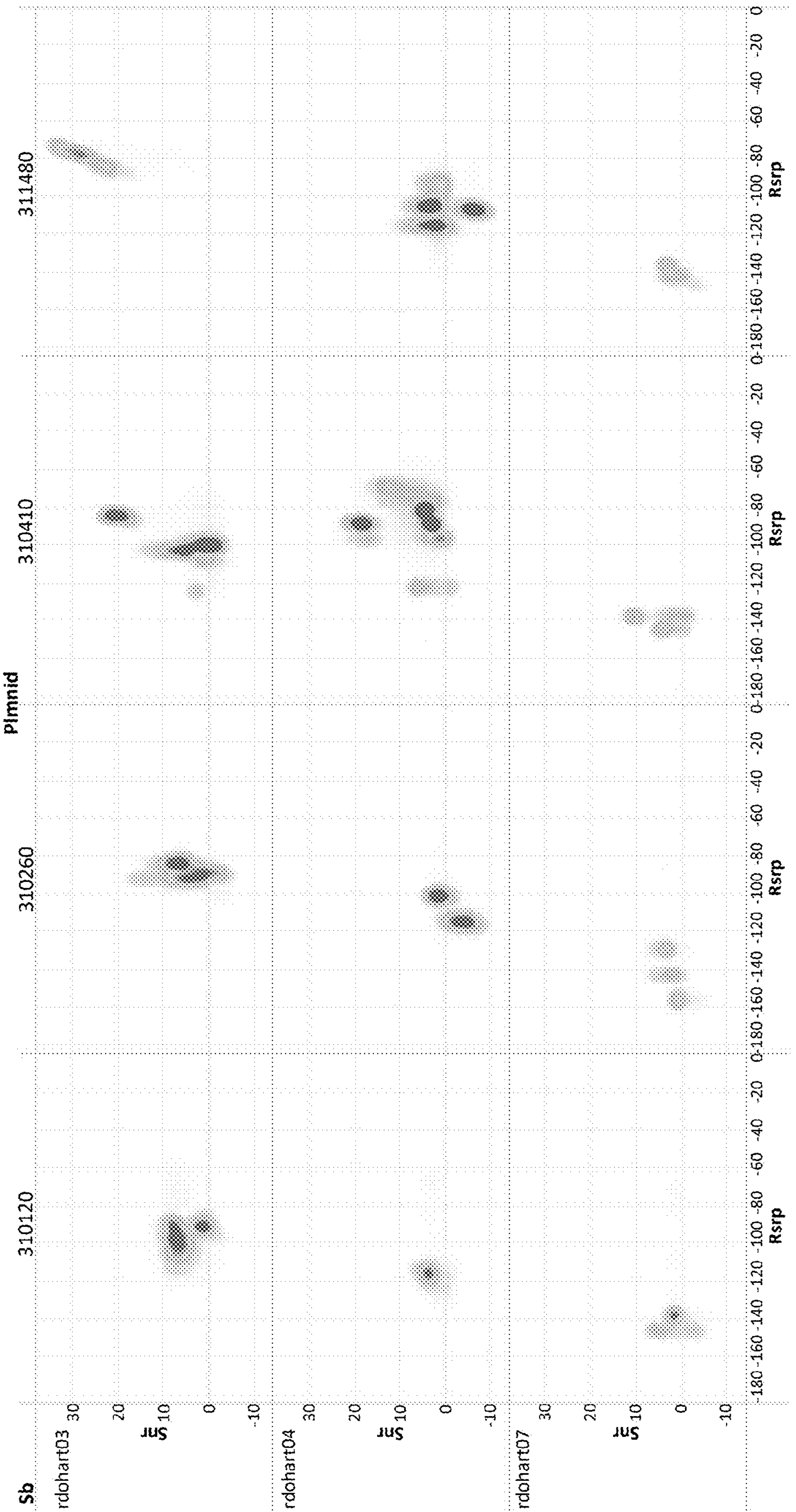
FIG. 48 is a graph of SNR vs. RSRP for each SigBASE for the third example.

FIG. 48 is a graph of SNR vs. RSRP for each SigBASE for the third example.

Figure 49:
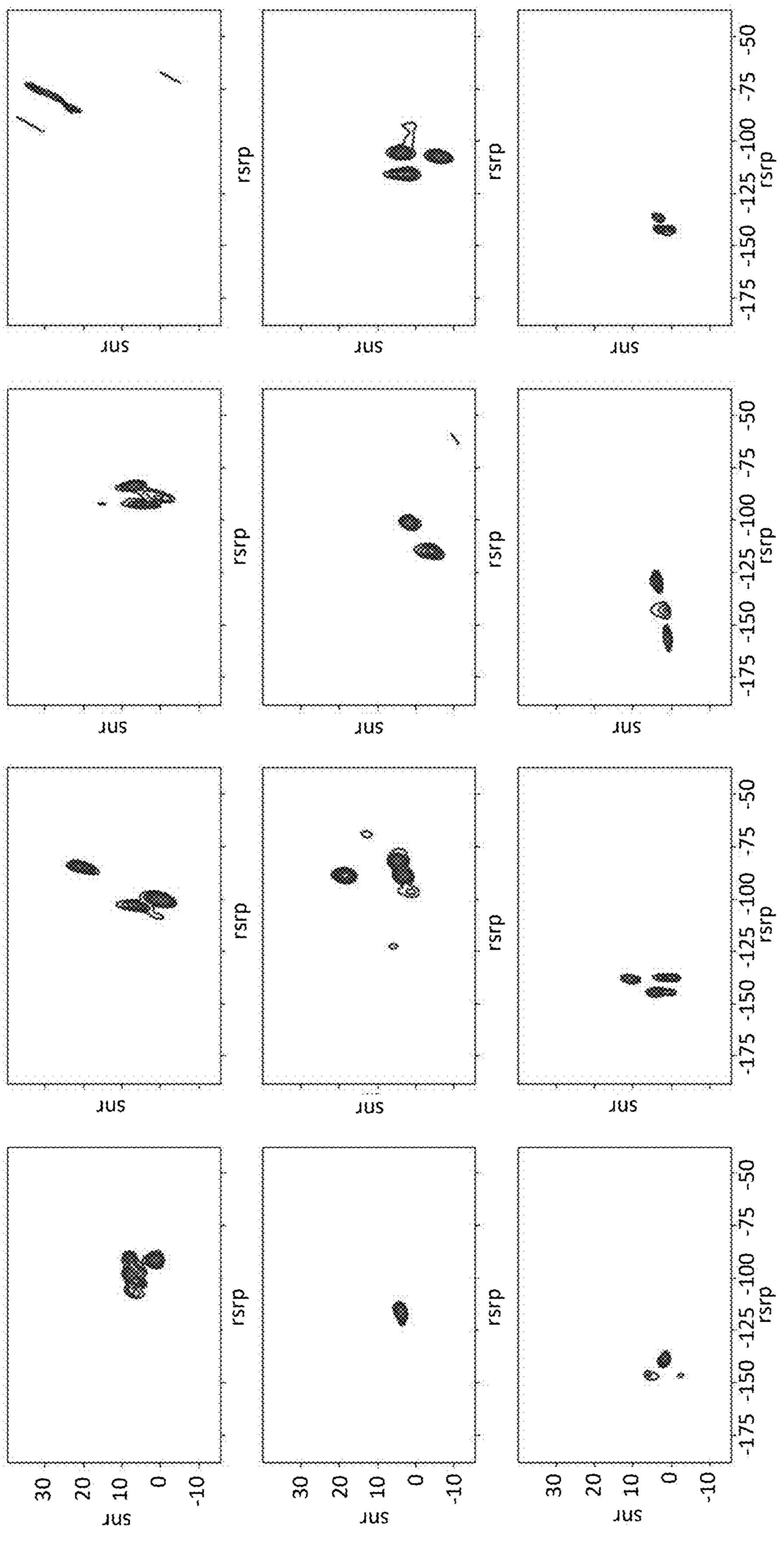
FIG. 49 is another graph of SNR vs. RSRP for each SigBASE for the third example.

FIG. 49 is another graph of SNR vs. RSRP for each SigBASE for the third example.

Figure 50:
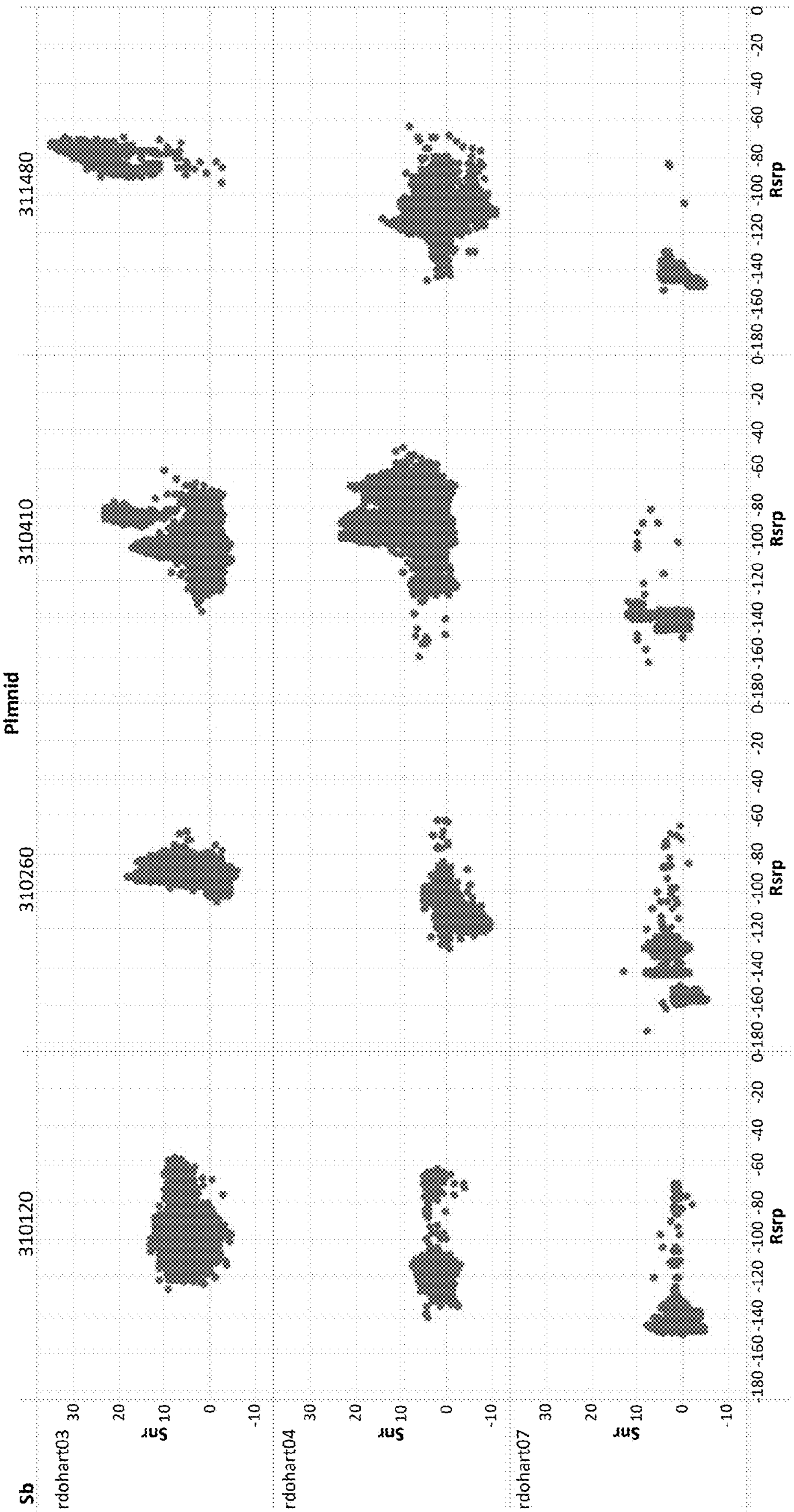
FIG. 50 is a clustered graph of SNR vs. RSRP for each SigBASE for the third example.

FIG. 50 is a clustered graph of SNR vs. RSRP for each SigBASE for the third example.

Figure 51:
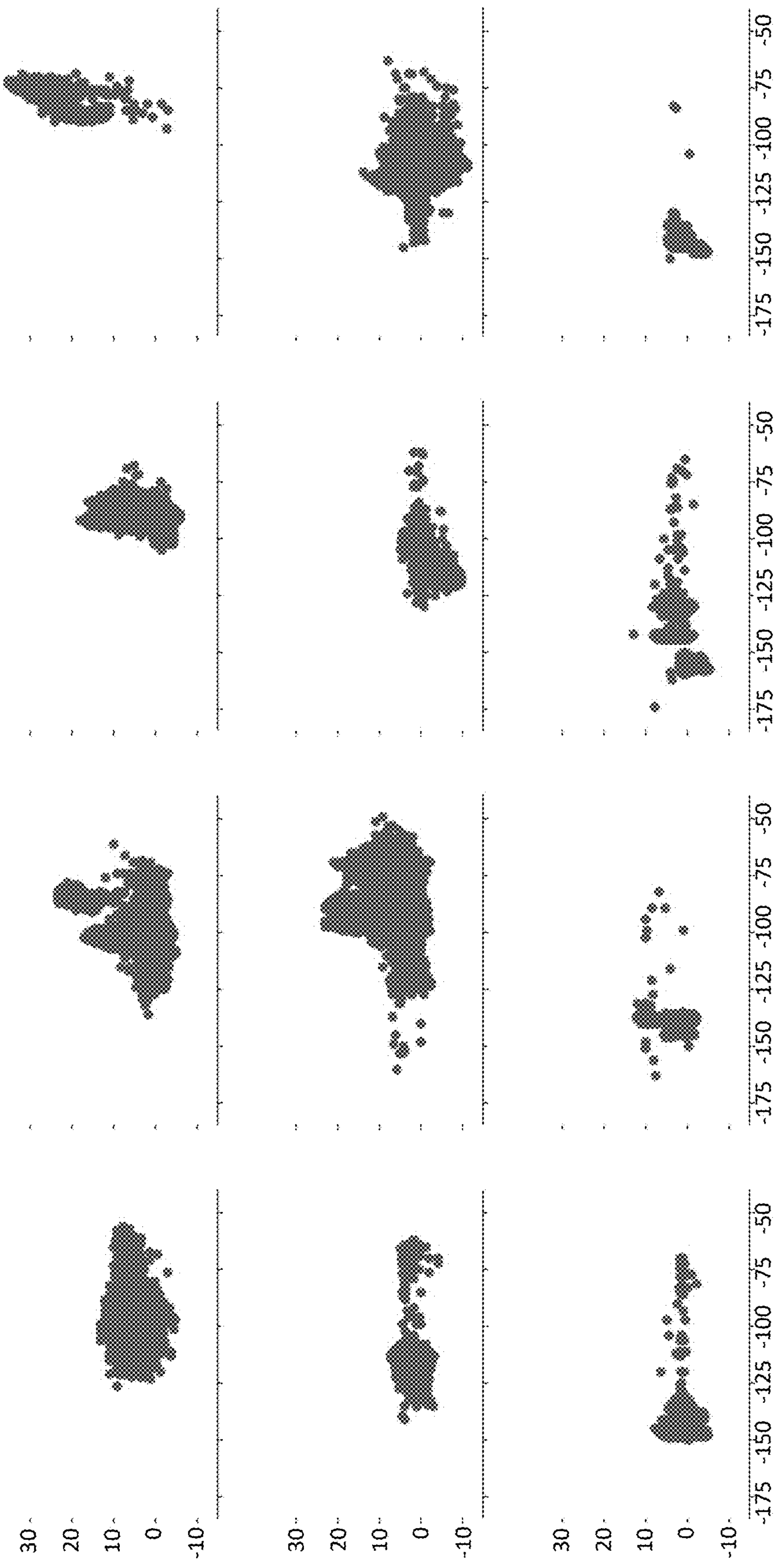
FIG. 51 is another clustered graph of SNR vs. RSRP for each SigBASE for the third example.

FIG. 51 is another clustered graph of SNR vs. RSRP for each SigBASE for the third example.

Figure 52:
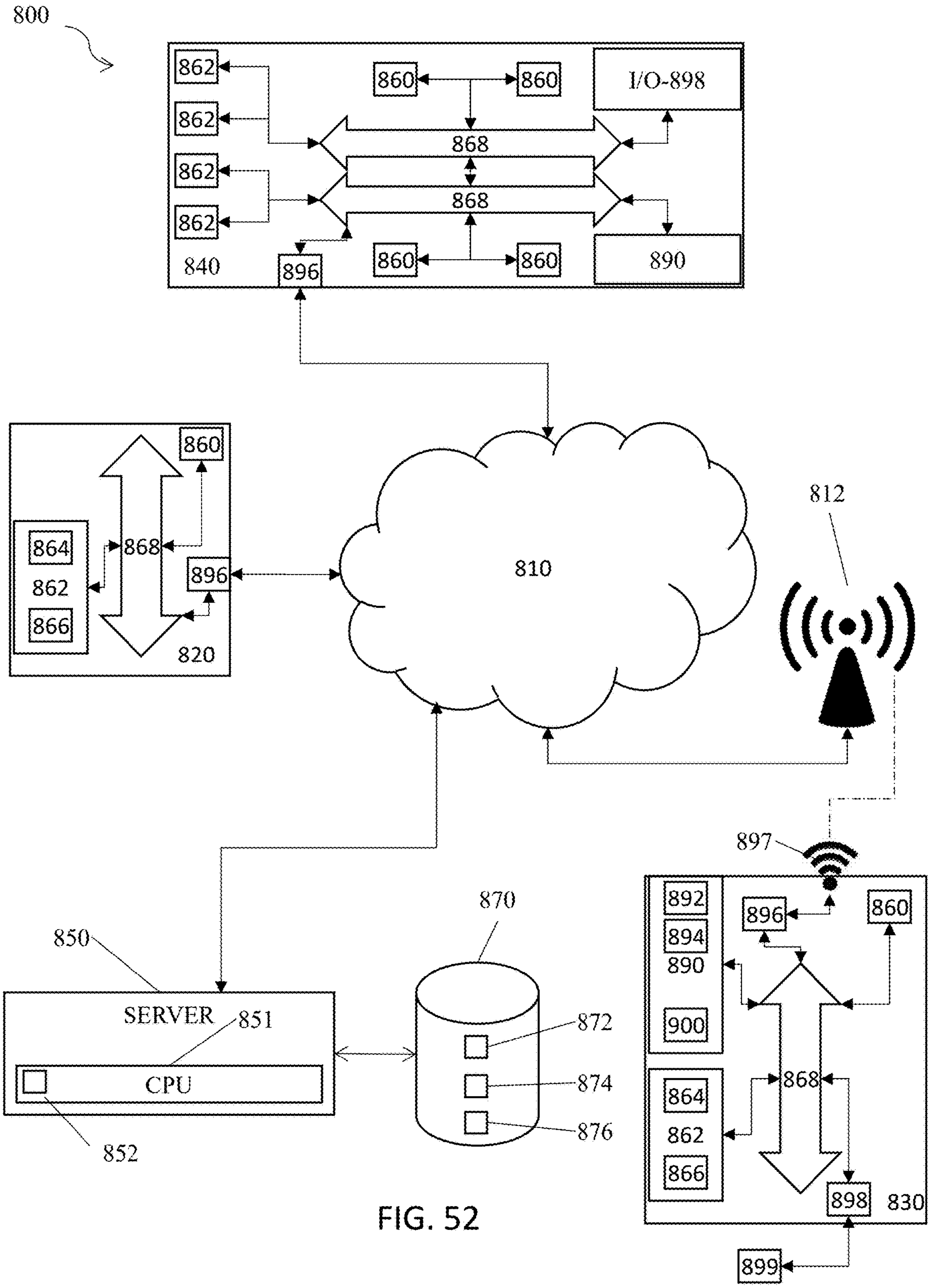
FIG. 52 is a schematic diagram of a system of the present invention.

FIG. 52 is a schematic diagram of an embodiment of the invention illustrating a computer system, generally described as 800, having a network 810, a plurality of computing devices 820, 830, 840, a server 850, and a database 870.

The server 850 is constructed, configured, and coupled to enable communication over a network 810 with a plurality of computing devices 820, 830, 840. The server 850 includes a processing unit 851 with an operating system 852. The operating system 852 enables the server 850 to communicate through network 810 with the remote, distributed user devices. Database 870 is operable to house an operating system 872, memory 874, and programs 876.

In one embodiment of the invention, the system 800 includes a network 810 for distributed communication via a wireless communication antenna 812 and processing by at least one mobile communication computing device 830. Alternatively, wireless and wired communication and connectivity between devices and components described herein include wireless network communication such as WI-FI, WORLDWIDE INTEROPERABILITY FOR MICROWAVE ACCESS (WIMAX), Radio Frequency (RF) communication including RF identification (RFID), NEAR FIELD COMMUNICATION (NFC), BLUETOOTH including BLUETOOTH LOW ENERGY (BLE), ZIGBEE, Infrared (IR) communication, cellular communication, satellite communication, Universal Serial Bus (USB), Ethernet communications, communication via fiber-optic cables, coaxial cables, twisted pair cables, and/or any other type of wireless or wired communication. In another embodiment of the invention, the system 800 is a virtualized computing system capable of executing any or all aspects of software and/or application components presented herein on the computing devices 820, 830, 840. In certain aspects, the computer system 800 is operable to be implemented using hardware or a combination of software and hardware, either in a dedicated computing device, or integrated into another entity, or distributed across multiple entities or computing devices.

By way of example, and not limitation, the computing devices 820, 830, 840 are intended to represent various forms of electronic devices including at least a processor and a memory, such as a server, blade server, mainframe, mobile phone, personal digital assistant (PDA), smartphone, desktop computer, netbook computer, tablet computer, workstation, laptop, and other similar computing devices. The components shown here, their connections and relationships, and their functions, are meant to be exemplary only, and are not meant to limit implementations of the invention described and/or claimed in the present application.

In one embodiment, the computing device 820 includes components such as a processor 860, a system memory 862 having a random access memory (RAM) 864 and a read-only memory (ROM) 866, and a system bus 868 that couples the memory 862 to the processor 860. In another embodiment, the computing device 830 is operable to additionally include components such as a storage device 890 for storing the operating system 892 and one or more application programs 894, a network interface unit 896, and/or an input/output controller 898. Each of the components is operable to be coupled to each other through at least one bus 868. The input/output controller 898 is operable to receive and process input from, or provide output to, a number of other devices 899, including, but not limited to, alphanumeric input devices, mice, electronic styluses, display units, touch screens, signal generation devices (e.g., speakers), or printers.

By way of example, and not limitation, the processor 860 is operable to be a general-purpose microprocessor (e.g., a central processing unit (CPU)), a graphics processing unit (GPU), a microcontroller, a Digital Signal Processor (DSP), an Application Specific Integrated Circuit (ASIC), a Field Programmable Gate Array (FPGA), a Programmable Logic Device (PLD), a controller, a state machine, gated or transistor logic, discrete hardware components, or any other suitable entity or combinations thereof that can perform calculations, process instructions for execution, and/or other manipulations of information.

In another implementation, shown as 840 in FIG. 52, multiple processors 860 and/or multiple buses 868 are operable to be used, as appropriate, along with multiple memories 862 of multiple types (e.g., a combination of a DSP and a microprocessor, a plurality of microprocessors, one or more microprocessors in conjunction with a DSP core).

Also, multiple computing devices are operable to be connected, with each device providing portions of the necessary operations (e.g., a server bank, a group of blade servers, or a multi-processor system). Alternatively, some steps or methods are operable to be performed by circuitry that is specific to a given function.

According to various embodiments, the computer system 800 is operable to operate in a networked environment using logical connections to local and/or remote computing devices 820, 830, 840 through a network 810. A computing device 830 is operable to connect to a network 810 through a network interface unit 896 connected to a bus 868. Computing devices are operable to communicate communication media through wired networks, direct-wired connections or wirelessly, such as acoustic, RF, or infrared, through an antenna 897 in communication with the network antenna 812 and the network interface unit 896, which are operable to include digital signal processing circuitry when necessary. The network interface unit 896 is operable to provide for communications under various modes or protocols.

In one or more exemplary aspects, the instructions are operable to be implemented in hardware, software, firmware, or any combinations thereof. A computer readable medium is operable to provide volatile or non-volatile storage for one or more sets of instructions, such as operating systems, data structures, program modules, applications, or other data embodying any one or more of the methodologies or functions described herein. The computer readable medium is operable to include the memory 862, the processor 860, and/or the storage media 890 and is operable be a single medium or multiple media (e.g., a centralized or distributed computer system) that store the one or more sets of instructions 900. Non-transitory computer readable media includes all computer readable media, with the sole exception being a transitory, propagating signal per se. The instructions 900 are further operable to be transmitted or received over the network 810 via the network interface unit 896 as communication media, which is operable to include a modulated data signal such as a carrier wave or other transport mechanism and includes any delivery media. The term "modulated data signal" means a signal that has one or more of its characteristics changed or set in a manner as to encode information in the signal.

Storage devices 890 and memory 862 include, but are not limited to, volatile and non-volatile media such as cache, RAM, ROM, EPROM, EEPROM, FLASH memory, or other solid state memory technology; discs (e.g., digital versatile discs (DVD), HD-DVD, BLU-RAY, compact disc (CD), or CD-ROM) or other optical storage; magnetic cassettes, magnetic tape, magnetic disk storage, floppy disks, or other magnetic storage devices; or any other medium that can be used to store the computer readable instructions and which can be accessed by the computer system 800.

In one embodiment, the computer system 800 is within a cloud-based network. In one embodiment, the server 850 is a designated physical server for distributed computing devices 820, 830, and 840. In one embodiment, the server 850 is a cloud-based server platform. In one embodiment, the cloud-based server platform hosts serverless functions for distributed computing devices 820, 830, and 840.

In another embodiment, the computer system 800 is within an edge computing network. The server 850 is an edge server, and the database 870 is an edge database. The edge server 850 and the edge database 870 are part of an edge computing platform. In one embodiment, the edge server 850 and the edge database 870 are designated to distributed computing devices 820, 830, and 840. In one embodiment, the edge server 850 and the edge database 870 are not designated for distributed computing devices 820, 830, and 840. The distributed computing devices 820, 830, and 840 connect to an edge server in the edge computing network based on proximity, availability, latency, bandwidth, and/or other factors.

It is also contemplated that the computer system 800 is operable to not include all of the components shown in FIG. 52, is operable to include other components that are not explicitly shown in FIG. 52, or is operable to utilize an architecture completely different than that shown in FIG. 52. The various illustrative logical blocks, modules, elements, circuits, and algorithms described in connection with the embodiments disclosed herein are operable to be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application (e.g., arranged in a different order or partitioned in a different way), but such implementation decisions should not be interpreted as causing a departure from the scope of the present invention.

The above-mentioned examples are provided to serve the purpose of clarifying the aspects of the invention, and it will be apparent to one skilled in the art that they do not serve to limit the scope of the invention. By nature, this invention is highly adjustable, customizable and adaptable. The above-mentioned examples are just some of the many configurations that the mentioned components can take on. All modifications and improvements have been deleted herein for the sake of conciseness and readability but are properly within the scope of the present invention.

The invention claimed is:

1. A system for spectrum analysis in an electromagnetic environment comprising:
- a radio receiver front-end subsystem configured to create processed data based on the electromagnetic environment;
- a spectral correlation density (SCD) analysis engine operable to analyze the processed data to detect and/or classify at least one signal;
- wherein the SCD analysis engine is operable to use machine learning (ML) to compare the at least one signal to at least one second signal wherein the system is operable to identify interference.

2. The system of claim 1, wherein the SCD analysis engine uses a fast Fourier transform (FFT) Accumulation Method (FAM) to analyze the processed data.

3. The system of claim 1, further comprising a frequency domain programmable channelizer.

4. The system of claim 3, wherein the frequency domain programmable channelizer includes at least one channel definition, at least one channelization vector, at least one fast Fourier transform (FFT) configuration, at least one deference matrix, at least one detector configuration, and/or at least one channel detection.

5. The system of claim 3, wherein the SCD analysis engine is included in the frequency domain programmable channelizer.

6. The system of claim 1, wherein the SCD analysis engine is operable to use a convolutional neural network (CNN).

7. The system of claim 1, wherein the SCD analysis engine is operable to detect transmitted signals with cyclo-stationary properties.

8. The system of claim 1, wherein the SCD analysis engine is operable to detect patterns in magnitude of a mid frequency (f) and cyclic frequency/alpha ($\alpha$) graph.

9. The system of claim 1, wherein the SCD analysis engine is operable to determine cyclo-stationary moments and a ratio of the cyclo-stationary moments.

10. The system of claim 1, wherein the at least one signal and/or the at least one second signal is an orthogonal frequency-division multiplexing (OFDM) signal or a Quadrature Phase Shift Keying (QPSK) signal.

11. The system of claim 1, further comprising a blind detection engine, wherein the SCD analysis engine is included in the blind detection engine.

12. A system for spectrum analysis in an electromagnetic environment comprising:
- a radio receiver configured to create processed data based on the electromagnetic environment;
- a spectral correlation density (SCD) analysis engine operable to detect and/or classify at least one signal;
- wherein the SCD analysis engine is operable to use machine learning (ML) to compare the at least one signal to at least one second signal;
- wherein the at least one second signal is operable to be previously identified and/or stored in a database; wherein the SCD analysis engine is operable to identify interference in the electromagnetic environment.

13. The system of claim 12, wherein the SCD analysis engine is operable to detect transmitted signals with cyclo-stationary properties.

14. The system of claim 12, wherein the SCD analysis engine is operable to use a convolutional neural network (CNN).

15. The system of claim 12, wherein the SCD analysis engine is operable to utilize a cyclic autocorrelation function (CAF) for signal detection and processing.

16. A method for spectrum analysis in an electromagnetic environment comprising:
- creating processed data based on the electromagnetic environment;
- analyzing the processed data using a spectral correlation density (SCD) analysis engine to detect and/or classify at least one signal;
- wherein the SCD analysis engine is operable to use machine learning (ML) for image comparison of the at least one signal to at least one second signal; further comprising channelizing the processed data using a channelizer.

17. The method of claim 16, wherein the channelizer is a frequency domain programmable channelizer.

* * * * *